United States Patent [19]

Hayashi et al.

[11] Patent Number: 5,720,826
[45] Date of Patent: Feb. 24, 1998

[54] PHOTOVOLTAIC ELEMENT AND FABRICATION PROCESS THEREOF

[75] Inventors: Ryo Hayashi, Tsukuba; Yasushi Fujioka; Shotaro Okabe, both of Nara; Masahiro Kanai, Tokyo; Jinsho Matsuyama; Akira Sakai, both of Soraku-gun; Yuzo Koda, Tsuzuki-gun; Tadashi Hori, Nara; Takahiro Yajima, Soraku-gun, all of Japan

[73] Assignee: Canon Kabushiki Kaisha, Tokyo, Japan

[21] Appl. No.: 657,066

[22] Filed: May 29, 1996

[30] Foreign Application Priority Data

| May 30, 1995 | [JP] | Japan | 7-132431 |
| May 30, 1995 | [JP] | Japan | 7-132432 |
| May 30, 1995 | [JP] | Japan | 7-132433 |
| May 30, 1995 | [JP] | Japan | 7-132434 |
| May 20, 1996 | [JP] | Japan | 8-124757 |

[51] Int. Cl.$^6$ ............... H01L 31/075; H01L 31/20
[52] U.S. Cl. ............ 136/249; 136/258; 257/440; 257/458; 427/574; 427/575; 427/578; 427/579; 438/96; 438/97; 438/482; 438/484; 438/485
[58] Field of Search .............. 136/249 TJ, 258 AM, 136/258 PC, 249; 257/53, 55, 440, 458; 437/4, 101, 108–109, 113; 427/574–575, 578–579; 438/96–97, 482, 484, 485

[56] References Cited

U.S. PATENT DOCUMENTS

| 2,949,498 | 8/1960 | Jackson | 136/249 |
| 4,254,429 | 3/1981 | Yamazaki | 257/65 |
| 4,377,723 | 3/1983 | Dalal | 136/249 |
| 4,400,409 | 8/1983 | Izu | 437/173 |
| 4,816,082 | 3/1989 | Guha | 136/249 |
| 5,589,007 | 12/1996 | Fujioka et al. | 136/249 |

FOREIGN PATENT DOCUMENTS

| 3-030419 | 2/1991 | Japan. | |
| 4-299576 | 10/1992 | Japan | 136/258 AM |
| 4-333289 | 11/1992 | Japan | 136/258 AM |
| 6-232429 | 8/1994 | Japan | 136/258 AM |
| 6-232432 | 9/1994 | Japan. | |

*Primary Examiner*—Aaron Weisstuch
*Attorney, Agent, or Firm*—Fitzpatrick, Cella, Harper & Scinto

[57] ABSTRACT

Provided are a photovoltaic element suitable for practical use, low in cost, high in reliability, and high in photoelectric conversion efficiency, and a fabrication process thereof. In the photovoltaic element having stacked layers of non-single-crystal semiconductors, at least an i-type semiconductor layer and a second conductivity type semiconductor layer are stacked on a first conductivity type semiconductor layer, and the second conduction type semiconductor layer has a layer A formed by exposing the surface of the i-type semiconductor layer to a plasma containing a valence electron controlling agent and a layer B deposited on the layer A by a CVD process using at least the valence electron controlling agent and the main constituent elements of the i-type semiconductor layer.

42 Claims, 8 Drawing Sheets

PHOTOVOLTAIC ELEMENT AND FABRICATION PROCESS THEREOF

BACKGROUND OF THE INVENTION

1. Field of the Invention

The present invention relates to a photovoltaic element of high photoelectric conversion efficiency and a process for fabricating it.

2. Related Background Art

Photovoltaic elements for converting sunlight into electric energy are widely used as consumer-oriented power supplies for low power devices, such as desk-top calculators and watches and are drawing attention as a practically available technology for future alternate power sources replacing the so-called fossil fuels such as petroleum and coal. The photovoltaic elements are based on techniques utilizing the photoelectromotive force of a pn junction of a semiconductor and are constructed in such a manner that a semiconductor of silicon or the like absorbs the sunlight to produce photocarriers, i.e. electrons and holes, and the photocarriers thus produced are drifted by the internal electric field in the pn junction portion to be outputted as electric current.

Most fabrication processes of such photovoltaic elements employ semiconductor processes. Specifically, a single crystal of silicon is prepared valence-electron-controlled to be p-type or n-type by a crystal growth method such as the CZ technique and the single crystal thus prepared is sliced into silicon wafers approximately 300 µm thick. Further, a pn junction is formed by forming layers of different conductivity types by an appropriate means, for example, diffusion of a valence electron controlling agent so as to provide an opposite conductivity type to that of the wafer.

Incidentally, many photovoltaic elements available at present use single-crystal silicon from the viewpoints of reliability or conversion efficiency, but fabrication cost of the photovoltaic elements is high because of use of the semiconductor processes as discussed above.

The single-crystal silicon used for such single-crystal silicon photovoltaic elements needs have a small coefficient of light absorption because of its indirect transition and a single-crystal photovoltaic element, therefore, needs to have a thickness of at least 50 µm in order to absorb the sunlight incident thereto. Also, it has a bandgap of about 1.1 eV, which is narrower than 1.5 to 1.6 eV considered preferable for a photovoltaic element, and, therefore, it cannot effectively utilize short-wavelength sunlight components. Even if polycrystal silicon is used to decrease the production cost, the problem of indirect transition, which is the problem with single crystals, still remains, so that the thickness of the photovoltaic element cannot be substantially decreased. Further, polycrystal silicon also has another problem of grain boundaries unlike single crystals.

There are further problems as follows. Because of crystalline properties, a wafer of large area cannot be produced and it is thus difficult to increase the area of the element. For attaining large power, unit elements need to be connected in series or in parallel, which requires many wiring connections. Expensive packaging is necessary for protecting the photovoltaic elements from mechanical damage due to various weather conditions when used outdoors. These factors raise a problem of an increase of production cost per unit power generated. Under such circumstances a decrease in cost and an increase in area are important technical subjects in order to promote practical use of photovoltaic elements for power. A variety of investigations have been conducted to achieve the technical requirements.

Search for cheap materials and materials of high conversion efficiency has been conducted. Examples of such materials for photovoltaic elements include tetrahedral amorphous semiconductors such as amorphous silicon, amorphous silicon germanium, and amorphous silicon carbide; compound semiconductors including so-called Group II–VI based compound semiconductors such as CdS and $Cu_2S$ and so-called Group III–V based compound semiconductors such as GaAs and GaAlAs; and so on. Among others, thin-film photovoltaic elements using amorphous semiconductors as a photoelectromotive force generation layer are promising because of such advantages that a larger area film can be fabricated as compared with the single-crystal photovoltaic elements, the film can be thinner, and the film can be deposited on an arbitrary substrate material.

However, improvements in photoelectric conversion efficiency and reliability are required for realizing practical use of the photovoltaic elements using the amorphous semiconductors stated above as power generation elements.

There are known various methods for improving the photoelectric conversion efficiencies of the photovoltaic elements using the amorphous semiconductors. For example, in the case of a photovoltaic element using a pin type semiconductor junction, it is necessary to improve the characteristics of the p-type semiconductor layer, i-type semiconductor layer, n-type semiconductor layer, transparent electrode, and back side electrode constituting the photovoltaic element in order to increase its photovoltaic conversion efficiency.

U.S. Pat. No. 2,949,498 discloses a so-called tandem stacked cell in which a plurality of photovoltaic elements of unit element structure are stacked, as another method for increasing the conversion efficiency of photovoltaic elements. This stacked cell uses pn junction crystalline semiconductors, but the idea is applicable to both amorphous and crystalline semiconductors. The idea was to have photovoltaic elements of different bandgaps efficiently absorb the solar light spectra so as to increase $V_{oc}$, thereby improving the power generation efficiency.

An example of a stacked cell under research is one in which elements of different bandgaps are stacked so as to efficiently absorb respective sections of the solar ray spectra, thereby improving the conversion efficiency, and which is designed in such a manner that the bandgap of a so-called bottom cell located underneath a so-called top cell is narrower than the bandgap of the top cell located on the light incidence side of the stacked elements. In another approach, Hamakawa et al. reported a so-called cascade type cell in which multiple amorphous silicon layers of the same bandgap were stacked without an insulating layer between the photovoltaic elements, thereby increasing $V_{oc}$ of the whole stack of elements. This method is now a known technique for stacking unit elements each made of an amorphous silicon material of the same bandgap.

Also in the case of such stacked cells as described above, it is necessary to improve the characteristics of the p-type semiconductor layer, i-type semiconductor layer, n-type semiconductor layer, transparent electrode, and back side electrode constituting the photovoltaic elements in order to improve the photoelectric conversion efficiency, similarly as in the case of the single-layer cells (single cells).

For example, in the case of the i-type semiconductor layer, it needs to have a desired bandgap depending upon the application of the single cell or the stacked cells and it is important to decrease local states in the gap as much as possible so as to improve the transit properties of the photocarriers.

Improvements in the characteristics of the photovoltaic elements have been also researched employing methods other than by a substantial improvement in the film quality of the i-type semiconductor layer. An example is a method using a so-called buffer layer having a sloped bandwidth at a junction interface between the p-type semiconductor and/ or n-type semiconductor and the i-type semiconductor layer, as disclosed in U.S. Pat. No. 4,254,429 and U.S. Pat. No. 4,377,723.

Many levels are produced from a difference of lattice constants at the junction interface between a p-type semiconductor or n-type semiconductor made of amorphous silicon and an i-type semiconductor made of amorphous silicon germanium. Thus, the buffer layer is provided at the junction interface so as to eliminate the levels, to enhance the junction properties, and not to degrade the transit property of photocarriers, thereby increasing $V_{oc}$.

A further example is a method using amorphous silicon germanium, for example, for the i-type semiconductor layer, changing the composition ratios of silicon and germanium so as to form a composition distribution in the intrinsic layer, and thereby forming a so-called sloped layer for improving the characteristics. For example, U.S. Pat. No. 4,816,082 discloses a method in which the bandgap of the i-layer is made wider in a portion in contact with a first valence-electron-controlled semiconductor layer on the light incidence side, the bandgap is gradually narrowed toward the center, and then the bandgap is gradually widened toward a second valence-electron-controlled semiconductor layer. By this method the carriers generated by light are efficiently separated by action of the internal electric field, thereby increasing the photoelectric conversion efficiency.

When amorphous silicon or amorphous silicon germanium is used for the i-type semiconductor layer, a small part thereof often becomes of the n-type. It is thus has been investigated to improve the transit property of holes in the i-layer by mixing a small amount of a p-type valence electron controlling agent in the i-layer.

Meanwhile, a so-called doped layer such as the p-type semiconductor layer or the n-type semiconductor layer is required to have high density of activated acceptors or donors and low activation energy. This increases the diffusion potential (built-in potential) upon formation of the pin junction and increases the open-circuit voltage ($V_{oc}$) of the photovoltaic element, thus increasing the photoelectric conversion efficiency.

Next, since the doped layer basically does not contribute to generation of photocurrents, it must not impede incidence of light to the i-type semiconductor layer generating the photocurrents. It is thus important to widen the optical bandgap and to decrease the film thickness of the doped layer. It is also required that the doped layer and the i-type semiconductor layer form a homo- or hetero-pin junction and to have less interface levels at the junction interface.

Studies have been made on materials for the doped layer provided with the characteristics as described above and on methods for forming it.

Examples of materials for the doped layer include Si, SiC, SiN, SiO, etc., and amorphous or microcrystalline forms thereof have been studied. RF plasma CVD, ECR plasma CVD, photo-assisted CVD, etc. have been studied as methods for forming them.

Among the above materials for the doped layer, amorphous silicon (a-Si) is widely used as a doped layer on the back side of the i-type semiconductor layer with respect to the direction of incidence of light because of its ease of formation; amorphous silicon carbide (a-SiC) is used as a doped layer on the light incidence side of the i-type semiconductor layer because of its small coefficient of absorption; and microcrystalline silicon (μc-Si) is used because of its small coefficient of absorption and low activation energy, as known examples.

Here, in comparing amorphous doped layers with microcrystalline doped layers, microcrystalline doped layers are considered to be more desirable because they have small absorption coefficients, large optical bandgaps, and low activation energy.

It is, however, not easy to form a microcrystalline material of high density of activated acceptors or donors and low activation energy, and, as for the materials other than microcrystalline Si, there are not many reported examples of high-efficiency photovoltaic elements of large open-circuit voltage ($V_{oc}$) and high photoelectric conversion efficiency. When a microcrystalline or polycrystalline doped layer is deposited on an amorphous i-type semiconductor layer, especially when the i-type semiconductor layer and doped layer form a heterojunction, an increased number of interface levels could negatively affect the pin junction.

It also has been investigated to decrease the absorption coefficient of the doped layer by the quantum well effect in multilayered structures made by combining the above materials. It is, however, considered that such a technique is not suitable for practical use because it is difficult to control the multilayered structure of the doped layer, the total film thickness of which should be made thin and because the cost of the apparatus for forming it will be high.

As explained above, there still remains room for developing the doped layer in the amorphous photovoltaic elements. For the amorphous photovoltaic elements, it is important not only to develop the i-type semiconductor layer, but also to develop an ideal doped layer at the same time in order to increase the photoelectric conversion efficiency.

On the other hand, the conversion efficiencies of the amorphous photovoltaic elements are not high enough because they are inferior in film quality to the crystal silicon photovoltaic elements; and power generation cost per watt thereof is higher than those of the existing nuclear power, thermal power, hydroelectric generation, etc. The amorphous silicon based photovoltaic elements are thus required to be further increased in their conversion efficiencies in order to be used in power applications competing with the existing power generation methods.

As a mass-production process of the photovoltaic elements as described above, U.S. Pat. No. 4,400,409 discloses a continuous plasma CVD apparatus employing a roll-to-roll method. This patent discloses that this apparatus can continuously form large-area elements having a semiconductor junction in such a manner that a plurality of glow discharge regions are provided, a flexible belt substrate of a desired width and a sufficient length is arranged along a path in which the substrate travels through the glow discharge regions in order, and the substrate is continuously carried in the longitudinal direction thereof while forming deposits of semiconductor layers of necessary conductivity types in the respective glow discharge regions. From this, the roll-to-roll method can be said to be a method suitable for mass production of large-area semiconductor elements.

Meanwhile, plasma processes using microwaves or VHF (Very High Frequency) waves have also been drawing attention recently. Since the frequencies of the microwaves or VHF waves are high, the energy density can be enhanced more than in the case of using the radio frequency waves conventionally used. Therefore, microwaves and VHF waves are suitable for efficiently generating plasma and maintaining it.

For example, Japanese Laid-open Patent Application No. 3-30419 discloses a film forming method and apparatus of the roll-to-roll method using the microwave plasma CVD process. It describes that formation of films becomes possible even under low pressure when the plasma is produced by microwaves, that a high-quality film can be obtained by suppressing polymerization of active species which could cause deterioration of film characteristics of the film, that formation of polysilane powder or the like is suppressed in the plasma, and that a drastic increase of film-forming speed can be obtained.

In the roll-to-roll method, for example, when the microwave plasma CVD process of high film-forming speed is employed for formation of the i-type semiconductor layer, the speed of the moving belt substrate can be considerably increased when compared with the high-frequency (RF) plasma CVD process. When the moving speed of the belt substrate is increased, it is necessary to lengthen the film-forming chambers in the movement direction of the belt substrate in proportion to the conveying speed because the period of time necessary for film formation is constant in forming the n- and p-type semiconductor layers. However, even with the RF plasma CVD process, there are limits to the formation of thin and uniform non-single-crystal semiconductor layers over a large area and with good repeatability in a long film formation chamber, which limits cam result in causing dispersion in film thickness, i.e. the film being thinner or thicker than a predetermined film thickness, and unevenness of the conductivity characteristics, etc. Especially, for the p-type or n-type impurity doped layer located on the light incidence side of the i-type semiconductor layer, the film thickness thereof must be of the necessary minimum in order to avoid a decrease in incident light transmitted to the i-type semiconductor layer due to absorption of light in the impurity doped layer. It is, however, not easy to form a large-area, thin, and uniform impurity doped layer in the long film forming chamber by the conventional RF plasma CVD process, which could be a cause of the dispersion or unevenness of the characteristics of photovoltaic elements formed.

For the photovoltaic elements such as solar cells, it is usual practice to obtain a desired current or voltage by connecting unit modules of photovoltaic elements in series or in parallel to form an array. In that case, the unit modules must show less dispersion or unevenness of characteristics including output voltages, output currents, or the like between the unit modules. Evenness of the characteristics of stacked semiconductor films is thus required, which is a significant factor in determining the characteristics, at the various stages for forming the unit modules. In order to simplify the assembling step of modules, formation of stacked semiconductor films of excellent characteristics across a large area can result in enhancing mass productivity of photovoltaic elements or the like and greatly decreasing the production cost. From the above viewpoints, it is seen that the conventional apparatus for continuously forming stacked semiconductor films, wherein the i-type semiconductor layer is formed by the microwave or VHF wave CVD process and the n-type and p-type semiconductor layers are formed by the RF plasma CVD process, had the problem that it produced dispersion or unevenness of the characteristics of the stacked semiconductor films for photovoltaic elements formed therein.

An ion implantation technique is known as another method for forming the n-type or p-type non-single-crystal semiconductor layer. The ion implantation technique can control the thickness of the n-type or p-type non-single-crystal semiconductor layer by controlling implantation strength of impurity ions by means of an acceleration voltage. In general, an ion implantation apparatus for implanting the impurity ions is composed of a system for generating ions, a system for leading the ions out in a beam shape, and a system for scanning the beam. Thus, the structure is complex and the apparatus is expensive. Therefore, the ion implantation technique is not suitable for fabricating the photovoltaic elements of non-single-crystal semiconductors at good productivity and at low cost, and thus, it has not been employed as a means for forming the impurity doping layer.

Plasma doping for introducing an impurity with a plasma of impurity gas instead of the ion implantation technique described above has recently been drawing attention as a method for forming a very shallow junction required for VLSI or the like, (see for example, Very-large-scale integrated (VLSI) circuit process data handbook (Science Forum, issued 1990)). In Extended Abstracts (The 35th Meeting, 1988), 30p-M-6; The Japan Society of Applied Physics and Related Societies, it is disclosed that an amorphous silicon film can be doped with impurities by plasma doping by exposing an i-type amorphous silicon film to an RF plasma of impurity gas. Further, Japanese Laid-open Patent Application No. 6-232432 discloses a film forming method and apparatus of the roll-to-roll type method for forming an impurity doping layer by plasma doping, and they are described as capable of forming high-quality photovoltaic elements of high open-circuit voltage across a large area, in the low frequency range of from about 5 kHz to about 500 kHz of discharge frequency without dispersion or unevenness. It is conceivable that the impurity gas is ionized by the plasma to become impurity ions and the impurity ions are implanted in a very thin region near the surface of the i-type semiconductor layer by energy of the plasma.

Many amorphous silicon solar cells have the p-type layer on the transparent electrode side, that is, on the light incidence side to facilitate collection of holes, the diffusion distances of which are shorter, of the electron-hole pairs photo-generated, thereby enhancing the collection efficiency of light. Using microcrystalline silicon (μc-Si:H) for the p-type layer on the light incidence side and thereby utilizing the high electric conductivity and small absorption coefficient in the short-wavelength region of μc-Si:H, the open-circuit voltage ($V_{oc}$) can be improved and the photoelectric conversion efficiency can be enhanced, as is well known.

When the impurity doped layer of μc-Si:H is formed by plasma doping, the energy of the plasma causes the impurity ions to be implanted into the surface of the i-type semiconductor layer and the outermost surface is considered to be greatly damaged. Particularly, in a crystal region wherein many surface levels exist, the upper transparent electrode is formed, and thus, the surface levels impede motion of carriers between the transparent electrode and the p-type semiconductor layer, which could negatively affect the photoelectric conversion efficiency.

SUMMARY OF THE INVENTION

In order to solve the above problems, an object of the present invention is to provide a photovoltaic element at low cost and suitable for practical use, with high reliability, and high photoelectric conversion efficiency, and a fabrication process thereof, by introducing a new doped layer and a forming method thereof.

The inventors intensively and extensively examined the structure and forming methods of the doped layer and determined that a photovoltaic element having a doped layer of the following structure demonstrated a large open-circuit voltage ($V_{oc}$) and a high photoelectric conversion efficiency.

Another object of the present invention is to provide a photovoltaic element having stacked layers of non-single-crystal semiconductors, which has at least an i-type semiconductor layer and a second conductivity type semiconductor layer in this order on a first conductivity type semiconductor layer, wherein the second conductivity type semiconductor layer has a layer A formed by exposing a surface of the i-type semiconductor layer to plasma containing a valence electron controlling agent and a layer B deposited on the layer A by a CVD process using at least a valence electron controlling agent and a main constituent element of said i-type semiconductor layer.

A further object of the present invention is to provide a process for fabricating a photovoltaic element, comprising:
  a step of depositing a first conductivity type semiconductor;
  a step of depositing an i-type semiconductor on the first conductivity type semiconductor;
  a step of exposing a surface of the i-type semiconductor to a plasma atmosphere containing a valence electron controlling agent, thereby forming a layer A of a second conductivity type semiconductor; and
  a step of depositing a second conductivity type semiconductor containing a valence electron controlling agent on the layer A, thereby forming a layer B.

In the photovoltaic element stated above, the layer A may further contain an element for expanding the bandgap. Also, the layer B may further contain an element for expanding a bandgap. Further, both layer A and layer B may contain an element for expanding the bandgap.

The photovoltaic element stated above may be formed so that the first conductivity type is n-type while the second conductivity type is the p-type. Another arrangement may be one where the first conductivity type is p-type while the second conductivity type is n-type.

A preferred embodiment of the above photovoltaic element is constituted such that the hydrogen content of the layer A, formed by converting the i-type semiconductor layer near the surface of the photovoltaic element into the p-type or the n-type, is greater than the hydrogen content of the i-type semiconductor layer.

Further, a desirable embodiment of the above photovoltaic element is constituted such that layer A is amorphous while layer B is microcrystalline or polycrystalline.

An example of a desirable process for fabricating the photovoltaic element according to the present invention is one wherein the pressure of the gas for producing the plasma upon forming the layer A is lower than the pressure of the gas upon depositing the layer B.

An example of a desirable fabrication process of the photovoltaic element as described above is one wherein a DC voltage or AC power upon forming the layer A is greater than a DC voltage or AC power upon depositing the layer B.

Further, an example of a desirable fabrication process of the photovoltaic element as described above is one wherein the hydrogen dilution ratio of the gas upon forming the layer A is greater than the hydrogen dilution ratio of the gas upon depositing the layer B.

Moreover, an example of a desirable fabrication process of the photovoltaic element as described above is one wherein the frequency of discharge power upon forming the layer A is lower than the frequency of discharge power upon depositing the layer B. The frequency of discharge power upon forming the layer A is preferably in the range of 5 kHz to 500 kHz (and in this case, the discharge power is preferably in the range of 0.01 W/cm$^2$ to 5 W/cm$^2$), while the frequency of discharge power upon forming the layer B is preferably in the range of 1 MHz to 100 MHz (and in this case, the discharge power is preferably in the range of 0.001 W/cm$^2$ to 1 W/cm$^2$).

DETAILED DESCRIPTION OF THE PREFERRED EMBODIMENTS

Figure 1:
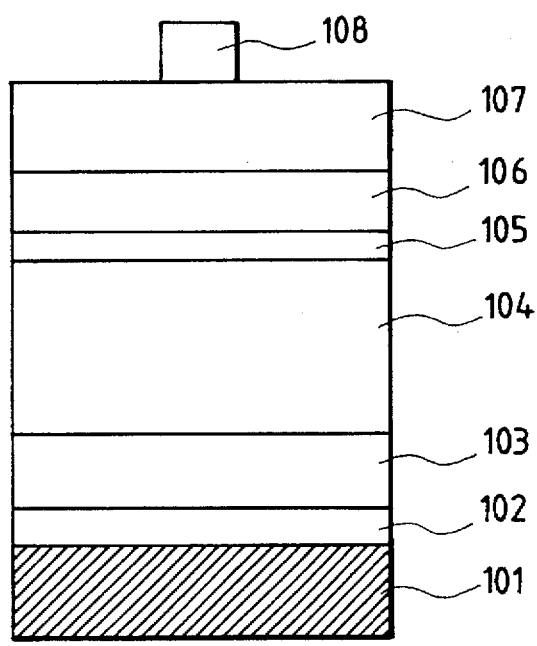
FIGS. 1, 2, 5, and 8 are schematic sectional views for explaining examples of the structure of the photovoltaic elements of the present invention.

The present invention will now be described in detail.

According to the present invention, a photovoltaic element having stacked films of non-single-crystal semiconductors has at least an i-type semiconductor layer and a second conductivity type semiconductor layer on a first conductivity type semiconductor layer, wherein the second conductivity type semiconductor layer has a layer A formed by exposing a surface of the i-type semiconductor layer to plasma containing a valence electron controlling agent and a layer B deposited on the layer A by the CVD process using at least a valence electron controlling agent and a main constituent element of the i-type semiconductor layer.

As a result of employing the above structure, the doped layer can be formed with a high density of activated acceptors or donors satisfying both conditions of low activation energy and small absorption coefficient; and, because the interface between the i-type semiconductor layer and the layer A is separated from the interface with the layer B, the open-circuit voltage ($V_{oc}$) and fill factor (F.F.) of photovoltaic element are increased so as to improve the photoelectric conversion efficiency.

Although the detailed mechanism of the above action is not clarified yet, the following can be considered as a possible mechanism.

First, by exposing the surface of the i-type semiconductor layer to the plasma containing the valence electron controlling agent, the layer A is formed by converting the i-type semiconductor layer near the surface into a p-type or n-type layer, whereby the p/i interface or n/i interface of the pin junction can be formed inside the i-type semiconductor layer already formed. The p/i interface or n/i interface in the pin junction is a very significant interface in determining the magnitude of the built-in potential when light is incident from the side of such interface.

With the p/i interface or n/i interface on the light incidence side, because most of the photocarriers occurring in the i-type semiconductor layer occur near the interface, it is important for the i-type semiconductor layer to be fully depleted near the interface. For that purpose, it is necessary for the band profile of the p/i interface or n/i interface to be so shaped as to keep the photocarriers generated from reversely diffusing into the p-type semiconductor layer or the n-type semiconductor layer and to include less interface levels at the p/i interface or n/i interface and thus to cause less recombination of the photocarriers generated.

It is, however, not easy to decrease the interface levels at the p/i interface or n/i interface when the second conductivity type semiconductor layer is formed by deposition on the i-type semiconductor layer as in the conventional technology, because the p/i interface or n/i interface in the pin junction is coincident with the interface between the layers deposited. This is presumably because of the interface levels appearing between the deposited layers.

Factors which cause such interface levels include impurities remaining in the interface, which are unnecessary impurities adhering to the surface of the first layer after deposition of the first layer (for example, the i-type semiconductor layer) and before deposition of the second layer (for example, the second conductivity type semiconductor layer); mismatching caused by a difference between the structures of the first layer and the second layer, etc.

In contrast, in the case of the photovoltaic element of the present invention, because the p/i interface or n/i interface is formed inside the i-type semiconductor layer already formed, the p/i interface or n/i interface is separated from the interface between the deposited layers, which can presumably decrease the interface levels in the p/i interface or n/i interface.

Further, because the i-type semiconductor layer near the surface is changed into the p-type or n-type layer, there is no big difference between the structures of the layer A and the i-type semiconductor layer, which can presumably decrease the interface levels in the p/i interface or n/i interface.

The conversion of the i-type semiconductor layer near the surface into the surface into the p-type or n-type layer can presumably decrease the interface levels in the p/i interface or n/i interface more than deposition of the p-type semiconductor layer or the n-type semiconductor layer can.

Further, in the photovoltaic element of the present invention the interface between the deposited layers is the p/p interface or n/n interface, and these interfaces, even with some interface levels, are considered to rarely negatively affect the photovoltaic element.

Incidentally, the present inventors found out by experiments that the layer A formed by converting the i-type semiconductor layer near the surface into the p-type or n-type layer can be uniformly formed across a large area, but it is desirable to select fine forming conditions in order to heavily dope the i-type semiconductor layer to further increase the built-in potential of the photovoltaic element.

Further, the present inventors determined by experiments that the layer B formed by deposition is easier to be heavily doped than the layer A formed by changing the i-type semiconductor layer into the p-type or n-type layer, the density of acceptors or donors activated can be sufficiently raised, the activation energy of the doping layer can be sufficiently lowered, and the built-in potential of the photovoltaic element can thus be readily enhanced.

Then the present inventors succeeded in adequately lowering the activation energy of the total doping layer by stacking the layer B formed by deposition on the layer A while keeping the film thin enough and preventing light absorption by the entire second conductivity type semiconductor layer from degrading the short-circuit current ($J_{sc}$) of photovoltaic element.

Combining the above results, the inventors succeeded in decreasing the interface levels in the p/i interface or n/i interface by composing the second conductivity type semiconductor layer of plural layers, specifically by depositing the layer B on the layer A, and in forming the doping layer having a high density of activated acceptors or donors satisfying both conditions of low activation energy and small absorption coefficient.

In the present invention, when the layer A further contains an element for expanding the bandgap, the built-in potential is enhanced and the light absorption in the layer A is decreased at the same time, which increases the short-circuit current ($J_{sc}$) of photovoltaic element, whereby the photoelectric conversion efficiency can be further improved.

In addition, in the present invention, when the layer B further contains an element for expanding the bandgap, light absorption in the layer B is decreased and the short-circuit current ($J_{sc}$) of photovoltaic element is increased, whereby the photoelectric conversion efficiency can be further improved.

In the present invention, when layer A and layer B further contain an element for expanding the bandgap, the photoelectric conversion efficiency can be further improved.

In the present invention, when the first conductivity type is n-type and the second conductivity type is p-type, a photovoltaic element can be obtained in a structure where the light is incident from the p-type semiconductor layer side.

In addition, in the present invention, when the first conductivity type is p-type and the second conductivity type is n-type, the photovoltaic element can be obtained in a structure where the light is incident from the n-type semiconductor layer side.

In the present invention, when the hydrogen content of layer A, formed by converting the i-type semiconductor layer near the surface of the photovoltaic element into a p-type or n-type layer, is greater than that of the i-type semiconductor layer, the bandgap can be expanded, the built-in potential can be enhanced, and the absorption coefficient can be decreased in the layer A. This can increase the open-circuit voltage ($V_{oc}$) and short circuit current ($J_{sc}$) of photovoltaic element and can improve the photoelectric conversion efficiency as a result.

In the present invention, when the crystal form of layer A is amorphous and the crystal form of layer B is microcrystalline or polycrystalline, the activation energy and absorption coefficient of the doped layer can be decreased. This can increase the open-circuit voltage ($V_{oc}$) and short-circuit current ($J_{sc}$) and can improve the photoelectric conversion efficiency as a result.

The detailed mechanism of this result is not clarified yet, but it is considered in general that interface levels appear at the p/i interface or n/i interface when the p/i interface or n/i interface is formed by contact between a doped layer made of a microcrystalline or polycrystal semiconductor and the i-type semiconductor layer made of an amorphous semiconductor; whereas it is considered in the case of the photovoltaic element of the present invention that, because the doped layer made of an amorphous semiconductor exists between the doped layer made of the microcrystalline or polycrystal semiconductor and the i-type semiconductor layer made of amorphous semiconductor, the interface levels occurring due to contact between the microcrystalline or polycrystal semiconductor and the amorphous semiconductor are present in the p/p interface or n/n interface, which greatly decreases the negative effect due to the interface levels and enhances the built-in potential. Further, it is also considered that the built-in potential is enhanced because of the presence of the doped layer made of an amorphous semiconductor with a wider bandgap than that of the microcrystal or polycrystal semiconductor, between the doping layer made of the microcrystal or polycrystal semiconductor and the i-type semiconductor layer made of amorphous semiconductor.

In the present invention, when the pressure of the gas for generating the plasma during formation of layer A is set lower than the pressure of the gas during deposition of layer B, during formation of layer A the region near the surface of the i-type semiconductor layer can be converted into a p-type layer or n-type layer up to a desired depth and the bandgap can be expanded, and during formation of layer B mainly the deposition reaction can take place.

Further, in the present invention, when the DC voltage or AC power during formation of layer A is set greater than the DC voltage or AC power during deposition of layer B, during formation of layer A the region near the surface of the i-type semiconductor layer can be converted into a p-type layer or an n-type layer up to a desired depth and the bandgap can be expanded, and during formation of the layer B mainly the deposition reaction can take place.

In addition, in the present invention, when the hydrogen dilution ratio of the gas during formation of layer A is set higher than the hydrogen dilution ratio of the gas during deposition of layer B, during formation of layer A the region near the surface of the i-type semiconductor layer can be converted into a p-type layer or an n-type layer up to a desired depth and the bandgap can be expanded, and during formation of layer B mainly the deposition reaction can take place.

Further, in the present invention, when the frequency of the discharge power during formation of layer A is set lower than the frequency of the discharge power during deposition of layer B, there occurs little dispersion or unevenness of characteristics, and the semiconductor layer can be formed across a large area.

Also, in the present invention, when the frequency of the discharge power during formation of layer A is set in the range of 5 kHz to 500 kHz and the discharge power in the range of 0.01 W/cm$^2$ to 5 W/cm$^2$, doping can be performed with good efficiency.

In addition, in the present invention, when the frequency of the discharge power during formation of layer B is set in the range of 1 MHz to 100 MHz and the discharge power in the range of 0.001 W/cm$^2$ to 1 W/cm$^2$, the film can be formed with high performance.

Embodiments according to the present invention will be explained in the following.

Photovoltaic Element

Figure 2:
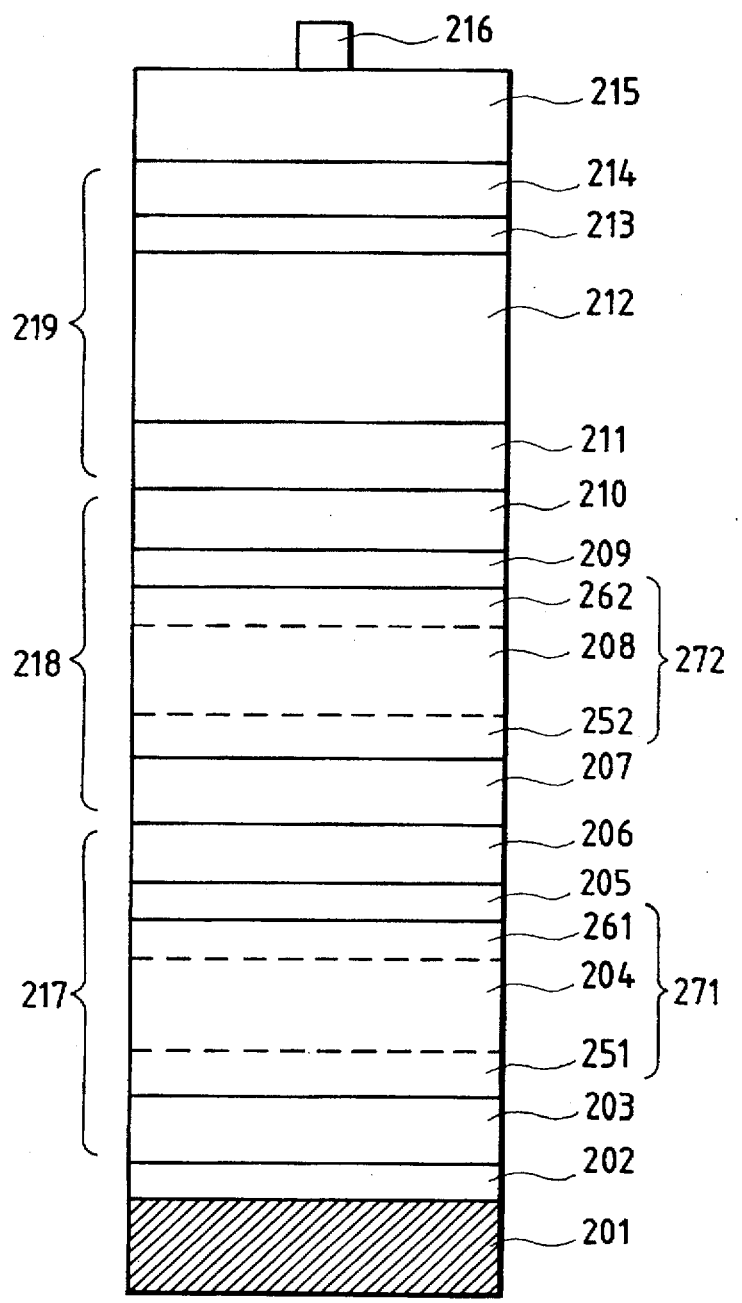
Figure 5:
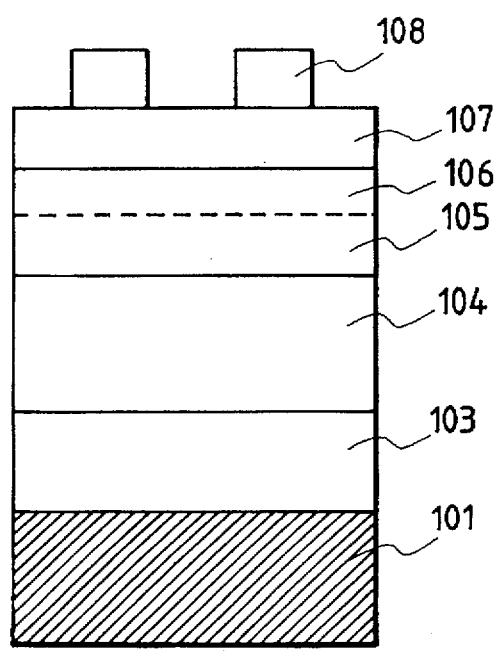
Figure 8:
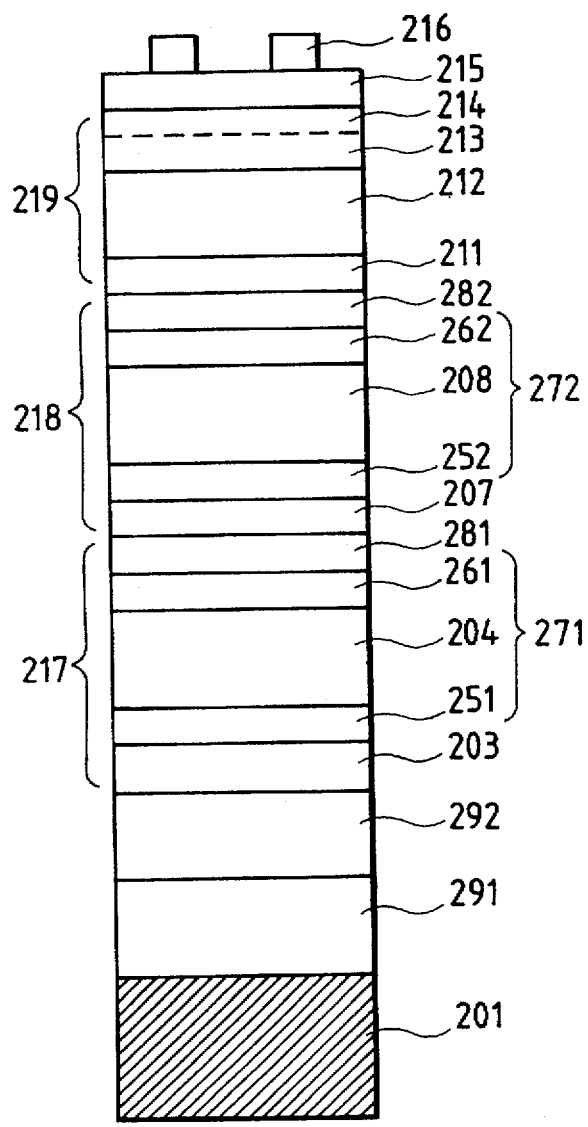

Specific examples of structures suitable for the photovoltaic element of the present invention include two types, for example, the single cell type shown in FIG. 1 or FIG. 5 and the tandem stacked cell type shown in FIG. 2 or FIG. 8. The structures of photovoltaic element and fabrication processes thereof according to the present invention will be explained in detail with reference to FIG. 1 and FIG. 2.

FIG. 1 is a schematic sectional view of an example of a single cell type photovoltaic element according to the present invention. It is noted that the present invention is by no means limited to the photovoltaic element of the structure shown in FIG. 1.

In FIG. 1, reference numeral 101 designates a substrate, 102 a back electrode, 103 a first conductivity type (n-type) semiconductor layer, 104 an i-type semiconductor layer, 105 a layer A forming a second conductivity type (p-type) semiconductor layer, 106 a layer B also forming the second conductivity type (p-type) semiconductor layer, 107 a transparent electrode, and 108 a collector electrode. FIG. 1 shows a structure in which the light is incident from the p-type semiconductor layer side, but, in the case of a photovoltaic element of the structure where the light is incident from the n-type semiconductor layer side, reference numeral 103 will be the first conductivity type (p-type) semiconductor layer, 105 the layer A forming the second conductivity type (n-type) semiconductor layer, and 106 the layer B forming the second conductivity type (n-type) semiconductor layer.

Further, FIG. 1 shows a structure in which a light is incident from the side opposite the substrate, but, in the case of a photovoltaic element of the structure in which the light is incident from the substrate side, the element will be arranged in such a manner that the substrate 101 is transparent, the positions of the transparent electrode and the back electrode are reversed, reference numeral 102 becomes the transparent electrode, 103 the first conductivity type (p-type/n-type) semiconductor layer, 105 the layer A forming the second conductivity type (n-type/p-type) semiconductor layer, 106 the layer B forming the second conductivity type (n-type/p-type) semiconductor layer, and 107 the back electrode.

FIG. 2 is a schematic sectional view showing an example of a tandem stacked cell type photovoltaic element according to the present invention. It is, however, noted that the present invention is by no means limited to the photovoltaic element shown in FIG. 2.

The tandem stacked cell type photovoltaic element shown in FIG. 2 is a laminated structure of three pin junctions, in which 219 is a first pin junction when counted from the light incidence side, 218 is a second pin junction, and 217 a third pin junction. These three pin junctions are stacked on a back electrode 202 formed on a substrate 201, and a transparent electrode 215 and a collector electrode 216 are formed on the top of the three pin junctions, thus forming a tandem stacked cell type photovoltaic element.

Each of the pin junctions 217, 218, and 219 shown in FIG. 2 has a first conductivity type (n-type/p-type) semiconductor layer 203, 207, or 211, an i-type semiconductor layer 271, 272, or 212, a layer A 205, 209, or 213 forming a second conductivity type (p-type/n-type) semiconductor layer, and a layer B 206, 210, or 214 forming the second conductivity type (p-type/n-type) semiconductor layer. FIG. 2 illustrates pin junctions 217 and 218 in each of which the i-layer 271 or 272 is composed of three regions. Each i-layer 271 or 272 has RF i-layers 251, 261 and 252, 262 formed utilizing RF (radio frequency) as the discharge frequency upon formation thereof and μw i-layers 204 and 208 formed utilizing microwaves (μ wave) as the discharge frequency upon formation thereof.

These regions are provided because use of microwave enables high-speed film formation of the i-layers 271, 272 so as to obtain the necessary film thickness in a short period of time and use of RF wave totally improves the characteristics of the i-layers 271 and 272.

The i-layers 271 or 272 may also be formed as a single region, if the desired characteristics are attained thereby.

Description has been focused on the case where three pin junctions are stacked as in FIG. 2, but two or three or more pin junctions may be stacked as necessary. In that case, the absorption coefficient of light and the power generation efficiency should be taken into consideration.

As explained with the photovoltaic element of FIG. 1, the locations of the doped layer and electrode layers are switched depending upon the direction of incidence of light.

FIG. 5 is a schematic sectional view showing the structure of another photovoltaic element. In FIG. 5, portions denoted by the same reference numerals as those in FIG. 1 represent the same structure. The element shown in FIG. 5 is an example in which the substrate 101 also serves as a back electrode.

FIG. 8 is a schematic sectional view showing the structure of still another preferred photovoltaic element. In FIG. 8, portions denoted by the same reference numerals as those in FIG. 2 represent the same structure. The element shown in FIG. 8 is formed in the same triple cell arrangement as the element shown in FIG. 2, but it is principally different from the element shown in FIG. 2 in that only the cell closest to the light incidence side (the top cell) has the layer A and in that the semiconductor layers are formed over a buffer layer 292 after a reflective and conductive layer 291 is formed on the substrate 201. In the drawing reference numerals 281 and 282 each denote second conductivity type semiconductor layers.

The various layers of the photovoltaic elements of the present invention, described above, will be now described in detail in the order of their formation.

Substrate

The substrate in the present invention can be selected as necessary, but it must be one which at least permits the semiconductor layers etc. to be formed thereon, as described above.

There is no specific restriction on the crystal form of such a substrate (for example, it may be either single crystal or non-single-crystal). It may be either conductive or insulating and may be selected depending upon the overall structure of the photovoltaic element or the procedures and fabrication steps thereof. It may be either transparent or opaque.

However, a preferably used substrate is one having little deformation or distortion but a desired strength.

Specific examples of the material for the substrate include thin plates of metals such as Fe, Ni, Cr, Al, Mo, Au, Nb, Ta, V, Ti, Pt, or Pb or alloys such as brass or stainless steel, and composites thereof; films or sheets of heat-resistant synthetic resins such as polyester, polyethylene, polycarbonate, cellulose acetate, polypropylene, polyvinyl chloride, polyvinylidene chloride, polystyrene, polyamide, polyimide, or epoxy, or composites thereof with glass fibers, carbon fibers, boron fibers, or metal fibers; thin plates of the aforementioned metals or sheets of the aforementioned resins coated with a metal thin film and/or an insulating thin film such as $SiO_2$, $Si_3N_4$, $Al_2O_3$, or AlN by sputtering, vapor deposition, plating, or the like; glass, ceramics, etc.

When the substrate is a metal or the like and is electrically conductive, it may be used also as an electrode for directly outputting an electric current. Further, if the substrate is a synthetic resin or the like and is electrically insulative, the electrode for outputting the electric current is desirably formed by a preliminary surface treatment by plating, vapor deposition, sputtering, or the like of a metal or an alloy, such as Al, Ag, Pt, Au, Ni, Ti, Mo, W, Fe, V, Cr, Cu, stainless steel, brass, nichrome, or a transparent conductive oxide (TCO) such as $SnO_2$, $In_2O_3$, ZnO, or ITO, on the surface on which the films are to be formed.

Of course, regardless of whether the substrate is an electrically conductive one such as the metals or insulative, a different metal layer or the like may be provided on the side where the films are formed on the substrate for the purposes of improving the reflectivity of light which passes unabsorbed through the semiconductor layers (for example, long-wavelength light) at the substrate surface, preventing mutual diffusion of constituent elements between the substrate material and the deposited films, etc. If the substrate is relatively transparent and the photovoltaic element is constructed so that the light is incident from the substrate side, it is desirable to preliminarily deposit a transparent conductive oxide or a conductive thin film such as a metal thin film on the substrate.

The surface of the substrate may be either smooth or finely roughened. When the surface of the substrate is a finely roughened surface, the roughness may be of a desired configuration including spheres, cones, pyramids, etc., but reflection of light on the surface becomes diffuse when the maximum height (Rmax) is preferably in the range of 0.05 μm to 2 μm. This can increase the optical pathlength of reflected light from the surface and can further improve the utilization factor of incident light.

The substrate may be configured as a plate, an elongate belt (band), a cylinder, or the like with a smooth or roughened surface depending upon the application, and the thickness thereof is determined so as to be capable of forming the desired photovoltaic element. If the photovoltaic element is desired to be flexibile or if the light is incident from the substrate side, the substrate may be formed as thin as possible within the range as long as it demonstrates the functions of a substrate. However, the thickness of the substrate is normally 10 μm or more in view of the methods of fabrication of substrates, handling thereof, mechanical strength, etc.

Especially, when the substrate is belt-like, a preferred material for the belt-like substrate is one having less deformation or distortion at temperatures necessary for fabrication of the semiconductor films, having desired strength, and having electrical conductivity, and specific examples of the material include thin plates of metals such as stainless steel, aluminum and alloys thereof, iron and alloys thereof, or copper and alloys thereof, and composites thereof; the foregoing coated with a thin film of a different metal and/or an electrically insulating thin film such as $SiO_2$, $Si_3N_4$, $Al_2O_3$, or AlN by sputtering, vapor deposition, plating, or the like; sheets of heat-resistant resins such as polyimide, polyamide, polyethylene terephthalate, or epoxy or composites thereof with glass fibers, carbon fibers, boron fibers, or metal fibers the surface of which is treated to become electrically conductive by a means of plating, vapor deposition, sputtering, or coating of a metal or an alloy thereof, and a transparent and conductive oxide (TCO) etc.

The thickness of the belt-like substrate is desirably as thin as possible within the range, as long as it demonstrates sufficient strength to maintain a curved shape formed when carried, and the cost, etc. Specifically, the thickness is preferably in the range of 0.01 mm to 5 mm, more preferably in the range of 0.02 mm to 2 mm, and most preferably in the range of 0.05 mm to 1 mm. When a thin film of a metal or the like is used, the thickness can be relatively thin while maintaining the desired strength.

The preferred width of the belt-like substrate is in the range so as to maintain uniformity of the plasma formed in each film-forming chamber and to suit the module arrangement of the photovoltaic elements thus formed, and specifically, it is preferably in the range of 5 cm to 100 cm, and more preferably in the range of 10 cm to 80 cm.

There is no specific limitation on the length of the belt-like substrate. It may be of a length sufficient to be rolled up into a roll form or it may be formed in an elongated shape by welding or the like of elongated strips.

When a reflective and conductive film for improving the reflectivity of the substrate is formed on the substrate, as described above, specific examples of suitable materials for the reflective and conductive film include Ag, Al, Cr, Au, Cu, etc.

In the case where a buffer layer is formed for preventing the mutual diffusion of constituent elements between the substrate material and the semiconductor films and for preventing short circuits, a transparent and conductive oxide film is preferably formed between the substrate and the semiconductor films. A suitable example of a material for the transparent and conductive oxide layer is ZnO.

Back Electrode and Light Reflecting Layer

The back electrode in the present invention is an electrode disposed on the surface of the semiconductor layer opposite the light incidence side. Thus, the back electrode is placed on the substrate, or at a position on the side opposite to the substrate when the substrate is transparent and the light is incident from the substrate side.

Specific examples of materials for the back electrode include metals such as gold, silver, copper, aluminum, nickel, iron, chromium, molybdenum, tungsten, titanium, cobalt, tantalum, niobium, zirconium, etc. or alloys such as stainless steel. Among them, metals with high reflectivity, such as aluminum, copper, silver, and gold are particularly preferred. When a metal with high reflectivity is used, the back electrode can also serve as a layer for reflecting light not absorbed by the semiconductor layers back toward the semiconductor layers.

The back electrode may be flat, but is more preferably roughened for scattering light. When the back electrode is roughened for scattering the light, it scatters the long-wavelength light not absorbed by the semiconductor layers so as to extend the optical pathlength in the semiconductor layers, to enhance long-wavelength sensitivity of the photovoltaic element and to increase the short-circuit current, whereby the photoelectric conversion efficiency can be increased.

The roughened configuration for scattering the light is desirably selected so that differences between peaks and valleys of the roughened configuration are in the range of Rmax of 0.05 µm to 2.0 µm, and more preferably in the range of 0.2 µm to 2.0 µm.

If the substrate also serves as a back electrode, the back electrode does not have to be formed.

The back electrode is formed using vapor deposition, sputtering, plating, printing, etc. If the back electrode is formed in the roughened configuration for scattering the light, it is formed by subjecting a film of a metal or an alloy formed to dry etching, wet etching, sandblasting, heating, etc. The roughened configuration for scattering the light can also be formed by vapor-depositing the aforementioned metal or alloy while heating the substrate.

A diffusion barrier such as conductive zinc oxide may be further provided, though not shown, between the back electrode 102 and the first conductivity type (n-type) semiconductor layer 103. Effects of the diffusion barrier layer are to prevent metal elements constituting the back electrode 102 from diffusing into the n-type semiconductor layer, to prevent short circuits from occurring at defects such as pinholes between the back electrode 102 and the transparent electrode 107 provided on either side of the semiconductor layers by providing a little resistance, by causing multiple interference by thin films so as to confine the incident light in the photovoltaic element, etc.

Semiconductor Layer

Specific examples of materials suitable for the semiconductor layer in the present invention include non-single-crystal materials contain a Group IV element such as Si, C, and Ge, or a Group IV alloy such as SiGe, SiC, and SiSn.

Among the above semiconductor materials, examples of semiconductor materials especially suitable for the photovoltaic apparatus of the present invention include a-Si:H (hydrogenated amorphous silicon), a-Si:F (fluorinated amorphous silicon), a-Si:H:F (hydrogenated and fluorinated amorphous silicon), a-SiGe:H (hydrogenated amorphous silicon germanium), a-SiGe:F (fluorinated amorphous silicon germanium), a-SiGe:H:F (hydrogenated and fluorinated amorphous silicon germanium), a-SiC:H (hydrogenated amorphous silicon carbide), a-SiC:F (fluorinated amorphous silicon carbide), a-SiC:H:F (hydrogenated and fluorinated amorphous silicon carbide), or Group IV element and Group IV alloy based non-single-crystal semiconductor materials containing microcrystals thereof.

The semiconductor layers can be modified by valence electron control and bandgap control. Specifically, modification is realized by introducing a compound containing an element which is a valence electron controlling agent or a bandgap controlling agent into a film-forming space singly or in mixture with a raw material gas for forming the film or with the diluent gas.

The valence electron control makes at least some parts of the semiconductor layers doped to the first conductivity type (the p-type or the n-type) and to the second conductivity type (the n-type or the p-type opposite to the first conductivity type), thereby forming at least one pin junction. When a plurality of pin junctions are stacked, a so-called tandem stacked cell structure is formed.

Methods for forming the semiconductor layers are selected from various CVD processes such as the microwave plasma CVD process, the RF plasma CVD process, the photo-assisted CVD process, the thermal CVD process, and the MOCVD process, various vapor deposition processes such as the EB vapor deposition, MBE, ion plating, and ion beam processes, sputtering, spraying, printing, and so on. The plasma CVD process for decomposing the raw material gas by plasma and depositing a film on the substrate is favorably used as a method in industry. A batch type apparatus or a continuous film-forming apparatus can be used as a reaction apparatus as occasion demands.

Described below in further detail are the semiconductor layers using the Group IV element based and Group IV alloy based non-single-crystal semiconductor materials especially suitable for the photovoltaic elements of the present invention.

(1) i-type semiconductor layer (intrinsic semiconductor layer)

Especially in the photovoltaic elements using the Group IV element based and Group IV alloy based non-single-crystal semiconductor materials, the i-type layer used in the pin junction is an important layer for generating and transporting carriers by absorption of the incident light.

The i-type layer may be a layer including a small p-type region or a small n-type region as long as it can function substantially as an i-type layer.

The Group IV element based and Group IV alloy based non-single-crystal semiconductor materials may contain hydrogen atoms (H, D) or halogen atoms (X), as described above.

The hydrogen atoms (H, D) or halogen atoms (X) contained in the i-type layer function to compensate for uncoupled bonds (dangling bonds) in the i-type layer and to improve the product of mobility and lifetime of carriers in the i-type layer. They also function to compensate for the levels in each interface between the p-type layer and the i-type layer or between the n-type layer and the i-type layer, so as to improve the photoelectromotive force, photocurrent, and optical response of the photovoltaic element.

The optimum content of the hydrogen atoms or/and halogen atoms contained in the i-type layer is 1 to 40 atomic %. Especially, it is preferred that the hydrogen atoms or/and halogen atoms be distributed at higher contents on each side of the interface between the p-type layer and the i-type layer or the interface between the n-type layer and the i-type layer. A preferable range of the contents of the hydrogen atoms and/or halogen atoms near the interfaces is 1.1 to 2 times greater than the content thereof in the bulk (at a position away from the interfaces, for example, in a region near the center in the thickness direction). Further, a preferable arrangement is such that the content of the hydrogen atoms and/or halogen atoms changes according to the content of silicon atoms.

In the tandem stacked cell type photovoltaic element, a desired arrangement is such that the material for the i-type semiconductor layer in a pin junction close to the light incidence side is a material with a wide bandgap while the material for the i-type semiconductor layer in a pin junction away from the light incidence side is a material with a narrow bandgap. An amorphous semiconductor material is preferably used as a material for the i-type semiconductor layer.

For example, amorphous silicon and amorphous silicon germanium containing an element or elements for compensating for the dangling bonds, such as a-Si:H, a-Si:F, a-Si:H:F, a-SiGe:H, a-SiGe:F, a-SiGe:H:F etc. are usable.

Preferable characteristics of the i-type semiconductor layer suitable for the photovoltaic element of the present invention are as follows: the content of hydrogen atoms ($C_H$) is 1.0 to 25.0%; photo conductivity ($\sigma_p$) under irradiation with pseudo sunlight of AM 1.5 and 100 mW/cm² is $1.0 \times 10^{-7}$ S/cm or more; dark conductivity ($\sigma^d$) is $1.0 \times 10^{-9}$ S/cm or less; Urbach energy by the constant photocurrent method (CPM) is 55 meV or less; localized level density is 10/cm or less.

By valence electron control of the semiconductor layers, at least some parts thereof are doped in the first conductivity type (p-type or n-type) and in the second conductivity type (n-type or p-type opposite to the first conductivity type), thereby forming at least one pin junction. When a plurality of pin junctions are stacked, a so-called tandem stacked cell structure is achieved.

(2) p-type semiconductor layer or n-type semiconductor layer

The p-type semiconductor layer or the n-type semiconductor layer in the present invention constitutes the first conductivity type semiconductor layer and the second conductivity type semiconductor layer (layer A, layer B), characterizing the photovoltaic element of the present invention, and it is an important layer for influencing the characteristics thereof.

A non-single-crystal material is suitable as the material of the p-type semiconductor layer or the n-type semiconductor layer. "Non-single-crystal material" in the present invention means an amorphous material (expressed by a-), a microcrystalline material (expressed by μc-), and a polycrystalline material (expressed by poly-).

Specific examples of the amorphous material and the microcrystalline material include materials obtained by adding a high concentration of a p-type valence electron controlling agent (the Group III atoms such as B, Al, Ga, In, and Tl) or an n-type valence electron controlling agent (the Group V atoms such as P, As, Sb, and Bi) to a-Si:H, a-Si:HX, a-SiC:H, a-SiC:HX, a-SiGe:H, a-SiGe:HX, a-SiGeC:H, a-SiGeC:HX, a-SiO:H, a-SiO:HX, a-SiN:H, a-SiN:HX, a-SiON:H, a-SiON:HX, a-SiOCN:H, a-SiOCN:HX, μc-Si:H, μc-Si:HX, μc-SiC:H, μc-SiC:HX, μc-Sio:H, μc-Sio:HX, μc-SiN:H, μc-SiN:HX, μc-SiGeC:H, μc-SiGeC:HX, μc-SiON:H, μc-SiON:HX, μc-SiOCN:H, μc-SiOCN:HX, etc.

Specific examples of the polycrystal material (expressed by poly-) include materials obtained by adding a high concentration of a p-type valence electron controlling agent (the Group III atoms such as B, Al, Ga, In, and Tl) or an n-type valence electron controlling agent (the Group V atoms such as P, As, Sb, and Bi) to poly-Si:H, poly-Si:HX, poly-SiC:H, poly-SiC:HX, poly-Sio:H, poly-Sio:HX, poly-SiN:H, poly-SiN:HX, poly-SiGeC:H, poly-SiGeC:HX, poly-SiON:H, poly-SiON:HX, poly-SiOCN:H, poly-SiOCN:HX, poly-Si, poly-SiC, poly-SiO, poly-SiN, etc.

Especially, a crystlline semiconductor layer of small light absorption of light or an amorphous semiconductor layer with a wide bandgap is suitable for the p-type layer or the n-type layer on the light incidence side.

A desirable amount of the Group III atoms added into the p-type layer and a desired amount of the Group V atoms added into the n-type layer are 0.1 to 50 atomic %.

The hydrogen atoms (H, D) or halogen atoms contained in the p-type layer or in the n-type layer function to compensate for the uncoupled ("dangling") bonds in the p-type layer or in the n-type layer to increase the doping efficiency of the p-type layer or the n-type layer. The hydrogen atoms or halogen atoms are preferably added in the range of 0.1 to 40 atomic % into the p-type layer or into the n-type layer. Especially when the p-type layer or the n-type layer is crystalline, the hydrogen atoms or the halogen atoms are preferably added in the range of 0.1 to 8 atomic %.

A preferred distribution is one in which the hydrogen atoms or/and halogen atoms are distributed more on the side of each interface between the p-type layer and the i-type layer or between the n-type layer and the i-type layer, and a preferable range of the contents of the hydrogen atoms or/and halogen atoms near the interfaces is 1.1 to 2 times greater than the contents in the bulk.

Defect level density or mechanical distortion near the interfaces can be decreased when the content of the hydrogen atoms or halogen atoms is increased near each interface between the p-type layer and the i-type layer or between the n-type layer and the i-type layer, whereby the photoelectromotive force and photocurrent of photovoltaic element of the present invention can be increased.

As for the electric properties of the p-type layer and the n-type layer in the photovoltaic element, the activation energy is preferably 0.2 eV or less and more preferably 0.1 eV or less. Further, the resistivity is preferably 100 Ωcm or less and more preferably 1 Ωcm or less. Further, the film thickness of the p-type layer and the n-type layer is preferably in the range of 1 to 50 nm and more preferably in the range of 3 to 10 nm.

(3) Methods for forming the semiconductor layers

Specific examples of fabrication processes suitable for forming the Group IV element based and Group IV alloy based amorphous semiconductor layers suitable for the semiconductor layers in the photovoltaic apparatus of the present invention include plasma CVD processes using an alternating current or high frequency waves, such as the RF plasma CVD process and the microwave plasma CVD process.

The microwave plasma CVD process is a method for forming a desired film on a substrate placed in a deposition chamber, in which a feedstock gas including a raw material gas, a diluent gas, etc. is introduced into the deposition chamber (vacuum chamber), which can be in a reduced-pressure state, the internal pressure in the deposition chamber is set at a desired pressure by evacuating the inside by means of a vacuum pump, microwaves oscillated by a microwave power supply are guided through a waveguide tube and a dielectric window (alumina ceramic or the like) into the deposition chamber, and the raw material gas is decomposed to produce a plasma thereof, thereby forming a desired film on the substrate set in the deposition chamber. The microwave plasma CVD process can form films applicable for photovoltaic elements, under wide deposition conditions.

When a semiconductor layer for a photovoltaic element of the present invention is deposited by the microwave plasma CVD process, preferable conditions are as follows: the substrate temperature in the deposition chamber is between 100° and 450° C.; the internal pressure is between 0.5 and 30 mTorr; the microwave power is between 0.01 and 1 W/cm$^3$; and the frequency of microwaves is between 0.1 and 10 GHz.

When a semiconductor layer is deposited by the RF plasma CVD process, preferable conditions are as follows: the substrate temperature in the deposition chamber is between 100° and 350° C.; the internal pressure is between 0.1 and 10 Torr; the RF power is between 0.001 and 5.0 W/cm$^3$; and the deposition rate is between 0.01 and 3 nm/sec.

Specific examples of the raw material gas suitable for deposition of the Group IV element based and Group IV alloy based amorphous semiconductor layers suitable for the photovoltaic elements of the present invention include gasifiable compounds containing the silicon atom(s), gasifiable compounds containing germanium atom(s), gasifiable compounds containing carbon atom(s), and mixture of gases of the foregoing compounds.

Specific examples of the gaseous or gasifiable compounds containing silicon atom(s) include chain or cyclic silane compounds, and more specifically, $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$, $Si_2Cl_3F_3$, etc.

Specific examples of the gaseous or gasifiable compounds containing germanium atom(s) include $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, $Ge_2H_6$, etc.

Examples of elements for increasing the bandgap of the p-type semiconductor layer used in forming the first p-type semiconductor layer in the photovoltaic element of the present invention include carbon, oxygen, nitrogen, etc. Specific examples of gaseous or gasifiable compounds containing carbon atom(s) include $CH_4$, $CD_4$, $C_nH_{2n+2}$ (n is an integer), $C_nH_{2n}$ (n is an integer), $C_2H_2$, $C_6H_6$, $CO_2$, CO, etc. Specific examples of gases containing nitrogen include $N_2$, $NH_3$, $ND_3$, NO, $NO_2$, $N_2O$, etc. Specific examples of gases containing oxygen include $O_2$, CO, $CO_2$, NO, $NO_2$, $N_2O$, $CH_3CH_2OH$, $CH_3OH$, etc.

Examples of dopant substances introduced for valence electron control into the p-type layer or the n-type layer are the Group III atoms and the Group V atoms in the Periodic Table.

Examples of starting materials effectively used for introducing the Group III atoms are as follows. Specific examples of the starting materials for introducing boron atoms include boron hydrides such as $B_2H_6$, $B_4H_{10}$, $B_5H_9$, $B_5H_{11}$, $B_6H_{10}$, $B_6H_{12}$, $B_6H_{14}$ and boron halides such as $BF_3$ and $BCl_3$. In addition, other starting materials include $AlCl_3$, $GaCl_3$, $InCl_3$, $TlCl_3$, etc. $B_2H_6$ and $BF_3$ are especially suitable.

Examples of starting materials used for introducing the Group V atoms are as follows. Specific examples of the starting materials for introducing phosphorus atoms include phosphorus hydrides such as $PH_3$ and $P_2H_4$ and phosphorus halides such as $PH_4I$, $PF_3$, $PH_5$, $PCl_3$, $PCl_5$, $PBr_3$, $PBr_5$, and $PI_3$. In addition, either materials include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$. $PH_3$ and $PF_3$ are especially suitable.

The gasifiable compound may be introduced into the deposition chamber diluted with a gas such as $H_2$, He, Ne, Ar, Xe, Kr, etc., or a gas selected from these may be separately introduced into the deposition chamber.

Particularly, for depositing a microcrystalline or polycrystalline semiconductor or a layer with less absorption of light or with a wide bandgap, such as a-SiC:H, preferred conditions are such that the stock gas is diluted at a dilution ratio of 2 to 100 with hydrogen gas and microwave power, or relatively high RF power is applied.

(4) Fabrication process of layer A constituting the second conductivity type (p-type or n-type) semiconductor layer Next described is the fabrication process of the layer A constituting the second conductivity type (p-type or n-type) semiconductor layer.

The layer A constituting the second conductivity type (p-type or n-type) semiconductor layer is formed in such a manner that, after formation of the i-type semiconductor layer, the surface of the i-type semiconductor layer is exposed to plasma containing the p-type or n-type valence electron controlling agent whereby the i-type semiconductor layer near the surface is converted into the p-type or n-type region, or the bandgap thereof is widened.

More specifically, the plasma containing the p-type or n-type valence electron controlling agent is produced by application of DC, AC, or high frequency waves. The frequency may be selected from various frequencies ranging from DC to microwaves of approximately 10 GHz.

The raw material gas for forming the plasma is selected from feed stock gases suitable for deposition of the Group IV element based and Group IV alloy based amorphous semiconductor layers as described previously, gases containing substances suitable for the valence electron control as described previously, and mixtures thereof with the diluent gas, as described previously.

Here, because the first p-type semiconductor layer or n-type semiconductor layer is not formed by deposition, the stock gases suitable for deposition of the Group IV element based and Group IV alloy based amorphous semiconductor layers stated above do not always have to be used. Even when the feedstock gas suitable for deposition of the Group IV element based and Group IV alloy based amorphous semiconductor layers is used, the forming conditions are selected so as to mainly cause the reaction for converting the i-type semiconductor layer near the surface into the p-type or n-type region or further to mainly cause incorporation of the element for increasing the bandgap of the i-type semiconductor layer, rather than the deposition reaction.

When the surface of the i-type semiconductor layer is exposed to such plasma, the p-type or n-type valence electron controlling agent and the element for increasing the bandgap of the i-type semiconductor layer are incorporated from the surface of the i-type semiconductor layer into a very shallow region thereof, thereby converting the i-type semiconductor layer near the surface into the p-type or n-type region. The depth of the p-type or n-type region differs depending upon the conditions of plasma, but it is desirably between 1.0 nm and 10 nm.

This incorporation of the valence electron controlling agent and the element for increasing the bandgap of the i-type semiconductor layer into the i-type semiconductor layer by glow discharge plasma is completely different from the conventional ion implantation used in crystalline silicon or the like. In conventional ion implantation, ions are accelerated in the form of a beam and their energy is high; whereas, in the incorporation by glow discharge plasma energy of the incorporated substances is low and they are incorporated from the surface of the i-type semiconductor layer only into a very shallow region. Fine control of the depth of incorporation is also easy and uniform incorporation is readily effected across a large area.

Further, because the accelerated ions do not damage the surface of the i-type semiconductor layer, a doped layer with less localized levels can be formed without deteriorating the film quality of the i-type semiconductor layer. Accordingly, the layer A constituting the second conductivity type (p-type or n-type) semiconductor layer can be formed uniformly across a large area and with good film quality.

Without use of the deposition reaction, there are other methods for causing incorporation of the valence electron controlling agent or the element for increasing the bandgap of the i-type semiconductor layer and examples thereof are the following three methods (a) to (c):

(a) Method in which the pressure of the gas mixture in the plasma state is set lower than the pressure during normal deposition of the doped layer Setting the pressure of the gas low can raise the incorporation efficiency of the valence electron controlling agent or the element for increasing the bandgap of the i-type semiconductor layer. The details of this mechanism are not clarified yet, but it is conceivable that because the self bias of electrode increases with a decrease of the gas pressure the energy of positive ions decomposed in the plasma state is increased. Another possible cause is an increase in mean free path of positive ions. Further, the valence electron controlling agent can be prevented from depositing on the surface of the i-type semiconductor layer, which can avoid negative effects, such as an increase of light absorption coefficient, due to deposition of the valence electron controlling agent. The preferred range of the gas pressure depends upon the type of gas mixture, the frequency of power applied to the plasma, input power, etc. For example, in the case of the RF CVD process, it is desirably between 0.01 and 1 Torr.

(b) Method in which a DC bias voltage or AC power applied to the plasma is set higher than those upon normal deposition of the doped layer.

Setting the DC voltage or AC power higher can raise the incorporation efficiency of the valence electron controlling agent or the element for increasing the bandgap of the i-type semiconductor layer. The details of this mechanism are not clarified yet, but it is conceivably because the plasma potential becomes higher with an increase of the DC voltage or AC power, which raises the energy of the positive ions created in the plasma state. It can also prevent the valence electron controlling agent from depositing on the surface of the i-type semiconductor layer.

The preferred range of the DC voltage or AC power depends upon the type of gas mixture, the frequency of the power applied to the plasma, and the gas pressure, but, for example in the case of the RF CVD process, the desired power is 0.01 or more W/cm$^3$.

(c) Method wherein the gas mixture contains hydrogen

First, the plasma produces ions or radicals of hydrogen, which have an etching effect, and therefore, even if the gas mixture contains a feedstock gas suitable for deposition of the aforementioned Group IV element based and Group IV alloy based amorphous semiconductor layers, an increase of the dilution ratio with hydrogen gas can control deposition of the feedstock gas, thus well incorporating the valence electron controlling agent or the element for increasing the bandgap of the i-type semiconductor layer. It can also prevent the valence electron controlling agent from depositing on the surface of the i-type semiconductor layer.

Second, hydrogen atoms, as well as the valence electron controlling agent, are incorporated into the region near the surface of the i-type semiconductor layer, which compensates for uncoupled bonds (dangling bonds) in the i-type semiconductor layer, due to incorporation of the valence electron controlling agent, and which can enhance an activation rate of acceptors or donors.

Third, when the hydrogen atoms are incorporated into the region near the surface of the i-type semiconductor layer, the bandgap of the i-type semiconductor layer is further increased near the surface, light absorption is decreased in the first p-type semiconductor layer or n-type semiconductor layer to increase the short-circuit current ($J_{sc}$) of photovoltaic element, and the built-in potential is increased so as to raise the open-circuit voltage ($V_{oc}$), whereby the photoelectric conversion efficiency is improved.

The preferred range of the hydrogen gas dilution ratio depends upon the type of gas mixture, the frequency of power applied to the plasma, the power, and the gas pressure, but, for example, in the case of the RF CVD process, a desired flow rate of hydrogen is 100 or more where 1 is the flow rate of the sum of the feedstock gas for deposition of the Group IV element based and Group IV alloy based amorphous semiconductor layers and the feedstock gas of the valence electron controlling agent.

(5) Fabrication process of the layer B constituting the second conductivity type (p-type or n-type) semiconductor layer.

The usual fabrication processes of p-type semiconductor layer or n-type semiconductor layer as explained in (3) above can be used for the fabrication of the layer B constituting the second conductivity type (p-type or n-type) semiconductor layer in the present invention.

However, the layer B constituting the second conductivity type (p-type or n-type) semiconductor layer is desirably more heavily doped than the ordinary doped layers and should have a smaller film thickness. A preferable range of the film thickness of the layer B constituting the second conductivity type (p-type or n-type) semiconductor layer is between 1 nm and 10 nm.

The frequency of the power used in forming layer A is preferably set lower than the frequency of the power used in forming layer B. In this case, the frequency during forming of the layer A is desirably selected from the range of 5 to 500 kHz while the frequency during forming of the layer B is desirably selected from the range of 1 to 100 MHz. Preferred discharge power is between 0.01 and 5 W/cm$^2$ for the layer A and between 0.0001 and 1 W/cm$^2$ for the layer B.

Namely, the first p-type (n-type) semiconductor layer (which is the layer A constituting the second conductivity type semiconductor layer) is formed by plasma doping using discharge power of a lower frequency than the power used in the step for forming the second p-type (n-type) semiconductor layer (which is the layer B constituting the second conductivity type semiconductor layer), whereby impurity ions are first incorporated with efficiency into the surface of the i-type semiconductor layer, thereby forming the first p-type (n-type) semiconductor layer containing a crystalline material. Next, the second p-type (n-type) semiconductor layer consisting of only an amorphous material is formed on the first p-type (n-type) semiconductor layer by the RF plasma CVD process, whereby the stacked semiconductor films for a photovoltaic element with high photoelectric conversion efficiency can be formed across a large area and without dispersion or unevenness of characteristics.

The detailed mechanism of the above action is not clarified yet, but the following points can be considered.

Upon forming the layer A containing the crystalline material by plasma doping the impurity ions are first incorporated into the surface of the i-type semiconductor layer and the outermost surface of the layer A is greatly damaged. Thus, it is considered that there exists many surface levels, especially in the crystalline region. After the transparent electrode is formed on the layer A, the surface levels become interface levels between the transparent electrode and the p-type (or n-type) semiconductor layer, which increases the activation energy at the outermost surface of the p-type (or n-type) semiconductor layer or which distorts the internal potential in the photovoltaic element, thereby trapping the charge carriers. Thus, it is considered that the surface levels negatively affect movement of charge carriers between the transparent electrode and the p-type (or n-type) semiconductor layer.

By contrast, it is considered that the amorphous semiconductor can uniformly cover the surface levels existing in the greatly damaged outermost surface of the layer A, when the layer B consisting of only the amorphous material is formed on the layer A by the RF plasma CVD process, which can decrease the surface levels.

As a result, the surface levels presumably are prevented from negatively affecting the movement of charge carriers between the transparent electrode and the p-type (or n-type) semiconductor layer, whereby the stacked semiconductor layers for photovoltaic element with high photoelectric conversion efficiency can be formed across a large area and without dispersion or unevenness of characteristics.

(Transparent Electrode)

The transparent electrode 107 of the present invention serves as an electrode on the light incidence side to transmit the light and also serves as an anti-reflection film when present in an optimum thickness. Requirements for the transparent electrode 107 are high transmittance in the wavelength region which the semiconductor layers can absorb, and low resistivity. Preferably, the transmittance at 550 nm is 80% or more and more preferably 85% or more. The resistivity is preferably $5\times10^{-3}$ $\Omega$cm or less and more preferably $1\times10^{-3}$ $\Omega$cm or less. Examples of materials preferably applicable for the transparent electrode include conductive metal oxides, such as $In_2O_3$, $SnO_2$, ITO ($In_2O_3$+$SnO_2$), ZnO, CdO, $Cd_2SnO_4$, $TiO_2$, $Ta_2O_5$, $Bi_2O_3$, $MoO_3$, $Na_xWO_3$, and mixtures thereof. An element (dopant) for changing the electric conductivity may be added to these compounds.

Examples of the element (dopant) for changing the electric conductivity are as follows. For example, in the case of the transparent electrode 107 being ZnO, they include Al, In, B, Ga, Si, and F; in the case of $In_2O_3$, they include Sn, F, Te, Ti, Sb, and Pb; and in the case of $SnO_2$, they include F, Sb, P, As, In, Tl, Te, W, Cl, Br, and I.

Suitable methods for forming the transparent electrode 107 are the vapor deposition process, the CVD process, the spraying process, the spin-on process, the dipping process, etc.

(Collector Electrode)

The collector electrode 108 in the present invention is formed on a part of the transparent electrode 107 when the resistivity of the transparent electrode 107 is not sufficiently low.

It decreases the resistivity of the electrode so as to lower series resistance of the photovoltaic element. Examples of materials for the collector electrode include metals such as gold, silver, copper, aluminum, nickel, iron, chromium, molybdenum, tungsten, titanium, cobalt, tantalum, niobium, and zirconium, alloys such as stainless steel, and conductive pastes using a powdered metal. It is formed in a branched pattern so as not to interrupt the passage of incident light into the semiconductor layer.

Figure 3:
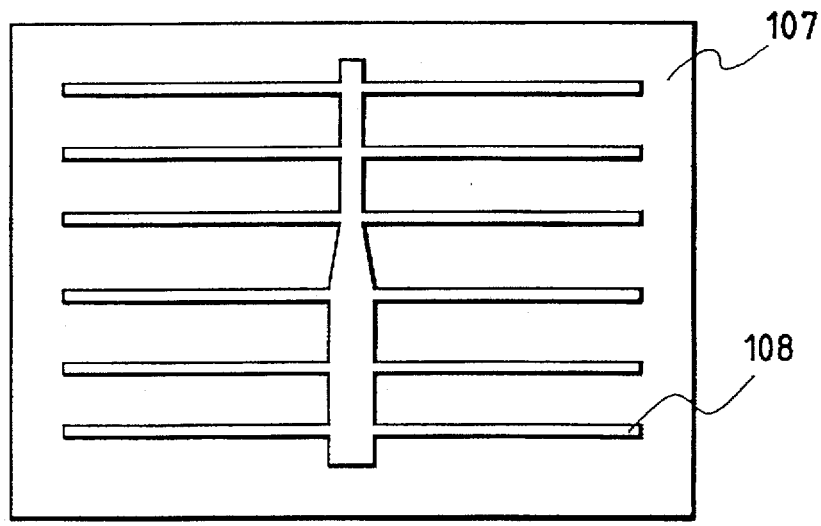
FIG. 3 is a schematic plan view of a photovoltaic element for explaining an example of the configuration of a collector electrode.

An example of the configuration of the collector electrode is next explained referring to FIG. 3.

FIG. 3 is a schematic plan view of the photovoltaic element, observed from the light incidence side. As shown in FIG. 3, the branched configuration of the collector electrode 108 can efficiently decrease the resistance without impeding the incident light from entering the element.

Further, as shown in FIG. 3, a greater reduction of the resistance can be expected by increasing the width of the strips horizontally extending in the branched pattern. In addition, output efficiency can be further improved by increasing the widths of the strips as the distance to the output terminal decreases.

Of the total area of the photovoltaic element, the area occupied by the collector electrode is preferably 15% or less, more preferably 10% or less, and most preferably 5% or less.

A mask is used for forming the pattern of the collector electrode, and methods for forming it include the vapor deposition process, the sputtering process, the plating process, the printing process, etc.

When a photovoltaic apparatus (module or panel) with desired output voltage and output current is fabricated using the photovoltaic elements of the present invention, the photovoltaic elements are connected in series or in parallel, protection layers are formed on the top and bottom surfaces, and output electrodes are attached. When the photovoltaic elements of the present invention are connected in series, a diode for preventing a reverse current is sometimes incorporated.

(Apparatus for Fabricating Photovoltaic Element)

Figure 4:
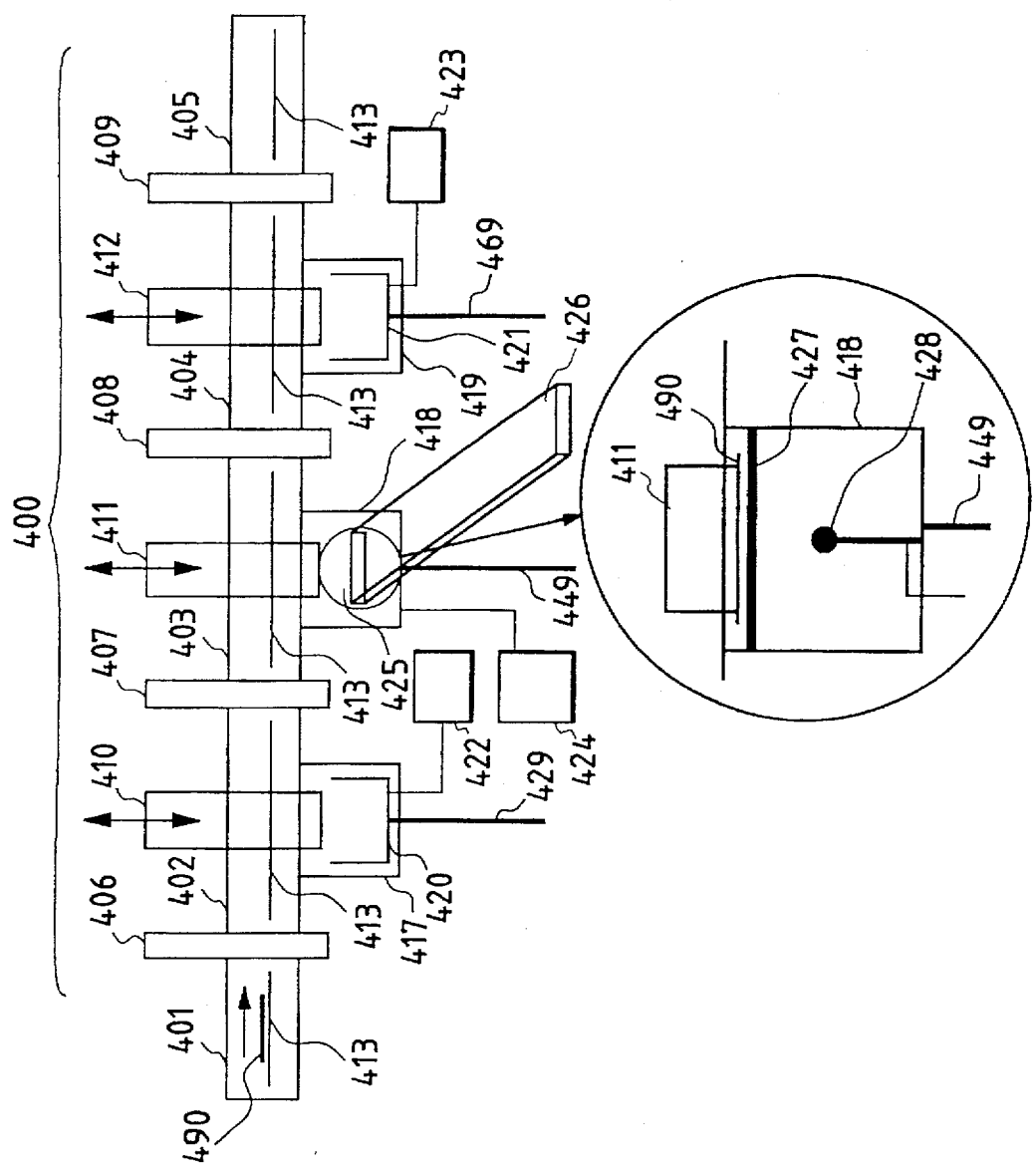
FIG. 4, FIG. 6, and FIG. 9 are schematic structural views for explaining examples of film-forming apparatus which can produce the photovoltaic elements of the present invention.
Figure 6:
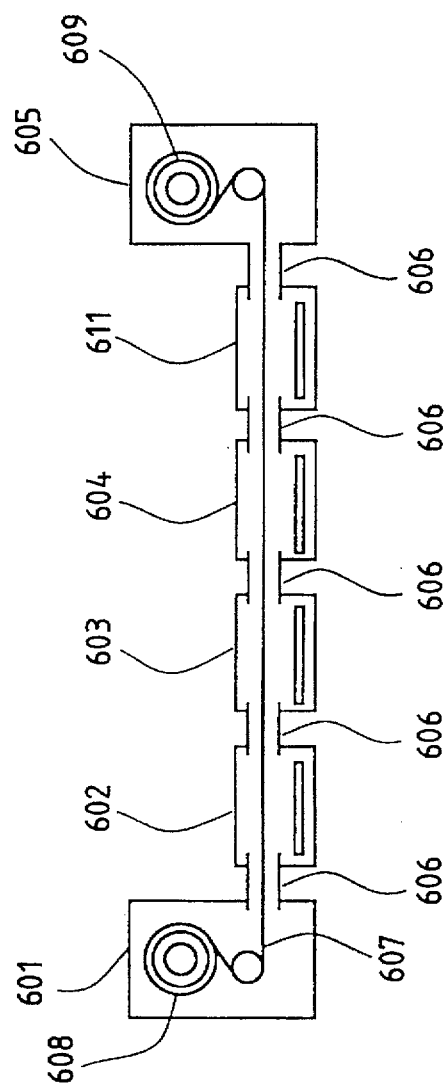

Examples of the fabricating apparatus of the photovoltaic element according to the present invention include the continuous stacked semiconductor films forming apparatus shown in FIG. 4 and FIG. 6. The apparatus of FIG. 4 is used when the form of the substrate is a plate (single plate type), while the apparatus of FIG. 6 is used when the form of the substrate is a belt (continuous type).

The fabrication apparatus of photovoltaic elements according to the present invention will be explained in detail with reference to the drawings.

In FIG. 4, reference numeral 401 designates a load lock chamber (input chamber), 402 a transport chamber for the n-type layer (or the p-type layer), 403 a transport chamber for the i-layer, 404 a transport chamber for the p-type layer (or the n-type layer), and 405 an unload chamber (taken-out chamber). Numerals 406, 407, 408, and 409 each denote gate valves, which are provided for communication between adjacent chambers or for establishing independence of each chamber. Numerals 410, 411, and 412 each denote heaters for heating the substrate, and numeral 413 denotes rails as a substrate carrying means. Numeral 417 represents a deposition chamber for formation of the n-type layer (or the p-type layer), 418 a deposition chamber for formation of the i-layer, and 419 a deposition chamber for formation of the p-type layer (or the n-type layer). Each deposition chamber 417, 419 has an RF introducing cup-shaped electrode 420 or 421 connected to an RF power supply 422 or 423, inside thereof. A gas supply pipe 429, 449, 469 is connected to each deposition chamber, whereby a desired gas can be supplied into each deposition chamber. A microwave introducing pipe 426 is connected through a microwave introducing window 425 to the deposition chamber 418, so that microwaves generated by a microwave generating means (not shown) can be guided through the microwave introducing pipe 426 and the microwave introducing window 425 into the deposition space. Numeral 424 designates a power supply for generating a bias voltage applied to the deposition chamber (or to the substrate in the chamber). An enlarged view of the deposition chamber for forming the i-layer is shown in a circle in the drawing, and, as shown inside the circle, the bias power supply is electrically connected to a bias electrode set inside the deposition space. Numeral 427 is a shutter, which is opened or closed as needed. When the shutter 427 is open, the i-layer is formed on the substrate 490. The heaters 410, 411, and 412 are movable in the directions of the arrows. Each heater is moved as needed from the side of carrying rails 413 to the deposition chamber 417, 418, 419 together with the substrate 490, and the substrate 490 can be moved from the side of the deposition chamber 417, 418, 419 to the carrying rails 413.

An exhaust means such as a vacuum pump, (not shown), is connected through a conductance valve (not shown) to each chamber.

FIG. 6 is a schematic explanatory drawing to show a basic example of the continuous forming apparatus for continuously forming the stacked semiconductor films according to the present invention. In FIG. 6, the continuous forming apparatus of stacked semiconductor films according to the present invention is basically composed of a belt substrate feeding chamber 601, a film-forming chamber 602 for forming the n-type semiconductor layer (i.e., the first conductivity type semiconductor layer) by the RF plasma CVD process, an i-type semiconductor layer forming chamber 603 for forming the i-type semiconductor layer by the RF plasma CVD process, a film-forming chamber 604 for forming the first p-type semiconductor layer (i.e., the layer A constituting the second conductivity type semiconductor layer) by plasma doping, a film-forming chamber 611 for forming the second p-type semiconductor layer (i.e., the layer B constituting the second conductivity type semiconductor layer) by the RF plasma CVD process, and a take-up chamber 605 for winding up the belt substrate. Gas gates 606 connect the chambers with each other.

In the apparatus of the present invention, the belt-like substrate 607 is fed out from a bobbin 608 in the feeding chamber 601 of the belt-like substrate and is carried through the four film-forming chambers connected by the gas gates before being rolled up on a bobbin 609 in the belt-like substrate winding chamber 605. While the substrate is carried through the four film-forming chambers, the stacked films of non-single-crystal semiconductors are formed in the nip structure on the surface thereof.

Figure 7:
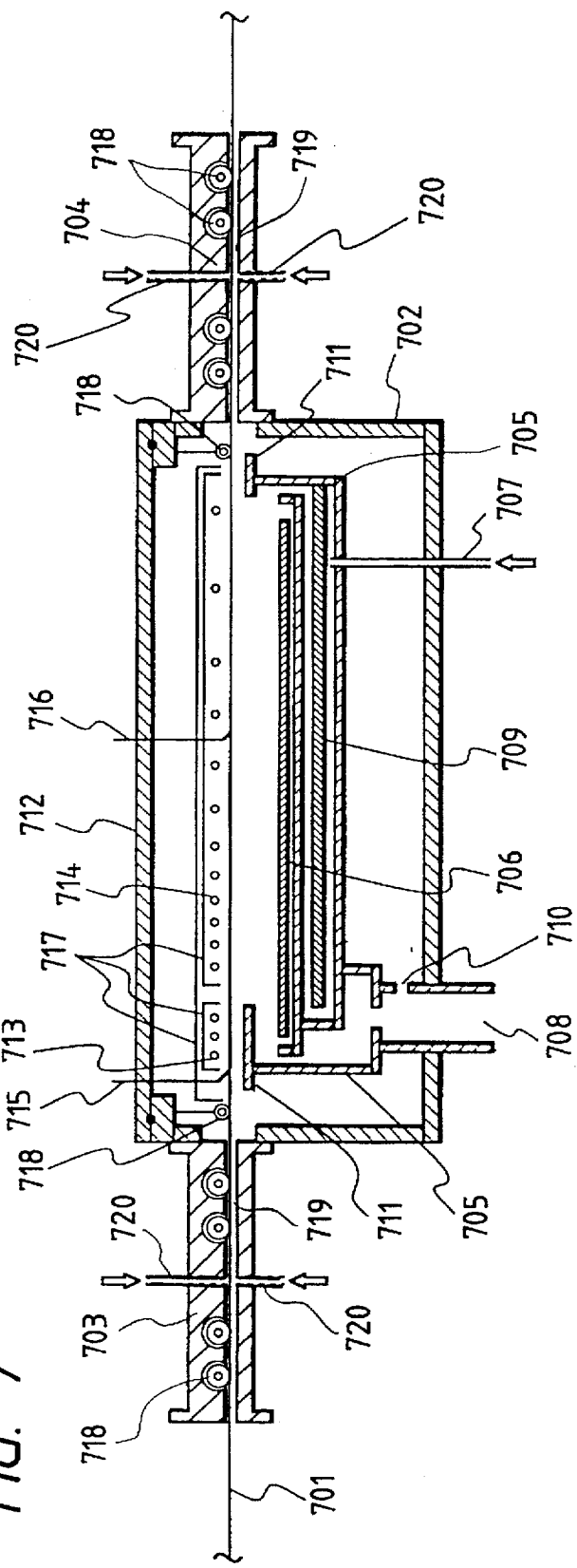
FIG. 7 and FIG. 10 are schematic sectional views for explaining examples of film-forming chambers which can be used in the present invention.

FIG. 7 is a schematic sectional view for explaining an example of the film-forming chambers in the apparatus shown in FIG. 6. In FIG. 7, reference numeral 701 designates a belt-like substrate, 702 a vacuum chamber, 703, 704 gas gates, 705 a discharge chamber, 706 a discharge electrode, 707 a feedstock gas introducing pipe, 708 an exhaust pipe, 709 a block heater, 710 a discharge chamber exhaust port, 711 a forming region aperture adjusting plate, 712 a film-forming chamber lid, 713, 714 heaters, 715, 716 thermocouples, 717 reflectors, 718 support rollers, 719 a separation passage, and 720 a gate gas introducing pipe.

As shown, the belt substrate 701 is guided into and out of the film-forming space through the gas gates 703 and 704. In the gas gates 703, 704 a gas having no negative effect on the film formation, such as He gas or $H_2$ gas, is supplied through the gate gas introducing pipes 720 into the separation passages 719, whereby separation can be made between the chamber and another film-forming chamber adjacent thereto or between the chamber and the atmosphere. The pressure inside the vacuum chamber 702 can be decreased by the exhaust means such as a vacuum pump via the exhaust pipe 708. In the case of the structure shown in FIG. 7, not only the film-forming space but also the space around it can be evacuated through the discharge chamber-to-exterior exhaust port 710. The belt-like substrate 701, supplied through the separation passage 719, is carried into the film-forming space while the position thereof is regulated by the support rollers 718. In the film-forming space the substrate 701 can be heated at a desired temperature by the heaters 713, 714 utilizing radiant heaters such as halogen lamps. The reflectors 717 are provided on the opposite side of the heaters 713, 714 to the substrate 701, so that heat from the heaters 713, 714 can be efficiently reflected toward the substrate. The discharge electrode 706 is disposed facing the film-forming surface of the substrate 701, and the block heater 709 is disposed on the opposite side of the discharge electrode 706 to the substrate 701. The feedstock gas is supplied through the feedstock gas introducing pipe 707 to the back face of the block heater 709 and is emitted from there into the film-forming space. The substrate 701, having passed through the film-forming space, is carried through the gas gate 704 as supported by the supporting rollers 718 in the same manner as when entering the film-forming space.

Figure 9:
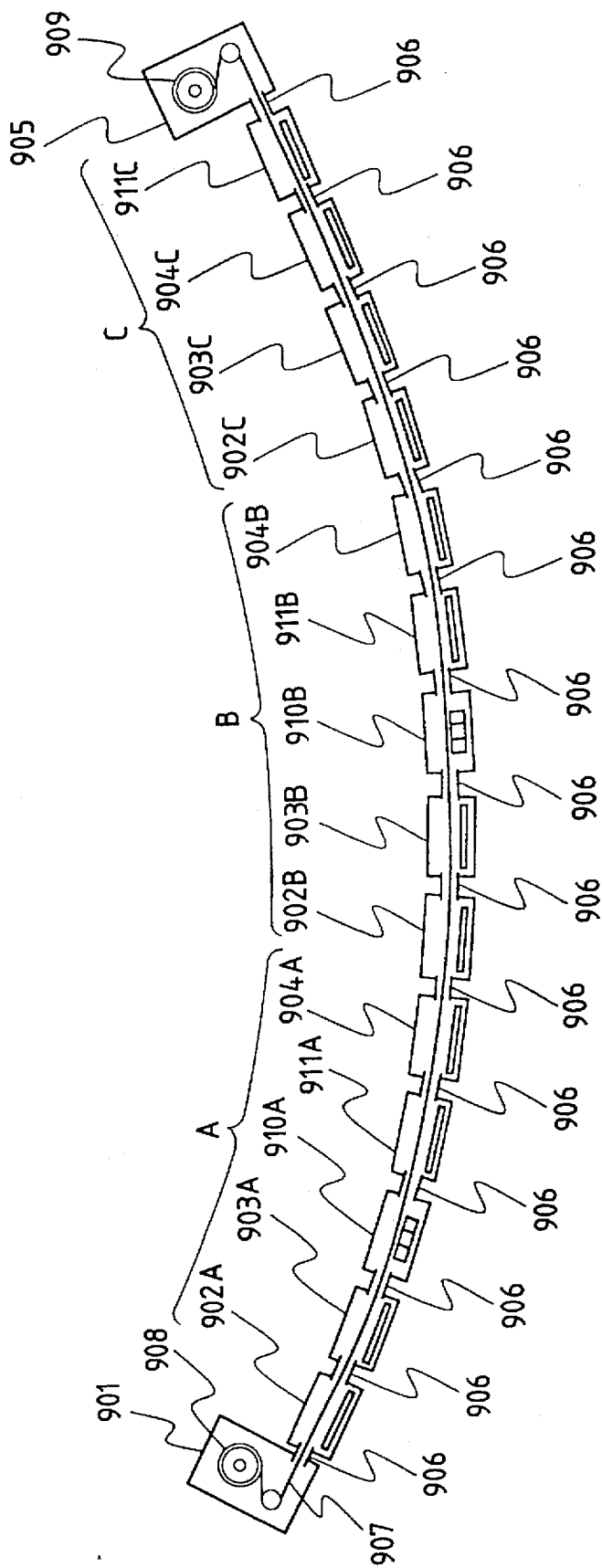

FIG. 9 is a schematic, sectional, structural drawing to explain an example of the film-forming apparatus used for making photovoltaic elements having a triple cell structure.

In FIG. 9, reference numeral 901 designates a feeding chamber for the belt-like substrate, A a set of film-forming chambers for forming a bottom cell, B a set of film-forming chambers for forming a middle cell, C a set of film-forming chambers set for forming a top cell, 902A, 902B, 902C designate film-forming chambers for forming the first conductivity type semiconductor layers utilizing RF plasma, 903A, 903B, 903C, 911A, 911B film-forming chambers for forming i-type semiconductor layers utilizing RF plasma, 910A, 910B designate film-forming chambers for forming i-type semiconductor layers utilizing microwave plasma, 904A, 904B, 911C designate film-forming chambers for forming second conductivity type semiconductor layers utilizing RF plasma, 904C designate a film-forming chamber for forming the second conductivity type semiconductor layer (the layer A) by plasma doping, 905 designates a winding chamber for the belt-like substrate, 906 designates gas gates, 907 designates a belt-like substrate, 908 designates a feeding bobbin of the belt-like substrate, and 909 designates a winding bobbin of the belt-like substrate.

In FIG. 9, the belt-like substrate 907 is fed from the feeding bobbin 908, is carried through the gas gates 906 and the respective film-forming chambers continuously arranged as the films are formed thereon, and is again wound up on the winding bobbin on the opposite side.

FIG. 9 shows the arrangement of film-forming chambers along an arcuate configuration of the belt-like substrate 907, which is employed because deflection of the substrate 907 due to its own weight is taken into account in order to carry the substrate more smoothly.

Figure 10:
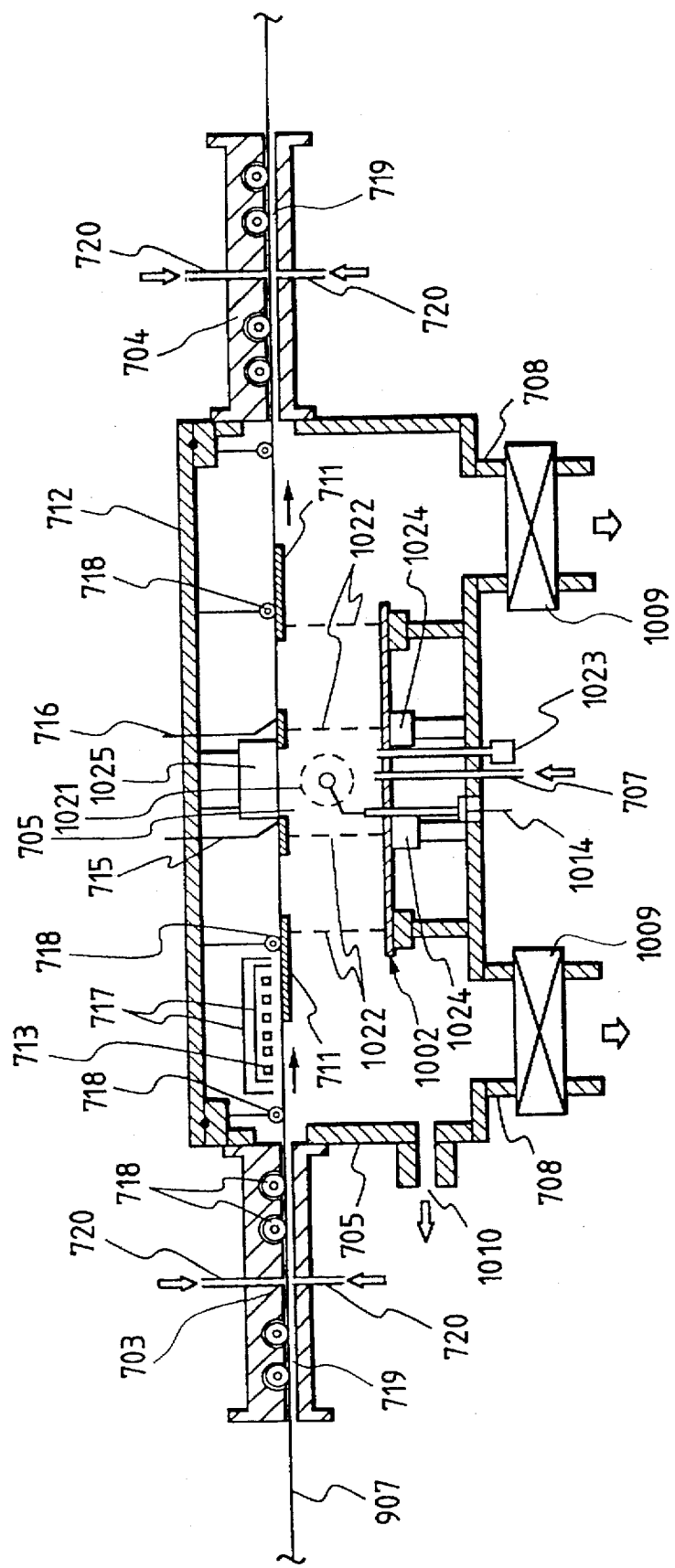

FIG. 10 is a schematic sectional view for explaining a suitable example of the film-forming chamber utilizing microwaves, applicable to the film-forming chambers shown in FIG. 9 (or FIG. 6). In the drawing, portions denoted by the same reference numerals as those shown in FIG. 7 represent the same members.

Numeral 1002 represents a discharge chamber unit, 1009 a conductance valve, 1010 an exhaust pipe for primary evacuation, 1014 a bias electrode, 1021 a microwave introducing window, 1022 a perforated partition plate, 1023 a pressure measuring pipe, 1024 a forming chamber temperature adjuster, and 1025 a substrate temperature adjuster (a heater or the like).

The apparatus as described above can be modified as occasion demands.

The photovoltaic element having the non-single-crystal silicon based semiconductor material will be explained in detail, but it is noted that the present invention is by no means limited by the description in the following.

Examples 1 to 10 were carried out to investigate cases where the second conductivity type semiconductor layer had the layer A formed by exposing the surface of the i-type semiconductor layer to the plasma containing the valence electron controlling agent and the layer B deposited on the layer A by the CVD process using at least the valence electron controlling agent and the main constituent element of the i-type semiconductor layer.

Examples 11 to 20 were carried out to investigate cases where the layer A further contained an element for increasing the bandgap.

Examples 21 to 28 were carried out to investigate cases where the layer B further contained an element for increasing the bandgap.

Examples 29 to 38 were carried out to investigate cases where the layer A and the layer B each further contained an element for increasing the bandgap.

Examples 39 to 41 were carried out to investigate the effect of the discharge power and the frequency thereof used in forming the layer A and the layer B.

EXAMPLE 1

In this example, the single cell type photovoltaic element shown in FIG. 1 was fabricated using the deposition apparatus of FIG. 4. Studied in this example was the case where the p-type semiconductor layer, being the second conductivity type semiconductor layer, was comprised of the layer A formed by exposing the surface of the i-type semiconductor layer to a plasma containing the p-type valence electron controlling agent and the layer B formed on the surface of the layer A by depositing the p-type valence electron controlling agent and the main constituent element of the i-type semiconductor layer thereon.

The fabricating process will now be explained according to its procedures.

(1) A stainless steel support 101 of thickness 0.5 mm and size 50×50 mm$^2$ was cleaned in acetone and isopropanol with ultrasonic waves, and thereafter was dried under warm air. After that, by the sputtering method, a light reflecting layer of Ag 0.3 µm thick was formed on the surface of the stainless steel support 101 at room temperature and a reflection enhancing layer of ZnO 1.0 µm thick was formed on the light reflecting layer at 350° C., thus forming the back electrode 102. The resultant obtained through these steps was a substrate 490.

(2) Using the deposition apparatus 400, the semiconductor layers each were formed on the substrate 490. The deposition apparatus 400 can perform both the microwave plasma CVD process and the RF plasma CVD process.

Feedstock gas cylinders (not shown) are connected through gas introducing pipes to the deposition apparatus. The feedstock gas cylinders all were of the grade refined at super-high purity, and they were SiH$_4$, SiF$_4$, SiH$_4$/H$_2$ (dilution rate: 10%), CH$_4$, C$_2$H$_6$, GeM$_4$, GeF$_4$, Si$_2$H$_6$, PH$_3$/H$_2$ (PH$_3$ gas diluted with H$_2$ at dilution rate: 2%), BF$_3$/H$_2$ (dilution rate: 1%), BF$_3$/He (dilution rate: 1%), H$_2$, and He, which were connected to the deposition apparatus.

(3) The substrate 490 was placed on the substrate carrying rails 413 in the load chamber 401 and the inside of the load chamber 401 was evacuated to a vacuum by a vacuum pump (not shown) to a pressure of about 1×10$^{-5}$ Torr.

(4) Upon opening of the gate valve 406, the substrate was carried into the transport chamber 402 and deposition chamber 417 which had been evacuated by the vacuum pump. The back face of the substrate 490 was heated in close contact with the substrate heating heater 410, and the inside of the deposition chamber 417 was evacuated to a pressure of about 1×10$^{-5}$ Torr by the vacuum pump. The above completed preparation for film formation.

(5) For forming the RF n-type layer of a-Si (the n-type semiconductor layer formed by the RF plasma CVD process), H$_2$ gas was introduced through the gas introducing pipe 429 into the deposition chamber 417 while the flow of H$_2$ gas was controlled at 200 sccm by a mass flow controller (not shown) by opening a valve (not shown). The pressure inside the deposition chamber 417 was adjusted to 1.1 Torr by means of a conductance valve (not shown).

(6) The substrate heater 410 was set to keep the temperature of the substrate 490 at 350° C. When the substrate temperature became stable, SiH$_4$ gas and PH$_3$/H$_2$ gas were introduced through the gas introducing pipe 429 into the deposition chamber 417 by manipulating valves (not shown). At this time, the SiH$_4$ gas flow rate was adjusted at 2 sccm, H$_2$ gas at 50 sccm, and PH$_3$/H$_2$ gas at 0.5 sccm by mass flow controllers (not shown), and the pressure inside the deposition chamber 417 was adjusted to be 101 Torr.

(7) The power of the high frequency (hereinafter referred to as "RF") power supply 422 was set to 0.005 W/cm$^3$, and the RF power was applied to the plasma forming cup 420 to cause glow discharge and to start formation of the RF n-type layer on the substrate. After the RF n-type layer was formed to a thickness of 20 nm, the RF power supply was turned off to stop the glow discharge, thus finishing the formation of the RF n-type layer 103.

(8) After stopping the flow of SiH$_4$ gas and PH$_3$/H$_2$ into the deposition chamber 417, H$_2$ gas was continuously flowed into the deposition chamber for five minutes. After that, the flow of H$_2$ was also stopped, and the inside of the deposition chamber and gas pipe were evacuated to a vacuum of 1×10$^{-5}$ Torr.

(9) The i-type layer 104 of a-Si was formed by the microwave plasm CVD process. First, upon opening the gate valve 407, the substrate 490 was carried into the transport chamber 403 and i-type layer deposition chamber 418 which had been evacuated by the vacuum evacuation pump. The back face of the substrate 490 was heated in close contact with the substrate heater 411, and the inside of the i-type layer deposition chamber 418 was evacuated to a pressure of about $1\times10^{-5}$ Torr by the vacuum evacuation pump.

(10) For fabricating the i-type layer, the substrate heating 411 was set to keep the temperature of the substrate 490 at 350° C., and, after the substrate was sufficiently heated, valves (not shown) were gradually opened to let $SiH_4$ gas and $H_2$ gas flow through the gas introducing pipe 449 into the i-type layer deposition chamber 418. At this time, the flow rates of $SiH_4$ gas was adjusted at 50 sccm and $H_2$ gas at 100 sccm by respective mass controllers (not shown). The pressure inside the i-type layer deposition chamber 418 was controlled at 5 mTorr by adjusting the aperture of a conductance valve (not shown).

(11) The RF power supply 424 was set at 0.50 W/cm³ and the power was applied to the bias electrode 428. After that, the power of the microwave power supply (not shown) was set at 0.20 W/cm³, and the microwave power was introduced through the microwave introducing waveguide tube 426 and microwave introducing window 425 into the i-type layer deposition chamber 418 to cause glow discharge. Then, by opening the shutter 427, fabrication of the i-type layer on the n-type layer was started. After the i-type layer was formed in a thickness of 0.1 μm, the microwave glow discharge was stopped and the output of bias power supply 424 was turned off, thus completing the fabrication of the i-type layer 104.

(12) After closing a valve (not shown), the flow of $SiH_4$ gas into the i-type layer deposition chamber 418 was stopped, and then $H_2$ gas was continuously flowed into the i-type layer deposition chamber 418 for two minutes. After that, by closing a valve (not shown), the inside of the i-type layer deposition chamber 418 and the gas pipe were evacuated to a vacuum of $1\times10^{-5}$ Torr.

(13) According to the following procedures, the i-type semiconductor layer of a-Si near the surface was converted into a p-type region to form the first p-type semiconductor layer or p1 layer (layer A) 105 by exposing the surface of the i-type semiconductor layer of a-Si to a plasma containing a p-type valence electron controlling agent.

First, after opening the gate valve 408, the substrate 490 was carried into the transport chamber 404 and p-type layer deposition chamber 419 which had been evacuated by the vacuum pump. The back face of the substrate 490 was heated in close contact with the substrate heater 412, and the inside of the p-type layer deposition chamber 419 was evacuated to a pressure of about $1\times10^{-5}$ Torr by the vacuum pump.

The substrate heater 412 was set so as to keep the temperature of substrate 490 at 230° C., and, after the substrate temperature became stable, He gas and $BF_3$/He gas were introduced through the gas introducing pipe 469 into the deposition chamber 419 by manipulating valves (not shown). At this time, the flow rates of He gas was controlled at 50 sccm and $BF_3$/He gas at 5 sccm by mass flow controllers (not shown) and the pressure inside the deposition chamber 419 was controlled at 2.0 Torr by adjusting the aperture of a conductance valve (not shown).

The power of the RF power supply 423 was set to 0.15 W/cm³ and the RF power was guided into the plasma forming cup 421 to cause glow discharge. By exposing the surface of the i-type semiconductor layer to the plasma containing the p-type valence electron controlling agent, the i-type semiconductor layer near the surface started to be converted into the p-type to form the first p-type semiconductor layer or p1 layer (layer A). After the layer was formed in a thickness of 3 nm, the RF power supply was turned off to stop the glow discharge, thus completing the formation of the first p-type semiconductor layer or p1 layer (layer A) 105.

(14) By manipulating the valves (not shown), the flows of He gas and $BF_3$/He gas were stopped, and $H_2$ gas was further flowed at 50 sccm, $SiH_4/H_2$ gas at 0.5 sccm, $BF_3/H_2$ gas at 0.5 sccm, and $CH_4$ gas at 5 sccm. The second p-type semiconductor layer or p2 layer (layer B) of a-Si was formed on the first p-type semiconductor layer or p1 layer (layer A) by the RF plasma CVD process. At this time, the pressure inside the p-type layer deposition chamber 419 was controlled at 2.0 Torr by adjusting the aperture of the conductance valve (not shown).

The power of the RF power supply 423 was set to 0.15 W/cm³ and the RF power was introduced to the plasma forming cup 421 to cause glow discharge, thus starting formation of the second p-type semiconductor layer or p2 layer (layer B) containing the main constituent elements of the i-type semiconductor layer of a-SiC and the element for increasing the bandgap of the i-type semiconductor layer. After the RF p-type layer was formed in a thickness of 5 nm, the RF power supply was turned off to stop the glow discharge, thus completing the formation of the p-type layer of the present invention.

After closing the valves (not shown), the flows of $SiH_4/H_2$ gas, $BF_3/H_2$ gas, and $CH_4$ gas into the p-type layer deposition chamber 419 were stopped, and $H_2$ gas was continuously flowed into the p-type layer deposition chamber 419 for three minutes. After that, the flow of $H_2$ was also stopped by closing the valve (not shown), and the inside of the p-type layer deposition chamber 419 and the gas pipe were evacuated to a vacuum of $1\times10^{-5}$ Torr.

(15) After opening the gate valve 409, the substrate 490 was carried into the unload chamber 405 which had been evacuated by the vacuum evacuation pump, and the unload chamber 405 was leaked to the atmosphere by opening a leak valve not shown.

(16) ITO then was deposited by the vacuum vapor deposition process as a transparent and conductive layer 107 in the thickness of 80 nm on the p-type layer. Next, a mask with a comb-shaped aperture was mounted on the transparent and conductive layer 107, and a comb-shaped collector electrode 108 was deposited in a layer structure of Cr (40 nm)/Ag (1000 nm)/Cr (40 nm) by the vacuum vapor deposition process.

The foregoing concludes the fabrication of the photovoltaic element of this example (SC Ex 1).

Comparative Example 1-1

This example is different from Example 1 in that the first p-type semiconductor layer or p1 layer (layer A) was not formed. Further, the film thickness of the second p-type semiconductor layer or p2 layer (layer B) of a-Si was 8 nm.

The other steps were the same as in Example 1.

The photovoltaic element fabricated in this example is referred to as SC Comp Ex 1—1.

Next explained are evaluation tests which were carried out on six photovoltaic elements obtained in each of Example 1 and Comparative Example 1—1.

As the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 1 shows the photoelectric conversion factor (η), open-circuit voltage ($V_{oc}$), short-circuit current ($J_{sc}$), and fill factor (F.F.) of (SC Ex 1), which were normalized with the corresponding measured values of (SC Comp Ex 1—1) being taken as 1.0.

TABLE 1

| | P-E conversion efficiency (η) | Open-ckt volt (Voc) | Short-ckt current (Jsc) | Fill factor (F. F.) |
|---|---|---|---|---|
| (SC Ex 1) | 1.07 | 1.03 | 1.01 | 1.03 |

From Table 1, it is found that the photovoltaic elements of (SC Ex 1) were superior in open-circuit voltage ($V_{oc}$) and fill factor (F.F.) as well as in photoelectric conversion efficiency (η) to those of (SC Comp Ex 1—1).

In order to check the unevenness and dispersion in the substrate, a mask with twenty five holes (of area of 0.25 $cm^2$) was placed on the p-type layer and a film of ITO was formed as a transparent conductive layer in a thickness of 70 nm by the vacuum vapor deposition process. Table 2 shows results of unevenness and dispersion in the substrate as to the open-circuit voltage ($V_{oc}$) and the fill factor (F.F.), measured for such samples. Here, the maximum value of measured values from the same substrate was taken as 1.

TABLE 2

| | Open-ckt voltage (Voc) | Fill Factor (F. F.) |
|---|---|---|
| (SC Ex 1) | 0.98–1.00 | 0.97–1.00 |
| (SC Comp Ex 1-1) | 0.90–1.00 | 0.95–1.00 |

From Table 2, it is found that the photovoltaic elements of (SC Ex 1) had less unevenness and dispersion in the substrates, whereby uniformity of photoelectric conversion characteristics thereof was improved.

Further, in measuring the V-I characteristics of the solar cells, a blue filter (HOYA B390) was used with AM 1.5 (100 $mW/cm^2$) irradation, thereby performing measurements to strongly reflect defect density on the light incidence side. Table 3 shows results of the photoelectric conversion efficiency (η), open-circuit voltage ($V_{oc}$), short-circuit current ($J_{sc}$), and fill factor (F.F.) measured for such samples. Each value in the table indicates a numerical value normalized with the corresponding measured value of (SC Comp Ex 1—1) being taken as 1.0.

TABLE 3

| | P-E conversion efficiency (η) | Open-ckt volt (Voc) | Short-ckt current (Jsc) | Fill factor (F. F.) |
|---|---|---|---|---|
| (SC Ex 1) | 1.09 | 1.03 | 1.01 | 1.05 |

From comparison of Table 3 with Table 1, it is found that an improvement in the fill factor (F.F.) in the measurement under blue light was more noticeable than in the measurement under white light.

It was concluded that this result showed that the interface levels in the p/i interface were decreased because almost all the photocarriers originated near the light incidence side of the i-type semiconductor layer under the blue light.

EXAMPLE 2

This example is different from Example 1 in that the following conditions were employed instead of those in Example 1 in forming the second p-type semiconductor layer or p2 layer (layer B).

(1) $H_2$ gas was flowed at 50 sccm, $SiH_4/H_2$ gas at 0.25 sccm, and $BF_3/H_2$ gas at 1 sccm.

(2) The power of the RF power supply 423 was set to 0.15 $W/cm^3$ to cause glow discharge and the layer was deposited under conditions so as to form p-type μc-Si by the RF plasma CVD process.

(3) The film thickness of the RF p-type μc-Si layer was 5 nm.

The other steps were the same as in Example 1.

The photovoltaic element fabricated in this example will be referred to as SC Ex 2.

Comparative Example 2-1

This example is different from Example 2 in that the first p-type semiconductor layer or p1 layer (layer A) was not formed. The film thickness of the second p-type semiconductor layer or p2 layer (layer B) of μc-Si was 8 nm.

The other steps were the same as in Example 2.

The photovoltaic element fabricated in this example will be referred to as SC Comp Ex 2-1.

Next to be explained are evaluation tests which were carried out on six photovoltaic elements obtained in each of Example 2 and Comparative Example 2-1.

As the evaluation tests, V-I characteristics were observed while each photovoltaic element was placed under light irradiation of AM 1.5 (100 $mW/cm^2$). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 4 shows the photoelectric conversion factor (μ), open-circuit voltage ($V_{oc}$), short-circuit current ($J_{sc}$), and fill factor (F.F.) of (SC Ex 2), which were normalized with the corresponding measured values of (SC Comp Ex 2-1) being taken as 1.0.

TABLE 4

| | P-E conversion efficiency (η) | Open-ckt volt (Voc) | Short-ckt current (Jsc) | Fill factor (F. F.) |
|---|---|---|---|---|
| (SC Ex 2) | 1.08 | 1.03 | 1.01 | 1.04 |

From Table 4, it is found that the photovoltaic elements of (SC Ex 2) were superior in open-circuit voltage ($V_{oc}$) and fill factor (F.F.) as well as in the photoelectric conversion efficiency (η) to those of (SC Comp Ex 2-1).

EXAMPLE 3

This example is different from Example 2 in that a-SiGe was used as a material for forming an MW i-type layer (an i-type semiconductor layer formed by the microwave CVD process) instead of a-Si.

The a process for fabricating the MW i-type layer of a-SiGe will be explained according to its procedures.

(1) The substrate heater 411 was set to keep the temperature of the substrate 490 at 380° C. and, by gradually opening the valves (not shown) after the substrate was sufficiently heated, SiH₄ gas, GeH₄ gas, and H₂ gas were flowed through the gas introducing pipe 449 into the i-type layer deposition chamber 418. At this time, the flow rate of SiH₄ gas was controlled at 50 sccm, GeH₄ gas at 35 sccm, and H₂ gas at 120 sccm by adjusting the respective mass flow controllers (not shown). The pressure inside the i-type layer deposition chamber 418 was controlled at 6 mTorr by adjusting the aperture of the conductance valve (not shown).

(2) The RF power supply 424 was set to 0.2 W/cm³ to apply power to the bias bar 428. After that, the power of the microwave power supply (not shown) was set to 0.1 W/cm³ and the microwave power was introduced through the microwave introducing waveguide pipe 426 and the microwave introducing window 425 into the i-type layer deposition chamber 418 to cause glow discharge. Then, by opening the shutter 427, fabrication of the MW i-type layer on the RF i-type layer was started. After the i-type layer was formed in a thickness of 0.15 μm, the microwave glow discharge was stopped and the output from the bias power supply 424 was turned off, thus completing the fabrication of the MW i-type layer 204.

(3) Then the valves (not shown) were closed to stop the flow of SiH₄ gas and GeH₄ gas into the i-type layer deposition chamber 418. After that, H₂ gas was continuously flowed into the i-type layer deposition chamber 418 for two minutes. Then the valve (not shown) was closed and the inside of the i-type layer deposition chamber 418 and the gas pipe were evacuated to a vacuum of $1 \times 10^{-5}$ Torr.

The other processes were the same as in Example 2.

The photovoltaic element fabricated in this example will be referred to as SC Ex 3.

Comparative Example 3-1

This example is different from Example 3 in that the first p-type semiconductor layer or p1 layer (layer A) was not formed. The film thickness of the second p-type semiconductor layer or p2 layer (layer B) of μc-Si was 8 nm.

The other processes were the same as in Example 3.

The photovoltaic element fabricated in this example will be referred to as SC Comp Ex 3-1.

Next explained are evaluation tests which were carried out for six photovoltaic elements obtained in each on Example 3 and Comparitive Example 3-1.

As the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 5 shows the photoelectric conversion factor (η), open-circuit voltage ($V_{oc}$), short-circuit current ($J_{sc}$), and fill factor (F.F.) of (SC Ex 3), which were normalized with the corresponding measured values of (SC Comp Ex 3-1) being set at 1.0.

TABLE 5

|  | P-E conversion efficiency (η) | Open-ckt volt (Voc) | Short-ckt current (Jsc) | Fill factor (F. F.) |
| --- | --- | --- | --- | --- |
| (SC Ex 3) | 1.04 | 1.01 | 1.00 | 1.03 |

From Table 5, it is found that the photovoltaic elements of (SC Ex 3) were superior particularly in the fill factor (F.F.) and photoelectric conversion efficiency (η) to those of (SC Comp Ex 3-1).

EXAMPLE 4

This example is different from Example 2 in that a-SiC was used for forming an MW i-type layer (an i-type semiconductor layer formed by the microwave CVD process) instead of a-Si.

A process for fabricating the MW i-type layer of a-SiC will now be explained according to its procedures.

(1) The substrate heater 411 was set to keep the temperature of the substrate 490 at 380° C. and, by gradually opening the valves (not shown) after the substrate was sufficiently heated, SiH₄ gas, CH₄ gas, and H₂ gas were flowed through the gas introducing pipe 449 into the i-type layer deposition chamber 418. At this time, the flow rates SiH₄ gas was controlled at 50 sccm, CH₄ gas at 35 sccm, and H₂ gas at 120 sccm by adjusting the respective mass flow controllers (not shown). The pressure inside the i-type layer deposition chamber 418 was controlled at 6 mTorr by adjusting the aperture of the conductance valve (not shown).

(2) The RF power supply 424 was set to 0.2 W/cm³ to apply power to the bias bar 428. After that, the power of the microwave power supply (not shown) was set to 0.1 W/cm³ and the microwave power was introduced through the microwave introducing waveguide pipe 426 and the microwave introducing window 425 into the i-type layer deposition chamber 418 to cause glow discharge. Then, by opening the shutter 427, fabrication of the MW i-type layer on the RF i-type layer was started. After the i-type layer was formed in a thickness of 0.1 μm, the microwave glow discharge was stopped and the output from the bias power supply 424 was turned off, thus completing the fabrication of the MW i-type layer 204.

(3) Then the valves (not shown) were closed to stop the flows of SiH₄ gas and CH₄ gas into the i-type layer deposition chamber 418. After that, H₂ gas was continuously flowed into the i-type layer deposition chamber 418 for two minutes. Then the valve (not shown) was closed and the inside of the i-type layer deposition chamber 418 and the gas pipe were evacuated to a vacuum of $1 \times 10^{-5}$ Torr.

The other steps were the same as in Example 2.

The photovoltaic element fabricated in this example will be referred to as SC Ex 4.

Comparative Example 4-1

This example is different from Example 4 in that the first p-type semiconductor layer or p1 layer (layer A) was not formed. The film thickness of the second p-type semiconductor layer or p2 layer (layer B) of μc-Si was 8 nm.

The other steps were the same as in Example 4.

The photovoltaic element fabricated in this example will be referred to as SC Comp Ex 4-1.

Next explained are evaluation tests which were carried out on six photovoltaic elements obtained in each of Example 4 and Comparative Example 4-1.

As the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 6 shows the photoelectric conversion factor (η), open-circuit voltage ($V_{oc}$), short-circuit current ($J_{sc}$), and fill factor (F.F.) of (SC Ex 4), which were normalized with the corresponding measured values of (SC Comp Ex 4-1) being set at 1.0.

TABLE 6

|  | P-E conversion efficiency (η) | Open-ckt volt (Voc) | Short-ckt current (Jsc) | Fill factor (F. F.) |
| --- | --- | --- | --- | --- |
| (SC Ex 4) | 1.06 | 1.04 | 1.01 | 1.01 |

From Table 6, it is found that the photovoltaic elements of (SC Ex 4) were superior in open-circuit voltage ($V_{oc}$) as well as in photoelectric conversion efficiency (η) to those of (SC Comp Ex 4-1).

EXAMPLE 5

This example is different from Example 2 in that Example 2 had the p layer on the light incidence side in the layer structure of substrate/n layer/i layer/p1 layer (layer A)/p2 layer (layer B), whereas this example has the n layer on the light incidence side in the layer structure of substrate/p layer/i layer/n1 layer (layer A)/n2 layer (layer B).

A process for fabricating the photovoltaic element of this example will now be explained according to its procedures.

(1) For forming the RF p-type layer 103 of a-Si, $H_2$ gas was introduced through the gas introducing pipe 469 into the deposition chamber 419 while the flow of $H_2$ gas was controlled at 200 sccm by the mass flow controller (not shown) by opening a valve (not shown). The pressure inside the deposition chamber 419 was adjusted to 1.1 Torr by the conductance valve (not shown).

(2) The substrate heater 412 was set to keep the temperature of the substrate 490 at 350° C. When the substrate temperature became stable, $H_2$ gas, $SiH_4/H_2$ gas and $BF_3/H_2$ gas were introduced through the gas introducing pipe 469 into the deposition chamber 419 by manipulating the valves (not shown). At this time, the flow rate of $H_2$ gas was adjusted at 50 sccm, $SiH_4/H_2$ gas at 0.5 sccm, and $BF_3/H_2$ gas at 5 sccm by the mass flow controllers (not shown), and the pressure inside the layer deposition chamber 419 was adjusted to 2.0 Torr by adjusting the aperture of the conductance valve (not shown).

The power of the RF power supply 423 was set to 0.15 W/cm$^3$, and the RF power was applied to the plasma forming cup 421 to cause glow discharge and to start formation of the p-type semiconductor layer of a-Si. After the RF p-type layer was formed in a thickness of 10 nm, the RF power supply was turned off to stop the glow discharge, thus completing formation of the p-type layer of the present invention.

(3) After closing the valves to stop the flows of $SiH_4/H_2$ gas and $BF_3/H_2$ gas into the p-type layer deposition chamber 419, $H_2$ gas was continuously flowed into the p-type layer deposition chamber 419 for three minutes. After that, the flow of $H_2$ was also stopped by closing the valve (not shown), and the inside of the p-type layer deposition chamber 419 and gas pipe was evacuated to a vacuum of $1\times10^{-5}$ Torr.

(4) The i-type layer 104 of a-Si was formed by the microwave plasma CVD process. First, after opening the gate valve 407, the substrate 490 was moved into the transport chamber 403 and i-type layer deposition chamber 418 which had been evacuated by the vacuum pump. The back face of the substrate 490 was heated in close contact with the substrate heating heater 411, and the inside of the i-type layer deposition chamber 418 was evacuated to a pressure of about $1\times10^{-5}$ Torr by the vacuum pump.

For fabricating the i-type layer, the substrate heater 411 was set to keep the temperature of the substrate 490 at 350° C., and, after the substrate was sufficiently heated, the valves (not shown) were gradually opened to flow $SiH_4$ gas and $H_2$ gas through the gas introducing pipe 449 into the i-type layer deposition chamber 418. At this time, the flow rates of $SiH_4$ gas was adjusted at 50 sccm and $H_2$ gas at 100 sccm by the respective mass controllers (not shown). The pressure inside the i-type layer deposition chamber 418 was controlled at 5 mTorr by adjusting the aperture of the conductance valve (not shown).

(5) The RF power supply 424 was set at 0.50 W/cm$^3$ and the power was applied to the bias bar 428. After that, the power of the microwave power supply was set at 0.20 W/cm$^3$, and the microwave power was introduced through the microwave introducing waveguide tube 426 and microwave introducing window 425 into the i-type layer deposition chamber 418 to cause glow discharge. Then, after opening the shutter 427, fabrication of the i-type layer on the p-type layer was started. After the i-type layer was formed in a thickness of 0.1 μm, the microwave glow discharge was stopped and the output of bias power supply 424 was turned off, thus completing the fabrication of the i-type layer 104.

After closing the valve (not shown), the flow of $SiH_4$ gas into the i-type layer deposition chamber 418 was stopped, and then $H_2$ gas was continuously flowed into the i-type layer deposition chamber 418 for two minutes. After that, by closing the valve, the inside of the i-type layer deposition chamber 418 and the gas pipe were evacuated to a vacuum of $1\times10^{-5}$ Torr.

(6) For forming the RF n-type layer, the first n-type semiconductor layer or n1 layer (layer A) 105 was formed by exposing the surface of the i-type semiconductor layer of a-Si to the plasma containing the n-type valence electron controlling agent so as to convert the i-type semiconductor layer near the surface into an n-type region. In forming the first n-type semiconductor layer or n1 layer (layer A) 105, the gate valve 407 was opened and the substrate 490 was moved into the transport chamber 402 and n-type layer deposition chamber 417 which had been evacuated by the vacuum pump.

(7) The back face of the substrate 490 was heated in close contact with the substrate heating heater 410, and the inside of the n-type layer deposition chamber 417 was evacuated to a pressure of about $1\times10^{-5}$ Torr by the vacuum pump. The substrate heating heater 412 was set so as to keep the temperature of substrate 490 at 230° C., and, after the substrate temperature became stable, He gas, $SiH_4$ gas, and $PH_3/H_2$ gas were introduced through the gas introducing pipe 429 into the deposition chamber 417 by manipulating the valves. At this time, the flow rates of He gas was controlled at 50 sccm and $PH_3/H_2$ gas at 0.5 sccm by the mass flow controllers and the pressure inside the layer deposition chamber 417 was controlled at 0.5 Torr by adjusting the aperture of the conductance valve.

The power of the RF power supply 423 was set to 0.015 W/cm$^3$ and the RF power was guided into the plasma forming cup 421 to cause glow discharge. By exposing the surface of the i-type semiconductor layer to the plasma containing the n-type valence electron controlling agent, the i-type semiconductor layer near the surface started to be converted into an n-type layer to form the first n-type semiconductor layer or n1 layer (layer A). After the layer was formed in a thickness of 3 nm, the RF power supply was turned off to stop the glow discharge, thus completing the formation of the first n-type semiconductor layer or n1 layer (layer A) 105.

(8) By manipulating the unrepresented valves, the flow of He gas was stopped, and $H_2$ gas was flowed at 50 sccm, $SiH_4$ gas at 0.5 sccm, and $PH_3/H_2$ gas at 0.5 sccm. The second n-type semiconductor layer or n2 layer (layer B) of a-Si was formed on the first n-type semiconductor layer or n1 layer (layer A) by the RF plasma CVD process. At this time, the pressure inside the layer deposition chamber 417 was controlled at 2.0 Torr by adjusting the aperture of the conductance valve (not shown).

The power of the RF power supply 423 was set to 0.1 W/cm³ and the RF power was introduced to the plasma forming cup 421 to cause glow discharge, thus starting formation of the second n-type semiconductor layer or n2 layer (layer B) of μc-Si. After the RF n-type layer was formed in a thickness of 5 nm, the RF power supply was turned off to stop the glow discharge, thus completing the formation of the n-type layer of the present invention.

(9) By closing the valves, the flow of $SiH_4$ gas and $PH_3/H_2$ gas into the n-type layer deposition chamber 417 was stopped, and $H_2$ gas was continuously flowed into the n-type layer deposition chamber 417 for three minutes. After that, the flow of $H_a$ was also stopped by closing the valve (not shown), and the inside of the n-type layer deposition chamber 417 and the gas pipe were evacuated to a vacuum of $1 \times 10^{-5}$ Torr. Then the substrate 490 was carried into the unload chamber 405 which had been evacuated by the vacuum evacuation pump, and the unload chamber 405 was leaked to the atmosphere by opening the leak valve (not shown).

(10) ITO was deposited as a transparent and conductive layer 107 in a thickness of 80 nm on the n-type layer by the vacuum vapor deposition process. Next, a mask with a comb-shaped aperture was placed on the transparent and conductive layer 107, and the comb-shaped collector electrode 108 was deposited in the structure of Cr (40 nm)/Ag (1000 nm)/Cr (40 nm) in order by the vacuum vapor deposition process.

The other steps were the same as in Example 1.

The photovoltaic element fabricated in this example will be referred to as SC Ex 5.

Comparative Example 5-1

This example is different from Example 5 in that the first n-type semiconductor layer or n1 layer (layer A) was not formed. Further, the film thickness of the second n-type semiconductor layer or n2 layer (layer B) of μc-Si was 8 nm.

The other steps were the same as in Example 5.

The photovoltaic element fabricated in this example will be referred to as SC Comp Ex 5-1.

Explained next are evaluation tests which were carried out on six photovoltaic elements obtained in each of Example 5 and Comparitive Example 5-1.

As the evaluation tests, V-I characteristics were observed while each photovoltaic element was subjected to light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 7 shows the photoelectric conversion factor (η), open-circuit voltage ($V_{oc}$), short-circuit current ($J_{sc}$), and fill factor (F.F.) of (SC Ex 5), which were normalized with the corresponding measured values of (SC Comp Ex 5-1) being set at 1.0.

TABLE 7

|  | P-E conversion efficiency (η) | Open-ckt volt (Voc) | Short-ckt current (Jsc) | Fill factor (F. F.) |
|---|---|---|---|---|
| (SC Ex 5) | 1.07 | 1.03 | 1.01 | 1.03 |

From Table 7, it is found that the photovoltaic elements of (SC Ex 5) were superior in open-circuit voltage ($V_{oc}$) and fill factor (F.F.) as well as in photoelectric conversion efficiency (η) to those of (SC Comp Ex 5-1).

In order to check the unevenness and dispersion in the substrate, a mask with twenty five holes (of 0.25 cm² area) was placed on the p-type layer and a film of ITO was formed as a transparent conductive layer in a thickness of 70 nm by the vacuum vapor deposition process. Table 8 shows results of unevenness and dispersion in the substrate as reflected by the open-circuit voltage ($V_{oc}$) and the fill factor (F.F.), measured for such samples. Here, the maximum value of the measured values of the same substrate was taken as 1.

TABLE 8

|  | Open-ckt voltage (Voc) | Fill Factor (F. F.) |
|---|---|---|
| (SC Ex 5) | 0.98–1.00 | 0.97–1.00 |
| (SC Comp Ex 5-1) | 0.90–1.00 | 0.95–1.00 |

From Table 8, it is found that the photovoltaic elements of (SC Ex 5) had less unevenness and dispersion in the substrate whereby uniformity of photoelectric conversion characteristics thereof was improved.

Further, in measuring the V-I characteristics of the solar cells, a blue filter (HOYA B390) was used with AM 1.5 (100 mW/cm²), thereby performing measurements which strongly reflect defect density on the light incidence side. Table 9 shows results of the photoelectric conversion efficiency (η), open-circuit voltage ($V_{oc}$), short-circuit current ($J_{sc}$), and fill factor (F.F.) measured for such samples. Each value in the table indicates a numerical value normalized with a corresponding measured value of (SC Comp Ex 5-1) being set at 1.0.

TABLE 9

|  | P-E conversion efficiency (η) | Open-ckt volt (Voc) | Short-ckt current (Jsc) | Fill factor (F. F.) |
|---|---|---|---|---|
| (SC Ex 5) | 1.09 | 1.03 | 1.01 | 1.05 |

From comparison of Table 9 with Table 7, it is found that improvement in the fill factor (F.F.) in the measurement under the blue light was more noticeable than in the measurement under the white light.

It was concluded that this result showed that the interface levels in the p/i interface were decreased because almost all photocarriers were generated near the light incidence side of the i-type semiconductor layer under the blue light.

EXAMPLE 6

This example is different from Example 1 in that Example 1 produced a photovoltaic element of the single cell type shown in FIG. 1 whereas this example produced a photovoltaic element of the triple cell type (the tandem stacked cell type in which three pin-type semiconductor junctions are stacked) shown in FIG. 2. The deposition apparatus used was a modification of the apparatus of FIG. 4 such that the number of deposition chambers was increased and they were connected through gate valves.

The layer structure of the photovoltaic element of this example was substrate 201/back electrode 202/first pin junction 217/second pin junction 218/third pin junction 219/transparent electrode 215/collector electrode 216.

Described below is the layer structure of each pin junction in this example.

The first pin junction 217 has the layer structure of, in order from the back electrode 202, RF n-type layer (n1 layer) 203 of a-Si/RF i-type layer 251 of a-Si/MW i-type layer (i1 layer) 204 of a-SiGe/RF i-type layer 261 of a-Si/first p-type semiconductor layer (p11 layer, or the layer A) 205 formed by exposing the surface of the i-type semiconductor layer (RF i-type layer) 261 to a plasma containing a p-type valence electron controlling agent/second p-type semiconductor layer (p12 layer, or the layer B) 206 formed by depositing the p-type valence electron controlling agent and the main constituent elements of the i-type semiconductor layer.

The second pin junction 218 has the layer structure of, in order from the first pin junction 217, RF n-type layer (n2 layer) 207 of a-Si/RF i-type layer 252 of a-Si/MW i-type layer (i2 layer) 208 of a-SiGe/RF i-type layer 262 of a-Si/first p-type semiconductor layer (p21 layer, or the layer A) 209 formed by exposing the surface of the i-type semiconductor layer (RF i-type layer 262) to a plasma containing a p-type valence electron controlling agent/second p-type semiconductor layer (p22 layer, or the layer B) 210 formed by depositing the p-type valence electron controlling agent and the main constituent elements of the i-type semiconductor layer.

The third pin junction 219 has the layer structure of, in order from the second pin junction 218, RF n-type layer (n3 layer) 211 of a-Si/RF i-type layer (i3 layer) 212 of a-Si/first p-type semiconductor layer (p31 layer, or the layer A) 213 formed by exposing the surface of the i-type semiconductor layer (i3 layer 212) to a plasma containing a p-type valence electron controlling agent/second p-type semiconductor layer (p32 layer, or the layer B) 214 formed by depositing the p-type valence electron controlling agent and the main constituent elements of the i-type semiconductor layer.

A process for fabricating the photovoltaic element of this example will be explained according to its procedures. Numerals in parentheses represent steps, wherein (1) and (2) are preparation steps, (3)–(6) are forming steps for forming the first pin junction 217, (7)–(10) are forming steps for forming the second pin junction 218, and (11)–(14) are forming steps for forming the third pin junction 219.

(1) A substrate prepared in the same manner as in Example 1 was placed on the substrate carrying rails in the loading chamber and the inside of the loading chamber was evacuated by the vacuum pump to a pressure of about $1\times10^{-5}$ Torr.

(2) The gate valve was opened and the substrate was moved into the transport chamber and deposition chamber which had been evacuated by the vacuum evacuation pump. The back face of the substrate was heated in close contact with the substrate heater, and the inside of the deposition chamber was evacuated to a pressure of about $1\times10^{-5}$ Torr by the vacuum pump.

(3) Formation of RF n-type layer (n1 layer) 203 of a-Si

For forming the RF n-type layer, $H_2$ gas was introduced through the gas introducing pipe into the deposition chamber while the flow of $H_2$ gas was controlled at 200 sccm by the mass flow controller by opening the valve.

The pressure inside the deposition chamber was adjusted to 1.1 Torr by a conductance valve (not shown).

The substrate heater was set to maintain the temperature of the substrate at 380° C. When the substrate temperature became stable, $SiH_4$ gas and $PH_3/H_2$ gas were introduced through the gas introducing pipe into the deposition chamber by manipulating the valves. At this time, the flow of $SiH_4$ gas was adjusted to 2 sccm, $H_2$ gas to 50 sccm, and $PH_3/H_2$ gas to 0.5 sccm by the mass flow controllers, and the pressure inside the deposition chamber was adjusted so to 1.1 Torr.

The power of the RF power supply was set to 0.005 $W/cm^3$, and the RF power was applied to the plasma forming cup to cause glow discharge and to start formation of the RF n-type layer on the substrate. After the RF n-type layer was formed in a thickness of 20 nm, the RF power supply was turned off to stop the glow discharge, thus completing formation of the RF n-type layer 203.

After stopping the flow of $SiH_4$ gas and $PH_3/H_2$ into the deposition chamber, $H_2$ gas was continuously flowed into the deposition chamber for five minutes. After that, the flow of $H_2$ was also stopped, and the inside of the deposition chamber and gas pipe were evacuated to a vacuum of $1\times10^{-5}$ Torr.

(4) The RF i-type layer 251 of a-Si, the MW i-type layer 204 of a-SiGe, and the RF i-type layer 261 of a-Si were successively formed using the RF plasma CVD process, the microwave plasma CVD process, and the RF plasma CVD process.

(4-1) After opening the gate valve, the substrate was moved into the transport chamber and i-type layer deposition chamber which had been evacuated by the vacuum pump. The back face of the substrate was heated in close contact with the substrate heater, and the inside of the i-type layer deposition chamber was evacuated to a pressure of about $1\times10^{-5}$ Torr by the vacuum pump.

(4-2) Formation of RF i-type layer 251 of a-Si

For forming the RF i-type layer, the substrate heater was set to maintain the temperature of the substrate at 350° C., and, after the substrate was heated, the valves (not shown) were gradually opened to flow $Si_2H_6$ gas and $H_2$ gas through the gas introducing pipe into the i-type layer deposition chamber. At this time, the flow of $Si_2H_6$ gas was adjusted at 4 sccm and $H_2$ gas at 100 sccm by the respective mass controllers. The pressure inside the i-type layer deposition chamber was controlled at 0.8 Torr by adjusting the aperture of the conductance valve (not shown).

Next, the RF power supply was set at 0.007 $W/cm^3$ and power was applied to the bias electrode to cause glow discharge. Then, after opening the shutter, formation of the i-type layer was started on the RF n-type layer. After the i-type layer was formed in a thickness of 10 nm, the RF glow discharge was stopped and the RF power supply was turned off, thus completing formation of the RF i-type layer 251.

After closing the valve, the flow of $Si_2H_6$ gas into the i-type layer deposition chamber was stopped, and then $H_2$ gas was continuously flowed into the i-type layer deposition chamber for two minutes. After closing the valve, the inside of the i-type layer deposition chamber and the gas pipe was evacuated to a vacuum of $1\times10^{-5}$ Torr.

(4-3) Formation of MW i-type layer (i1 layer) 204 of a-SiGe

For forming the MW i-type layer, the substrate heater was set to keep the temperature of the substrate at 380° C. and, after gradually opening the valves after the substrate was heated, $SiH_4$ gas, $GeH_4$ gas, and $H_2$ gas were flowed through the gas introducing pipe into the i-type layer deposition chamber. At this time, the flow of $SiH_4$ gas was controlled at 50 sccm, $GeH_4$ gas at 35 sccm, and $H_2$ gas at 120 sccm by adjusting the respective mass flow controllers. The pressure inside the i-type layer deposition chamber was controlled at 6 mTorr by adjusting the aperture of the conductance valve.

Next, the RF power supply was set to 0.2 $W/cm^3$ to apply power to the bias electrode and the power of the microwave power supply was set to 0.2 $W/cm^3$. The microwave power was introduced through the microwave introducing waveguide pipe and the microwave introducing window into the i-type layer deposition chamber to cause glow discharge. Then, by opening the shutter, formation of the MWi-type layer was started i-type layer was started. After the i-type layer was formed in a thickness of 0.1 μm, the microwave glow discharge was stopped and the output from the bias power supply was turned off, thus completing the formation of the MW i-type layer 204.

Then the valves were closed to stop the flow of $SiH_4$ gas and $GeH_4$ gas into the i-type layer deposition chamber. After that, $H_2$ gas was continuously flowed into the i-type layer deposition chamber for two minutes. Then the valve was closed and the inside of the i-type layer deposition chamber and the gas pipe were evacuated to a vacuum of $1\times10^{-5}$ Torr.

(4-4) Formation of RF i-type layer 261 of a-Si

For forming the RF i-type layer, the substrate heater was set to keep the temperature of the substrate at 250° C. and, after the substrate was heated, the valves were gradually opened to let the $Si_2H_6$ gas and $H_2$ gas flow through the gas introducing pipe into the i-type layer deposition chamber. At this time, the flow of $Si_2H_6$ gas was controlled at 2 sccm and $H_2$ gas at 80 sccm by adjusting the respective mass flow controllers. The pressure inside the i-type layer deposition chamber was controlled at 0.7 Torr by adjusting the aperture of the conductance valve.

Next, the RF power supply was set to 0.007 $W/cm^3$ and power was applied to the bias electrode to cause glow discharge. Then the shutter was opened to start formation of the RF i-type layer on the MW i-type layer. After the i-type layer was formed in a thickness of 20 nm, the RF glow discharge was stopped and the output from the RF power supply was turned off, thus completing the formation of RF i-type layer 261. The valve was closed to stop the flow of $Si_2H_6$ gas into the i-type layer deposition chamber and $H_2$ gas was continuously flowed into the i-type layer deposition chamber for two minutes. After that, the valve (not shown) was closed and the inside of the i-type layer deposition chamber and the gas pipe were evacuated to a vacuum of $1\times10^{-5}$ Torr.

(5) Formation of first p-type semiconductor layer (p11 layer, or the layer A) 205

After opening the gate valve, the substrate was moved into the transport chamber and p-type layer deposition chamber which had been evacuated by the vacuum pump.

The back face of the substrate was heated in close contact with the substrate heater, and the inside of the p-type layer deposition chamber was evacuated to a pressure of about $1\times10^{-5}$ Torr by the vacuum pump. The substrate heater was set so as to keep the temperature of the substrate at 230° C., and, after the substrate temperature became stable, He gas and $BF_3$/He gas were introduced through the gas introducing pipe 469 into the deposition chamber by manipulating the valves. At this time, the flow of He gas was controlled at 50 sccm and $BF_3$/He gas at 5 sccm by the mass flow controllers and the pressure inside the layer deposition chamber was controlled at 2.0 Torr by adjusting the aperture of the conductance valve.

The power of the RF power supply was set to 0.1 $W/cm^3$ and the RF power was supplied to the plasma forming cup to cause glow discharge. By exposing the surface of the i-type semiconductor layer to the plasma containing the p-type valence electron controlling agent, the i-type semiconductor layer near the surface was converted into a p-type layer to form the first p-type semiconductor layer (p11 layer, or the layer A) 205. After the layer was formed in a thickness of 3 nm, the RF power supply was turned off to stop the glow discharge, thus completing the formation of the first p-type semiconductor layer (p11 layer, or the layer A) 205.

(6) Formation of second p-type semiconductor layer (p12 layer, or the layer B) 206

By manipulating the valves, the flow of He gas was stopped, and $H_2$ gas was flowed at 50 sccm, $SiH_4/H_2$ gas at 0.25 sccm, and $BF_3/H_2$ gas at 0.5 sccm. The second p-type semiconductor layer (p12 layer, or the layer B) of a-Si was successively stacked on the first p-type semiconductor layer (p11 layer, or the layer A) 205 by the RF plasma CVD process. At this time, the pressure inside the deposition chamber was controlled at 2.0 Torr by adjusting the aperture of the conductance valve (not shown).

The power of the RF power supply was set to 0.15 $W/cm^3$ and the RF power was supplied to the plasma forming cup 421 to cause glow discharge, thus starting formation of the second p-type semiconductor layer (p12 layer, or the layer B) 206 containing the main constituent elements of the i-type semiconductor layer of μc-Si and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p12 layer, or the layer B) 206.

By closing the valves, the flow of $SiH_4/H_2$ gas, $BF_3/H_2$ gas, and $H_2$ gas into the p-type layer deposition chamber was stopped, and $H_2$ gas was continuously flowed into the p-type layer deposition chamber for three minutes. After that, the flow of $H_2$ was also stopped by closing the valve, and the inside of the p-type layer deposition chamber and the gas pipe was evacuated to a vacuum of $1\times10^{-5}$ Torr.

Step (3) to step (6) as described above complete the formation of the first pin junction 217.

Explained in the following are steps for forming the second pin junction 218. These steps are basically the same as those for forming the first pin junction 217 as described above.

(7) Formation of RF n-type layer (n2 layer) 207 of a-Si

For forming the RF n-type layer, $H_2$ gas was introduced through the gas introducing pipe into the deposition chamber while the flow of $H_2$ gas was controlled at 200 sccm by the mass flow controller by opening the valve. The pressure inside the deposition chamber was adjusted to be 1.1 Torr by the conductance valve (not shown).

The substrate heater was set to keep the temperature of the substrate at 380° C. When the substrate temperature became stable, $SiH_4$ gas and $PH_3/H_2$ gas were introduced through the gas introducing pipe into the deposition chamber by manipulating the valves. At this time, the flow $SiH_4$ gas was adjusted at 2 sccm, $H_2$ gas at 50 sccm, and $PH_3/H_2$ gas at 0.5 sccm by the mass flow controllers, and the pressure inside the deposition chamber was adjusted to 1.1 Torr.

The power of the RF power supply was set to 0.005 $W/cm^3$, and the RF power was applied to the plasma forming cup to cause glow discharge and start formation of the RF n-type layer on the substrate. After the RF n-type layer was formed in a thickness of 20 nm, the RF power supply was turned off to stop the glow discharge, thus completing formation of the RF n-type layer 207.

After stopping the flow of SiH$_4$ gas and PH$_3$/H$_2$ into the deposition chamber, H$_2$ gas was continuously flowed into the deposition chamber for five minutes. After that, the flow of H$_2$ was also stopped, and the inside of the deposition chamber and gas pipe were evacuated to a vacuum of 1×10$^{-5}$ Torr.

(8) The RF i-type layer 252 of a-Si, the MW i-type layer 208 of a-SiGe, and the RF i-type layer 262 of a-Si were successively formed using the RF plasma CVD process, the microwave plasma CVD process, and the RF plasma CVD process, respectively.

(8-1) After opening the gate valve, the substrate was moved into the transport chamber and i-type layer deposition chamber which had been evacuated by the vacuum pump. The back face of the substrate was heated in close contact with the substrate heating heater, and the inside of the i-type layer deposition chamber was evacuated to a pressure of about 1×10$^{-5}$ Torr by the vacuum evacuation pump.

(8-2) Formation of RF i-type layer 252 of a-Si

For forming the RF i-type layer, the substrate heater was set to keep the temperature of the substrate at 350° C., and, after the substrate was heated, the valves were gradually opened to flow Si$_2$H$_6$ gas and H$_2$ gas through the gas introducing pipe into the i-type layer deposition chamber. At this time, the flow of Si$_2$H$_6$ gas was adjusted at 4 sccm and H$_2$ gas at 100 sccm by the respective mass controllers. The pressure inside the i-type layer deposition chamber was controlled at 0.8 Torr by adjusting the aperture of the conductance valve.

Next, the RF power supply was set at 0.007 W/cm$^3$ and the power was applied to the bias electrode to cause glow discharge. Then, by opening the shutter, formation of the i-type layer was started on the RF n-type layer. After the i-type layer was formed in a thickness of 10 nm, the RF glow discharge was stopped and the output of the RF power supply was turned off, thus completing formation of the RF i-type layer 252.

By closing the valve, the flow of Si$_2$H$_6$ gas into the i-type layer deposition chamber was stopped, and then H$_2$ gas was continuously flowed into the i-type layer deposition chamber for two minutes. After that, by closing the valve, the inside of the i-type layer deposition chamber and the gas pipe was evacuated to a vacuum of 1×10$^{-5}$ Torr.

(8-3) Formation of MW i-type layer (i1 layer) 208 of a-SiGe

For forming the MW i-type layer, the substrate heater was set to keep the temperature of the substrate at 380° C. and, bu gradually opening the valves after the substrate was heated, SiH$_4$ gas, GeH$_4$ gas, and H$_2$ gas were flowed through the gas introducing pipe into the i-type layer deposition chamber. At this time, the flow of SiH$_4$ gas was controlled at 50 sccm, GeH$_4$ gas at 35 sccm, and H$_2$ gas at 120 sccm by adjusting the respective mass flow controllers. The pressure inside the i-type layer deposition chamber was controlled at 6 mTorr by adjusting the aperture of the conductance valve.

Next, the RF power supply was set to 0.2 W/cm$^3$ to apply power to the bias electrode and the power of the microwave power supply was set to 0.2 W/cm$^3$. The microwave power was introduced through the microwave introducing waveguide pipe and the microwave introducing window into the i-type layer deposition chamber to cause glow discharge. Then by opening the shutter, formation of the MW i-type layer was started on the RF i-type layer. After the i-type layer was formed in a thickness of 0.1 µm, the microwave glow discharge was stopped and the output from the bias power supply was turned off, thus completing the formation of the MW i-type layer 208.

Then the valves were closed to stop the flow of SiH$_4$ gas and GeH$_4$ gas into the i-type layer deposition chamber. After that, H$_2$ gas was continuously flowed into the i-type layer deposition chamber for two minutes. Then the valve was closed and the inside of the i-type layer deposition chamber and the gas pipe were evacuated to the vacuum of 1×10$^{-5}$ Torr.

(8-4) Formation of RF i-type layer 262 of a-Si

For forming the RF i-type layer, the substrate heater was set to keep the temperature of the substrate at 250° C. and, after the substrate was heated, the valves were gradually opened to flow the Si$_2$H$_6$ gas and H$_2$ gas through the gas introducing pipe into the i-type layer deposition chamber. At this time, the flow of Si$_2$H$_6$ gas was controlled at 2 sccm and H$_2$ gas at 80 sccm by adjusting the respective mass flow controllers. The pressure inside the i-type layer deposition chamber was controlled at 0.7 Torr by adjusting the aperture of the conductance valve.

Next, the RF power supply was set to 0.007 W/cm$^3$ and power was applied to the bias electrode to cause glow discharge. Then the shutter was opened to start formation of the RF i-type layer on the MW i-type layer. After the i-type layer was formed in a thickness of 20 nm, the RF glow discharge was stopped and the RF power supply was turned off, thus completing formation of RF i-type layer 262.

The valve was closed to stop the flow of Si$_2$H$_6$ gas into the i-type layer deposition chamber and H$_2$ gas was continuously flowed into the i-type layer deposition chamber for two minutes. After that, the valve was closed and the inside of the i-type layer deposition chamber and the gas pipe were evacuated to a vacuum of 1×10$^{-5}$ Torr.

(9) Formation of first p-type semiconductor layer (p21 layer) 209

After opening the gate valve, the substrate was moved into the transport chamber and p-type layer deposition chamber which had been evcauated by the vacuum pump.

The back face of the substrate was heated in close contact with the substrate heater, and the inside of the p-type layer deposition chamber was evacuated to a pressure of about 1×10$^{-5}$ Torr by the vacuum pump. The substrate heater was set so as to keep the temperature of the substrate at 230° C., and, after the substrate temperature became stable, He gas and BF$_3$/He gas were introduced through the gas introducing pipe 469 into the deposition chamber by manipulating the valves. At this time, the flow of He gas was controlled at 50 sccm and BF$_3$/He gas at 5 sccm by the mass flow controllers and the pressure inside the layer deposition chamber was controlled at 1.0 Torr by adjusting the aperture of the conductance valve.

The power of the RF power supply was set to 0.15 W/cm$^3$ and the RF power was supplied to the plasma forming cup to cause glow discharge. By exposing the surface of the i-type semiconductor layer to the plasma containing the p-type valence electron controlling agent, the i-type semiconductor layer near the surface was converted into a p-type layer to form the first p-type semiconductor layer (p21 layer, or the layer A) 209. After the layer was formed in a thickness of 3 nm, the RF power supply was turned off to stop the glow discharge, thus completing a formation of the first p-type semiconductor layer (p21 layer, or the layer A) 209.

(10) Formation of second p-type semiconductor layer (p22 layer, or the layer B) 210

By manipulating the valves, the flow of He gas was stopped, and H$_2$ gas was flowed at 50 sccm, SiH$_4$/H$_2$ gas at 0.25 sccm, and BF$_3$/H$_2$ gas at 0.5 sccm. The second p-type semiconductor layer (p22 layer, or the layer B) containing the main constituent elements of the i-type semiconductor layer of μc-Si and the element for increasing the bandgap of the i-type semiconductor layer, was stacked on the first p-type semiconductor layer (p21 layer, or the layer A) 209 by the RF plasma CVD process. At this time, the pressure inside the layer deposition chamber was controlled at 2.0 Torr by adjusting the aperture of the conductance valve.

The power of the RF power supply was set to 0.15 W/cm$^3$ and the RF power was supplied to the plasma forming cup 421 to cause glow discharge, thus starting formation of the second p-type semiconductor layer (p22 layer, or the layer B) 210 containing the main constituent element(s) of the i-type semiconductor layer of μc-Si and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p22 layer, or the layer B) 210.

By closing the valves, the flow of $SiH_4/H_2$ gas and $BF_3/H_2$ gas into the p-type layer deposition chamber was stopped, and $H_2$ gas was continuously flowed into the p-type layer deposition chamber for three minutes. After that, the flow of $H_2$ was also stopped by closing the valve, and the inside of the p-type layer deposition chamber and the gas pipe was evacuated to a vacuum of $1\times10^{-5}$ Torr.

Step (7) to step (10) as described above complete the formation of the second pin junction 218.

Explained in the following are steps for forming the third pin junction 219.

(11) Formation of RF n-type layer (n3 layer) 211 of a-Si

For forming the RF n-type layer, $H_2$ gas was introduced through the gas introducing pipe into the deposition chamber while the flow of $H_2$ gas was controlled at 200 sccm by the mass flow controller by opening the valve. The pressure inside the deposition chamber was adjusted to 1.1 Torr by the conductance valve.

The substrate heater was set to keep the temperature of the substrate at 350° C. When the substrate temperature became stable, $SiH_4$ gas and $PH_3/H_2$ gas were introduced through the gas introducing pipe into the deposition chamber by manipulating the valves. At this time, the flow of $SiH_4$ gas was adjusted at 2 sccm, $H_2$ gas at 50 sccm, and $PH_3/H_2$ gas at 0.5 sccm by the mass flow controllers, and the pressure inside the deposition chamber was adjusted to 1.1 Torr.

The power of the RF power supply was set to 0.005 W/cm$^3$, and the RF power was applied to the plasma forming cup to cause glow discharge and to start formation of the RF n-type layer on the substrate. After the RF n-type layer was formed in a thickness of 10 nm, the RF power supply was turned off to stop the glow discharge, thus completing formation of the RF n-type layer 211.

After stopping the flow of $SiH_4$ gas and $PH_3/H_2$ into the deposition chamber, $H_2$ gas was continuously flowed into the deposition chamber for two minutes. After that, the flow of $H_2$ was also stopped, and the inside of the deposition chamber and gas pipe was evacuated to a vacuum of $1\times10^{-5}$ Torr.

(12) Formation of RF i-type layer 212 of a-si

After opening the gate valve, the substrate was moved into the transport chamber and i-type layer deposition chamber which had been evacuated by the vacuum pump. The back face of the substrate was heated in close contact with the substrate heater, and the inside of the i-type layer deposition chamber was evacuated to a pressure of about $1\times10^{-5}$ Torr by the vacuum pump. For forming the RF i-type layer 212, the substrate heater was set to keep the temperature of the substrate at 200° C., and, after the substrate was heated, the valves were gradually opened to flow $Si_2H_6$ gas and $H_2$ gas through the gas introducing pipe into the i-type layer deposition chamber. At this time, the flow of $Si_2H_6$ gas was adjusted at 2 sccm and $H_2$ gas at 80 sccm by the respective mass controllers. The pressure inside the i-type layer deposition chamber was controlled at 0.6 Torr by adjusting the aperture of the conductance valve (not shown).

Next, the RF power supply was set at 0.07 W/cm$^3$ and the power was applied to the bias electrode to cause glow discharge. Then, after opening the shutter, formation of the i-type layer was started on the RF n-type layer 211. After the i-type layer was formed in a thickness of 120 nm, the RF glow discharge was stopped and the output of the RF power supply was turned off, thus completing the formation of the RF i-type layer 212.

By closing the valve, the flow of $Si_2H_2$ gas into the i-type layer deposition chamber was stopped, and then $H_2$ gas was continuously flowed into the i-type layer deposition chamber for two minutes. After that, by closing the valve, the inside of the i-type layer deposition chamber and the gas pipe were evacuated to a vacuum of $1\times10^{-5}$ Torr.

(13) Formation of first p-type semiconductor layer (p31 layer, or the layer A) 213

After opening the gate valve, the substrate was moved into the transport chamber and p-type layer deposition chamber which had been evacuated by the vacuum pump.

The back face of the substrate was heated in close contact with the substrate heater, and the inside of the p-type layer deposition chamber was evacuated to a pressure of about $1\times10^{-5}$ Torr by the vacuum pump. The substrate heater was set to keep the temperature of substrate at 170° C., and, after the substrate temperature became stable, He gas and $BF_3$/He gas were introduced through the gas introducing pipe into the deposition chamber by manipulating the valves (not shown). At this time, the flow of He gas was controlled at 50 sccm and $BF_3$/Me gas at 5 sccm by the mass flow controllers and the pressure inside the layer deposition chamber was controlled at 2.0 Torr by adjusting the aperture of the conductance valve.

The power of the RF power supply was set to 0.15 W/cm$^3$ and the RF power was supplied to the plasma forming cup to cause glow discharge. By exposing the surface of the i-type semiconductor layer to the plasma containing the p-type valence electron controlling agent, the i-type semiconductor layer near the surface was converted into a p-type layer to form the first p-type semiconductor layer (p31 layer, or the layer A) 213. After the layer was formed in a thickness of 3 nm, the RF power supply was turned off to stop the glow discharge, thus completing the formation of the first p-type semiconductor layer (p31 layer, or the layer A) 213.

(14) Formation of second p-type semiconductor layer (p32 layer, or the layer B) 214

By manipulating the valves, the flow of He gas was stopped, and $H_2$ gas was flowed at 50 sccm, $SiH_4/H_2$ gas at 0.25 sccm, and $BF_3/H_2$ gas at 0.5 sccm. The second p-type semiconductor layer (p32 layer, or the layer B) containing the main constituent elements of the i-type semiconductor layer of μc-Si and the element for increasing the bandgap of the i-type semiconductor layer, was stacked on the first p-type semiconductor layer (p31 layer, or the layer A) 213 by the RF plasma CVD process. At this time, the pressure inside the layer deposition chamber was controlled at 2.0 Torr by adjusting the aperture of the conductance valve.

The power of the RF power supply was set to 0.15 W/cm$^3$ and the RF power was supplied to the plasma forming cup to cause glow discharge, thus starting formation of the second p-type semiconductor layer (p32 layer, or the layer B) 214 containing the main constituent elements of the i-type semiconductor layer of μc-Si and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p32 layer, or the layer B) 214.

By closing the valves, the flow of $SiH_4/H_2$ gas and $BF_3/H_2$ gas into the p-type layer deposition chamber was stopped, and $H_2$ gas was continuously flowed into the p-type layer deposition chamber for three minutes. After that, the flow of $H_2$ was also stopped by closing the valve, and the inside of the p-type layer deposition chamber and the gas pipe were evacuated to the vacuum of $1\times10^{-5}$ Torr.

Step (11) to step (14) as described above complete the formation of the third pin junction 219.

(15) Formation of transparent and conductive layer 215 and collector electrode 216

After opening the gate valve, the substrate was moved into the unloading chamber which had been evacuated by the vacuum pump, and the unload chamber was leaked to the atmosphere by opening the leak valve.

Next, ITO was deposited as a transparent and conductive layer 215 on the RF p-type layer 214 in a thickness of 70 nm by the vacuum vapor deposition process.

Next, a mask with a comb-shaped aperture was placed on the transparent and conductive layer 212, and the comb-shaped collector electrode 216 was deposited in the structure of Cr (400 nm)/Ag (1000 nm)/Cr (40 nm) in this order by the vacuum vapor deposition process.

The foregoing concludes the fabrication of the photovoltaic element of this example. The photovoltaic element fabricated in this example will be referred to as SC Ex 6.

Comparative Example 6-1

This example is different from Example 6 in that the first p-type semiconductor layers (p11 layer, p21 layer, p31 layer, or the layers A) were not formed. Further, the film thickness of the second p-type semiconductor layers (p12 layer, p22 layer, p32 layer, or the layers B) of μc-Si was 8 nm.

The other steps were the same as in Example 6.

The photovoltaic element fabricated in this example will be referred to as SC Comp Ex 6-1.

Explained next are evaluation tests which were carried out on six photovoltaic elements obtained in each of Example 6 and Comparative Example 6-1.

For the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 10 shows the photoelectric conversion factor (η), open-circuit voltage ($V_{oc}$), short-circuit current ($J_{sc}$), and fill factor (F.F.) of (SC Ex 6), which were normalized with corresponding measured values of (SC Comp Ex 6-1) being taken as 1.0.

TABLE 20

|  | P-E conversion efficiency (η) | Open-ckt volt ($V_{oc}$) | Short-ckt current ($J_{sc}$) | Fill factor (F. F.) |
| --- | --- | --- | --- | --- |
| (SC Ex 6) | 1.05 | 1.02 | 1.01 | 1.02 |

From Table 10, it is found that the photovoltaic elements of (SC Ex 6) were superior to those of (SC Comp Ex 6-1) in the open-circuit voltage ($V_{oc}$) and the fill factor (F.F.) as well as in the photoelectric conversion efficiency (η).

In order to check the unevenness and dispersion in the substrate, a mask with twenty five holes (of area of 0.25 cm²) was placed on the p-type layer and a film of ITO was formed as a transparent conductive layer in a thickness of 70 nm by the vacuum vapor deposition process. Table 11 shows results of unevenness and dispersion in substrate as reflected in the open-circuit voltage ($V_{oc}$) and the fill factor (F.F.), measured for such samples. Here, the maximum value of the measured values of a single substrate was taken as 1.

TABLE 11

|  | Open-ckt voltage ($V_{oc}$) | Fill Factor (F. F.) |
| --- | --- | --- |
| (SC Ex 6) | 0.98–1.00 | 0.98–1.00 |
| (SC Comp Ex 6-1) | 0.94–1.00 | 0.95–1.00 |

From Table 11, it is found that the photovoltaic elements of (SC Ex 6) had less unevenness and dispersion in the substrate whereby uniformity of photoelectric conversion characteristics thereof was improved.

EXAMPLE 7

This in example is different from Example 6 in that in Example 6 the photovoltaic element of the triple junction type was formed with the p layers on the light incidence side whereas in this example a photovoltaic element of the triple junction type was formed with the n layers on the light incidence side, similar to Example 5.

The other points were the same as in Example 6.

The photovoltaic element fabricated in this example will be referred to as SC Ex 7.

Comparative Example 7-1

This example is different from Example 7 in that the first n-type semiconductor layers (n11 layer, n21 layer, n31 layer, i.e. the layers A) were not formed. Further, the film thickness of the second n-type semiconductor layers (n12 layer, n22 layer, n32 layer, or the layers B) of μc-Si was 8 nm.

The other steps were the same as in Example 7.

The photovoltaic element fabricated in this example will be referred to as SC Comp Ex 7-1.

Next explained are evaluation tests which were carried out on six photovoltaic elements obtained in each of Example 7 and Comparative Example 7-1.

As the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$) and fill factor (F.F.). Table 12 shows the photoelectric conversion factor (η), open-circuit voltage ($V_{oc}$), short-circuit current ($J_{sc}$) and fill factor (F.F.) of (SC Ex 7), which were normalized with corresponding measured values of (SC Comp Ex 7-1) taken as 1.0.

TABLE 12

|  | P-E conversion efficiency (η) | Open-ckt volt ($V_{oc}$) | Short-ckt current ($J_{sc}$) | Fill factor (F. F.) |
| --- | --- | --- | --- | --- |
| (SC Ex 7) | 1.05 | 1.02 | 1.01 | 1.02 |

From Table 12, it is found that the photovoltaic elements of (SC Ex 7) were superior in the open-circuit voltage ($V_{oc}$) and the fill factor (F.F.) as well as in the photoelectric conversion efficiency (η) to those of (SC Comp Ex 7-1).

In order to check the unevenness and dispersion in the substrate, a mask with twenty five holes (of the area of 0.25 cm$^2$) was placed on the p-type layer and a film of ITO was formed as a transparent conductive layer in a thickness of 70 nm by the vacuum vapor deposition process. Table 13 shows results of unevenness and dispersion in substrate as indicated by the open-circuit voltage ($V_{oc}$) and the fill factor (F.F.), measured for such samples. Mere, the maximum value of measured values of the same substrate was taken as 1.

TABLE 13

|  | Open-ckt voltage ($V_{oc}$) | Fill Factor (F. F.) |
| --- | --- | --- |
| (SC Ex 7) | 0.98–1.00 | 0.98–1.00 |
| (SC Comp Ex 7-1) | 0.94–1.00 | 0.95–1.00 |

From Table 13, it is found that the photovoltaic elements of (SC Ex 7) had less unevenness and dispersion in the substrate whereby uniformity of photoelectric conversion characteristics thereof was improved.

EXAMPLE 8

This example is different from Example 6 in that the following conditions were employed instead of those in Example 6 in forming the first p-type semiconductor layers (p11 layer, p21 layer, p31 layer, i.e. the layers A).
(1) H$_2$ gas flow was controlled at 50 sccm, SiH$_4$/H$_2$ gas at 0.25 sccm, and BF$_3$/H$_2$ gas at 1 sccm.

The other steps were the same as in Example 6.

The photovoltaic element fabricated in this example will be called as SC Ex 8.

This solar cell was evaluated by SIMS, which showed that the first p-type semiconductor layer had a larger hydrogen content than that of the i-type semiconductor layer.

Next explained are evaluation tests which were carried out on six photovoltaic elements obtained in each of Example 8 and Comparative Example 6-1.

As the evaluation tests, V-I characteristics were observed while each photovoltaic element was placed under light irradiation of AM 1.5 (100 mW/cm$^2$). From the results, an average value was calculated for each of photoelectric conversion efficiency (η) defined as (photoelectromotive force)/(incident light power), open-circuit voltage ($V_{oc}$), short-circuit current ($J_{sc}$) and fill factor (F.F.). Table 14 shows the photoelectric conversion factor (η), open-circuit voltage ($V_{oc}$), short-circuit current ($J_{sc}$), and fill factor (F.F.) of (SC Ex 8), which were normalized with corresponding measured values of (SC Comp Ex 6-1) being taken as 1.0.

TABLE 14

|  | P-E conversion efficiency (η) | Open-ckt volt ($V_{oc}$) | Short-ckt current ($J_{sc}$) | Fill factor (F. F.) |
| --- | --- | --- | --- | --- |
| (SC Ex 8) | 1.07 | 1.03 | 1.01 | 1.03 |

From Table 14, it is found that the photovoltaic elements of (SC Ex 8) were superior in the open-circuit voltage ($V_{oc}$) and the fill factor (F.F.) as well as in the photoelectric conversion efficiency (η) to those of (SC Comp Ex 6-1).

EXAMPLE 9

This example is different from Example 2 in that the following conditions were employed instead of those in Example 2 in forming the first p-type semiconductor layer (p1 layer, or the layer A) 105 and the second p-type semiconductor layer (p2 layer, or the layer B) 106.

(1) Formation of first p-type semiconductor layer (p1 layer, i.e. the layer A) 105

In forming the first p-type semiconductor layer (p1 layer, i.e. the layer A) 105, H$_2$ gas flow was controlled at 50 sccm, SiH$_4$/H$_2$ gas at 0.25 sccm, and BF$_3$/H$_2$ gas at 1 sccm and the pressure was controlled at 2.0 Torr. The RF power was set to 0.20 W/cm$^3$ to cause glow discharge and formation of the first p-type semiconductor layer (p1 layer, i.e. the layer A) 105 was started to convert the surface of the i-type semiconductor layer into the p-type layer. After the layer was formed in a thickness of 3 nm, the RF power supply was turned off to stop the glow discharge, thus completing the formation of the first p-type semiconductor layer (p1 layer, i.e. the layer A) 105.

(2) Formation of second p-type semiconductor layer (p2 layer, i.e. the layer b) 106

After completion of the formation of the first p-type semiconductor layer (p1 layer, i.e. the layer A) 105, the power of the RF power supply was next lowered to 0.15 W/cm$^3$ to cause glow discharge, and formation of the second p-type semiconductor layer (p2 layer, i.e. the layer B) 106 was started under the conditions to deposit μc-Si. After the RF p-type layer was formed in the thickness of 5 nm, the RF power supply was turned off to stop the glow discharge, thus completing the formation of the second p-type semiconductor layer (p2 layer, i.e. the layer B) 106.

The other steps were the same as in Example 2.

The photovoltaic element fabricated in this example will be referred to as SC Ex 9.

Next explained are evaluation tests which were carried out on six photovoltaic elements obtained in each of Example 9 and Comparative Example 2-1.

As the evaluation tests, V-I characteristics were observed while each photovoltaic element was placed under light irradiation of AM 1.5 (100 mW/cm$^2$). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 15 shows the photoelectric conversion factor (η), open-circuit voltage ($V_{oc}$), short-circuit current ($J_{sc}$), and fill factor (F.F.) of (SC Ex 9), which were normalized with corresponding measured values of (SC Comp Ex 2-1) being taken as 1.0.

TABLE 15

| | P-E conversion efficiency (η) | Open-ckt volt ($V_{oc}$) | Short-ckt current ($J_{sc}$) | Fill factor (F. F.) |
|---|---|---|---|---|
| (SC Ex 9) | 1.09 | 1.04 | 1.04 | 1.01 |

From Table 15, it is found that the photovoltaic elements of (SC Ex 9) were superior in the open-circuit voltage ($V_{oc}$) and the fill factor (F.F.) as well as in the photoelectric conversion efficiency (η) to those of (SC Comp Ex 2-1).

EXAMPLE 10

This example is different from Example 2 in that the following conditions were employed instead of those in Example 2 in forming the first p-type semiconductor layer (p1 layer, i.e. the layer A) 105 and the second p-type semiconductor layer (p2 layer, i.e. the layer B) 106.

(1) Formation of first p-type semiconductor layer (p1 layer, i.e. the layer A) 105

In forming the first p-type semiconductor layer (p1 layer, or the layer A) 105, $H_2$ gas flow was controlled at 200 sccm, $SiH_4/H_2$ gas at 0.25 sccm, and $BF_3/H_2$ gas at 1 sccm, and the pressure was controlled at 2.0 Torr. The RF power was set to 0.15 W/cm³ to cause glow discharge and formation of the first p-type semiconductor layer (p1 layer, i.e. the layer A) 105 was started to convert the surface of the i-type semiconductor layer into the p-type layer. After the layer was formed in a thickness of 3 nm, the RF power supply was turned off to stop the glow discharge, thus completing the formation of the first p-type semiconductor layer (p1 layer, i.e. the layer A) 105.

(2) Formation of second p-type semiconductor layer (p2 layer, i.e. the layer B) 106

After completion of the formation of the first p-type semiconductor layer (p1 layer, i.e. the layer A) 105, $H_2$ gas flow was controlled at 50 sccm, $SiH_4/H_2$ gas at 0.25 sccm, and $BF_3/H_2$ gas at 1 sccm. Formation of the second p-type semiconductor layer (p2 layer, i.e. the layer B) 106 was started under the conditions to deposit μc-Si. After the RF p-type layer was formed in a thickness of 5 nm, the RF power supply was turned off to stop the glow discharge, thus completing the formation of the second p-type semiconductor layer (p2 layer, or the layer B) 106.

The other steps were the same as in Example 2.

The photovoltaic element fabricated in this example will be referred to as SC Ex 10.

Next explained are evaluation tests which were carried out on six photovoltaic elements obtained in each of Example 10 and Comparative Example 2-1.

As the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$) and fill factor (F.F.). Table 16 shows the photoelectric conversion factor (η), open-circuit voltage ($V_{oc}$), short-circuit current ($J_{sc}$) and fill factor (F.F.) of (SC Ex 10), which were normalized with corresponding measured values of (SC Comp Ex 2-1) being taken as 1.0.

TABLE 16

| | P-E conversion efficiency (η) | Open-ckt volt ($V_{oc}$) | Short-ckt current ($J_{sc}$) | Fill factor (F. F.) |
|---|---|---|---|---|
| (SC Ex 10) | 1.09 | 1.04 | 1.03 | 1.02 |

From Table 16, it is found that the photovoltaic elements of (SC Ex 10) were superior to those of (SC Comp Ex 2-1) in the open-circuit voltage ($V_{oc}$), the short-circuit current ($J_{sc}$), the fill factor (F.F.), as well as in the photoelectric conversion efficiency (η).

EXAMPLE 11

This example is different from Example 1 in that the layer A was formed by exposing the surface of the i-type semiconductor layer to a plasma containing the p-type valence electron controlling agent and an element for increasing the bandgap of the i-type semiconductor layer.

Specifically, the single cell type photovoltaic element shown in FIG. 1 was fabricated using the deposition apparatus of FIG. 4. Checked with this example is the case where the p-type semiconductor layer, being the second conductivity type semiconductor layer, was comprised of the layer A formed by exposing the surface of the i-type semiconductor layer to a plasma containing the p-type valence electron controlling agent and an element for increasing the bandgap of the i-type semiconductor layer, and the layer B formed on the surface of the layer A by depositing the p-type valence electron controlling agent and the main constituent elements of the i-type semiconductor layer thereon.

The process for fabricating it will now be explained according to its procedures.

(1) A stainless steel support 101 of thickness 0.5 mm and size 50×50 mm² was cleaned in acetone and isopropanol with ultrasonic waves, and thereafter was dried under warm air. After that, by the sputtering method, a light reflecting layer of Ag 0.3 μm thick was formed on the surface of the stainless steel support 101 at room temperature and a reflection enhancing layer of ZnO 1.0 μm thick was formed on the light reflecting layer at 350° C., thus forming the back electrode 102. The resultant obtained through these steps was a substrate 490.

(2) Using the deposition apparatus 400, the various semiconductor layers each were formed on the substrate 490. The deposition apparatus 400 can perform both the microwave plasma CVD process and the RF plasma CVD process.

Feed stock gas cylinders (not shown) are connected through gas introducing pipes to the deposition apparatus. The feed stock gas cylinders all were of the grade refined at super-high purity, and they were a $SiH_4$ gas cylinder, a $SiF_4$ gas cylinder, a $SiH_4/H_2$ (dilution rate: 10%) gas cylinder, a $CH_4$ gas cylinder, a $C_2H_6$ gas cylinder, a $GeH_4$ gas cylinder, a $GeF_4$ gas cylinder, a $Si_2H_2$ gas cylinder, a $PH_3/H_2$ ($PH_3$ gas diluted with $H_2$ at dilution rate: 2%) gas cylinder, a $BF_3/H_2$ (dilution rate: 1%) gas cylinder, a $BF_3/He$ (dilution rate: 1%) gas cylinder, a $H_2$ gas cylinder, a He gas cylinder, a $NH_3$ gas cylinder, a $O_2/He$ (dilution rate: 1%) gas cylinder, and a NO gas cylinder, which were connected to the deposition apparatus.

(3) The substrate 490 was placed on the substrate carrying rails 413 in the load chamber 401 and the inside of the load chamber 401 was evacuated by the vacuum pump to a pressure of about 1×10⁻⁵ Torr.

(4) After opening the gate valve 406, the substrate was moved into the transport chamber 402 and deposition chamber 417 which had been evacuated by the vacuum pump. The back face of the substrate 490 was heated in close contact with the substrate heater 410, and the inside of the deposition chamber 417 was evacuated to a pressure of about $1\times10^{-5}$ Torr by the vacuum pump. The above steps completed the preparation for film formation.

(5) For forming the RF n-type layer of a-Si (the n-type semiconductor layer formed by the RF plasma CVD process), $H_2$ gas was introduced through the gas introducing pipe 429 into the deposition chamber 417 while the flow of $H_2$ gas was controlled at 200 sccm by the mass flow controller (not shown) by opening the valve (not shown). The pressure inside the deposition chamber 417 was adjusted to 1.1 Torr by the conductance valve (not shown).

(6) The substrate heater 410 was set to keep the temperature of the substrate 490 at 350° C. When the substrate temperature became stable, $SiH_4$ gas and $PH_3/H_2$ gas were introduced through the gas introducing pipe 429 into the deposition chamber 417 by manipulating the valves. At this time, $SiH_4$ gas flow was adjusted to 2 sccm, $H_2$ gas to 50 sccm, and $PH_3/H_2$ gas to 0.5 sccm by respective mass flow controllers, and the pressure inside the deposition chamber 417 was adjusted to 1.1 Torr.

(7) The power of the high frequency (hereinafter referred to as "RF") power supply 422 was set to 0.005 $W/cm^3$, and the RF power was applied to the plasma forming cup 420 to cause glow discharge and to start formation of the RF n-type layer on the substrate. After the RF n-type layer was formed in a thickness of 20 nm, the RF power supply was turned off to stop the glow discharge, thus finishing the formation of the RF n-type layer 103.

(8) After stopping the flow of $SiH_4$ gas and $PH_3/H_2$ into the deposition chamber 417, $H_2$ gas was continuously flowed into the deposition chamber for five minutes. After that, the flow of $H_2$ was also stopped, and the inside of the deposition chamber and gas pipe were evacuated to a vacuum of $1\times10^{-5}$ Torr.

(9) The i-type layer 104 of a-Si was then formed by the microwave plasm CVD process. First, after opening the gate valve 407, the substrate 490 was moved into the transport chamber 403 and i-type layer deposition chamber 418 which had been evacuated by the vacuum pump. The back face of the substrate 490 was heated in close contact with the substrate heater 411, and the inside of the i-type layer deposition chamber 418 was evacuated to a pressure of about $1\times10^{-5}$ Torr by the vacuum pump.

(10) For fabricating the i-type layer, the substrate heater 411 was set to keep the temperature of the substrate 490 at 350° C., and, after the substrate was heated, the valves (not shown) were gradually opened to let $SiH_4$ gas and $H_2$ gas flow through the gas introducing pipe 449 into the i-type layer deposition chamber 418. At this time, $SiH_4$ gas flow was adjusted to 50 sccm and $H_2$ gas to 100 sccm by the respective mass flow controllers (not shown). The pressure inside the i-type layer deposition chamber 418 was controlled at 5 m Torr by adjusting the aperture of the conductance valve (not shown).

(11) The RF power supply 424 was set at 0.50 $W/cm^3$ and the power was applied to the bias electrode 428. After that, the power of the microwave power supply was set at 0.20 $W/cm^3$, and the microwave power was introduced through the microwave introducing waveguide tube 426 and microwave introducing window 425 into the i-type layer deposition chamber 418 to cause glow discharge. Then, after opening the shutter 427, formation of the i-type layer was started on the n-type layer. After the i-type layer was formed in a thickness of 0.1 μm, the microwave glow discharge was stopped and the output of bias power supply 424 was turned off, thus completing the fabrication of the i-type layer 104.

(12) By closing the valve (not shown), the flow of $SiH_4$ gas into the i-type layer deposition chamber 418 was stopped, and then $H_2$ gas was continuously flowed into the i-type layer deposition chamber 418 for two minutes. After that, by closing the valve (not shown), the inside of the i-type layer deposition chamber 418 and the gas pipe evacuated to a vacuum of $1\times10^{-5}$ Torr.

(13) According to the following procedures, the surface of the i-type semiconductor layer of a-Si was converted into the p-type region and the bandgap was increased to form the first p-type semiconductor layer or p1 layer (layer A) 105 by exposing the surface of the i-type semiconductor layer of a-Si to a plasma containing the p-type valence electron controlling agent and an element for increasing the bandgap of the i-type semiconductor layer.

First, after opening the gate valve 408, the substrate 490 was moved into the transport chamber 404 and p-type layer deposition chamber 419 which had been evacuated by the vacuum pump. The back face of the substrate 490 was heated in close contact with the substrate heater 412, and the inside of the p-type layer deposition chamber 419 was evacuated to a pressure of about $1\times10^{-5}$ Torr by the vacuum pump.

The substrate heater 412 was set so as to keep the temperature of substrate 490 at 230° C., and, after the substrate temperature became stable, He gas, $BF_4/He$ gas, and $CH_4$ gas were introduced through the gas introducing pipe 469 into the deposition chamber 419 by manipulating the valves. At this time, He gas flow was controlled at 50 sccm, $BF_3/He$ gas at 5 sccm, and $CH_4$ gas at 5 sccm by the mass flow controllers and the pressure inside the layer deposition chamber 419 was controlled at 2.0 Torr by adjusting the aperture of the conductance valve.

The power of the RF power supply 423 was set to 0.15 $W/cm^3$ and the RF power was applied to the plasma forming cup 421 to cause glow discharge. By exposing the surface of the i-type semiconductor layer to the plasma containing the p-type valence electron controlling agent and the element for increasing the bandgap of the i-type semiconductor layer, the surface of the i-type semiconductor layer was converted into the p-type layer and its bandgap was increased to form the first p-type semiconductor layer or p1 layer (layer A). After the layer was formed in a thickness of 3 nm, the RF power supply was turned off to stop the glow discharge, thus completing the formation of the first p-type semiconductor layer or p1 layer (layer A) 105.

(14) By manipulating the valves, the flow of He gas, $BF_3/He$ gas, and $CH_4$ gas was stopped, and $H_2$ gas was further flowed at 50 sccm, $SiH_4/H_2$ gas at 0.5 sccm, and $BF_3/H_2$ gas at 0.5 sccm. The second p-type semiconductor layer or p2 layer (layer B) of a-Si was stacked on the first p-type semiconductor layer or p1 layer (layer A) by the RF plasma CVD process. At this time, the pressure inside the p-type layer deposition chamber 419 was controlled at 2.0 Torr by adjusting the aperture of the conductance valve (not shown).

The power of the RF power supply 423 was set to 0.15 $W/cm^3$ and the RF power was applied to the plasma forming cup 421 to cause glow discharge, thus starting formation of the second p-type semiconductor layer or p2 layer of a-Si. After the RF p-type layer was formed in a thickness of 5 nm, the RF power supply was turned off to stop the glow discharge, thus completing the formation of the p-type layer of the present invention.

By closing the valves (not shown), the flows of $SiH_4/H_2$ gas and $BF_3/H_2$ gas into the p-type layer deposition chamber 419 were stopped, and H₂ gas was continuously flowed into the p-type layer deposition chamber 419 for three minutes. After that, the flow of H₂ was also stopped by closing the valve (not shown), and the inside of the p-type layer deposition chamber 419 and the gas pipe were evacuated to a vacuum of $1 \times 10^{-5}$ Torr.

(15) After opening the gate valve 409, the substrate 490 was moved into the unloading chamber 405 which had been evacuated by the vacuum pump, and the unloading chamber 405 was allowed to leak to the atmosphere by opening the leak valve (not shown).

(16) ITO was then deposited as a transparent and conductive layer 107 in a thickness of 70 nm on the p-type layer by the vacuum vapor deposition process. Next, a mask with a comb-shaped aperture was placed on the transparent and conductive layer 107, and the comb-shaped collector electrode 108 was deposited in the structure of Cr (40 nm)/Ag (1000 nm)/Cr (40 nm) in this order by the vacuum vapor deposition process.

The foregoing concludes the fabrication of the photovoltaic element of this example (SC Ex 11).

Comparative Example 11-1

This example is different from Example 11 in that the first p-type semiconductor layer or p1 layer (layer A) was not formed. Further, the film thickness of the second p-type semiconductor layer or p2 layer (layer B) of a-Si was 8 nm.

The other steps were the same as in Example 11.

The photovoltaic element fabricated in this example will be referred to as SC Comp Ex 11-1.

Next explained are evaluation tests which were carried out on six photovoltaic elements obtained in each of Example 11 and Comparative Example 11-1.

As the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$) and fill factor (F.F.). Table 17 shows the photoelectric conversion factor (η), open-circuit voltage ($V_{oc}$), short-circuit current ($J_{sc}$) and fill factor (F.F.) of (SC Ex 11), which were normalized with corresponding measured values of (SC Comp Ex 11-1) being taken as 1.0.

TABLE 17

| | P-E conversion efficiency (η) | Open-ckt volt ($V_{oc}$) | Short-ckt current ($J_{sc}$) | Fill factor (F. F.) |
|---|---|---|---|---|
| (SC Ex 11) | 1.09 | 1.05 | 1.01 | 1.03 |

From Table 17, it is found that the photovoltaic elements of (SC Ex 11) were superior to those of (SC Comp Ex 11-1) in the open-circuit voltage ($V_{oc}$) and the fill factor (F.F.), and particularly superior in the photoelectric conversion efficiency (η).

In order to check the unevenness and dispersion in the substrate, a mask with twenty five holes (of the area of 0.25 cm²) was placed on the p-type layer and a film of ITO was formed as a transparent conductive layer in a thickness of 70 nm by the vacuum vapor deposition process. Table 18 shows results of unevenness and dispersion in substrate as reflected in the open-circuit voltage ($V_{oc}$) and the fill factor (F.F.), measured on such samples. Here, the maximum value of measured values of the same substrate was taken as 1.

TABLE 18

| | Open-ckt voltage ($V_{oc}$) | Fill Factor (F. F.) |
|---|---|---|
| (SC Ex 11) | 0.98–1.00 | 0.97–1.00 |
| (SC Comp Ex 11-1) | 0.90–1.00 | 0.95–1.00 |

From Table 18, it is found that the photovoltaic elements of (SC Ex 11) had less unevenness and dispersion in the substrate whereby uniformity of photoelectric conversion characteristics thereof was improved.

Further, in measuring the V-I characteristics of the solar cells, a blue filter (HOYA B390) was used over AM 1.5 (100 mW/cm²), thereby performing measurements to strongly reflect defect density on the light incidence side. Table 19 shows results of the photoelectric conversion efficiency (η), open-circuit voltage ($V_{oc}$), short-circuit current ($J_{sc}$), and fill factor (F.F.) measured for such samples. Each value in the table indicates a numerical value normalized with a corresponding measured value of (SC Comp Ex 11-1) being taken as 1.0.

TABLE 19

| | P-E conversion efficiency (η) | Open-ckt volt ($V_{oc}$) | Short-ckt current ($J_{sc}$) | Fill factor (F. F.) |
|---|---|---|---|---|
| (SC Ex 11) | 1.12 | 1.05 | 1.02 | 1.05 |

From comparison of Table 19 with Table 17, it is found that improvements in the fill factor (F.F.) and in the photoelectric conversion efficiency (η) in the measurement under the blue light were more noticeable than in the measurement under the white light.

It is concluded that this result shows that the interface levels in the p/i interface are decreased because almost all photocarriers were generated near the light incidence side of the i-type semiconductor layer under the blue light.

EXAMPLE 12

This example is different from Example 11 in that the following conditions were employed instead of those in Example 11 in forming the second p-type semiconductor layer or p2 layer (layer B).

(1) H₂ gas was flowed at 50 sccm, SiH₄/H₂ gas at 0.25 sccm, and BF₃/H₂ gas at 1 sccm.

(2) The power of the RF power supply 423 was set 0.15 W/cm³ to cause glow discharge and the layer was deposited under such conditions to form μc-Si by the RF plasma CVD process.

(3) The film thickness of the RF p-type μc-Si layer was 5 nm.

The other steps were the same as in Example 11.

The photovoltaic element fabricated in this example will be referred to as SC Ex 12.

Comparative Example 12-1

This example is different from Example 12 in that the first p-type semiconductor layer or p1 layer (layer A) was not formed. The film thickness of the second p-type semiconductor layer or p2 layer (layer B) of μc-Si was 8 nm.

The other steps were the same as in Example 12.

The photovoltaic element fabricated in this example will be referred to SC Comp Ex 12-1.

Next explained are evaluation tests which were carried out on six photovoltaic elements obtained in each of Example 12 and Comparative Example 12-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$) and fill factor (F.F.). Table 20 shows the photoelectric conversion factor ($\mu$), open-circuit voltage ($V_{oc}$), short-circuit current ($J_{sc}$) and fill factor (F.F.) of (SC Ex 12), which were normalized with corresponding measured values of (SC Comp Ex 12-1) being taken as 1.0.

TABLE 20

| | P-E conversion efficiency ($\eta$) | Open-ckt volt ($V_{oc}$) | Short-ckt current ($J_{sc}$) | Fill factor (F. F.) |
|---|---|---|---|---|
| (SC Ex 12) | 1.11 | 1.05 | 1.02 | 1.04 |

From Table 20, it is found that the photovoltaic elements of (SC Ex 12) were superior in the open-circuit voltage ($V_{oc}$) and the fill factor (F.F.), as well as in the photoelectric conversion efficiency ($\eta$) to those of (SC Comp Ex 12-1).

EXAMPLE 13

This example is different from Example 12 in that a-SiGe was used for forming a MW i-type layer (an i-type semiconductor layer formed by the microwave CVD process) instead of a-Si.

A process for fabricating the MW i-type layer of a-SiGe will be explained according to its procedures.

(1) The substrate heater 411 was set to keep the temperature of the substrate 490 at 380° C. and, by gradually opening the valves (not shown) after the substrate was heated, SiH$_4$ gas, GeH$_4$ gas, and H$_2$ gas were flowed through the gas introducing pipe 449 into the i-type layer deposition chamber 418. At this time, SiH$_4$ gas flow was controlled at 50 sccm, GeH$_4$ gas at 35 sccm, and H$_2$ gas at 120 sccm by adjusting the respective mass flow controllers (not shown). The pressure inside the i-type layer deposition chamber 418 was controlled at 6 mTorr by adjusting the aperture of the conductance valve (not shown).

(2) The RF power supply 424 was set to apply 0.2 W/cm$^3$ power to the bias bar 428. After that, the power of the microwave power supply (not shown) was set to 0.1 W/cm$^3$ and the microwave power was introduced through the microwave introducing waveguide pipe 426 and the microwave introducing window 425 into the i-type layer deposition chamber 418 to cause glow discharge. Then after opening the shutter 427, fabrication of the MW i-type layer was started on the RF i-type layer. After the i-type layer was formed in a thickness of 0.15 µm, the microwave glow discharge was stopped and the output from the bias power supply 424 was turned off, thus completing the fabrication of the MW i-type layer 204.

(3) Then the valves (not shown) were closed to stop the flow of SiH$_4$ gas and GeH$_4$ gas into the i-type layer deposition chamber 418. After that, H$_2$ gas was continuously flowed into the i-type layer deposition chamber 418 for two minutes. Then the valve (not shown) was closed and the inside of the i-type layer deposition chamber 418 and the gas pipe were evacuated to the vacuum of 1×10$^{-5}$ Torr.

(4) For forming the first p-type semiconductor layer or p1 layer (layer A) 105 by exposing the surface of the i-type semiconductor layer of a-SiGe to the plasma containing a p-type valence electron controlling agent and an element for increasing the bandgap of the i-type semiconductor layer, thereby converting the i-type semiconductor layer near the surface into a p-type region and increasing the bandgap, He gas, BF$_3$/He gas, and O$_2$/He gas were introduced into the deposition chamber. At this time, He gas flow was controlled at 50 sccm, BF$_3$/He gas at 5 sccm, and O$_2$/He gas at 5 sccm by adjusting the mass flow controllers (not shown), and the pressure was controlled at 2.0 Torr.

The RF power was set to 0.15 W/cm$^3$ to cause glow discharge, and formation of the first p-type semiconductor layer or p1 layer (layer A) was started by exposing the surface of the i-type semiconductor layer to a plasma containing a p-type valence electron controlling agent and an element for increasing the bandgap of the i-type semiconductor layer, thereby converting the i-type semiconductor layer near the surface into a p-type region and increasing the bandgap thereof. After the layer was formed in a thickness of 3 nm, the RF power supply was turned off to stop the glow discharge, thus completing the formation of the first p-type semiconductor layer or p1 layer (layer A) 105.

The other steps were the same as in Example 12.

The photovoltaic element fabricated in this example will be referred to as SC Ex 13.

Comparative Example 13-1

This example is different from Example 13 in that the first p-type semiconductor layer or p1 layer (layer A) was not formed. The film thickness of the second p-type semiconductor layer or p2 layer (layer B) of µc-Si was 8 nm.

The other steps were the same as in Example 13.

The photovoltaic element fabricated in this example will be referred to as SC Comp Ex 13-1.

Next explained are evaluation tests which were carried out on six photovoltaic elements obtained in each of Example 13 and Comparative Example 13-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$) and fill factor (F.F.). Table 21 shows the photoelectric conversion factor ($\eta$), open-circuit voltage ($V_{oc}$), short-circuit current ($J_{sc}$) and fill factor (F.F.) of (SC Ex 13), which were normalized with corresponding measured values of (SC Comp Ex 13-1) being taken as 1.0.

TABLE 21

| | P-E conversion efficiency ($\eta$) | Open-ckt volt ($V_{oc}$) | Short-ckt current ($J_{sc}$) | Fill factor (F. F.) |
|---|---|---|---|---|
| (SC Ex 13) | 1.07 | 1.04 | 1.00 | 1.03 |

From Table 21, it is found that the photovoltaic elements of (SC Ex 13) were superior in the open-circuit voltage ($V_{oc}$) and the fill factor (F.F.) as well as in the photoelectric conversion efficiency ($\eta$) to those of (SC Comp Ex 13-1).

EXAMPLE 14

This example is different from Example 12 in that a-SiC was used for forming an MW i-type layer (an i-type semiconductor layer formed by the microwave CVD process) instead of a-Si.

A process for fabricating the MW i-type layer of a-SiC will be explained according to its procedures.

(1) The substrate heater 411 was set to keep the temperature of the substrate 490 at 380° C. and, by gradually opening the valves (not shown) after the substrate was heated, $SiH_4$ gas, $CH_4$ gas, and $H_2$ gas were flowed through the gas introducing pipe 449 into the i-type layer deposition chamber 418. At this time, $SiH_4$ gas flow was controlled at 50 sccm, $CH_4$ gas at 35 sccm, and $H_2$ gas at 120 sccm by adjusting the respective mass flow controllers (not shown). The pressure inside the i-type layer deposition chamber 418 was controlled at 6 mTorr by adjusting the aperture of the conductance valve (not shown).

(2) The RF power supply 424 was set to supply 0.2 $W/cm^3$ power to the bias electrode 428. After that, the power of the microwave power supply (not shown) was set to 0.1 $W/cm^3$ and the microwave power was introduced through the microwave introducing waveguide pipe 426 and the microwave introducing window 425 into the i-type layer S deposition chamber 418 to cause glow discharge. Then after opening the shutter 427, fabrication of the MW i-type layer was started on the RF i-type layer. After the i-type layer was formed in a thickness of 0.1 um, the microwave glow discharge was stopped and the output from the bias power supply 424 was turned off, thus completing the fabrication of the MW i-type layer 204.

The valves (not shown) were closed to stop the flow of $SiH_4$ gas and $CH_4$ gas into the i-type layer deposition chamber 418. After that, $H_2$ gas was continuously flowed into the i-type layer deposition chamber 418 for two minutes. Then the valve (not shown) was closed and the inside of the i-type layer deposition chamber 418 and the gas pipe were evacuated to $1 \times 10^{-5}$ Torr.

(3) For forming the first p-type semiconductor layer or pi layer (layer A) 105 by exposing the surface of the i-type semiconductor layer of a-SiC to a plasma containing a p-type valence electron controlling agent and an element for increasing the bandgap of the i-type semiconductor layer, thereby converting the i-type semiconductor layer near the surface into a p-type region and increasing the bandgap, He gas, $BF_3$/He gas, and $NH_3$ gas were introduced into the deposition chamber. At this time, He gas flow was controlled at 50 sccm, $BF_3$/He gas at 5 sccm, and $NH_3$ gas at 5 sccm by adjusting the mass flow controllers and the pressure was controlled at 2.0 Torr.

The RF power was set to 0.15 $W/cm^3$ to cause glow discharge, and formation of the first p-type semiconductor layer or p1 layer (layer A) was started by exposing the surface of the i-type semiconductor layer to the plasma containing the p-type valence electron controlling agent and the element for increasing the bandgap of the i-type semiconductor layer, thereby converting the i-type semiconductor layer near the surface into the p-type region and increasing the bandgap thereof. After the layer was formed in a thickness of 3 nm, the RF power supply was turned off to stop the glow discharge, thus completing the formation of the first p-type semiconductor layer or p1 layer (layer A) 105.

The other steps were the same as in Example 12.

The photovoltaic element fabricated in this example will be referred to as SC Ex 14.

Comparative Example 14-1

This example is different from Example 14 in that the first p-type semiconductor layer or p1 layer (layer A) was not formed. The film thickness of the second p-type semiconductor layer or p2 layer (layer B) of μc-Si was 8 nm.

The other steps were the same as in Example 14.

The photovoltaic element fabricated in this example will be referred to as SC Comp Ex 14-1.

Next explained are evaluation tests which were carried out on six photovoltaic elements obtained in each of Example 14 and Comparative Example 14-1.

As the evaluation tests, V-I characteristics were observed while each photovoltaic element was placed under light irradiation of AM 1.5 (100 $mW/cm^2$). From the results, an average value was calculated for each of photoelectric conversion efficiency (η) defined as (photoelectromotive force)/(incident light power), open-circuit voltage ($V_{oc}$), short-circuit current ($J_{sc}$) and fill factor (F.F.). Table 22 shows the photoelectric conversion factor (η), open-circuit voltage ($V_{oc}$), short-circuit current ($J_{sc}$) and fill factor (F.F.) of (SC Ex 14), which were normalized with corresponding measured values of (SC Comp Ex 14-1) being taken as 1.0.

TABLE 22

|  | P-E conversion efficiency (η) | Open-ckt volt ($V_{oc}$) | Short-ckt current ($J_{sc}$) | Fill factor (F. F.) |
| --- | --- | --- | --- | --- |
| (SC Ex 14) | 1.06 | 1.01 | 1.01 | 1.04 |

From Table 22, it is found that the photovoltaic elements of (SC Ex 14) were superior in the fill factor (F.F.) as well as in the photoelectric conversion efficiency (η) to those of (SC Comp Ex 14-1).

EXAMPLE 15

This example is different from Example 11 in that Example 11 had the p layer on the light incidence side in the layer structure: substrate/n layer/i layer /p1 layer (layer A)/p2 layer (layer B) whereas this example had the n layer on the light incidence side in the layer structure: substrate/p layer/i layer/n1 layer (layer A)/n2 layer (layer B).

A process for fabricating the photovoltaic element of this example will be explained according to its procedures.

(1) For forming the RF p-type layer 103 of a-Si, $H_2$ gas was introduced through the gas introducing pipe 469 into the deposition chamber 419 while the flow of $H_2$ gas was controlled at 200 sccm by the mass flow controller (not shown) by opening the valve (not shown). The pressure inside the deposition chamber 419 was adjusted to 1.1 Torr by the conductance valve (not shown).

(2) The substrate heater 412 was set to keep the temperature of the substrate 490 at 350° C. When the substrate temperature became stable, $H_2$ gas, $SiH_4/H_2$ gas and $BF_3/H_2$ gas were introduced through the gas introducing pipe 469 into the deposition chamber 419 by manipulating the valves (not shown). At this time, $H_2$ gas flow was adjusted at 50 sccm, $SiH_4/H_2$ gas at 0.5 sccm, and $BF_3/H_2$ gas at 5 sccm by the mass flow controllers (not shown), and the pressure inside the layer deposition chamber 419 was adjusted to 2.0 Torr by adjusting the aperture of the conductance valve (not shown).

The power of the RF power supply 423 was set to 0.15 $W/cm^3$, and the RF power was applied to the plasma forming cup 421 to cause glow discharge and to start formation of the p-type semiconductor layer of a-Si. After the RF p-type layer was formed in a thickness of 10 nm, the RF power supply was turned off to stop the glow discharge, thus finishing a formation of the p-type layer of the present invention.

(3) After closing the valves (not shown) to stop the flow of SiH$_4$/H$_2$ gas and BF$_3$/H$_2$ gas into the p-type layer deposition chamber 419, H$_2$ gas was continuously flowed into the p-type layer deposition chamber 419 for three minutes. After that, the flow of H$_2$ was also stopped by closing the valve (not shown), and the inside of the p-type layer deposition chamber 419 and gas pipe were evacuated to of 1×10$^{-5}$ Torr.

(4) The i-type layer 104 of a-Si was formed by the microwave plasm CVD process. First, after opening the gate valve 407, the substrate 490 was moved into the transport chamber 403 and i-type layer deposition chamber 418 preliminarily evacuated by the vacuum pump. The back face of the substrate 490 was heated in close contact with the substrate heater 411, and the inside of the i-type layer deposition chamber 418 was evacuated to a pressure of about 1×10$^{-5}$ Torr by the vacuum pump.

For fabricating the i-type layer, the substrate heater 411 was set to keep the temperature of the substrate 490 at 350° C., and, after the substrate was heated, the valves (not shown) were gradually opened to let SiH$_4$ gas and H$_2$ gas flow through the gas introducing pipe 449 into the i-type layer deposition chamber 418. At this time, SiH$_4$ gas flow was adjusted at 50 sccm and H$_2$ gas at 100 sccm by the respective mass controllers (not shown). The pressure inside the i-type layer deposition chamber 418 was controlled at 5 mTorr by adjusting the aperture of the conductance valve (not shown).

(5) The RF power supply 424 was set at 0.50 W/cm$^3$ and applied to the bias electrode 428. After that, the power of the microwave power supply was set at 0.20 W/cm$^3$, and the microwave power was introduced through the microwave introducing waveguide tube 426 and microwave introducing window 425 into the i-type layer deposition chamber 418 to cause glow discharge. Then, by opening the shutter 427, fabrication of the i-type layer was started on the p-type layer. After the i-type layer was formed in a thickness of 0.1 μm, the microwave glow discharge was stopped and the output of bias power supply 424 was turned off, thus completing fabrication of the i-type layer 104.

By closing the valve (not shown), the flow of SiH$_4$ gas into the i-type layer deposition chamber 418 was stopped, and then H$_2$ gas was continuously flowed into the i-type layer deposition chamber 418 for two minutes. After that, after closing the valve (not shown), the inside of the i-type layer deposition chamber 418 and the gas pipe were evacuated to 1×10$^{-5}$ Torr.

(6) For forming the RF n-type layer, the first n-type semiconductor layer or n1 layer (layer A) 105 was first formed by exposing the surface of the i-type semiconductor layer of a-Si to a plasma containing an n-type valence electron controlling agent and an element for increasing the bandgap of the i-type semiconductor layer so as to convert the i-type semiconductor layer near the surface into an n-type region and to increase the bandgap. In forming the first n-type semiconductor layer or n1 layer (layer A) 105, the gate valve 407 was opened and the substrate 490 was moved into the transport chamber 402 and n-type layer deposition chamber 417 which had been preliminarily evacuated by the vacuum pump.

(7) The back face of the substrate 490 was heated in close contact with the substrate heater 410, and the inside of the n-type layer deposition chamber 417 was evacuated to a pressure of about 1×10$^{-5}$ Torr by the vacuum evacuation pump. The substrate heater 412 was to keep the temperature of substrate 490 at 230° C., and, after the substrate temperature became stable, He gas, PH$_3$/H$_2$ gas, and NO gas were introduced through the gas introducing pipe 429 into the deposition chamber 417 by manipulating the valves. At this time, He gas flow was controlled at 50 sccm, PH$_3$/H$_2$ gas at 0.5 sccm, and NO gas at 0.5 sccm by the mass flow controllers and the pressure inside the layer deposition chamber 417 was controlled at 0.5 Torr by adjusting the aperture of the conductance valve.

The power of the RF power supply 423 was set to 0.015 W/cm$^3$ and the RF power was supplied to the plasma forming cup 421 to cause glow discharge. By exposing the surface of the i-type semiconductor layer to the plasma containing the n-type valence electron controlling agent and the element for increasing the bandgap of the i-type semiconductor layer, the surface of the i-type semiconductor layer started to be converted into the n-type layer and to increase the bandgap thereof to form the first n-type semiconductor layer or n1 layer (layer A). After the layer was formed in a thickness of 3 nm, the RF power supply was turned off to stop the glow discharge, thus completing the formation of the first n-type semiconductor layer or n1 layer (layer A) 105.

(8) By manipulating the unrepresented valves, the flow of He gas and NO gas was stopped, and H$_2$ gas was further flowed at 50 sccm, SiH$_4$ gas at 0.5 sccm, and PH$_3$/H$_2$ gas at 0.5 sccm. The second n-type semiconductor layer or n2 layer (layer B) containing the main constituent elements of the i-type semiconductor layer and the element for increasing the bandgap of the i-type semiconductor layer was successively stacked on the first n-type semiconductor layer or n1 layer (layer A). At this time, the pressure inside the layer deposition chamber 417 was controlled at 2.0 Torr by adjusting the aperture of the conductance valve (not shown).

The power of the RF power supply 423 was set to 0.1 W/cm$^3$ and the RF power was supplied to the plasma forming cup 421 to cause glow discharge, thus starting formation of the second n-type semiconductor layer or n2 layer (layer B) containing the main constituent elements of the i-type semiconductor layer of a-SiO and the element for increasing the bandgap of the i-type semiconductor layer. After the RF n-type layer was formed in a thickness of 5 nm, the RF power supply was turned off to stop the glow discharge, thus completing the formation of the n-type layer of the present invention.

(9) By closing the valves (not shown), the flow of SiH$_4$ gas and PH$_3$/H$_2$ gas into the n-type layer deposition chamber 417 was stopped, and H$_2$ gas was continuously flowed into the n-type layer deposition chamber 417 for three minutes. After that, the flow of H$_2$ was also stopped by closing the valve (not shown), and the inside of the n-type layer deposition chamber 417 and the gas pipe were evacuated to 1×10$^{-5}$ Torr. Then the substrate 490 was moved into the unload chamber 405 which had been preliminarily evacuated by the vacuum pump, and the unloading chamber 405 was leaked to the atmosphere by opening the leak valve (not shown).

(10) ITO was deposited as a transparent and conductive layer 107 in a thickness of 70 nm on the n-type layer by the vacuum vapor deposition process. Next, a mask with a comb-shaped aperture was placed on the transparent and conductive layer 107, and the comb-shaped collector electrode 108 was deposited in the structure of Cr (40 nm)/Ag (1000 nm)/Cr (40 nm) by the vacuum vapor deposition process.

The other steps were the same as in Example 11.

The photovoltaic element fabricated in this example will be referred to as SC Ex 15.

Comparative Example 15-1

This example is different from Example 15 in that the first n-type semiconductor layer or n1 layer (layer A) was not formed. Further, the thickness of the second n-type semiconductor layer or n2 layer (layer B) of μc-Si was 8 nm.

The other steps were the same as in Example 15.

The photovoltaic element fabricated in this example will be referred to as SC Comp Ex 15-1.

Next explained are evaluation tests which were carried out on six photovoltaic elements obtained in each of Example 15 and Comparative Example 15-1.

As the evaluation tests, V-I characteristics were observed while each photovoltaic element was placed under light irradiation of AM 1.5 (100 mW/cm$^2$). From the results, an average value was calculated for each of photoelectric conversion efficiency (η) defined as (photoelectromotive force)/(incident light power), open-circuit voltage ($V_{oc}$), short-circuit current ($J_{sc}$) and fill factor (F.F.). Table 23 shows the photoelectric conversion factor (η), open-circuit voltage ($V_{oc}$), short-circuit current ($J_{sc}$) and fill factor (F.F.) of (SC Ex 15), which were normalized with corresponding measured values of (SC Comp Ex 15-1) being taken 1.0.

TABLE 23

|  | P-E conversion efficiency (η) | Open-ckt volt ($V_{oc}$) | Short-ckt current ($J_{sc}$) | Fill factor (F. F.) |
|---|---|---|---|---|
| (SC Ex 15) | 1.11 | 1.05 | 1.02 | 1.04 |

From Table 23, it is found that the photovoltaic elements of (SC Ex 15) were superior in the open-circuit voltage ($V_{oc}$) and the fill factor (F.F.) as well as in the photoelectric conversion efficiency (η) to those of (SC Comp Ex 15-1).

In order to check the unevenness and dispersion in the substrate, a mask with twenty five holes (of the area of 0.25 cm$^2$) was placed on the p-type layer and a film of ITO was formed as a transparent conductive layer in a thickness of 70 nm by the vacuum vapor deposition process. Table 24 shows results of unevenness and dispersion in the substrate as indicated by the open-circuit voltage ($V_{oc}$) and the fill factor (F.F.), measured for such samples. Here, the maximum value of the measured values for the same substrate was taken as 1.

TABLE 24

|  | Open-ckt voltage ($V_{oc}$) | Fill Factor (F. F.) |
|---|---|---|
| (SC Ex 15) | 0.98–1.00 | 0.97–1.00 |
| (SC Comp Ex 15-1) | 0.90–1.00 | 0.95–1.00 |

From Table 24, it is found that the photovoltaic elements of (SC Ex 15) had less unevenness and dispersion in the substrate, whereby uniformity of photoelectric conversion characteristics thereof was improved.

Further, in measuring the V-I characteristics of solar cell, the blue filter (HOYA B390) was used over AM 1.5 (100 mW/cm$^2$), thereby performing measurements to reflect defect density on the light incidence side. Table 25 shows results of the photoelectric conversion efficiency (η), open-circuit voltage ($V_{oc}$), short-circuit current ($J_{sc}$) and fill factor (F.F.) measured for such samples. Each value in the table indicates a numerical value normalized with a corresponding measured value of (SC Comp Ex 15-1) being taken as 1.0.

TABLE 25

|  | P-E conversion efficiency (η) | Open-ckt volt ($V_{oc}$) | Short-ckt current ($J_{sc}$) | Fill factor (F. F.) |
|---|---|---|---|---|
| (SC Ex 15) | 1.12 | 1.05 | 1.02 | 1.05 |

From comparison of Table 25 with Table 23, it was found that an improvement in the fill factor (F.F.) in the measurement under the blue light was more noticeable than in the measurement under the white light.

It was concluded that this result showed that the interface levels in the p/i interface were decreased because almost all photocarriers were generated near the light incidence side of the i-type semiconductor layer under the blue light.

EXAMPLE 16

This example produced a photovoltaic element of the triple cell type (the stacked cell type in which three pin-type semiconductor junctions are stacked) shown in FIG. 2 in the same manner as in Example 6.

The layer structure of the photovoltaic element of this example was: substrate 201/back electrode 202/first pin junction/second pin junction/third pin junction/transparent electrode 215/collector electrode 216.

Described below is the layer structure of each pin junction in this example.

The first pin junction 217 has the layer structure of, in order from the side of the back electrode 202, RF n-type layer (n1 layer) 203 of a-Si/RF i-type layer 251 of a-Si/MW i-type layer (i1 layer) 204 of a-SiGe/RF i-type layer 261 of a-Si/first p-type semiconductor layer (p11 layer, or the layer A) 205 formed by exposing the surface of the i-type semiconductor layer (RF i-type layer 261) to a plasma containing a p-type valence electron controlling agent and an element for increasing the bandgap of the i-type semiconductor layer/second p-type semiconductor layer (p12 layer, or the layer B) 206 formed by depositing the p-type valence electron controlling agent and main constituent element of the i-type semiconductor layer.

The second pin junction 218 has the layer structure of, in order from the side of the first pin junction 217, RF n-type layer (n2 layer) 207 of a-Si/RF i-type layer 252 of a-Si/MW i-type layer (i2 layer) 208 of a-SiGe/RF i-type layer 262 of a-Si/first p-type semiconductor layer (p21 layer, or the layer A) 209 formed by exposing the surface of the i-type semiconductor layer (RF i-type layer 262) to a plasma containing a p-type valence electron controlling agent and an element for increasing the bandgap of the i-type semiconductor layer/second p-type semiconductor layer (p22 layer, or the layer B) 210 formed by depositing the p-type valence electron controlling agent.

The third pin junction 219 has the layer structure of, in order from the side of the second pin junction 218, RF n-type layer (n3 layer) 211 of a-Si/RF i-type layer (i3 layer) 212 of a-Si/first p-type semiconductor layer (p31 layer, or the layer A) 213 formed by exposing the surface of the i-type semiconductor layer (i3 layer 212) to a plasma containing a p-type valence electron controlling agent and an element for increasing the bandgap of the i-type semiconductor layer/second p-type semiconductor layer (p32 layer, or the layer B) 214 formed by depositing the p-type valence electron controlling agent.

A process for fabricating the photovoltaic element of this example will be explained according to its procedures.

Numerals in parentheses represent steps, wherein (1) and (2) are preparatory steps, (3)–(6) steps for forming the first pin junction 217, (7)–(10) steps for forming the second pin junction 218, and (11)–(14) steps for forming the third pin junction 219.

(1) A substrate prepared in the same manner as in Example 6 was placed on the substrate carrying rails in the loading chamber and the inside of the loading chamber was evacuated to a pressure of about $1 \times 10^{-5}$ Torr.

(2) After opening the gate valve, the substrate was moved into the transport chamber and deposition chamber which had been evacuated by the vacuum pump. The back face of the substrate was heated in close contact with the substrate heater, and the inside of the deposition chamber was evacuated to about $1 \times 10^{-5}$ Torr by the vacuum evacuation pump.

(3) Formation of RF n-type layer (n1 layer) 203 of a-Si

For forming the RF n-type layer, $H_2$ gas was introduced through the gas introducing pipe into the deposition chamber while the flow of $H_2$ gas was controlled at 200 sccm by the mass flow controller by opening the valve. The pressure inside the deposition chamber was adjusted to 1.1 Torr by the conductance valve (not shown).

The substrate heater was set to keep the temperature of the substrate at 380° C. When the substrate temperature became stable, $SiH_4$ gas and $PH_3/H_2$ gas were introduced through the gas introducing pipe into the deposition chamber by manipulating the valves. At this time, $SiH_4$ gas flow was adjusted to 2 sccm, $H_2$ gas to 50 sccm, and $PH_3/H_2$ gas to 0.5 sccm by the mass flow controllers, and the pressure inside the deposition chamber was adjusted to 1.1 Torr.

The power of the RF power supply was set to 0.005 W/cm$^3$, and the RF power was applied to the plasma forming cup to cause glow discharge and to start formation of the RF n-type layer on the substrate. After the RF n-type layer was formed in a thickness of 20 nm, the RF power supply was turned off to stop the glow discharge, thus finishing the formation of the RF n-type layer 203.

After stopping the flow of $SiH_4$ gas and $PH_3/H_2$ into the deposition chamber, $H_2$ gas was continuously flowed into the deposition chamber for five minutes. After that, the flow of $H_2$ was also stopped, and the inside of the deposition chamber and gas pipe was evacuated to $1 \times 10^{-5}$ Torr.

(4) The RF i-type layer 251 of a-Si, the MW i-type layer 204 of a-SiGe, and the RF i-type layer 261 of a-Si were successively formed using the RF plasma CVD process, the microwave plasma CVD process, and the RF plasma CVD process, respectively.

(4-1) After opening the gate valve, the substrate was moved into the transport chamber and i-type layer deposition chamber which had been evacuated preliminarily by the vacuum pump. The back face of the substrate was heated in close contact with the substrate heater, and the inside of the i-type layer deposition chamber was evacuated to about $1 \times 10^{-5}$ Torr by the vacuum pump.

(4-2) Formation of RF i-type layer 251 of a-Si

For forming the RF i-type layer, the substrate heater was set to keep the temperature of the substrate at 350° C., and, after the substrate was heated, the valves (not shown) were gradually opened to let $Si_2H_6$ gas and $H_2$ gas flow through the gas introducing pipe into the i-type layer deposition chamber. At this time, $Si_2H_6$ gas flow was adjusted to 4 sccm and $H_2$ gas to 100 sccm by the respective mass controllers. The pressure inside the i-type layer deposition chamber was controlled at 0.8 Torr by adjusting the aperture of the conductance valve.

Next, the RF power supply was set at 0.007 W/cm$^3$ and the power was applied to the bias electrode to cause glow discharge. Then, by opening the shutter, formation of the i-type layer was started on the RF n-type layer. After the i-type layer was formed in a thickness of 10 nm, the RF glow discharge was stopped and the output of the RF power supply was turned off, thus completing the formation of the RF i-type layer 251.

By closing the valve, the flow of $Si_2H_6$ gas into the i-type layer deposition chamber was stopped, and then $H_2$ gas was continuously flowed into the i-type layer deposition chamber for two minutes. After that, after closing the valve, the inside of the i-type layer deposition chamber and the gas pipe were evacuated to the $1 \times 10^{-5}$ Torr.

(4-3) Formation of MW i-type layer (i1 layer) 204 of a-SiGe

For forming the MW i-type layer, the substrate heater was set to keep the temperature of the substrate at 380° C. and, by gradually opening the valves after the substrate was heated, $SiH_4$ gas, $GeH_4$ gas, and $H_2$ gas were flowed through the gas introducing pipe into the i-type layer deposition chamber. At this time, $SiH_4$ gas flow was controlled to 50 sccm, $GeH_4$ gas to 35 sccm, and $H_2$ gas to 120 sccm by adjusting the respective mass flow controllers. The pressure inside the i-type layer deposition chamber was controlled at 6 mTorr by adjusting the aperture of the conductance valve.

Next, the RF power supply was set to 0.2 W/cm$^3$ to apply power to the bias electrode. After that, the power of the microwave power supply was set to 0.2 W/cm$^3$ and the microwave power was introduced through the microwave introducing waveguide pipe and the microwave introducing window into the i-type layer deposition chamber to cause glow discharge. Then by opening the shutter, formation of the MW i-type layer was started on the RF i-type layer. After the i-type layer was formed in a thickness of 0.1 μm, the microwave glow discharge was stopped and the output from the bias power supply was turned off, thus completing the formation of the MW i-type layer.

Then the valves were closed to stop the flow of $SiH_4$ gas and $GeH_2$ gas into the i-type layer deposition chamber. After that, $H_4$ gas was continuously flowed into the i-type layer deposition chamber for two minutes. Then the valve was closed and the inside of the i-type layer deposition chamber and the gas pipe were evacuated to $1 \times 10^{-5}$ Torr.

(4-4) Formation of RF i-type layer 261 of a-Si

For forming the RF i-type layer, the substrate heater was set to keep the temperature of the substrate at 250° C. and, after the substrate was heated, the valves were gradually opened to let the $Si_2H_6$ gas and $H_2$ gas flow through the gas introducing pipe into the i-type layer deposition chamber. At this time, $Si_2H_6$ gas flow was controlled to 2 sccm and $H_2$ gas to 80 sccm by adjusting the respective mass flow controllers. The pressure inside the i-type layer deposition chamber was controlled at 0.7 Torr by adjusting the aperture of the conductance valve.

Next, the RF power supply was set to 0.007 W/cm$^3$ and the power was applied to the bias electrode to cause glow discharge. Then the shutter was opened to start formation of the RF i-type layer on the MW i-type layer. After the i-type layer was formed in a thickness of 20 nm, the RF glow discharge was stopped and the output from the RF power supply was turned off, thus completing the formation of RF i-type layer 261. The valve was closed to stop the flow of $Si_2H_6$ gas into the i-type layer deposition chamber and $H_2$ gas was continuously flowed into the i-type layer deposition chamber for two minutes. After that, the valve (not shown) was closed and the inside of the i-type layer deposition chamber and the gas pipe were evacuated to $1 \times 10^{-5}$ Torr.

(5) Formation of first p-type semiconductor layer (p11 layer, or the layer A) 205

After opening the gate valve, the substrate was moved into the transport chamber and p-type layer deposition chamber which had been preliminarily evacuated by the vacuum pump.

The back face of the substrate was heated in close contact with the substrate heater, and the inside of the p-type layer deposition chamber was evacuated to a pressure of about $1 \times 10^{-5}$ Torr by the vacuum pump. The substrate heater was set so as to keep the temperature of substrate at 230° C., and, after the substrate temperature became stable, He gas, $BF_3$/He gas, and $CH_4$ gas were introduced through the gas introducing pipe into the deposition chamber by manipulating the valves. At this time, He gas flow was controlled 50 sccm, $BF_3$/He gas at 5 sccm, and $CH_4$ gas at 5 sccm by the mass flow controllers and the pressure inside the layer deposition chamber was controlled at 2.0 Torr by adjusting the aperture of the conductance valve.

The power of the RF power supply was set to 0.1 W/cm$^3$ and the RF power was supplied to the plasma forming cup to cause glow discharge. By exposing the surface of the i-type semiconductor layer to a plasma containing a p-type valence electron controlling agent and an element for increasing the bandgap of the i-type semiconductor layer, the surface of the i-type semiconductor layer started to be converted into a p-type layer and to increase its bandgap to form the first p-type semiconductor layer (p11 layer, or the layer A) 205. After the layer was formed in a thickness of 3 nm, the RF power supply was turned off to stop the glow discharge, thus completing the formation of the first p-type semiconductor layer (p11 layer, or the layer A) 205.

(6) Formation of second p-type semiconductor layer (p12 layer, or the layer B) 206

By manipulating the valves, the flow of He gas and $CH_4$ gas was stopped, and $H_2$ gas was flowed at 50 sccm, $SiH_4$/$H_2$ gas at 0.25 sccm, and $BF_3$/$H_2$ gas at 0.5 sccm. The second p-type semiconductor layer (p12 layer, or the layer B) of μc-Si was then stacked on the first p-type semiconductor layer (p11 layer, or the layer A) 205 by the RF plasma CVD process. At this time, the pressure inside the layer deposition chamber was controlled at 2.0 Torr by adjusting the aperture of the conductance valve.

The power of the RF power supply was set to 0.15 W/cm$^3$ and the RF power was supplied to the plasma forming cup to cause glow discharge, thus starting formation of the second p-type semiconductor layer (p12 layer, or the layer B) 206 of μc-Si. After the RF p-type layer was formed in a thickness of 5 nm, the RF power supply was turned off to stop the glow discharge, thus completing the formation of the second p-type semiconductor layer (p12 layer, or the layer B) 206.

By closing the valves, the flow of $SiH_4$/$H_2$ gas and $BF_3$/$H_2$ gas into the p-type layer deposition chamber was stopped, and $H_2$ gas was continuously flowed into the p-type layer deposition chamber for three minutes. After that, the flow of $H_2$ was also stopped by closing the valve, and the inside of the p-type layer deposition chamber and the gas pipe were evacuated to $1 \times 10^{-5}$ Torr.

Step (3) to step (6) as described above complete the formation of the first pin junction 217.

Explained in the following are steps for forming the second pin junction 218. The operation of these steps is basically the same operation as that for forming the first pin junction 217 as discussed above.

(7) Formation of RF n-type layer (n2 layer) 207 of a-Si

For forming the RF n-type layer, $H_2$ gas was introduced through the gas introducing pipe into the deposition chamber while the flow of $H_2$ gas was controlled at 200 sccm by the mass flow controller by opening the valve. The pressure inside the deposition chamber was adjusted to 1.1 Torr by the conductance valve.

The substrate heater was set to keep the temperature of the substrate at 380° C. When the substrate temperature became stable, $SiH_4$ gas and $PH_3$/$H_2$ gas were introduced through the gas introducing pipe into the deposition chamber by manipulating the valves. At this time, $SiH_4$ gas flow was adjusted to 2 sccm, $H_2$ gas to 50 sccm, and $PH_3$/$H_2$ gas to 0.5 sccm by the mass flow controllers, and the pressure inside the deposition chamber was adjusted to 1.1 Torr.

The power of the RF power supply was set to 0.005 W/cm$^3$, and the RF power was applied to the plasma forming cup to cause glow discharge and to start formation of the RF n-type layer on the substrate. After the RF n-type layer was formed in a thickness of 20 nm, the RF power supply was turned off to stop the glow discharge, thus finishing the formation of the RF n-type layer 207.

By stopping the flow of $SiH_4$ gas and $PH_3$/$H_2$ into the deposition chamber, $H_2$ gas was continuously flowed into the deposition chamber for five minutes. After that, the flow of $H_2$ was also stopped, and the inside of the deposition chamber and gas pipe were evacuated to $1 \times 10^{-5}$ Torr.

(8) The RF i-type layer 252 of a-Si, the MW i-type layer 208 of a-SiGe, and the RF i-type layer 262 of a-Si were successively formed using the RF plasma CVD process, the microwave plasma CVD process, and the RF plasma CVD process, respectively.

(8-1) After opening the gate valve, the substrate was moved into the transport chamber and i-type layer deposition chamber which had been preliminarily evacuated by the vacuum pump. The back face of the substrate was heated in close contact with the substrate heater, and the inside of the i-type layer deposition chamber was evacuated to a pressure of about $1 \times 10^{-5}$ Torr by the vacuum pump.

(8-2) Formation of RF i-type layer 252 of a-Si

For forming the RF i-type layer, the substrate heater was set to keep the temperature of the substrate at 350° C., and, after the substrate was heated, the valves were gradually opened to flow $Si_2H_6$ gas and $H_2$ gas through the gas introducing pipe into the i-type layer deposition chamber. At this time, $Si_2H_6$ gas flow was adjusted to 4 sccm and $H_2$ gas to 100 sccm by the respective mass controllers. The pressure inside the i-type layer deposition chamber was controlled to 0.8 Torr by adjusting the aperture of the conductance valve.

Next, the RF power supply was set at 0.007 W/cm$^3$ and the power was applied to the bias electrode to cause glow discharge. Then, by opening the shutter, formation of the i-type layer on the RF n-type layer was started. After the i-type layer was formed in a thickness of 10 nm, the RF glow discharge was stopped and the output of the RF power supply was turned off, thus completing the formation of the RF i-type layer 252.

By closing the valve, the flow of $Si_2H_6$ gas into the i-type layer deposition chamber was stopped, and then gas was continuously flowed into the i-type layer deposition chamber for two minutes. After that, by closing the valve, the inside of the i-type layer deposition chamber and the gas pipe were evacuated to $1 \times 10^{-5}$ Torr.

(8-3) Formation of MW i-type layer (i1 layer) 208 of a-SiGe

For forming the MW i-type layer, the substrate heater 411 was set to keep the temperature of the substrate at 380° C. and, by gradually opening the valves after the substrate was heated, $SiH_4$ gas, $GeH_2$ gas, and $H_2$ gas were flowed through the gas introducing pipe into the i-type layer deposition chamber. At this time, $SiH_2$ gas flow was controlled at 50 sccm, $GeH_2$ gas at 35 sccm, and $H_2$ gas at 120 sccm by adjusting the respective mass flow controllers. The pressure inside the i-type layer deposition chamber was controlled at 6 mTorr by adjusting the aperture of the conductance valve.

Next, the RF power supply was set to 0.2 W/cm$^3$ to apply power to the bias electrode. After that, the power of the microwave power supply was set to 0.2 W/cm$^3$ and the microwave power was introduced through the microwave introducing waveguide pipe and the microwave introducing window into the i-type layer deposition chamber to cause glow discharge. Then by opening the shutter, formation of the MW i-type layer on the RF i-type layer was started. After the i-type layer was formed in a thickness of 0.1 μm, the microwave glow discharge was stopped and the output from the bias power supply was turned off, thus completing the formation of the MW i-type layer 208.

Then the valves were closed to stop the flow of SiH$_4$ gas and GeH$_4$ gas into the i-type layer deposition chamber. After that, H$_2$ gas was continuously flowed into the i-type layer deposition chamber for two minutes. Then the valve was closed and the inside of the i-type layer deposition chamber and the gas pipe was evacuated to 1×10$^{-5}$ Torr.

(8-4) Formation of RF i-type layer 262 of a-Si

For forming the RF i-type layer, the substrate heater was set to keep the temperature of the substrate at 250° C. and, after the substrate was heated, the valves were gradually opened to let the Si$_2$H$_6$ gas and H$_2$ gas flow through the gas introducing pipe into the i-type layer deposition chamber. At this time, Si$_2$H$_6$ gas flow was controlled at 2 sccm and H$_2$ gas at 80 sccm by adjusting the respective mass flow controllers. The pressure inside the i-type layer deposition chamber was controlled at 0.7 Torr by adjusting the aperture of the conductance valve.

Next, the RF power supply was set to 0.007 W/cm$^3$ and the power was applied to the bias electrode to cause glow discharge. Then the shutter was opened to start formation of the RF i-type layer on the MW i-type layer. After the i-type layer was formed in a thickness of 20 nm, the RF glow discharge was stopped and the output from the RF power supply was turned off, thus completing the formation of RF i-type layer 262.

The valve was closed to stop the flow of Si$_2$H$_2$ gas into the i-type layer deposition chamber and H$_2$ gas was continuously flowed into the i-type layer deposition chamber for two minutes. After that, the valve was closed and the inside of the i-type layer deposition chamber and the gas pipe were evacuated to 1×10$^{-5}$ Torr.

(9) Formation of first p-type semiconductor layer (p21 layer, or the layer A) 209

After opening the gate valve, the substrate was moved into the transport chamber and p-type layer deposition chamber which had been preliminarily evacuated by the vacuum pump.

The back face of the substrate was heated in close contact with the substrate heater, and the inside of the p-type layer deposition chamber was evacuated to about 1×10$^{-5}$ Torr by the vacuum pump. The substrate heater was set so as to keep the temperature of substrate at 230° C., and, after the substrate temperature became stable, He gas, BF$_3$/He gas, and CH$_4$ gas were introduced through the gas introducing pipe into the deposition chamber by manipulating the valves. At this time, He gas flow was controlled at 50 sccm, BF$_3$/He gas at 5 sccm, and CH$_4$ gas at 5 sccm by the mass flow controllers and the pressure inside the layer deposition chamber was controlled at 1.0 Torr by adjusting the aperture of the conductance valve.

The power of the RF power supply was set to 0.15 W/cm$^3$ and the RF power was supplied into the plasma forming cup to cause glow discharge. By exposing the surface of the i-type semiconductor layer to a plasma containing a p-type valence electron controlling agent and an element for increasing the bandgap of the i-type semiconductor layer, the surface of the i-type semiconductor layer started to be converted into a p-type layer and to increase the bandgap thereof to form the first p-type semiconductor layer (p21 layer, or the layer A) 209. After the layer was formed in a thickness of 3 nm, the RF power supply was turned off to stop the glow discharge, thus completing the formation of the first p-type semiconductor layer (p21 layer, or the layer A) 209.

(10) Formation of second p-type semiconductor layer (p22 layer, or the layer B) 210

By manipulating the valves, the flow of He gas and CH$_4$ gas was stopped, and H$_2$ gas was flowed at 50 sccm, SiH$_4$/H$_2$ gas at 0.25 sccm, and BF$_3$/H$_2$ gas at 0.5 sccm. The second p-type semiconductor layer (p22 layer, or the layer B) of μc-Si was then stacked on the first p-type semiconductor layer (p21 layer, or the layer A) 209 by the RF plasma CVD process. At this time, the pressure inside the layer deposition chamber was controlled at 2.0 Torr by adjusting the aperture of the conductance valve.

The power of the RF power supply was set to 0.15 W/cm$^3$ and the RF power was supplied to the plasma forming cup to cause glow discharge, thus starting formation of the second p-type semiconductor layer (p22 layer, or the layer B) 210 containing the main constituent elements of the i-type semiconductor lever of μc-Si and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p22 layer, or the layer B) 210.

By closing the valves, the flow of SiH$_4$/H$_2$ gas and BF$_3$/H$_2$ gas into the p-type layer deposition chamber was stopped, and H$_2$ gas was continuously flowed into the p-type layer deposition chamber for three minutes. After that, the flow of H$_2$ was also stopped by closing the valve, and the inside of the p-type layer deposition chamber and the gas pipe were evacuated to 1×10$^{-5}$ Torr.

Step (7) to step (10) as described above complete the formation of the second pin junction 218.

Explained in the following are steps for forming the third pin junction 219.

(11) Formation of RF n-type layer (n3 layer) 211 of a-Si

For forming the RF n-type layer, H$_2$ gas was introduced through the gas introducing pipe into the deposition chamber while the flow of H$_2$ gas was controlled at 200 sccm by the mass flow controller by opening the valve. The pressure inside the deposition chamber was adjusted to 1.1 Torr by the conductance valve.

The substrate heater was set to keep the temperature of the substrate at 350° C. When the substrate temperature became stable, SiH$_4$ gas and PH$_3$/H$_2$ gas were introduced through the gas introducing pipe into the deposition chamber by manipulating the valves. At this time, SiH$_4$ gas flow was adjusted to 2 sccm, H$_2$ gas to 50 sccm, and PH$_3$/H$_2$ gas to 0.5 sccm by the mass flow controllers, and the pressure inside the deposition chamber was adjusted to 1.1 Torr.

The power of the RF power supply was set to 0.005 W/cm$^3$, and the RF power was applied to the plasma forming cup to cause glow discharge and to start formation of the RF n-type layer on the substrate. After the RF n-type layer was formed in a thickness of 10 nm, the RF power supply was turned off to stop the glow discharge, thus finishing the formation of the RF n-type layer 211.

After stopping the flow of SiH$_4$ gas and PH$_3$/H$_2$ into the deposition chamber, H$_2$ gas was continuously flowed into the deposition chamber for two minutes. After that, the flow of H$_2$ was also stopped, and the inside of the deposition chamber and gas pipe were evacuated to 1×10$^{-5}$ Torr.

(12) Formation of RF i-type layer 212 of a-Si

After opening the gate valve, the substrate was moved into the transport chamber and i-type layer deposition chamber which had been preliminarily evacuated by the vacuum pump (not shown). The back face of the substrate was heated in close contact with the substrate heater, and the inside of the i-type layer deposition chamber was evacuated to about 1×10$^{-5}$ Torr by the vacuum pump.

For forming the RF i-type layer 212, the substrate heater was set to keep the temperature of the substrate at 200° C., and, after the substrate was heated, the valves were gradually opened to let Si$_2$H$_6$ gas and H$_2$ gas flow through the gas introducing pipe into the i-type layer deposition chamber. At this time, Si$_2$H$_6$ gas flow was adjusted to 2 sccm and H$_2$ gas to 80 sccm by the respective mass controllers. The pressure inside the i-type layer deposition chamber was controlled at 0.6 Torr by adjusting the aperture of the conductance valve.

Next, the RF power supply was set at 0.07 W/cm$^3$ and the power was applied to the bias electrode to cause glow discharge. Then, by opening the shutter, formation of the i-type layer on the RF n-type layer 211 was started. After the i-type layer was formed in a thickness of 120 nm, the RF glow discharge was stopped and the output of the RF power supply was turned off, thus completing the formation of the RF i-type layer 212.

By closing the valve, the flow of Si$_2$H$_6$ gas into the i-type layer deposition chamber was stopped, and then H$_2$ gas was continuously flowed into the i-type layer deposition chamber for two minutes. After that, by closing the valve, the inside of the i-type layer deposition chamber and the gas pipe were evacuated to 1×10$^{-5}$ Torr.

(13) Formation of first p-type semiconductor layer (p31 layer, or the layer A) 213

After opening the gate valve, the substrate was moved into the transport chamber and p-type layer deposition chamber which had been preliminarily evacuated by the vacuum pump.

The back face of the substrate was heated in close contact with the substrate heater, and the inside of the p-type layer deposition chamber was evacuated to about 1×10$^{-5}$ Torr by the vacuum pump. The substrate heater was set so as to keep the temperature of substrate at 170° C., and, after the substrate temperature became stable, He gas, BF$_3$/He gas, and CH$_4$ gas were introduced through the gas introducing pipe into the deposition chamber by manipulating the valves. At this time, He gas flow was controlled at 50 sccm, BF$_3$/He gas at 5 sccm, and CH$_4$ gas at 5 sccm by the mass flow controllers and the pressure inside the layer deposition chamber was controlled at 2.0 Torr by adjusting the aperture of the conductance valve.

The power of the RF power supply was set to 0.15 W/cm$^3$ and the RF power was supplied to the plasma forming cup 421 to cause glow discharge. By exposing the surface of the i-type semiconductor layer to a plasma containing a p-type valence electron controlling agent and an element for increasing the bandgap of the i-type semiconductor layer, the surface of the i-type semiconductor layer started to be converted into a p-type layer and to increase the bandgap thereof to form the first p-type semiconductor layer (p31 layer, or the layer A) 213. After the layer was formed in a thickness of 3 nm, the RF power supply was turned off to stop the glow discharge, thus completing the formation of the first p-type semiconductor layer (p31 layer, or the layer A) 213.

(14) Formation of second p-type semiconductor layer (p32 layer, or the layer B) 214

By manipulating the valves, the flow of He gas and CH$_4$ gas was stopped, and H$_2$ gas was flowed at 50 sccm, SiH$_4$/H$_2$ gas at 0.25 sccm, and BF$_3$/H$_2$ gas at 0.5 sccm. The second p-type semiconductor layer (p32 layer, or the layer B) of µc-Si was then stacked on the first p-type semiconductor layer (p31 layer, or the layer A) 213 by the RF plasma CVD process. At this time, the pressure inside the layer deposition chamber was controlled at 2.0 Torr by adjusting the aperture of the conductance valve.

The power of the RF power supply was set to 0.15 W/cm$^3$ and the RF power was supplied to the plasma forming cup to cause glow discharge, thus starting formation of the second p-type semiconductor layer (p32 layer, or the layer B) 214 containing the main constituent elements of the i-type semiconductor layer of µc-Si and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p32 layer, or the layer B) 214.

By closing the valves, the flow of SiH$_4$/H$_2$ gas and BF$_3$/H$_2$ gas into the p-type layer deposition chamber was stopped, and H$_2$ gas was continuously flowed into the p-type layer deposition chamber for three minutes. After that, the flow of H$_2$ was also stopped by closing the valve, and the inside of the p-type layer deposition chamber and the gas pipe were evacuated to 1×10$^{-5}$ Torr.

Step (11) to step (14) as described above complete the formation of the third pin junction 219.

(15) Formation of transparent and conductive layer 215 and collector electrode 216

After opening the gate valve 409, the substrate 490 was moved into the unloading chamber 405 which had been preliminarily evacuated by the vacuum pump, and the unloading chamber 405 was leaked to the atmosphere by opening the leak valve.

Next, ITO was deposited as a transparent and conductive layer 215 in a thickness of 70 nm on the RF p-type layer 214 by the vacuum vapor deposition process.

Next, a mask with a comb-shaped aperture was placed on the transparent and conductive layer 212, and the comb-shaped collector electrode 216 was deposited in the structure of Cr (40 nm)/Ag (1000 nm)/Cr (40 nm) by the vacuum vapor deposition process.

The foregoing concludes the fabrication of the photovoltaic element of this example. The photovoltaic element fabricated in this example will be referred to as SC Ex 16.

Comparative Example 16-1

This example is different from Example 16 in that the first p-type semiconductor layers (p11 layer, p21 layer, p31 layer, or the layers A) were not formed. Further, the film thickness of the second p-type semiconductor layers (p12 layer, p22 layer, p32 layer, or the layers B) of µc-Si was 8 nm.

The other steps were the same as in Example 16.

The photovoltaic element fabricated in this example will be referred to as SC Comp Ex 16-1.

Next explained are evaluation tests which were carried out on six photovoltaic elements obtained in each of Example 16 and Comparative Example 16-1.

As the evaluation tests, V-I characteristics were observed while each photovoltaic element was placed under light irradiation of AM 1.5 (100 mW/cm$^2$). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 26 shows the photoelectric conversion factor (η), open-circuit voltage ($V_{oc}$), short-circuit current ($J_{sc}$) and fill factor (F.F.) of (SC Ex 16), which were normalized with corresponding measured values of (SC Comp Ex 16-1) being taken as 1.0.

TABLE 26

|  | P-E conversion efficiency (η) | Open-ckt volt ($V_{oc}$) | Short-ckt current ($J_{sc}$) | Fill factor (F. F.) |
|---|---|---|---|---|
| (SC Ex 16) | 1.08 | 1.05 | 1.01 | 1.02 |

From Table 26, it is found that the photovoltaic elements of (SC Ex 16) were superior in the open-circuit voltage ($V_{oc}$) and the fill factor (F.F.) as well as in the photoelectric conversion efficiency (μ) to those of (SC Comp Ex 16-1).

In order to check the unevenness and dispersion in the substrate, a mask with twenty five holes (of the area of 0.25 $cm^2$) was placed on the p-type layer and a film of ITO was formed as a transparent conductive layer in a thickness of 70 nm by the vacuum vapor deposition process. Table 27 shows the results of unevenness and dispersion in the substrate as indicated by the open-circuit voltage ($V_{oc}$) and the fill factor (F.F.), measured for such samples. Here, the maximum value of the measured values of the same substrate was taken as 1.

TABLE 27

|  | Open-ckt voltage ($V_{oc}$) | Fill factor (F. F.) |
|---|---|---|
| (SC Ex 16) | 0.98–1.00 | 0.98–1.00 |
| (SC Comp Ex 16-1) | 0.94–1.00 | 0.95–1.00 |

From Table 27, it is found that the photovoltaic elements of (SC Ex 16) had less unevenness and dispersion in the substrate, whereby uniformity of photoelectric conversion characteristics thereof was improved.

EXAMPLE 17

This example is different from Example 16 in that in Example 16 the photovoltaic element of the triple cell type was formed with the p layers on the light incidence side whereas this example formed a photovoltaic element of the triple cell type with the n layers on the light incidence side, similar to Example 15.

The other steps were the same as in Example 16.

The photovoltaic element fabricated in this example will be referred to as SC Ex 17.

Comparative Example 17-1

This example is different from Example 17 in that the first n-type semiconductor layers (n11 layer, n21 layer, n31 layer, or the layers A) were not formed. Further, the film thickness of the second n-type semiconductor layers (n12 layer, n22 layer, n32 layer, or the layers B) of μc-Si was 8 nm.

The other steps were the same as in Example 17.

The photovoltaic element fabricated in this example will be referred to as SC Comp Ex 17-1.

Next explained are evaluation tests which were carried out on six photovoltaic elements obtained in each of Example 17 and Comparative Example 17-1.

As the evaluation tests, V-I characteristics were observed while each photovoltaic element was placed under light irradiation of AM 1.5 (100 mW/$cm^2$). From the results, an average value was calculated for each of photoelectric conversion efficiency (η) defined as (photoelectromotive force)/(incident light power), open-circuit voltage ($V_{oc}$), short-circuit current ($J_{sc}$) and fill factor (F.F.). Table 28 shows the photoelectric conversion factor (η), open-circuit voltage ($V_{oc}$), short-circuit current ($J_{sc}$) and fill factor (F.F.) of (SC Ex 17), which were normalized with corresponding measured values of (SC Comp Ex 17-1) being taken as 1.0.

TABLE 28

|  | P-E conversion efficiency (η) | Open-ckt volt ($V_{oc}$) | Short-ckt current ($J_{sc}$) | Fill factor (F. F.) |
|---|---|---|---|---|
| (SC Ex 17) | 1.08 | 1.05 | 1.01 | 1.02 |

From Table 28, it is found that the photovoltaic elements of (SC Ex 17) were superior in the open-circuit voltage ($V_{oc}$) and the fill factor (F.F.) as well as in the photoelectric conversion efficiency (η) to those of (SC Comp Ex 17-1).

In order to check the unevenness and dispersion in the substrate, a mask with twenty five holes (of the area of 0.25 $cm^2$) was placed on the p-type layer and a film of ITO was formed as a transparent conductive layer in a thickness of 80 nm by the vacuum vapor deposition process. Table 29 shows results of unevenness and dispersion in substrate as indicated by the open-circuit voltage ($V_{oc}$) and the fill factor (F.F.), measured for such samples. Here, the maximum value of the measured values of the same substrate was taken as 1.

TABLE 29

|  | Open-ckt voltage ($V_{oc}$) | Fill factor (F. F.) |
|---|---|---|
| (SC Ex 17) | 0.98–1.00 | 0.98–1.00 |
| (SC Comp Ex 17-1) | 0.94–1.00 | 0.95–1.00 |

From Table 29, it is found that the photovoltaic elements of (SC Ex 17) had less unevenness and dispersion in the substrate whereby uniformity of photoelectric conversion characteristics thereof was improved.

EXAMPLE 18

This example is different from Example 16 in that the following conditions were employed instead of those in Example 16 in forming the first p-type semiconductor layers (p11 layer, p21 layer, p31 layer, or the layers A).

(1) $H_2$ gas flow was controlled at 50 sccm, $SiH_4/H_2$ gas at 0.25 sccm, $BF_3/H_2$ gas at 1 sccm, and $CH_4$ gas at 0.25 sccm.

The other steps were the same as in Example 16.

The photovoltaic element fabricated in this example will be referred to as SC Ex 18.

This solar cell was evaluated by SIMS, which showed that the first p-type semiconductor layer had a larger hydrogen content than that of the i-type semiconductor layer.

Next explained are evaluation tests which were carried out on six photovoltaic elements obtained in each of Example 18 and Comparative Example 16-1.

As the evaluation tests, V-I characteristics were observed while each photovoltaic element was placed under light irradiation of AM\1.5 (100 mW/$cm^2$). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 30 shows the photoelectric conversion factor (η), open-circuit voltage ($V_{oc}$), short-circuit current ($J_{sc}$), and fill factor (F.F.) of (SC Ex 18), which were normalized with corresponding measured values of (SC Comp Ex 16-1) being taken as 1.0.

TABLE 30

|  | P-E conversion efficiency (η) | Open-ckt volt ($V_{oc}$) | Short-ckt current ($J_{sc}$) | Fill factor (F. F.) |
| --- | --- | --- | --- | --- |
| (SC Ex 18) | 1.08 | 1.03 | 1.01 | 1.04 |

From Table 30, it is found that the photovoltaic elements of (SC Ex 18) were superior in the open-circuit voltage ($V_{oc}$) and the fill factor (F.F.) as well as in the photoelectric conversion efficiency to those of (SC Comp Ex 16-1).

EXAMPLE 19

This example is different from Example 12 in that the following conditions were employed instead of those in Example 12 in forming the first p-type semiconductor layer (p1 layer, or the layer A) 105 and the second p-type semiconductor layer (p2 layer, or the layer B) 106.

(1) Formation of first p-type semiconductor layer (p1 layer, or the layer A) 105

In forming the first p-type semiconductor layer (p1 layer, or the layer A) 105, $H_2$ gas flow was controlled at 50 sccm, $SiH_4/H_2$ gas at 0.25 sccm, $BF_3/H_2$ gas at 1 sccm, $CH_4$ gas at 5 sccm, and the pressure was controlled at 2.0 Torr. The RF power was set to 0.20 W/cm³ to cause glow discharge and formation of the first p-type semiconductor layer (p1 layer, or the layer A) 105 by converting the surface of the i-type semiconductor layer into a p-type layer and to increase the bandgap thereof. After the layer was formed in a thickness of 3 nm, the RF power supply was turned off to stop the glow discharge and the flow of $CH_4$ gas was stopped, thus completing the formation of the first p-type semiconductor layer (p1 layer, or the layer A) 105.

(2) Formation of second p-type semiconductor layer (p2 layer, or the layer B) 106

After completion of the formation of the first p-type semiconductor layer (p1 layer, or the layer A) 105, the power of the RF power supply was lowered to 0.15 W/cm³ to cause glow discharge, and formation of the second p-type semiconductor layer (p2 layer, or the layer B) 106 was started under conditions to deposit μc-Si. After the RF p-type layer was formed in a thickness of 5 nm, the RF power supply was turned off to stop the glow discharge, thus completing the formation of the second p-type semiconductor layer (p2 layer, or the layer B) 106.

The other steps were the same as in Example 12.

The photovoltaic element fabricated in this example will be referred to as SC Ex 19.

Next explained are evaluation tests which were carried out on six photovoltaic elements obtained in each of Example 19 and Comparative Example 12-1.

As the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectrmotive force)/(incident light power), open-circuit voltage ($V_{oc}$), short-circuit current ($J_{sc}$), and fill factor (F.F.). Table 31 shows the photoelectric conversion factor (η), open-circuit voltage ($V_{oc}$), short-circuit current ($J_{sc}$), and fill factor (F.F.) of (SC Ex 19), which were normalized with corresponding measured values of (SC Comp Ex 12-1) being taken as 1.0.

TABLE 31

|  | P-E conversion efficiency (η) | Open-ckt volt ($V_{oc}$) | Short-ckt current ($J_{sc}$) | Fill factor (F. F.) |
| --- | --- | --- | --- | --- |
| (SC Ex 19) | 1.11 | 1.05 | 1.04 | 1.02 |

From Table 31, it is found that the photovoltaic elements of (SC Ex 19) were superior in the open-circuit voltage ($V_{oc}$), the short-circuit current ($J_{sc}$), and the fill factor (F.F.) as well as in the photoelectric conversion efficiency (η), to those of (SC Comp Ex 12-1).

EXAMPLE 20

This example is different from Example 12 in that the following conditions were employed instead of those in Example 12 in forming the first p-type semiconductor layer (p1 layer, or the layer A) 105 and the second p-type semiconductor layer (p2 layer, or the layer B) 106.

(1) Formation of first p-type semiconductor layer (p1 layer, or the layer A) 105

In forming the first p-type semiconductor layer (p1 layer, or the layer A) 105, $H_2$ gas flow was controlled at 200 sccm, $SiH_4/H_2$ gas at 0.25 sccm, $BF_3/H_2$ gas at 1 sccm, and the pressure was controlled at 2.0 Torr. The RF power was set to 0.15 W/cm³ to cause glow discharge and formation of the first p-type semiconductor layer (p1 layer, or the layer A) 105 by converting the surface of the i-type semiconductor layer into the p-type layer and to increase the bandgap thereof. After the layer was formed in a thickness of 3 nm, the RF power supply was turned off to stop the glow discharge, thus completing the formation of the first p-type semiconductor layer (p1 layer, or the layer A) 105.

(2) Formation of second p-type semiconductor layer (p2 layer, or the layer B) 106

After completion of the formation of the first p-type semiconductor layer (p1 layer, or the layer A) 105, $H_2$ gas flow was controlled at 50 sccm, $SiH_4/H_2$ gas at 0.25 sccm, and $BF_3/H_2$ gas at 1 sccm. Formation of the second p-type semiconductor layer (p2 layer, or the layer B) 106 was started under conditions to deposit μc-Si. After the RF p-type layer was formed in a thickness of 5 nm, the RF power supply was turned off to stop the glow discharge, thus completing the formation of the second p-type semiconductor layer (p2 layer, or the layer B) 106.

The other steps were the same as in Example 12.

The photovoltaic element fabricated in this example will be referred to as SC Ex 20.

Next explained are evaluation tests which were carried out on six photovoltaic elements obtained in each of Example 20 and Comparative Example 12-1.

As the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 32 shows the photoelectric conversion factor (η), open-circuit voltage ($V_{oc}$), short-circuit current ($J_{sc}$) and fill factor (F.F.)

of (SC Ex 20), which were normalized with corresponding measured values of (SC Comp Ex 12-1) being taken as 1.0.

TABLE 32

|         | P-E conversion efficiency ($\eta$) | Open-ckt volt ($V_{oc}$) | Short-ckt current ($J_{sc}$) | Fill factor (F. F.) |
|---------|------------------------------------|--------------------------|------------------------------|---------------------|
| (SC Ex 20) | 1.11                            | 1.05                     | 1.04                         | 1.02                |

From Table 32, it is found that the photovoltaic elements of (SC Ex 20) were superior in the open-circuit voltage ($V_{oc}$) and the fill factor (F.F.) as well as in the photoelectric conversion efficiency ($\eta$) to those of (SC Comp Ex 12-1).

EXAMPLE 21

This example is different from Example 20 in that the layer B was formed by depositing the p-type valence electron controlling agent, the element for increasing the bandgap of the i-type semiconductor layer, and the main constituent elements of the i-type semiconductor layer.

Namely, this example studied the case where the p-type semiconductor layer, being the second conductivity type semiconductor layer, was comprised of the layer A formed by exposing the surface of the i-type semiconductor layer to a plasma containing a p-type valence electron controlling agent and the layer B formed on the surface of the layer A by depositing thereon the p-type valence electron controlling agent, the element for increasing the bandgap of the i-type semiconductor layer, and the main constituent elements of the i-type semiconductor layer.

A process for fabricating it will be now explained according to its procedures.

(1) A stainless steel support 101 of thickness 0.5 mm and size 50×50 mm² was cleaned in acetone and isopropanol with ultrasonic waves, and thereafter was dried under warm air. After that, by means of the sputtering method, a light reflecting layer of Ag 0.3 µm thick was formed on the surface of the stainless steel support 101 at room temperature and a reflection enhancing layer of ZnO 1.0 µm thick was formed on the light reflecting layer at 350° C., thus forming the back electrode 102. The resultant obtained through these steps was a substrate 490.

(2) Using the deposition apparatus 400, the semiconductor layers each were formed on the substrate 490. The deposition apparatus 400 can perform both the microwave plasma CVD process and the RF plasma CVD process.

Feed stock gas cylinders (not shown) are connected through gas introducing pipes to the deposition apparatus. The feed stock gas cylinders all were of the grade refined at super-high purity, and they were $SiH_4$ gas cylinder, $SiF_4$ gas cylinder, $SiH_4/H_2$ (dilution rate: 10%) gas cylinder, $CH_2$ gas cylinder, $C_2H_6$ gas cylinder, $GeH_4$ gas cylinder, $GeF_4$ gas cylinder, $Si_2H_6$ gas cylinder, $PH_3/H_2$ ($PH_3$ gas diluted with $H_2$ at dilution rate: 2%) gas cylinder, $BF_3/H_2$ (dilution rate: 1%) gas cylinder, $BF_3/He$ (dilution rate: 1%) gas cylinder, $H_2$ gas cylinder, He gas cylinder, $NH_3$ gas cylinder, $O_2/He$ (dilution rate: 1%) gas cylinder, and NO gas cylinder, which were connected to the deposition apparatus.

(3) The substrate 490 was placed on the substrate carrying rails 413 in the loading chamber 401 and the inside of the loading chamber 401 was evacuated by the vacuum pump (not shown) to a pressure of about $1\times10^{-5}$ Torr.

(4) After opening the gate valve 406, the substrate was moved into the transport chamber 402 and deposition chamber 417 which had been preliminarily evacuated by the vacuum pump.

The back face of the substrate 490 was heated in close contact with the substrate heater 410, and the inside of the deposition chamber 417 was evacuated to a pressure of about $1\times10^{-5}$ Torr by the vacuum pump. The above completed preparation for film formation.

(5) For forming the RF n-type layer of a-Si (the n-type semiconductor layer formed by the RF plasma CVD process), $H_2$ gas was introduced through the gas introducing pipe 429 into the deposition chamber 417 while the flow of $H_2$ gas was controlled at 200 sccm by the mass flow controller (not shown) by opening the valve (not shown). The pressure inside the deposition chamber 417 was adjusted to 1.1 Torr by the conductance valve (not shown).

(6) The substrate heater 410 was set to keep the temperature of the substrate 490 at 350° C. When the substrate temperature became stable, $SiH_4$ gas and $PH_3/H_2$ gas were introduced through the gas introducing pipe 429 into the deposition chamber 417 by manipulating the valves. At this time, $SiH_4$ gas flow was adjusted at 2 sccm, $H_2$ gas at 50 sccm, and $PH_3/H_2$ gas at 0.5 sccm by the mass flow controllers, and the pressure inside the deposition chamber 417 was adjusted to 1.1 Torr.

(7) The power of the high frequency (hereinafter referred to as "RF") power supply 422 was set to 0.005 W/cm³, and the RF power was applied to the plasma forming cup 420 to cause glow discharge and to start formation of the RF n-type layer on the substrate. After the RF n-type layer was formed in a thickness of 20 nm, the RF power supply was turned off to stop the glow discharge, thus finishing the formation of the RF n-type layer 103.

(8) After stopping the flow of $SiH_4$ gas and $PH_3/H_2$ into the deposition chamber 417, $H_2$ gas was continuously flowed into the deposition chamber for five minutes. After that, the flow of $H_2$ was also stopped, and the inside of the deposition chamber and gas pipe were evacuated to $1\times10^{-5}$ Torr.

(9) The i-type layer 104 of a-Si was formed by the microwave plasma CVD process. First, after opening the gate valve 407, the substrate 490 was moved into the transport chamber 403 and i-type layer deposition chamber 418 which had been preliminarily evacuated by the vacuum pump. The back face of the substrate 490 was heated in close contact with the substrate heater 411, and the inside of the i-type layer deposition chamber 418 was evacuated to a pressure of about $1\times10^{-5}$ Torr by the vacuum pump.

(10) For fabricating the i-type layer, the substrate heater 411 was set to keep the temperature of the substrate 490 at 350° C., and, after the substrate was heated, the valves (not shown) were gradually opened to let $SiH_4$ gas and $H_2$ gas flow through the gas introducing pipe 449 into the i-type layer deposition chamber 418. At this time, $SiH_4$ gas flow was adjusted at 50 sccm and $H_2$ gas at 100 sccm by the respective mass flow controllers (not shown). The pressure inside the i-type layer deposition chamber 418 was controlled at 5 mTorr by adjusting the aperture of the conductance valve (not shown).

(11) The RF power supply 424 was set at 0.50 W/cm³ and the power was applied to the bias electrode 428. After that, the power of the microwave power supply was set at 0.20 W/cm³, and the microwave power was introduced through the microwave introducing waveguide tube 426 and microwave introducing window 425 into the i-type layer deposition chamber 418 to cause glow discharge. Then, by opening the shutter 427, fabrication of the i-type layer on the n-type layer was started. After the i-type layer was formed in a thickness of 0.1 µm, the microwave glow discharge was stopped and the output of bias power supply 424 was turned off, thus completing the fabrication of the i-type layer 104.

(12) By closing the valve (not shown), the flow of $SiH_4$ gas into the i-type layer deposition chamber 418 was stopped, and then $H_2$ gas was continuously flowed into the i-type layer deposition chamber 418 for two minutes. After that, by closing the valve (not shown), the inside of the i-type layer deposition chamber 418 and the gas pipe were evacuated to $1\times10^{-5}$ Torr.

(13) According to the following procedures, the surface region of the i-type semiconductor layer of a-Si was converted into a p-type region to form the first p-type semiconductor layer or p1 layer (layer A) 105 by exposing the surface of the i-type semiconductor layer of a-Si to a plasma containing a p-type valence electron controlling agent.

First, by opening the gate valve 408, the substrate 490 was moved into the transport chamber 404 and p-type layer deposition chamber 419 which had been preliminarily evacuated by the vacuum pump. The back face of the substrate 490 was heated in close contact with the substrate heater 412, and the inside of the p-type layer deposition chamber 419 was evacuated to the pressure of about $1\times10^{-5}$ Torr by the vacuum pump.

The substrate heater 412 was set so as to keep the temperature of substrate 490 at 230° C., and, after the substrate temperature became stable, He gas and $BF_3$/Me gas were introduced through the gas introducing pipe 469 into the deposition chamber 419 by manipulating the valves. At this time, He gas flow was controlled at 50 sccm and $BF_3$/He gas at 5 sccm by the mass flow controllers and the pressure inside the layer deposition chamber 419 was controlled at 2.0 Torr by adjusting the aperture of the conductance valve.

The power of the RF power supply 423 was set to 0.15 W/cm³ and the RF power was applied to the plasma forming cup 421 to cause glow discharge. By exposing the surface of the i-type semiconductor layer to the plasma containing the p-type valence electron controlling agent, the surface region of the i-type semiconductor layer started to be converted into a p-type layer to form the first p-type semiconductor layer or p1 layer (layer A). After the layer was formed in a thickness of 3 nm, the RF power supply was turned off to stop the glow discharge, thus completing the formation of the first p-type semiconductor layer or p1 layer (layer A) 105.

(14) By manipulating the valves, the flow of He gas and $BF_3$/He gas was stopped, and $H_2$ gas was further flowed at 50 sccm, $SiH_4/H_2$ gas at 0.5 sccm, $BF_3/H_2$ gas at 0.5 sccm, and $CH_4$ gas at 5 sccm. The second p-type semiconductor layer or p2 layer (layer B) containing the main constituent elements of the i-type semiconductor layer and an element for increasing the bandgap of the i-type semiconductor layer was stacked on the first p-type semiconductor layer or p1 layer (layer A). At this time, the pressure inside the p-type layer deposition chamber 419 was controlled at 2.0 Torr by adjusting the aperture of the conductance valve (not shown).

The power of the RF power supply 423 was set to 0.15 W/cm³ and the RF power was supplied to the plasma forming cup 421 to cause glow discharge, thus starting formation of the second p-type semiconductor layer or p2 layer (layer B) containing the main constituent elements of the a-SiC i-type semiconductor layer and the element for increasing the bandgap of the i-type semiconductor layer. After the RF p-type layer was formed in a thickness of 5 nm, the RF power supply was turned off to stop the glow discharge, thus completing the formation of the p-type layer of the present invention.

By closing the valves (not shown), the flow of $SiH_4/H_2$ gas, $BF_3/H_2$ gas, and $CH_4$ gas into the p-type layer deposition chamber 419 was stopped, and $H_2$ gas was continuously flowed into the p-type layer deposition chamber 419 for three minutes. After that, the flow of $H_2$ was also stopped by closing the valve (not shown), and the inside of the p-type layer deposition chamber 419 and the gas pipe were evacuated to $1\times10^{-5}$ Torr.

(15) After opening the gate valve 409, the substrate 490 was moved into the unloading chamber 405 which had been preliminarily evacuated by the vacuum pump, and the unloading chamber 405 was leaked to the atmosphere by opening the leak valve (not shown).

(16) ITO was deposited as a transparent and conductive layer 107 on the p-type layer in a thickness of 70 nm by the vacuum vapor deposition process. Next, a mask with a comb-shaped aperture was placed on the transparent and conductive layer 107, and the comb-shaped collector electrode 108 was deposited in the structure of Cr (400 nm)/Ag (1000 nm)/Cr (40 nm) by the vacuum vapor deposition process.

The foregoing concludes the fabrication of the photovoltaic element of this example (SC Ex 21).

Comparative Example 21-1

This example is different from Example 21 in that the first p-type semiconductor layer or p1 layer (layer A) was not formed. Further, the film thickness of the second p-type semiconductor layer or p2 layer (layer B) of a-SiC was 8 nm.

The other steps were the same as in Example 21.

The photovoltaic element fabricated in this example will be referred to as SC Comp Ex 21-1.

Next explained are evaluation tests which were carried out for six photovoltaic elements obtained in each of Example 21 and Comparative Example 21-1.

As the evaluation tests, V-I characteristics were observed while each photovoltaic element was placed under light irradiation of AM 1.5 (100 mW/cm²). From the results, an average value was calculated for each of photoelectric conversion efficiency ($\eta$) defined as (photoelectromotive force)/(incident light power), open-circuit voltage ($V_{oc}$), short-circuit current ($J_{sc}$) and fill factor (F.F.). Table 33 shows the photoelectric conversion factor ($\eta$), open-circuit voltage (voc), short-circuit current ($J_{sc}$), and fill factor (F.F.) of (SC Ex 21), which were normalized with corresponding measured values of (SC Comp Ex 21-1) being taken as 1.0.

TABLE 33

| | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 21) | 1.07 | 1.03 | 1.01 | 1.03 |

From Table 33, it is found that the photovoltaic elements of (SC Ex 21) were superior in the open-circuit voltage $V_{oc}$) and the fill factor (F.F.), as well as in the photoelectric conversion efficiency ($\eta$) to those of (SC Comp Ex 21-1).

In order to check the unevenness and dispersion in the substrate, a mask with twenty five holes (of the area of 0.25 cm²) was placed on the p-type layer and a film of ITO was formed as a transparent conductive layer in a thickness of 80 nm by the vacuum vapor deposition process. Table 34 shows results of unevenness and dispersion in the substrate as reflected by the open-circuit voltage ($V_{oc}$) and the fill factor (F.F.), measured for such samples. Here, the maximum value of the measured values for the same substrate was taken as 1.

TABLE 34

|  | Open-ckt voltage ($V_{oc}$) | Fill factor (F. F.) |
|---|---|---|
| SC Ex 21) | 0.98–1.00 | 0.97–1.00 |
| (SC Comp Ex 21-1) | 0.90–1.00 | 0.95–1.00 |

From Table 34, it is found that the photovoltaic elements of (SC Ex 21) had less unevenness and dispersion in the substrate, whereby uniformity of photoelectric conversion characteristics thereof was improved.

Further, in measuring the V-I characteristics of the solar cells, a blue filter (HOYA B390) was used over AM 1.5 (100 mW/cm$^2$), thereby performing measurements to strongly reflect defect density on the light incidence side. Table 35 shows results of the photoelectric conversion efficiency (η), open-circuit voltage ($V_{oc}$), short-circuit current ($J_{sc}$) and fill factor (F.F.) measured for such samples. Each value in the table indicates a numerical value normalized with a corresponding measured value of (SC Comp Ex 21-1) being taken as 1.0.

TABLE 35

|  | P-E conversion efficiency (η) | Open-ckt volt ($V_{oc}$) | Short-ckt current ($J_{sc}$) | Fill factor (F. F.) |
|---|---|---|---|---|
| (SC Ex 21) | 1.09 | 1.03 | 1.01 | 1.05 |

From a comparison of Table 35 with Table 33, it is found that an improvement in the fill factor (F.F.) in the measurement under the blue light was more noticeable than in the measurement under the white light.

It was concluded that this result showed that the interface levels in the p/i interface were decreased because almost all photocarriers were generated near the light incidence side of the i-type semiconductor layer under the blue light.

EXAMPLE 22

This example is different from Example 21 in that the following conditions were employed instead of those in Example 21 in forming the second p-type semiconductor layer or p2 layer (layer B).

(1) H$_2$ gas was flowed at 50 sccm, SiH$_4$/H$_2$ gas at 0.25 sccm, BF$_3$/H$_2$ gas at 1 sccm, and CH$_4$ gas at 0.25 sccm.
(2) The power of the RF power supply 423 was set to 0.15 W/cm$^3$ to cause glow discharge and the layer was deposited by the RF plasma CVD process under the conditions to form μc-SiC.
(3) The film thickness of the RF p-type μc-SiC layer was 5 nm.

The other steps were the same as in Example 21.

The photovoltaic element fabricated in this example will be referred to as SC Ex 22.

Comparative Example 22-1

This example is different from Example 22 in that the first p-type semiconductor layer or p1 layer (layer A) was not formed. The film thickness of the second p-type semiconductor layer or p2 layer (layer B) of pc-SiC was 8 nm.

The other steps were the same as in Example 22.

The photovoltaic element fabricated in this example will be referred to as SC Comp Ex 22-1.

Next explained are evaluation tests which were carried out on six photovoltaic elements obtained in each of Example 22 and Comparative Example 22-1.

As the evaluation tests, V-I characteristics were observed while each photovoltaic element was placed under light irradiation of AM 1.5 (100 mW/cm$^2$). From the results, an average value was calculated for each of photoelectric conversion efficiency (η), defined as (photoelectromotive force)/(incident light power), open-circuit voltage ($V_{oc}$), short-circuit current ($J_{sc}$) and fill factor (F.F.). Table 36 shows the photoelectric conversion factor (η), open-circuit voltage ($V_{oc}$), short-circuit current ($J_{sc}$), and fill factor (F.F.) of (SC Ex 22), which were normalized with corresponding measured values of (SC Comp Ex 22-1) being taken as 1.0.

TABLE 36

|  | P-E conversion efficiency (η) | Open-ckt volt ($V_{oc}$) | Short-ckt current ($J_{sc}$) | Fill factor (F. F.) |
|---|---|---|---|---|
| (SC Ex 22) | 1.08 | 1.03 | 1.01 | 1.04 |

From Table 36, it is found that the photovoltaic elements of (SC Ex 22) were superior in the open-circuit voltage ($V_{oc}$) and the fill factor (F.F.), as well as in the photoelectric conversion efficiency (η) to those of (SC Comp Ex 22-1).

EXAMPLE 23

This example is different from Example 21 in that a-SiGe was used as a material for forming an MW i-type layer (an i-type semiconductor layer formed by the microwave CVD process) instead of a-Si.

A process for fabricating the MW i-type layer of a-SiGe will now be explained according to its procedures.

(1) The substrate heater 411 was set to keep the temperature of the substrate 490 at 380° C. and, by gradually opening the valves (not shown) after the substrate was heated, SiN$_4$ gas, GeH$_4$ gas, and H$_2$ gas were flowed through the gas introducing pipe 449 into the i-type layer deposition chamber 418. At this time, SiH$_2$ gas flow was controlled at 50 sccm, GeH$_4$ gas at 35 sccm, and H$_2$ gas at 120 sccm by adjusting the respective mass flow controllers (not shown). The pressure inside the i-type layer deposition chamber 418 was controlled at 6 mTorr by adjusting the aperture of the conductance valve (not shown).

(2) The RF power supply 424 was set to 0.2 W/cm$^3$ to apply the power to the bias electrode 428. After that, the power of the microwave power supply (not shown) was set to 0.1 W/cm$^3$ and the microwave power was introduced through the microwave introducing waveguide pipe 426 and the microwave introducing window 425 into the i-type layer deposition chamber 418 to cause glow discharge. Then, by opening the shutter 427, fabrication of the MW i-type layer on the RF i-type layer was started. After the i-type layer was formed in a thickness of 0.15 μm, the microwave glow discharge was stopped and the output from the bias power supply 24 was turned off, thus completing the fabrication of the MW i-type layer 204.

(3) Then the valves (not shown) were closed to stop the flow of SiH$_4$ gas and GeH$_4$ gas into the i-type layer deposition chamber 418. After that, H$_2$ gas was continuously flowed into the i-type layer deposition chamber 418 for two minutes. Then the valve (not shown) was closed and the inside of the i-type layer deposition chamber 418 and the gas pipe were evacuated to 1×10$^{-5}$ Torr.

(4) The first p-type semiconductor layer or p1 layer (layer A) 105 was formed by exposing the surface of the i-type semiconductor layer of a-SiGe to a plasma containing the p-type valence electron controlling agent under the same conditions as in Example 21, thereby converting the surface of the i-type semiconductor layer into a p-type region.

(5) The valves (not shown) were manipulated to stop the flow of He gas and to let $H_2$ gas flow at 50 sccm, $SiH_4/H_2$ gas at 0.5 sccm, $BF_3/H_2$ gas at 0.5 sccm, and $O_2/He$ gas at 0.5 sccm. The second p-type semiconductor layer or p2 layer (layer B) containing the main constituent elements of the i-type semiconductor layer and the element for increasing the bandgap of the i-type semiconductor layer was then deposited on the first p-type semiconductor layer or p1 layer (layer A).

At this time, the pressure inside the p layer deposition chamber 419 was controlled at 2.0 Torr by adjusting the aperture of the conductance valve (not shown).

The power of the RF power supply 423 was set to 0.15 W/cm$^3$ and the RF power was applied to the plasma forming cup 421 to cause glow discharge. Then formation of the second p-type semiconductor layer or p2 layer (layer B) containing the main constituent elements of the i-type semiconductor layer of a-SiO and the element for increasing the bandgap of the i-type semiconductor layer was started. After the RF p-type layer was formed in a thickness of 5 nm, the RF power supply was turned off to stop the glow discharge, thus completing the formation of the p-type layer of the present invention.

(6) The valves (not shown) were closed to stop the flow of $SiH_4/H_2$ gas, $BF_3/H_2$ gas, and $O_2/He$ gas into the p-type layer deposition chamber 419, and $H_2$ gas was continuously flowed into the p-type layer deposition chamber 419 for three minutes. After that, the valve was closed to stop the flow of $H_2$, and the inside of the p-type layer deposition chamber 419 and the gas pipe were evacuated to $1 \times 10^{-5}$ Torr.

The other steps were the same as in Example 21.

The photovoltaic element fabricated in this example will be referred to as SC Ex 23.

Comparative Example 23-1

This example is different from Example 23 in that the first p-type semiconductor layer or p1 layer (layer A) was not formed. The film thickness of the second p-type semiconductor layer or p2 layer (layer B) of a-SiO was 8 nm. In forming the second p-type semiconductor layer or p2 layer (layer B), $H_2$ gas was flowed at 50 sccm, $SiH_4/H_2$ gas at 0.25 sccm, $BF_3/H_2$ gas at 1 sccm, and $O_2/He$ gas at 0.25 sccm.

The other steps were the same as in Example 23.

The photovoltaic element fabricated in this example will be referred to as SC Comp Ex 23-1.

Next explained are evaluation tests which were carried out on six photovoltaic elements obtained in each of Example 23 and Comparative Example 23-1.

As the evaluation tests, V-I characteristics were observed while each photovoltaic element was placed under light irradiation of AM 1.5 (100 mW/cm$^2$). From the results, an average value was calculated for each of photoelectric conversion efficiency (η), defined as (photoelectromotive force)/(incident light power), open-circuit voltage ($V_{oc}$), short-circuit current ($J_{sc}$), and fill factor (F.F.). Table 37 shows the photoelectric conversion factor (η), open-circuit voltage $V_{oc}$, short-circuit current ($J_{sc}$) and fill factor (F.F.) of (SC Ex 23), which were normalized with corresponding measured values of (SC Comp Ex 23-1) being taken as 1.0.

TABLE 37

|  | P-E conversion efficiency (η) | Open-ckt volt ($V_{oc}$) | Short-ckt current ($J_{sc}$) | Fill factor (F.F.) |
| --- | --- | --- | --- | --- |
| (SC Ex 23) | 1.07 | 1.03 | 0.99 | 1.05 |

From Table 37, it is found that the photovoltaic elements of (SC Ex 23) were superior in the open-circuit voltage ($V_{oc}$) and the fill factor (F.F.), as well as in the photoelectric conversion efficiency (η), to those of (SC Comp Ex 23-1).

EXAMPLE 24

This example is different from Example 21 in that a-SiC was used as a material for forming an MW i-type layer (an i-type semiconductor layer formed by the microwave CVD process) instead of a-Si.

A process for fabricating the MW i-type layer of a-SiC will now be explained according to its procedures.

(1) The substrate heater 411 was set to keep the temperature of the substrate 490 at 380° C. and, by gradually opening the valves (not shown) after the substrate was heated, $SiN_4$ gas, $CH_4$ gas, and $H_2$ gas were flowed through the gas introducing pipe 449 into the i-type layer deposition chamber 418. At this time, $SiH_4$ gas flow was controlled at 50 sccm, $CH_2$ gas at 35 sccm, and $H_2$ gas at 120 sccm by adjusting the respective mass flow controllers (not shown). The pressure inside the i-type layer deposition chamber 418 was controlled at 6 mTorr by adjusting the aperture of the conductance valve (not shown).

(2) The RF power supply 424 was set to 0.2 W/cm$^3$ to apply the power to the bias electrode 428. After that, the power of the microwave power supply (not shown) was set to 0.1 W/cm$^3$ and the microwave power was introduced through the microwave introducing waveguide pipe 426 and the microwave introducing window 425 into the i-type layer deposition chamber 418 to cause glow discharge. Then, by opening the shutter 427, fabrication of the MW i-type layer on the RF i-type layer was started. After the i-type layer was formed in a thickness of 0.1 μm, the microwave glow discharge was stopped and the output from the bias power supply 424 was turned off, thus completing the fabrication of the MW i-type layer 204.

The valves (not shown) were closed to stop the flow of $SiH_2$ gas and $CH_4$ gas into the i-type layer deposition chamber 418 After that $H_2$ was continuously flowed into the i-type layer deposition chamber 418 for two minutes. Then the valve (not shown) was closed and the inside of the i-type layer deposition chamber 418 and the gas pipe were evacuated to $1 \times 10^{-5}$ Torr.

(3) In forming the second p-type semiconductor layer or p2 layer (layer B) containing the main constituent elements of the i-type semiconductor layer and the element for increasing the bandgap of the i-type semiconductor layer, $H_2$ gas was flowed at 50 sccm, $SiH_4/H_2$ gas at 0.25 sccm, $BF_3/H_2$ gas at 1 sccm, and $NH_3$ gas at 0.1 sccm, and the power of the RF power supply 423 was set to 0.15 W/cm$^3$ to cause glow discharge. Deposition was effected under the conditions to form a-SiN by the RF plasma CVD process. At this time, the pressure inside the deposition chamber 419 was controlled at 2.0 Torr by adjusting the aperture of the conductance valve (not shown). Formation of the RF p-type a-SiN layer was started to form a layer in a thickness of 5 nm.

The other steps were the same as in Example 21.

The photovoltaic element fabricated in this example will be referred to as SC Ex 24.

Comparative Example 24-1

This example is different from Example 24 in that the first p-type semiconductor layer or p1 layer (layer A) was not formed. The film thickness of the second p-type semiconductor layer or p2 layer (layer B) of a-SiN was 8 nm.

The other steps were the same as in Example 24.

The photovoltaic element fabricated in this example will be referred to as SC Comp Ex 24-1.

Next explained are evaluation tests which were carried out on six photovoltaic elements obtained in each of Example 24 and Comparative Example 24-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$), and fill factor (F.F.). Table 38 shows the photoelectric conversion factor ($\eta$), open-circuit voltage ($V_{oc}$), short-circuit current ($J_{sc}$), and fill factor (F.F.) of (SC Ex 24), which were normalized with corresponding measured values of (SC Comp Ex 24-1) being taken as 1.0.

TABLE 38

| | P-E conversion efficiency ($\eta$) | Open-ckt volt ($V_{oc}$) | Short-ckt current ($J_{sc}$) | Fill factor (F. F.) |
|---|---|---|---|---|
| (SC Ex 24) | 1.07 | 1.06 | 1.00 | 1.01 |

From Table 38, it is found that the photovoltaic elements of (SC Ex 24) were superior in the open-circuit voltage ($V_{oc}$) as well as in the photoelectric conversion efficiency ($\eta$) to those of (SC Comp Ex 241).

EXAMPLE 25

This example is different from Example 21 in that Example 21 had the p layer on the light incidence side in the layer structure: substrate/n layer/i layer /p1 layer (layer A)/p2 layer (layer B) whereas this example had the n layer on the light incidence side in the layer structure: substrate/p layer/i layer/n1 layer (layer A)/n2 layer (layer B).

A process for fabricating the photovoltaic element of this example will now be explained according to its procedures.
(1) For forming the RF p-type layer 103 of a-Si, H$_2$ gas was introduced through the gas introducing pipe 469 into the deposition chamber 419 while the flow of H$_2$ gas was controlled at 200 sccm by the mass flow controller (not shown) by opening the valve (not shown). The pressure inside the deposition chamber 419 was adjusted to 1.1 Torr by the conductance valve (not shown).
(2) The substrate heater 412 was set to keep the temperature of the substrate 490 at 350° C. When the substrate temperature became stable, H$_2$ gas, SiH$_4$/H$_2$ gas and BF$_3$/H$_2$ gas were introduced through the gas introducing pipe 469 into the deposition chamber 419 by manipulating the valves. At this time, H$_2$ gas flow was adjusted at 50 sccm, SiH$_4$/H$_2$ gas at 0.5 sccm, and BF$_3$/H$_2$ gas at 5 sccm by the mass flow controllers, and the pressure inside the layer deposition chamber 419 was adjusted to 2.0 Torr by adjusting the aperture of the conductance valve (not shown).

The power of the RF power supply 423 was set to 0.15 W/cm$^3$, and the RF power was applied to the plasma forming cup 421 to cause glow discharge and to start formation of the p-type semiconductor layer of a-Si. After the RF p-type layer was formed in a thickness of 10 nm, the RF power supply was turned off to stop the glow discharge, thus finishing the formation of the p-type layer of the present invention.
(3) By closing the valves to stop the flow of SiH$_4$/H$_2$ gas and BF$_3$/H$_2$ gas into the p-type layer deposition chamber 419, H$_2$ gas was continuously flowed into the p-type layer deposition chamber 419 for three minutes. After that, the flow of H$_2$ was also stopped by closing the valve (not shown), and the inside of the p-type layer deposition chamber 419 and gas pipe were evacuated to 1×10$^{-5}$ Torr.
(4) The i-type layer 104 of a-Si was formed by the microwave plasm CVD process. First, after opening the gate valve 407, the substrate 490 was moved into the transport chamber 403 and i-type layer deposition chamber 418 which had been preliminarily evacuated by the vacuum evacuation pump. The back face of the substrate 490 was heated in close contact with the substrate heater 411, and the inside of the i-type layer deposition chamber 418 was evacuated to the pressure of about 1×10$^{-5}$ Torr by the vacuum pump.

For fabricating the i-type layer, the substrate heater 411 was set to keep the temperature of the substrate 490 at 350° C., and, after the substrate was heated, the valves (not shown) were gradually opened to let SiH$_4$ gas and H$_2$ gas flow through the gas introducing pipe 449 into the i-type layer deposition chamber 418. At this time, SiH$_4$ gas flow was adjusted at 50 sccm and H$_2$ gas at 100 sccm by the respective mass controllers (not shown). The pressure inside the i-type layer deposition chamber 418 was controlled at 5 mTorr by adjusting the aperture of the conductance valve (not shown).
(5) The RF power supply 424 was set at 0.50 W/cm$^3$ and the power was applied to the bias bar 428. After that, the power of the microwave power supply was set at 0.20 W/cm$^3$, and the microwave power was introduced through the microwave introducing waveguide tube 426 and microwave introducing window 425 into the i-type layer deposition chamber 418 to cause glow discharge. Then, by opening the shutter 427, fabrication of the i-type layer on the p-type layer was started. After the i-type layer was formed in a thickness of 0.1 μm, the microwave glow discharge was stopped and the output of bias power supply 424 was turned off, thus completing the fabrication of the i-type layer 104.

By closing the valve not shown, the flow of SiH$_4$ gas into the i-type layer deposition chamber 418 was stopped, and then H$_2$ gas was continuously flowed into the i-type layer deposition chamber 418 for two minutes. After that, by closing the valve (not shown), the inside of the i-type layer deposition chamber 418 and the gas pipe were evacuated to 1×10$^{-5}$ Torr.
(6) For forming the RF n-type layer, the first n-type semiconductor layer or n1 layer (layer A) 105 was formed by exposing the surface of the i-type semiconductor layer of a-Si to a plasma containing an n-type valence electron controlling agent so as to convert the surface of the i-type semiconductor layer into an n-type region. In forming the first n-type semiconductor layer or n1 layer (layer A) 105, the gate valve 407 was opened and the substrate 490 was moved into the transport chamber 402 and n-type layer deposition chamber 417 was preliminarily evacuated by means of the vacuum pump.
(7) The back face of the substrate 490 was heated in close contact with the substrate heater 410, and the inside of the n-type layer deposition chamber 417 was evacuated to about $1\times10^{-5}$ Torr by the vacuum pump. The substrate heater 412 was set so as to keep the temperature of substrate 490 at 230° C., and, after the substrate temperature became stable, He gas, $SiH_4$ gas, and $PH_3/H_2$ gas were introduced through the gas introducing pipe 429 into the deposition chamber 417 by manipulating the unrepresented valves. At this time, He gas flow was controlled at 50 sccm and $PH_3/H_2$ gas at 0.5 sccm by the mass flow controllers and the pressure inside the layer deposition chamber 417 was controlled at 0.5 Torr by adjusting the aperture of the conductance valve.

The power of the RF power supply 423 was set to 0.015 $W/cm^3$ and the RF power was supplied to the plasma forming cup 421 to cause glow discharge. By exposing the surface of the i-type semiconductor layer to the plasma containing an n-type valence electron controlling agent, the surface of the i-type semiconductor layer started to be converted into an n-type layer to form the first n-type semiconductor layer or n1 layer (layer A). After the layer was formed in a thickness of 3 nm, the RF power supply was turned off to stop the glow discharge, thus completing the formation of the first n-type semiconductor layer or n1 layer (layer A) 105.

(8) By manipulating the unrepresented valves, the flow of He gas was stopped, and $H_2$ gas was further flowed at 50 sccm, $SiH_4$ gas at 0.5 sccm, $PH_3/H_2$ gas at 0.5 sccm, and $O_2/He$ gas at 5 sccm. The second n-type semiconductor layer or n2 layer (layer B) containing the main constituent elements of the i-type semiconductor layer and an element for increasing the bandgap of the i-type semiconductor layer was then stacked on the first n-type semiconductor layer or n1 layer (layer A). At this time, the pressure inside the layer deposition chamber 417 was controlled at 2.0 Torr by adjusting the aperture of the conductance valve (not shown).

The power of the RF power supply 423 was set to 0.1 $W/cm^3$ and the RF power was applied to the plasma forming cup 421 to cause glow discharge, thus starting formation of the second n-type semiconductor layer or n2 layer (layer B) containing the main constituent elements of the i-type semiconductor layer of a-SiO and the element for increasing the bandgap of the i-type semiconductor layer. After the RF n-type layer was formed in a thickness of 5 nm, the RF power supply was turned off to stop the glow discharge, thus completing the formation of the n-type layer of the present invention.

(9) By closing the valves not shown, the flow of $SiH_4$ gas, $PH_3/H_2$ gas, and $O_2/He$ gas into the n-type layer deposition chamber 417 was stopped, and $H_2$ gas was continuously flowed into the n-type layer deposition chamber 417 for three minutes. After that, the flow of $H_2$ was also stopped by closing the valve (not shown), and the inside of the n-type layer deposition chamber 417 and the gas pipe were evacuated to $1\times10^{-5}$ Torr. Then the substrate 490 was moved into the unloading chamber 405 which had been preliminarily evacuated by the vacuum pump, and the unloading chamber 405 was leaked to the atmosphere by opening the leak valve (not shown).

(10) ITO was deposited as a transparent and conductive layer 107 in a thickness of 70 nm on the n-type layer by the vacuum vapor deposition process. Next, a mask with a comb-shaped aperture was placed on the transparent and conductive layer 107, and the comb-shaped collector electrode 108 was deposited in the structure of Cr (400 nm)/Ag (1000 nm)/Cr (40 nm) by the vacuum vapor deposition process.

The other steps were the same as in Example 21.

The photovoltaic element fabricated in this example will be referred to as SC Ex 25.

Comparative Example 25-1

This example is different from Example 25 in that the first n-type semiconductor layer or n1 layer (layer A) was not formed. Further, the film thickness of the second n-type semiconductor layer or n2 layer (layer B) of a-SiO was 8 nm.

The other steps were the same as in Example 25.

The photovoltaic element fabricated in this example will be referred to as SC Comp Ex 25-1.

Next explained are evaluation tests which were carried out on six photovoltaic elements obtained in each of Example 25 and Comparative Example 25-1.

As the evaluation tests, V-I characteristics were observed while each photovoltaic element was placed under light irradiation of AM 1.5 (100 $mW/cm^2$). From the results, an average value was calculated for each of photoelectric conversion efficiency ($\eta$), defined as (photoelectromotive force)/(incident light power), open-circuit voltage ($V_{oc}$), short-circuit current ($J_{sc}$), and fill factor (F.F.). Table 39 shows the photoelectric conversion factor ($\eta$), open-circuit voltage ($V_{oc}$), short-circuit current ($J_{sc}$), and fill factor (F.F.) of (SC Ex 25), which were normalized with corresponding measured values of (SC Comp Ex 25-1) being taken as 1.0.

TABLE 39

|  | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 25) | 1.07 | 1.03 | 0.99 | 1.05 |

From Table 39, it is found that the photovoltaic elements of (SC Ex 25) were superior in the open-circuit voltage ($V_{oc}$) and the fill factor (F.F.), as well as in the photoelectric conversion efficiency ($\eta$) to those of (SC Comp Ex 25-1).

In order to check the unevenness and dispersion in the substrate, a mask with twenty five holes (of the area of 0.25 $cm^2$) was placed on the p-type layer and a film of ITO was formed as a transparent conductive layer in a thickness of 80 nm by the vacuum vapor deposition process. Table 40 shows results of unevenness and dispersion in substrate reflected by the open-circuit voltage $V_{oc}$) and the fill factor (F.F.), measured for such samples. Here, the maximum value of the measured values of the same substrate was taken as 1.

TABLE 40

|  | Open-ckt voltage ($V_{oc}$) | Fill factor (F. F.) |
| --- | --- | --- |
| (SC Ex 25) | 0.98–1.00 | 0.97–1.00 |
| (SC Comp Ex 25-1) | 0.90–1.00 | 0.95–1.00 |

From Table 40, it is found that the photovoltaic elements of (SC Ex 25) had less unevenness and dispersion in the substrate, whereby uniformity of photoelectric conversion characteristics thereof is improved.

Further, in measuring the V-I characteristics of the solar cells, a blue filter (HOYA B390) was used over AM 1.5 (100 $mW/cm^2$), thereby performing measurements to strongly reflect defect density on the light incidence side. Table 41 shows results of the photoelectric conversion efficiency ($\eta$), open-circuit voltage ($V_{oc}$), short-circuit current ($J_{sc}$) and fill factor (F.F.) measured for such samples. Each value in the table indicates a numerical value normalized with a corresponding measured value of (SC Comp Ex 25-1) being taken as 1.0.

TABLE 41

| | P-E conversion efficiency ($\eta$) | Open-ckt volt ($V_{oc}$) | Short-ckt current ($J_{sc}$) | Fill factor (F.F.) |
|---|---|---|---|---|
| (SC Ex 25) | 1.10 | 1.03 | 1.00 | 1.07 |

From comparison of Table 41 with Table 39, it is found that improvement in the fill factor (F.F.) in the measurement under the blue light was more noticeable than in the measurement under the white light.

It was concluded that this result showed that the interface levels in the p/i interface were decreased because almost all photocarriers were generated near the light incidence side of the i-type semiconductor layer under the blue light.

EXAMPLE 26

This example produced a photovoltaic element of the triple cell type (the tandem stacked cell type of structure in which three pin-type semiconductor junctions are stacked) shown in FIG. 2.

The layer structure of the photovoltaic element of this example was: substrate 201/back electrode 202/first pin junction/second pin junction/third pin junction transparent electrode 215/collector electrode 216. Each pin junction was of the following layer structure from the substrate side.

The first pin junction 217 has the layer structure of, in order from the side of the back electrode 202, RF n-type layer (n1 layer) 203 of a-Si/RF i-type layer 251 of a-Si/MW i-type layer (i1 layer) 204 of a-SiGe/RF i-type layer 261 of a-Si/first p-type semiconductor layer (p11 layer, or the layer A) 205 formed by exposing the surface of the i-type semiconductor layer (RF i-type layer) 261 to a plasma containing a p-type valence electron controlling agent/second p-type semiconductor layer (p12 layer, or the layer B) 206 formed by depositing the p-type valence electron controlling agent, an element for increasing the bandgap of the i-type semiconductor layer, and the main constituent elements of the i-type semiconductor layer.

The second pin junction 218 has the layer structure of, in order from the side of the first pin junction 217, RF n-type layer (n2 layer) 207 of a-Si/RF i-type layer 252 of a-Si/MW i-type layer (i2 layer) 208 of a-SiGe/RF i-type layer 262 of a-Si/first p-type semiconductor layer (p21 layer, or the layer A) 209 formed by exposing the surface of the i-type semiconductor layer (RF i-type layer 262) to a plasma containing a p-type valence electron controlling agent/second p-type semiconductor layer (p22 layer, or the layer B) 210 formed by depositing the p-type valence electron controlling agent, an element for increasing the bandgap of the i-type semiconductor layer, and the main constituent element of the i-type semiconductor layer.

The third pin junction 219 has the layer structure of, in order from the side of the second pin junction 218, RF n-type layer (n3 layer) 211 of a-Si/RF i-type layer (i3 layer) 212 of a-Si/first p-type semiconductor layer (p31 layer, or the layer A) 213 formed by exposing the surface of the i-type semiconductor layer (i3 layer 212) to a plasma containing a p-type valence electron controlling agent second p-type semiconductor layer (p32 layer, or the layer B) 214 formed by depositing the p-type valence electron controlling agent, an element for increasing the bandgap of the i-type semiconductor layer, and the main constituent elements of the i-type semiconductor layer.

A process for fabricating the photovoltaic element of this example will now be explained according to its procedures. Numerals in parentheses represent steps, wherein (1) and (2) are preparation steps, (3)–(6) are forming steps for forming the first pin junction 217, (7)–(10) are forming steps for forming the second pin junction 218, and (11)–(14) are forming steps for forming the third pin junction 219.

(1) A substrate prepared in the same manner as in Example 1 was placed on the substrate carrying rails in the loading chamber and the inside of the loading chamber was evacuated by the vacuum pump to a pressure of about $1 \times 10^{-5}$ Torr.

(2) After opening the gate valve, the substrate was moved into the transport chamber and deposition chamber which had been preliminarily evacuated by the vacuum pump. The back face of the substrate was heated in close contact with the substrate heater, and the inside of the deposition chamber was evacuated to about $1 \times 10^{-5}$ Torr by the vacuum pump.

(3) Formation of RF n-type layer (n1 layer) 203 of a-Si

For forming the RF n-type layer, $H_2$ gas was introduced through the gas introducing pipe 429 into the deposition chamber while the flow of $H_2$ gas was controlled at 200 sccm by the mass flow controller by opening the valve. The pressure inside the deposition chamber was adjusted to 1.1 Torr by the conductance valve.

The substrate heater was set to keep the temperature of the substrate at 380° C. When the substrate temperature became stable, $SiH_4$ gas and $PH_3/H_2$ gas were introduced through the gas introducing pipe into the deposition chamber by manipulating the valves. At this time, $SiH_4$ gas flow was adjusted at 2 sccm, $H_2$ gas at 50 sccm, and $PH_3/H_2$ gas at 0.5 sccm by the mass flow controllers, and the pressure inside the deposition chamber was adjusted to 1.1 Torr.

The power of the RF power supply was set to 0.005 W/cm³, and the RF power was applied to the plasma forming cup to cause glow discharge and to start formation of the RF n-type layer on the substrate. After the RF n-type layer was formed in a thickness of 20 nm, the RF power supply was turned off to stop the glow discharge, thus finishing the formation of the RF n-type layer 203.

After stopping the flow of $SiH_4$ gas and $PH_3/H_2$ into the deposition chamber, $H_2$ gas was continuously flowed into the deposition chamber for five minutes. After that, the flow of $H_2$ was also stopped, and the inside of the deposition chamber and gas pipe was evacuated to $1 \times 10^{-5}$ Torr.

(4) The RF i-type layer 251 of a-Si, the MW i-type layer 204 of a-SiGe, and the RF i-type layer 261 of a-Si were successively formed using the RF plasma CVD process, the microwave plasma CVD process, and the RF plasma CVD process, respectively.

(4-1) After opening the gate valve, the substrate was moved into the transport chamber and i-type layer deposition chamber which had been preliminarily evacuated by means of the vacuum pump. The back face of the substrate was heated in close contact with the substrate heater, and the inside of the i-type layer deposition chamber was evacuated to a pressure of about $1 \times 10^{-5}$ Torr by the vacuum pump.

(4-2) Formation of RF i-type layer 251 of a-Si

For forming the RF i-type layer, the substrate heater was set to keep the temperature of the substrate at 350° C., and, after the substrate was heated, the valves (not shown) were gradually opened to let $Si_2H_6$ gas and $H_2$ gas flow through the gas introducing pipe into the i-type layer deposition chamber. At this time, $Si_2H_6$ gas flow was adjusted at 4 sccm and $H_2$ gas at 100 sccm by the respective mass controllers. The pressure inside the i-type layer deposition chamber was controlled at 0.8 Torr by adjusting the aperture of the conductance valve.

Next, the RF power supply was set at 0.007 W/cm$^3$ and the power was applied to the bias electrode to cause glow discharge. Then, by opening the shutter, formation of the i-type layer on the RF n-type layer was started.

After the i-type layer was formed in a thickness of 10 nm, the RF glow discharge was stopped and the output of the RF power supply was turned off, thus completing the formation of the RF i-type layer 251.

By closing the valve, the flow of Si$_2$H$_6$ gas into the i-type layer deposition chamber was stopped, and then H$_2$ gas was continuously flowed into the i-type layer deposition chamber for two minutes. After that, by closing the valve, the inside of the i-type layer deposition chamber and the gas pipe were evacuated to t1×10$^{-5}$ Torr.

(4-3) Formation of MW i-type layer (i1 layer) 204 of a-SiGe

For forming the MW i-type layer, the substrate heater was set to keep the temperature of the substrate at 380° C. and, by gradually opening the valves after the substrate was heated, SiH$_4$ gas, GeH$_4$ gas, and H$_2$ gas were flowed through the gas introducing pipe into the i-type layer deposition chamber. At this time, SiH$_4$ gas flow was controlled at 50 sccm, GeH$_4$ gas at 35 sccm, and H$_2$ gas at 120 sccm by adjusting the respective mass flow controllers. The pressure inside the i-type layer deposition chamber was controlled at 6 mTorr by adjusting the aperture of the conductance valve.

Next, the RF power supply was set to 0.2 W/cm$^3$ to apply the power to the bias electrode. After that, the power of the microwave power supply was set to 0.2 W/cm$^3$ and the microwave power was introduced through the microwave introducing waveguide pipe and the microwave introducing window into the i-type layer deposition chamber to cause glow discharge. Then, by opening the shutter, formation of the MW i-type layer on the RF i-type layer was started. After the i-type layer was formed in a thickness of 0.1 μm, the microwave glow discharge was stopped and the output from the bias power supply was turned off, thus completing the formation of the MW i-type layer 204.

Then the valves were closed to stop the flow of SiH$_4$ gas and GeH$_4$ gas into the i-type layer deposition chamber. After that, H$_2$ gas was continuously flowed into the i-type layer deposition chamber for two minutes. Then the valve was closed and the inside of the i-type layer deposition chamber and the gas pipe were evacuated to 1×10$^{-5}$ Torr.

(4-4) Formation of RF i-type layer 261 of a-Si

For forming the RF i-type layer, the substrate heater was set to keep the temperature of the substrate at 250° C. and, after the substrate was heated, the valves were gradually opened to let the Si$_2$H$_6$ gas and H$_2$ gas flow through the gas introducing pipe into the i-type layer deposition chamber. At this time, Si$_2$H$_6$ gas flow was controlled at 2 sccm and H$_2$ gas at 80 sccm by adjusting the respective mass flow controllers. The pressure inside the i-type layer deposition chamber was controlled at 0.7 Torr by adjusting the aperture of the conductance valve.

Next, the RF power supply was set to 0.007 W/cm$^3$ and the power was applied to the bias electrode to cause glow discharge. Then the shutter was opened to start formation of the RF i-type layer on the MW i-type layer. After the i-type layer was formed in a thickness of 20 nm, the RF glow discharge was stopped and the output from the RF power supply was turned off, thus completing the formation of RF i-type layer 261. The valve was closed to stop the flow of Si$_2$H$_6$ gas into the i-type layer deposition chamber and H$_2$ gas was continuously flowed into the i-type layer deposition chamber for two minutes. After that, the valve (not shown) was closed and the inside of the i-type layer deposition chamber and the gas pipe were evacuated to 1×10$^{-5}$ Torr.

(5) Formation of first p-type semiconductor layer (p11 layer, or the layer A) 205

After opening the gate valve, the substrate was moved into the carrying chamber and p-type layer deposition chamber which had been preliminarily evacuated by the vacuum pump.

The back face of the substrate was heated in close contact with the substrate heater, and the inside of the p-type layer deposition chamber was evacuated to about 1×10$^{-5}$ Torr by the vacuum pump. The substrate heater was set so as to keep the temperature of substrate at 230° C., and, after the substrate temperature became stable, He gas and BF$_3$/He gas were introduced through the gas introducing pipe 469 into the deposition chamber by manipulating the valves. At this time, He gas flow was controlled at 50 sccm and BF$_3$/He gas at 5 sccm by the mass flow controllers the pressure inside the layer deposition chamber was controlled at 2.0 Torr by adjusting the aperture of the conductance valve.

The power of the RF power supply was set to 0.1 W/cm$^3$ and the RF power was applied to the plasma forming cup to cause glow discharge. By exposing the surface of the i-type semiconductor layer to the plasma containing the p-type valence electron controlling agent, the surface of the i-type semiconductor layer started to be converted into a p-type layer to form the first p-type semiconductor layer (p11 layer, or the layer A) 205.

After the layer was formed in a thickness of 3 nm, the RF power supply was turned off to stop the glow discharge, thus completing the formation of the first p-type semiconductor layer (p11 layer, or the layer A) 205.

(6) Formation of second p-type semiconductor layer (p12 layer, or the layer B) 206

By manipulating the valves, the flow of He gas was stopped, and H$_2$ gas was flowed at 50 sccm, SiH$_4$/H$_2$ gas at 0.25 sccm, BF$_3$/H$_2$ gas at 0.5 sccm, and CH$_4$ gas at 0.25 sccm. The second p-type semiconductor layer (p12 layer, or the layer B) containing the main constituent elements of the i-type semiconductor layer and element for increasing the bandgap of the i-type semiconductor layer was then stacked on the first p-type semiconductor layer (p11 layer, or the layer A) 205. At this time, the pressure inside the layer deposition chamber was controlled at 2.0 Torr by adjusting the aperture of the conductance valve.

The power of the RF power supply was set to 0.15 W/cm$^3$ and the RF power was applied to the plasma forming cup 421 to cause glow discharge, thus starting formation of the second p-type semiconductor layer (p12 layer, or the layer B) 206 containing the main constituent elements of the i-type semiconductor layer of μc-Si and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p12 layer, or the layer B) 206.

By closing the valves, the flow of SiH$_4$/H$_2$ gas, BF$_3$/H$_2$ gas, and CH$_4$ gas into the p-type layer deposition chamber was stopped, and H$_2$ gas was continuously flowed into the p-type layer deposition chamber for three minutes. After that, the flow of H$_2$ was also stopped by closing the valve, and the inside of the p-type layer deposition chamber and the gas pipe were evacuated to 1×10$^{-5}$ Torr.

Step (3) to step (6) as described above complete the formation of the first pin junction 217.

Explained in the following are steps for forming the second pin junction 218. The operation of these steps is basically the same as that for forming the first pin junction 217 as discussed above.

(7) Formation of RF n-type layer (n2 layer) 207 of a-Si

For forming the RF n-type layer, H$_2$ gas was introduced through the gas introducing pipe into the deposition chamber while the flow of H$_2$ gas was controlled at 200 sccm by the mass flow controller by opening the valve. The pressure inside the deposition chamber was adjusted to 1.1 Torr by the conductance valve.

The substrate heater was set to keep the temperature of the substrate at 380° C. When the substrate temperature became stable, SiH$_4$ gas and PH$_3$/H$_2$ gas were introduced through the gas introducing pipe into the deposition chamber by manipulating the valves. At this time, SiH$_4$ gas flow was adjusted at 2 sccm, H$_2$ gas at 50 sccm, and PH$_3$/H$_2$ gas at 0.5 sccm by the mass flow controllers, and the pressure inside the deposition chamber was adjusted to 1.1 Torr.

The power of the RF power supply was set to 0.005 W/cm$^3$, and the RF power was applied to the plasma forming cup to cause glow discharge and to start formation of the RF n-type layer on the substrate. After the RF n-type layer was formed in a thickness of 20 nm, the RF power supply was turned off to stop the glow discharge, thus finishing the formation of the RF n-type layer 207.

After stopping the flow of SiH$_4$ gas and PH$_3$/H$_2$ into the deposition chamber, H$_2$ gas was continuously flowed into the deposition chamber for five minutes. After that, the flow of H$_2$ was also stopped, and the inside of the deposition chamber and gas pipe were evacuated to 1×10$^{-5}$ Torr.

(8) The RF i-type layer 252 of a-Si, the MW i-type layer 208 of a-SiGe, and the RF i-type layer 262 of a-Si were successively formed using the RF plasma CVD process, the microwave plasma CVD process, and the RF plasma CVD process, respectively.

(8-1) After opening the gate valve, the substrate was moved into the transport chamber and i-type layer deposition chamber which had been preliminarily evacuated by the vacuum pump. The back face of the substrate was heated in close contact with the substrate heater, and the inside of the i-type layer deposition chamber was evacuated to a pressure of about 1×10$^{-5}$ Torr by the vacuum pump.

(8-2) Formation of RF i-type layer 252 of a-Si

For forming the RF i-type layer, the substrate heater was set to keep the temperature of the substrate at 350° C., and, after the substrate was heated, the valves were gradually opened to let the Si$_2$H$_6$ gas and H$_2$ gas flow through the gas introducing pipe into the i-type layer deposition chamber. At this time, Si$_2$H$_6$ gas flow was adjusted at 4 sccm and H$_2$ gas at 100 sccm by the respective mass controllers. The pressure inside the i-type layer deposition chamber was controlled at 0.8 Torr by adjusting the aperture of the conductance valve.

Next, the RF power supply was set at 0.007 W/cm$^3$ and the power was applied to the bias electrode to cause glow discharge. Then, by opening the shutter, formation of the i-type layer on the RF n-type layer was started.

After the i-type layer was formed in a thickness of 10 nm, the RF glow discharge was stopped and the output of the RF power supply was turned off, thus completing the formation of the RF i-type layer 252.

By closing the valve, the flow of Si$_2$H$_6$ gas into the i-type layer deposition chamber was stopped, and then H$_2$ gas was continuously flowed into the i-type layer deposition chamber for two minutes. After that, by closing the valve, the inside of the i-type layer deposition chamber and the gas pipe were evacuated to 1×10$^{-5}$ Torr.

(8-3) Formation of MW i-type layer (i1 layer) 208 of a-SiGe

For forming the MW i-type layer, the substrate heater was set to keep the temperature of the substrate at 380° C. and, by gradually opening the valves after the substrate was heated, SiH$_4$ gas, GeH$_4$ gas, and H$_2$ gas were flowed through the gas introducing pipe into the i-type layer deposition chamber. At this time, SiH$_4$ gas flow was controlled at 50 sccm, GeH$_4$ gas at 35 sccm, and H$_2$ gas at 120 sccm by adjusting the respective mass flow controllers. The pressure inside the i-type layer deposition chamber was controlled at 6 mTorr by adjusting the aperture of the conductance valve.

Next, the RF power supply was set to 0.2 W/cm$^3$ to apply the power to the bias electrode. After that, the power of the microwave power supply was set to 0.2 W/cm$^3$ and the microwave power was introduced through the microwave introducing waveguide pipe and the microwave introducing window into the i-type layer deposition chamber to cause glow discharge. Then, by opening the shutter, formation of the MW i-type layer on the RF i-type layer was started. After the i-type layer was formed in the thickness of 0.1 μm, the microwave glow discharge was stopped and the output from the bias power supply was turned off, thus completing the formation of the MW i-type layer 208.

Then the valves were closed to stop the flow of SiH$_4$ gas and GeM$_4$ gas into the i-type layer deposition chamber. After that, H$_2$ gas was continuously flowed into the i-type layer deposition chamber for two minutes. Then the valve was closed and the inside of the i-type layer deposition chamber and the gas pipe were evacuated to 1×10$^{-5}$ Torr.

(8-4) Formation of RF i-type layer 262 of a-Si

For forming the RF i-type layer, the substrate heater was set to keep the temperature of the substrate at 250° C. and, after the substrate was heated, the valves were gradually opened to let the Si$_2$H$_6$ gas and H$_2$ gas flow through the gas introducing pipe into the i-type layer deposition chamber. At this time, Si$_2$H$_6$ gas flow was controlled at 2 sccm and H$_2$ gas at 80 sccm by adjusting the respective mass flow controllers. The pressure inside the i-type layer deposition chamber was controlled at 0.7 Torr by adjusting the aperture of the conductance valve.

Next, the RF power supply was set to 0.007 W/cm$^3$ and the power was applied to the bias electrode to cause glow discharge. Then the shutter was opened to start formation of the RF i-type layer on the MW i-type layer. After the i-type layer was formed in a thickness of 20 nm, the RF glow discharge was stopped and the output from the RF power supply was turned off, thus completing the formation of RF i-type layer 262.

The valve was then closed to stop the flow of Si$_2$H$_6$ gas into the i-type layer deposition chamber and H$_2$ gas was continuously flowed into the i-type layer deposition chamber for two minutes. After that, the valve was closed and the inside of the i-type layer deposition chamber and the gas pipe were evacuated to 1×10$^{-5}$ Torr.

(9) Formation of first p-type semiconductor layer (p21 layer, or the layer A) 209

After opening the gate valve, the substrate was moved into the transport chamber and p-type layer deposition chamber which had been preliminarily evacuated by the vacuum pump.

The back face of the substrate was heated in close contact with the substrate heater, and the inside of the p-type layer deposition chamber was evacuated to the pressure of about 1×10$^{-5}$ Torr by the vacuum evacuation pump. The substrate heater was set so as to keep the temperature of substrate at 230° C., and, after the substrate temperature became stable, He gas and BF$_3$/He gas were introduced through the gas introducing pipe into the deposition chamber by manipulating the valves. At this time, He gas flow was controlled at 50 sccm and BF$_3$/He gas at 5 sccm by the mass flow controllers and the pressure inside the layer deposition chamber was controlled at 1.0 Torr by adjusting the aperture of the conductance valve.

The power of the RF power supply was set to 0.15 W/cm$^3$ and the RF power was applied to the plasma forming cup to cause glow discharge. By exposing the surface of the i-type semiconductor layer to the plasma containing the p-type valence electron controlling agent, the surface of the i-type semiconductor layer started to be converted into a p-type layer to form the first p-type semiconductor layer (p21 layer, or the layer A) 209. After the layer was formed in a thickness of 3 nm, the RF power supply was turned off to stop the glow discharge, thus completing the formation of the first p-type semiconductor layer (p21 layer) 209.

(10) Formation of second p-type semiconductor layer (p22 layer, or the layer B) 210

By manipulating the valves, the flow of He gas was stopped, and $H_2$ gas was flowed at 50 sccm, $SiH_4/H_2$ gas at 0.25 sccm, $BF_3/H_2$ gas at 0.5 sccm, and $CH_4$ gas at 0.25 sccm. The second p-type semiconductor layer (p22 layer, or the layer B) containing the main constituent elements of the i-type semiconductor layer of μc-SiC and an element for increasing the bandgap of the i-type semiconductor layer, was then stacked on the first p-type semiconductor layer (p21 layer, or the layer A) 209 by the RF plasma CVD process. At this time, the pressure inside the layer deposition chamber was controlled at 2.0 Torr by adjusting the aperture of the conductance valve.

The power of the RF power supply was set to 0.15 W/cm$^3$ and the RF power was introduced to the plasma forming cup to cause glow discharge, thus starting formation of the second p-type semiconductor layer (p22 layer, or the layer B) 210 containing the main constituent elements of the i-type semiconductor layer of μc-SiC and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p22 layer, or the layer B) 210.

By closing the valves, the flow of $SiH_4/H_2$ gas, $BF_3/H_2$ gas, and $CH_4$ gas into the p-type layer deposition chamber was stopped, and $H_2$ gas was continuously flowed into the p-type layer deposition chamber for three minutes. After that, the flow of $H_2$ was also stopped by closing the valve, and the inside of the p-type layer deposition chamber and the gas pipe were evacuated to 1×10$^{-5}$ Torr.

Step (7) to step (10) as described above complete the formation of the second pin junction 218.

Explained in the following are steps for forming the third pin junction 219.

(11) Formation of RF n-type layer (n3 layer) 211 of a-Si

For forming the RF n-type layer, $H_2$ gas was introduced through the gas introducing pipe into the deposition chamber while the flow of $H_2$ gas was controlled at 200 sccm by the mass flow controller by opening the valve. The pressure inside the deposition chamber was adjusted to 1.1 Torr by the conductance valve.

The substrate heater was set to keep the temperature of the substrate at 350° C. When the substrate temperature became stable, $SiH_4$ gas and $PH_3/H_2$ gas were introduced through the gas introducing pipe into the deposition chamber by manipulating the valves. At this time, $SiH_4$ gas flow was adjusted to 2 sccm, $H_2$ gas to 50 sccm, and $PH_3/H_2$ gas to 0.5 sccm by the mass flow controllers, and the pressure inside the deposition chamber was adjusted to 1.1 Torr.

The power of the RF power supply was set to 0.005 W/cm$^3$, and the RF power was applied to the plasma forming cup to cause glow discharge and to start formation of the RF n-type layer on the substrate. After the RF n-type layer was formed in a thickness of 10 nm, the RF power supply was turned off to stop the glow discharge, thus finishing the formation of the RF n-type layer 211.

After stopping the flow of $SiH_4$ gas and $PH_3/H_2$ into the deposition chamber, $H_2$ gas was continuously flowed into the deposition chamber for two minutes. After that, the flow of $H_2$ was also stopped, and the inside of the deposition chamber and gas pipe were evacuated to 1×10$^{-5}$ Torr.

(12) Formation of RF i-type layer 212 of a-Si

After opening the gate valve, the substrate was moved into the transport chamber and i-type layer deposition chamber which had been preliminarily evacuated by the vacuum pump. The back face of the substrate was heated in close contact with the substrate heater, and the inside of the i-type layer deposition chamber was evacuated to about 1×10$^{-5}$ Torr by the vacuum pump.

For forming the RF i-type layer 212, the substrate heater was set to keep the temperature of the substrate at 200° C., and, after the substrate was heated, the valves were gradually opened to let $Si_2H_6$ gas and $H_2$ gas flow through the gas introducing pipe into the i-type layer deposition chamber. At this time, $Si_2H_6$ gas flow was adjusted to 2 sccm and $H_2$ gas to 80 sccm by the respective mass controllers. The pressure inside the i-type layer deposition chamber was controlled at 0.6 Torr by adjusting the aperture of the conductance valve (not shown).

Next, the RF power supply was set at 0.07 W/cm$^3$ and the power was applied to the bias electrode to cause glow discharge. Then, by opening the i-type, formation of the i-type layer on the RF n-type layer 211 was started. After the i-type layer was formed in a thickness of 120 nm, the RF glow discharge was stopped and the output of the RF power supply was turned off, thus completing the formation of the RF i-type layer 212.

By closing the valve, the flow of $Si_2H_6$ gas into the i-type layer deposition chamber was stopped, and then $H_2$ gas was continuously flowed into the i-type layer deposition chamber for two minutes. After that, by closing the valve, the inside of the i-type layer deposition chamber and the gas pipe were evacuated to 1×10$^{-5}$ Torr.

(13) Formation of first p-type semiconductor layer (p31 layer, or the layer A) 213

After opening the gate valve, the substrate was moved into the transport chamber and p-type layer deposition chamber which had been preliminarily evacuated by the vacuum pump.

The back face of the substrate was heated in close contact with the substrate heater, and the inside of the p-type layer deposition chamber was evacuated to a pressure of about 1×10$^{-5}$ Torr by the vacuum pump. The substrate heater was set so as to keep the temperature of the substrate at 170° C., and, after the substrate temperature became stable, He gas and $BF_3$/He gas were introduced through the gas introducing pipe into the deposition chamber by manipulating the valves. At this time, He gas flow was controlled at 50 sccm and $BF_3$/He gas at 5 sccm by the mass flow controllers and the pressure inside the layer deposition chamber was controlled at 2.0 Torr by adjusting the aperture of the conductance valve.

The power of the RF power supply was set to 0.15 W/cm$^3$ and the RF power was applied to the plasma forming cup to cause glow discharge. By exposing the surface of the i-type semiconductor layer to a plasma containing a p-type valence electron controlling agent, the surface of the i-type semiconductor layer started to be converted into a p-type layer to form the first p-type semiconductor layer (p31 layer, or the layer A) 213. After the layer was formed in a thickness of 3 nm, the RF power supply was turned off to stop the glow discharge, thus completing the formation of the first p-type semiconductor layer (p31 layer, or the layer A) 213.

(14) Formation of second p-type semiconductor layer (p32 layer, or the layer B) 214

By manipulating the valves, the flow of He gas was stopped, and $H_2$ gas was let to flow at 50 sccm, $SiH_4/H_2$ gas at 0.25 sccm, $BF_3/H_2$ gas at 0.5 sccm, and $CH_4$ gas at 0.25 sccm. The second p-type semiconductor layer (p32 layer, or the layer B) containing the main constituent elements of the i-type semiconductor layer of μc-SiC and an element for increasing the bandgap of the i-type semiconductor layer, was stacked on the first p-type semiconductor layer (p31 layer, or the layer A) 213 by the RF plasma CVD process. At this time, the pressure inside the layer deposition chamber was controlled at 2.0 Torr by adjusting the aperture of the conductance valve.

The power of the RF power supply was set to 0.15 W/cm³ and the RF power was introduced to the plasma forming cup 421 to cause glow discharge, thus starting formation of the second p-type semiconductor layer (p32 layer, or the layer B) 214 containing the main constituent elements of the i-type semiconductor layer of pc-SiC and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p32 layer) 214.

By closing the valves, the flow of $SiH_4/H_2$ gas, $BF_3/H_2$ gas, and $CH_4$ gas into the p-type layer deposition chamber was stopped, and $H_2$ gas was continuously flowed into the p-type layer deposition chamber for three minutes. After that, the flow of $H_2$ was also stopped by closing the valve, and the inside of the p-type layer deposition chamber and the gas pipe were evacuated to $1\times10^{-5}$ Torr.

Step (11) to step (14) as described above complete the formation of the third pin junction 219.

(15) Formation of transparent and conductive layer 215 and collector electrode 216

After opening the gate valve, the substrate was carried into the unloading chamber which had been preliminarily evacuated by the vacuum evacuation pump, and the unloading chamber was leaked to the atmosphere by opening the leak valve.

Next, ITO was deposited as a transparent and conductive layer 215 in a thickness of 70 nm on the RF p-type layer 214 by the vacuum vapor deposition process.

Next, a mask with a comb-shaped aperture was placed on the transparent and conductive layer 212, and the comb-shaped collector electrode 216 was deposited in the structure of Cr (400 nm)/Ag (1000 nm)/Cr (40 nm) by the vacuum vapor deposition process.

The foregoing concludes the fabrication of the photovoltaic element of this example. The photovoltaic element fabricated in this example will be referred to as SC Ex 26.

Comparative Example 26-1

This example is different from Example 26 in that the first p-type semiconductor layers (p11 layer, p21 layer, p31 layer, or the layers A) were not formed. Further, the film thickness of the second p-type semiconductor layers (p12 layer, p22 layer, p32 layer, or the layers B) of μc-SiC was 8 nm.

The other steps were the same as in Example 26.

The photovoltaic element fabricated in this example will be referred to as SC Comp Ex 26-1.

Next explained are evaluation tests which were carried out on six photovoltaic elements obtained in each of Example 26 and Comparative Example 26-1.

As the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$), and fill factor (F.F.). Table 42 shows the photoelectric conversion factor (η), open-circuit voltage ($V_{oc}$), short-circuit current ($J_{sc}$), and fill factor (F.F.) of (SC Ex 26), which were normalized with corresponding measured values of (SC Comp Ex 26-1) being taken as 1.0.

TABLE 42

|  | P-E conversion efficiency (η) | Open-ckt volt ($V_{oc}$) | Short-ckt current ($J_{sc}$) | Fill factor (F. F.) |
| --- | --- | --- | --- | --- |
| (SC Ex 26) | 1.08 | 1.05 | 1.01 | 1.02 |

From Table 42, it is found that the photovoltaic elements of (SC Ex 26) were superior in the open-circuit voltage ($V_{oc}$) and the fill factor (F.F.), as well as in the photoelectric conversion efficiency (η) to those of (SC Comp Ex 26-1).

In order to check the unevenness and dispersion in the substrate, a mask with twenty five holes (of the area of 0.25 cm²) was placed on the p-type layer and a film of ITO was formed as a transparent conductive layer in a thickness of 70 nm by the vacuum vapor deposition process. Table 43 shows results of unevenness and dispersion in substrate as reflected by the open-circuit voltage ($V_{oc}$) and the fill factor (F.F.), measured for such samples. Here, the maximum value out of the measured values for the same substrate was taken as 1.

TABLE 43

|  | Open-ckt voltage ($V_{oc}$) | Fill factor (F. F.) |
| --- | --- | --- |
| (SC Ex 26) | 0.98–1.00 | 0.98–1.00 |
| (SC Comp Ex 26-1) | 0.94–1.00 | 0.95–1.00 |

From Table 43, it is found that the photovoltaic elements of (SC Ex 26) had less unevenness and dispersion in the substrate, whereby uniformity of photoelectric conversion characteristics thereof was improved.

EXAMPLE 27

This example is different from Example 26 in that Example 26 formed a photovoltaic element of the triple cell type with the p layers on the light incidence side whereas this example formed a photovoltaic element of the triple cell type with the n layers on the light incidence side, similar to Example 25.

The other steps were the same as in Example 26.

Explained in the following is the formation of the n-type layer in a process for fabricating the photovoltaic element of this example.

(1) The surface of the i-type semiconductor layer (RF i-type layer 261, RF i-type layer 262, i3 layer) of a-Si was exposed to a plasma containing the n-type valence electron controlling agent so as to convert the surface of the i-type semiconductor layer into an n-type region, thereby forming the first n-type semiconductor layer (n11 layer, n21 layer, n31 layer, or the layer A) in a thickness of 3 nm.

(2) The n-type valence electron controlling agent, an element for increasing the bandgap of the i-type semiconductor layer, and the main constituent elements of the i-type semiconductor layer were deposited on the surface of the first n-type semiconductor layer (n11 layer, n21 layer, n31 layer, or the layer A), thereby forming the second n-type semiconductor layer (n12 layer, n22 layer, n32 layer, or the layer B) in a thickness of 5 nm.

The photovoltaic element fabricated in this example will be referred to as SC Ex 27.

Comparative Example 27-1

This example is different from Example 27 in that the first n-type semiconductor layers (n11 layer, n21 layer, n31 layer, or the layers A) were not formed. Further, the film thickness of the second n-type semiconductor layers (n12 layer, n22 layer, n32 layer, or the layers B) of a-SiO was 8 nm.

The other steps were the same as in Example 27.

The photovoltaic element fabricated in this example will be referred to as SC Comp Ex 27-1.

Next explained are evaluation tests which were carried out on six photovoltaic elements obtained in each of Example 27 and Comparative Example 27-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$), and fill factor (F.F.). Table 44 shows the photoelectric conversion factor ($\eta$), open-circuit voltage ($V_{oc}$), short-circuit current ($J_{sc}$) and fill factor (F.F.) of (SC Ex 27), which were normalized with corresponding measured values of (SC Comp Ex 27-1) being taken as 1.0.

TABLE 44

|  | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 27) | 1.08 | 1.05 | 1.01 | 1.02 |

From Table 44, it is found that the photovoltaic elements of (SC Ex 27) were superior in the open-circuit voltage ($V_{oc}$) and the fill factor (F.F.), as well as in the photoelectric conversion efficiency ($\eta$), to those of (SC Comp Ex 27-1).

In order to check the unevenness and dispersion in the substrate, a mask with twenty five holes (of the area of 0.25 cm$^2$) was placed on the p-type layer and a film of ITO was formed as a transparent conductive layer in a thickness of 70 nm by the vacuum vapor deposition process. Table 45 shows results of unevenness and dispersion in substrate as reflected by the open-circuit voltage ($V_{oc}$) and the fill factor (F.F.), measured for such samples. Here, the maximum value out of the measured values for the same substrate was taken as 1.

TABLE 45

|  | Open-ckt voltage ($V_{oc}$) | Fill factor (F. F.) |
| --- | --- | --- |
| (SC Ex 7) | 0.98–1.00 | 0.98–1.00 |
| (SC Comp Ex 7-1) | 0.94–1.00 | 0.95–1.00 |

From Table 45, it is found that the photovoltaic elements of (SC Ex 27) had less unevenness and dispersion in the substrate, whereby uniformity of photoelectric conversion characteristics thereof was improved.

EXAMPLE 28

This example is different from Example 26 in that the following conditions were employed instead of those in Example 26 in forming the first p-type semiconductor layers (p11 layer, p21 layer, p31 layer, or the layers A).

(1) H$_2$ gas flow was controlled at 50 sccm, SiH$_4$/H$_2$ gas at 0.25 sccm, and BF$_3$/H$_2$ gas at 1 sccm.

The other steps were the same as in Example 26.

The photovoltaic element fabricated in this example will be referred to as SC Ex 28.

This solar cell was evaluated by SIMS, which showed that the first p-type semiconductor layer had a hydrogen content larger than that of the i-type semiconductor layer.

Next explained are evaluation tests which were carried out on six photovoltaic elements obtained in each of Example 28 and Comparative Example 26-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$) and fill factor (F.F.). Table 46 shows the photoelectric conversion factor ($\eta$), open-circuit voltage ($V_{oc}$), short-circuit current ($J_{sc}$), and fill factor (F.F.) of (SC Ex 28), which were normalized with corresponding measured values of (SC Comp Ex 26-1) being taken as 1.0.

TABLE 46

|  | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 28) | 1.09 | 1.04 | 1.00 | 1.05 |

From Table 46, it is found that the photovoltaic elements of (SC Ex 28) were superior in the open-circuit voltage ($V_{oc}$) and the fill factor (F.F.), as well as in the photoelectric conversion efficiency ($\eta$) to those of (SC Comp Ex 26-1).

EXAMPLE 29

This example is different from Example 26 in that the layer A was formed by exposing the surface of the i-type semiconductor layer to a plasma containing the p-type valence electron controlling agent and element for increasing the bandgap of the i-type semiconductor layer and the layer B was formed by depositing the p-type valence electron controlling agent, the element for increasing the bandgap of the i-type semiconductor layer, and the main constituent elements of the i-type semiconductor layer.

Namely, studied with this example was a case where the p-type semiconductor layer, being the second conductivity type semiconductor layer, was comprised of the layer A formed by exposing the surface of the i-type semiconductor layer to a plasma containing a p-type valence electron controlling agent and an element for increasing the bandgap of the i-type semiconductor layer, and the layer B formed on the surface of the layer A by depositing the p-type valence electron controlling agent, the element for increasing the bandgap of the i-type semiconductor layer, and the main constituent elements of the i-type semiconductor layer thereon.

A process for fabricating it will be explained according to its procedures.

(1) A stainless steel support 101 of thickness 0.5 mm and size 50×50 mm$^2$ was cleaned in acetone and isopropanol with ultrasonic waves, and thereafter was dried under warm air. After that, by means of the sputtering method, a light reflecting layer of Ag 0.3 µm thick was formed on the surface of the stainless steel support 101 at room temperature and a reflection enhancing layer of ZnO 1.0 μm thick was formed on the light reflecting layer at 350° C., thus forming the back electrode 102. The resultant obtained through these steps was a substrate 490.

(2) Using the deposition apparatus 400, the semiconductor layers each were formed on the substrate 490. The deposition apparatus 400 can perform both the microwave plasma CVD process and the RF plasma CVD process.

Feed stock gas cylinders (not shown) are connected through gas introducing pipes to the deposition apparatus. The feed stock gas cylinders all were of the grade refined at super-high purity, and they were $SiH_4$ gas cylinder, $SiF_4$ gas cylinder, $SiH_4/H_2$ (dilution rate: 10%) gas cylinder, $CH_4$ gas cylinder, $C_2H_6$ gas cylinder, $GeH_4$ gas cylinder, $GeF_4$ gas cylinder, $Si_2H_6$ gas cylinder, $PH_3/H_2$ ($PH_3$ gas diluted with $H_2$ at dilution rate: 2%) gas cylinder, $BF_3/H_2$ (dilution rate: 1%) gas cylinder, $BF_3/He$ (dilution rate: 1%) gas cylinder, $H_2$ gas cylinder, He gas cylinder, $NH_3$ gas cylinder, $O_2/He$ (dilution rate: 1%) gas cylinder, and NO gas cylinder, which were connected to the deposition apparatus.

(3) The substrate 490 was placed on the substrate carrying rails 413 in the loading chamber 401 and the inside of the loading chamber 401 was evacuated by the vacuum pump to a pressure of about $1\times10^{-5}$ Torr.

(4) After opening the gate valve 406, the substrate was moved into the transport chamber 402 and deposition chamber 417 which had been preliminarily evacuated to a vacuum by the vacuum evacuation pump. The back face of the substrate 490 was heated in close contact with the substrate heater 410, and the inside of the deposition chamber 417 was evacuated to a pressure of about $1\times10^{-5}$ Torr by the vacuum evacuation pump. The above completed preparation for film formation.

(5) For forming the RF n-type layer of a-Si (the n-type semiconductor layer formed by the RF plasma CVD process), $H_2$ gas was introduced through the gas introducing pipe 429 into the deposition chamber 417 while the flow of $H_2$ gas was controlled at 200 sccm by the mass flow controller (not shown) as opening the valve (not shown). The pressure inside the deposition chamber 417 was adjusted to be 1.1 Torr by the conductance valve (not shown).

(6) The substrate heater 410 was set to keep the temperature of the substrate 490 at 350° C. When the substrate temperature became stable, $SiH_4$ gas and $PH_3/H_2$ gas were introduced through the gas introducing pipe 429 into the deposition chamber 417 by manipulating the valves. At this time, $SiH_4$ gas flow was adjusted to 2 sccm, $H_2$ gas to 50 sccm, and $PH_3/H_2$ gas to 0.5 sccm by the mass flow controllers, and the pressure inside the deposition chamber 417 was adjusted to 1.1 Torr.

(7) The power of the high frequency (hereinafter referred to as "RF") power supply 422 was set to 0.005 W/cm³, and the RF power was applied to the plasma forming cup 420 to cause glow discharge and to start formation of the RF n-type layer on the substrate. After the RF n-type layer was formed in a thickness of 20 nm, the RF power supply was turned off to stop the glow discharge, thus finishing the formation of the RF n-type layer 103.

(8) After stopping the flow of $SiH_4$ gas and $PH_3/H_2$ into the deposition chamber 417, $H_2$ gas was continuously flowed into the deposition chamber for five minutes. After that, the flow of $H_2$ was also stopped, and the inside of the deposition chamber and gas pipe were evacuated to $1\times10^{-5}$ Torr.

(9) The i-type layer 104 of a-Si was formed by the microwave plasm CVD process. First, after opening the gate valve 407, the substrate 490 was moved into the transport chamber 403 and i-type layer deposition chamber 418 which had been preliminarily evacuated by the vacuum pump. The back face of the substrate 490 was heated in close contact with the substrate heater 411, and the inside of the i-type layer deposition chamber 418 was evacuated to a pressure of about $1\times10^{-5}$ Torr by the vacuum pump.

(10) For fabricating the i-type layer, the substrate heater 411 was set to keep the temperature of the substrate 490 at 350° C., and, after the substrate was heated, the valves (not shown) were gradually opened to let $SiH_4$ gas and $H_2$ gas flow through the gas introducing pipe 449 into the i-type layer deposition chamber 418. At this time, $SiH_4$ gas flow was adjusted to 50 sccm and $H_2$ gas to 100 sccm by the respective mass controllers (not shown). The pressure inside the i-type layer deposition chamber 418 was controlled at 5 mTorr by adjusting the aperture of the conductance valve (not shown).

(11) The RF power supply 424 was set at 0.50 W/cm³ and the power was applied to the bias electrode 428. After that, the power of the microwave power supply was set at 0.20 W/cm³, and the microwave power was introduced through the microwave introducing waveguide tube 426 and microwave introducing window 425 into the i-type layer deposition chamber 418 to cause glow discharge. Then, by opening the shutter 427, fabrication of the i-type layer on the n-type layer was started. After the i-type layer was formed in a thickness of 0.1 μm, the microwave glow discharge was stopped and the output of bias power supply 424 was turned off, thus completing the fabrication of the i-type layer 104.

(12) By closing the valve (not shown), the flow of $SiH_4$ gas into the i-type layer deposition chamber 418 was stopped, and then $H_2$ gas was continuously flowed into the i-type layer deposition chamber 418 for two minutes. After that, by closing the valve (not shown), the inside of the i-type layer deposition chamber 418 and the gas pipe were evacuated to $1\times10^{-5}$ Torr.

(13) According to the following procedures, the surface of the i-type semiconductor layer of a-Si was converted into a p-type region and the bandgap was increased to form the first p-type semiconductor layer or p1 layer (layer A) 105 by exposing the surface of the i-type semiconductor layer of a-Si to a plasma containing a p-type valence electron controlling agent and an element for increasing the bandgap of the i-type semiconductor layer.

First, after opening the gate valve 408, the substrate 490 was moved into the transport chamber 404 and p-type layer deposition chamber 419 which had been preliminarily evacuated by the vacuum pump. The back face of the substrate 490 was heated in close contact with the substrate heater 412, and the inside of the p-type layer deposition chamber 419 was evacuated to a pressure of about $1\times10^{-5}$ Torr by the vacuum pump.

The substrate heater 412 was set so as to keep the temperature of substrate 490 at 230° C., and, after the substrate temperature became stable, He gas and $BF_3/He$ gas and $CH_4$ gas were introduced through the gas introducing pipe 469 into the deposition chamber 419 by manipulating the valves. At this time, He gas flow was controlled at 50 sccm and $BF_3/He$ gas at 5 sccm by the mass flow controllers and the pressure inside the layer deposition chamber 419 was controlled at 2.0 Torr by adjusting the aperture of the conductance valve.

The power of the RF power supply 423 was set to 0.15 W/cm³ and the RF power was applied to the plasma forming cup 421 to cause glow discharge. By exposing the surface of the i-type semiconductor layer to the plasma containing the p-type valence electron controlling agent and the element for increasing the bandgap of the i-type semiconductor layer, the surface of the i-type semiconductor layer started to be converted into the p-type layer and increase its bandgap to form the first p-type semiconductor layer or p1 layer (layer A). After the layer was formed in a thickness of 3 nm, the RF power supply was turned off to stop the glow discharge, thus completing the formation of the first p-type semiconductor layer or p1 layer (layer A) 105.

(14) By manipulating the unrepresented valves, the flow of He gas and $BF_3$/He gas was stopped, and $H_2$ gas was further flowed at 50 sccm, $SiH_4/H_2$ gas at 0.5 sccm, $BF_3/H_2$ gas at 0.5 sccm, and $CH_4$ gas at 5 sccm. The second p-type semiconductor layer or p2 layer (layer B) containing the main constituent elements of the i-type semiconductor layer and the element for increasing the bandgap of the i-type semiconductor layer was stacked on the first p-type semiconductor layer or p1 layer (layer A). At this time, the pressure inside the p-type layer deposition chamber 419 was controlled at 2.0 Torr by adjusting the aperture of the conductance valve (not shown).

The power of the RF power supply 423 was set to 0.15 W/cm$^3$ and the RF power was applied to the plasma forming cup 421 to cause glow discharge, thus starting formation of the second p-type semiconductor layer or p2 layer (layer B) of a-SiC. After the RF p-type layer was formed in a thickness of 5 nm, the RF power supply was turned off to stop the glow discharge, thus completing the formation of the p-type layer of the present invention.

By closing the valves (not shown), the flow of $SiH_4/H_2$ gas, $BF_3/H_2$ gas, and $CH_2$ gas into the p-type layer deposition chamber 419 was stopped, and $H_2$ gas was continuously flowed into the p-type layer deposition chamber 419 for three minutes. After that, the flow of $H_2$ was also stopped by closing the valve (not shown), and the inside of the p-type layer deposition chamber 419 and the gas pipe were evacuated to $1 \times 10^{-5}$ Torr.

(15) After opening the gate valve 409, the substrate 490 was moved into the unloading chamber 405 which had been preliminarily evacuated by the vacuum pump, and the unloading chamber 405 was leaked to the atmosphere by opening the leak valve (not shown).

(16) ITO was deposited as a transparent and conductive layer 107 in a thickness of 70 nm on the p-type layer by the vacuum vapor deposition process. Next, a mask with a comb-shaped aperture was mounted on the transparent and conductive layer 107, and the comb-shaped collector electrode 168 was deposited in the structure of Cr (40 nm)/Ag (1000 nm)/Cr (40 nm) by the vacuum vapor deposition process.

The foregoing concludes the fabrication of the photovoltaic element of this example (SC Ex 29).

Comparative Example 29-1

This example is different from Example 29 in that the first p-type semiconductor layer or p1 layer (layer A) was not formed. Further, the film thickness of the second p-type semiconductor layer or p2 layer (layer B) of a-SiC was 8 nm.

The other steps were the same as in Example 29.

The photovoltaic element fabricated in this example will be referred to as SC Comp Ex 29-1.

Next explained are evaluation tests which were carried out on six photovoltaic elements obtained in each of Example 29 and Comparative Example 29-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$), and fill factor (F.F.). Table 47 shows the photoelectric conversion factor ($\eta$), open-circuit voltage ($V_{oc}$), short-circuit current ($J_{sc}$) and fill factor (F.F.) of (SC Ex 29), which were normalized with corresponding measured values of (SC Comp Ex 29-1) being taken as 1.0.

TABLE 47

|  | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 29) | 1.09 | 1.06 | 1.01 | 1.02 |

From Table 47, it is found that the photovoltaic elements of (SC Ex 29) were superior in the open-circuit voltage ($V_{oc}$) and the fill factor (F.F.), and particularly superior in the photoelectric conversion efficiency ($\eta$) to those of (SC Comp Ex 29-1).

In order to check the unevenness and dispersion in the substrate, a mask with twenty five holes (of the area of 0.25 cm$^2$) was placed on the p-type layer and a film of ITO was formed as a transparent conductive layer in a thickness of 70 nm by the vacuum vapor deposition process. Table 48 shows results of unevenness and dispersion in substrate as reflected by the open-circuit voltage ($V_{oc}$) and the fill factor (F.F.), measured for such samples. Here, the maximum value out of the measured values for the same substrate was taken as 1.

TABLE 48

|  | Open-ckt voltage ($V_{oc}$) | Fill factor (F. F.) |
| --- | --- | --- |
| (SC Ex 29) | 0.98–1.00 | 0.97–1.00 |
| (SC Comp Ex 29-1) | 0.90–1.00 | 0.95–1.00 |

From Table 48, it is found that the photovoltaic elements of (SC Ex 29) had less unevenness and dispersion in the substrate, whereby uniformity of photoelectric conversion characteristics thereof was improved.

Further, in measuring the V-I characteristics of the solar cells, a blue filter (HOYA B390) was used over AM 1.5 (100 mW/cm$^2$), thereby performing measurements to strongly reflect defect density on the light incidence side. Table 49 shows results of the photoelectric conversion efficiency ($\eta$), open-circuit voltage ($V_{oc}$), short-circuit current ($J_{sc}$) and fill factor (F.F.) measured for such samples. Each value in the table indicates a numerical value normalized with a corresponding measured value of (SC Comp Ex 29-1) being taken as 1.0.

TABLE 49

|  | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 29) | 1.12 | 1.05 | 1.02 | 1.05 |

From comparison of Table 49 with Table 47, it is found that the improvement in the fill factor (F.F.) in the measurement under the blue light was more noticeable than in the measurement under the white light.

It was concluded that this result showed that the interface levels in the p/i interface were decreased because almost all photocarriers were generated near the light incidence side of the i-type semiconductor layer under the blue light.

EXAMPLE 30

This example is different from Example 29 in that the following conditions were employed instead of those in Example 29 in forming the second p-type semiconductor layer or p2 layer (layer B).

(1) $H_2$ gas was flowed at 50 sccm, $SiH_4/H_2$ gas at 0.25 sccm, $BF_3/H_2$ gas at 1 sccm, and $CH_4$ gas at 2.5 sccm.

(2) The power of the RF power supply 423 was set to 0.15 W/cm³ to cause glow discharge and the layer was deposited under the conditions to form μc-SiC by the RF plasma CVD process.

(3) The film thickness of the RF p-type μc-SiC layer was 5 nm.

The other steps were the same as in Example 29.

The photovoltaic element fabricated in this example will be referred to as SC Ex 30.

Comparative Example 30-1

This example is different from Example 30 in that the first p-type semiconductor layer or p1 layer (layer A) was not formed. The film thickness of the second p-type semiconductor layer or p2 layer (layer B) of μc-SiC was 8 nm.

The other steps were the same as in Example 30.

The photovoltaic element fabricated in this example will be referred to as SC Comp Ex 30-1.

Next explained are evaluation tests which were carried out on six photovoltaic elements obtained in each of Example 30 and Comparative Example 30-1.

As the evaluation tests, V-I characteristics were observed while each photovoltaic element was placed under light irradiation of AM 1.5 (100 mW/cm²). From the results, an average value was calculated for each of photoelectric conversion efficiency (η) defined as (photoelectromotive force)/(incident light power), open-circuit voltage ($V_{oc}$), short-circuit current ($J_{sc}$) and fill factor (F.F.). Table 50 shows the photoelectric conversion factor (η), open-circuit voltage ($V_{oc}$), short-circuit current ($J_{sc}$) and fill factor (F.F.) of (SC Ex 30), which were normalized with corresponding measured values of (SC Comp Ex 30-1) being taken as 1.0.

TABLE 50

|  | P-E conversion efficiency (η) | Open-ckt volt ($V_{oc}$) | Short-ckt current ($J_{sc}$) | Fill factor (F.F.) |
|---|---|---|---|---|
| (SC Ex 30) | 1.11 | 1.05 | 1.01 | 1.05 |

From Table 50, it is found that the photovoltaic elements of (SC Ex 30) were superior in the open-circuit voltage ($V_{oc}$) and the fill factor (F.F.), as well as in the photoelectric conversion efficiency (η), to those of (SC Comp Ex 30-1).

EXAMPLE 31

This example is different from Example 29 in that a-SiGe was used as the material for forming an MW i-type layer (an i.-type semiconductor layer formed by the microwave CVD process) instead of a-Si.

A process for fabricating the MW i-type layer of a-SiGe will now be explained according to its procedures.

(1) The substrate heater 411 was set to keep the temperature of the substrate 490 at 380° C. and, by gradually opening the valves (not shown) after the substrate was heated, $SiH_4$ gas, $GeH_4$ gas, and $H_2$ gas were flowed through the gas introducing pipe 449 into the i-type layer deposition chamber 418. At this time, $SiH_4$ gas flow was controlled at 50 sccm, $GeH_4$ gas at 35 sccm, and $H_2$ gas at 120 sccm by adjusting the respective mass flow controllers (not shown). The pressure inside the i-type layer deposition chamber 418 was controlled at 6 mTorr by adjusting the aperture of the conductance valve (not shown).

(2) The RF power supply 424 was set to 0.2 W/cm³ to apply the power to the bias electrode 428. After that, the power of the microwave power supply (not shown) was set to 0.1 W/cm³ and the microwave power was introduced through the microwave introducing waveguide pipe 426 and the microwave introducing window 425 into the i-type layer deposition chamber 418 to cause glow discharge. Then, by opening the shutter 427, fabrication of the MW i-type layer on the RF i-type layer was started. After the i-type layer was formed in a thickness of 0.15 μm, the microwave glow discharge was stopped and the output from the bias power supply 424 was turned off, thus completing the fabrication of the MW i-type layer 204.

(3) Then the valves (not shown) were closed to stop the flow of $SiH_4$ gas and $GeH_4$ gas into the i-type layer deposition chamber 418. After that, $H_2$ gas was continuously flowed into the i-type layer deposition chamber 418 for two minutes. Then the valve (not shown) was closed and the inside of the i-type layer deposition chamber 418 and the gas pipe were evacuated to 1×10⁵ Torr.

(4) For forming the first p-type semiconductor layer or p1 layer 105, the surface of the i-type semiconductor layer of a-SiGe was exposed to a plasma containing a p-type valence electron controlling agent and an element for increasing the bandgap of the i-type semiconductor layer, thereby converting the surface region of the i-type semiconductor layer into the p-type region and increasing the bandgap thereof, He gas, $BF_3$/He gas, and $O_2$/He gas were introduced into the deposition chamber. At this time, He gas flow was controlled at 50 sccm, $BF_3$/He gas at 5 sccm, and $O_2$/He gas at 5 sccm by adjusting the mass flow controllers (not shown), and the pressure was controlled at 2.0 Torr.

The RF power was set to 0.15 W/cm³ to cause glow discharge, and formation of the first p-type semiconductor layer or p1 layer was started by exposing the surface of the i-type semiconductor layer to the plasma containing the p-type valence electron controlling agent and the element for increasing the bandgap of the i-type semiconductor layer, thereby converting the i-type semiconductor layer near the surface into the p-type region and increasing the bandgap thereof. After the layer was formed in a thickness of 3 nm, the RF power supply was turned off to stop the glow discharge, thus completing the formation of the first p-type semiconductor layer or p1 layer 105.

(5) The valves (not shown) were manipulated to stop the flow of He gas and to let $H_2$ gas flow at 50 sccm, $SiH_4/H_2$ gas at 0.5 sccm, $BF_3/H_2$ gas at 0.5 sccm, and $O_2$/He gas at 0.5 sccm. The second p-type semiconductor layer or p2 layer containing the main constituent elements of the i-type semiconductor layer and the elements for increasing the bandgap of the i-type semiconductor layer was then deposited on the first p-type semiconductor layer or p1 layer. At this time, the pressure inside the p layer deposition chamber 419 was controlled at 2.0 Torr by adjusting the aperture of the conductance valve (not shown).

The power of the RF power supply 423 was set to 0.15 W/cm$^3$ and the RF power was supplied to the plasma forming cup 421 to cause glow discharge. Then formation of the second p-type semiconductor layer or p2 layer containing the main constituent elements of the i-type semiconductor layer of a-SiO and the element for increasing the bandgap of the i-type semiconductor layer was started. After the RF p-type layer was formed in a thickness of 5 nm, the RF power supply was turned off to stop the glow discharge, thus completing the formation of the p-type layer of the present invention.

(6) The valves (not shown) were closed to stop the flow of SiH$_4$/H$_2$ gas, BF$_3$/H$_2$ gas, and O$_2$/He gas into the p-type layer deposition chamber 419, and H$_2$ gas was continuously flowed into the p-type layer deposition chamber 419 for three minutes. After that, the valve was closed to stop the flow of H$_2$, and the inside of the p-type layer deposition chamber 419 and the gas pipe were evacuated to $1 \times 10^{-5}$ Torr.

The other steps were the same as in Example 29.

The photovoltaic element fabricated in this example will be referred to as SC Ex 31.

Comparative Example 31-1

This example is different from Example 31 in that the first p-type semiconductor layer or p1 layer (layer A) was not formed. The film thickness of the second p-type semiconductor layer or p2 layer (layer B) of a-SiO was 8 nm.

The other steps were the same as in Example 31.

The photovoltaic element fabricated in this example will be referred to as SC Comp Ex 31-1.

Next explained are evaluation tests which were carried out on six photovoltaic elements obtained in each of Example 31 and Comparative Example 31-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$) and fill factor (F.F.). Table 51 shows the photoelectric conversion factor ($\eta$), open-circuit voltage ($V_{oc}$), short-circuit current ($J_{sc}$) and fill factor (F.F.) of (SC Ex 31), which were normalized with corresponding measured values of (SC Comp Ex 31-1) being taken as 1.0.

TABLE 51

|  | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 31) | 1.09 | 1.04 | 0.99 | 1.06 |

From Table 51, it is found that the photovoltaic elements of (SC Ex 31) were superior in the open-circuit voltage $V_{oc}$ and the fill factor (F.F.), as well as in the photoelectric conversion efficiency ($\eta$) to those of (SC Comp Ex 31-1).

EXAMPLE 32

This example is different from Example 29 in that a-SiC was used as a material for forming a MW i-type layer (an i-type semiconductor layer formed by the microwave CVD process) instead of a-Si.

A process for fabricating the MW i-type layer of a-SiC will now be explained according to its procedures.

(1) The substrate heater 411 was set to keep the temperature of the substrate 490 at 380° C. and, by gradually opening the valves (not shown) after the substrate was heated, SiH$_4$ gas, CH$_4$ gas, and H$_2$ gas were flowed through the gas introducing pipe 449 into the i-type layer deposition chamber 418. At this time, SiH$_4$ gas flow was controlled at 50 sccm, CH$_4$ gas at 35 sccm, and H$_2$ gas at 120 sccm by adjusting the respective mass flow controllers (not shown). The pressure inside the i-type layer deposition chamber 418 was controlled at 6 mTorr by adjusting the aperture of the conductance valve (not shown).

(2) The RF power supply 424 was set to 0.2 W/cm$^3$ to apply the power to the bias electrode 428. After that, the power of the microwave power supply (not shown) was set to 0.1 W/cm$^3$ and the microwave power was introduced through the microwave introducing waveguide pipe 426 and the microwave introducing window 425 into the i-type layer deposition chamber 418 to cause glow discharge. Then, by opening the shutter 427, fabrication of the MW i-type layer was started on the RF i-type layer. After the i-type layer was formed in a thickness of 0.1 μm, the microwave glow discharge was stopped and the output from the bias power supply 424 was turned off, thus completing the fabrication of the MW i-type layer 204.

The valves (not shown) were closed to stop the flow of SiH$_4$ gas and CH$_4$ gas into the i-type layer deposition chamber 418. After that, H$_2$ gas was continuously flowed into the i-type layer deposition chamber 418 for two minutes. Then the valve (not shown) was closed and the inside of the i-type layer deposition chamber 418 and the gas pipe were evacuated to $1 \times 10^{-5}$ Torr.

(3) For forming the first p-type semiconductor layer or p1 layer 105, the surface of the i-type semiconductor layer of a-SiC was exposed to a plasma containing a p-type valence electron controlling agent and an element for increasing the bandgap of the i-type semiconductor layer, thereby converting the surface of the i-type semiconductor layer near the surface into a p-type region and increasing the bandgap thereof, He gas, BF$_3$/He gas, and NH$_3$ gas were introduced into the deposition chamber. At this time, He gas flow was controlled at 50 sccm, BF$_3$/He gas at 5 sccm, and NH$_3$ gas at 5 sccm by adjusting the mass flow controllers (not shown), and the pressure was controlled at 2.0 Torr.

The RF power was set to 0.15 W/cm$^3$ to cause glow discharge, and formation of the first p-type semiconductor layer or p1 layer was started by exposing the surface of the i-type semiconductor layer to the plasma containing the p-type valence electron controlling agent and the element for increasing the bandgap of the i-type semiconductor layer, thereby converting the surface of the i-type semiconductor layer into the p-type region and increasing the bandgap thereof. After the layer was formed in a thickness of 3 nm, the RF power supply was turned off to stop the glow discharge, thus completing the formation of the first p-type semiconductor layer or p1 layer 105.

(4) The valves (not shown) were manipulated to stop the flow of He gas and to let H$_2$ gas flow at 50 sccm, SiH$_4$/H$_2$ gas at 0.25 sccm, BF$_3$/H$_2$ gas at 1 sccm, and NH$_3$ gas at 0.1 sccm. The second p-type semiconductor layer or p2 layer containing the main constituent element of the i-type semiconductor layer and an element for increasing the bandgap thereof was then deposited on the first p-type semiconductor layer or p1 layer. At this time, the pressure inside the p layer deposition chamber 419 was controlled at 2.0 Torr by adjusting the aperture of the conductance valve (not shown).

The power of the RF power supply 423 was set to 0.15 W/cm$^3$ and the RF power was applied to the plasma forming cup 421 to cause glow discharge. Then formation of the second p-type semiconductor layer or p2 layer containing the main constituent elements of the i-type semiconductor layer of a-SiN and the element for increasing the bandgap of the i-type semiconductor layer was started. After the RF p-type layer was formed in a thickness of 5 nm, the RF power supply was turned off to stop the glow discharge, thus completing the formation of the p-type layer of the present invention.

(5) The valves (not shown) were closed to stop the flow of $SiH_4/H_2$ gas, $BF_3/H_2$ gas, and $NH_3$ gas into the p-type layer deposition chamber 419, and $H_2$ gas was continuously flowed into the p-type layer deposition chamber 419 for three minutes. After that, the valve was closed to stop the flow of $H_2$, and the inside of the p-type layer deposition chamber 419 and the gas pipe were evacuated to a vacuum of $1 \times 10^{-5}$ Torr.

The other steps were the same as in Example 29.

The photovoltaic element fabricated in this example will be referred to as SC Ex 32.

Comparative Example 32-1

This example is different from Example 32 in that the first p-type semiconductor layer or p1 layer (layer A) was not formed. The film thickness of the second p-type semiconductor layer or p2 layer (layer B) of a-SiN was 8 nm.

The other steps were the same as in Example 32.

The photovoltaic element fabricated in this example will be referred to as SC Comp Ex 32-1.

Next explained are evaluation tests which were carried out on six photovoltaic elements obtained in each of Example 32 and Comparative Example 32-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$), and fill factor (F.F.). Table 52 shows the photoelectric conversion factor ($\eta$), open-circuit voltage ($V_{oc}$), short-circuit current ($J_{sc}$), and fill factor (F.F.) of (SC Ex 32), which were normalized with corresponding measured values of (SC Comp Ex 32-1) being taken as 1.0.

TABLE 52

| | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 32) | 1.08 | 1.04 | 1.00 | 1.04 |

From Table 52, it is found that the photovoltaic elements of (SC Ex 32) were superior in the open-circuit voltage ($V_{oc}$) and the fill factor (F.F.), as well as in the photoelectric conversion efficiency ($\eta$) to those of (SC Comp Ex 32-1).

EXAMPLE 33

This example is different from Example 29 in that Example 29 had the p layer on the light incidence side in the layer structure: substrate/n layer/i layer /p1 layer (layer A)/p2 layer (layer B), whereas this example had the n layer on the light incidence side in the layer structure: substrate/p layer/i layer/n1 layer (layer A)/n2 layer (layer B).

A process for fabricating the photovoltaic element of this example will now be explained according to its procedures.

(1) For forming the RF p-type layer 103 of a-Si, $H_2$ gas was introduced through the gas introducing pipe 469 into the deposition chamber 419 while the flow of $H_2$ gas was controlled at 200 sccm by the mass flow controller (not shown) by opening the valve (not shown). The pressure inside the deposition chamber 419 was adjusted to 1.1 Torr by the conductance valve (not shown).

(2) The substrate heater 412 was set to keep the temperature of the substrate 490 at 350° C. When the substrate temperature became stable, $H_2$ gas, $SiH_4/H_2$ gas and $BF_3/H_2$ gas were introduced through the gas introducing pipe 469 into the deposition chamber 419 by manipulating the valves. At this time, $H_2$ gas flow was adjusted to 50 sccm, $SiH_4/H_2$ gas to 0.5 sccm, and $BF_3/H_2$ gas to 5 sccm by the mass flow controllers, and the pressure inside the layer deposition chamber 419 was adjusted to 2.0 Torr by adjusting the aperture of the conductance valve (not shown).

The power of the RF power supply 423 was set to 0.15 W/cm$^3$, and the RF power was applied to the plasma forming cup 421 to cause glow discharge and to start formation of the p-type semiconductor layer of a-Si. After the RF p-type layer was formed in a thickness of 10 nm, the RF power supply was turned off to stop the glow discharge, thus finishing the formation of the p-type layer of the present invention.

(3) By closing the valves to stop the flow of $SiH_4/H_2$ gas and $BF_3/H_2$ gas into the p-type layer deposition chamber 419, $H_2$ gas was continuously flowed into the p-type layer deposition chamber 419 for three minutes.

After that, the flow of $H_2$ was also stopped by closing the valve (not shown), and the inside of the p-type layer deposition chamber 419 and gas pipe were evacuated to $1 \times 10^{-5}$ Torr.

(4) The i-type layer 104 of a-Si was formed by the microwave plasma CVD process. First, after opening the gate valve 407, the substrate 490 was moved into the transport chamber 403 and i-type layer deposition chamber 418 which had been preliminarily evacuated by the vacuum pump. The back face of the substrate 490 was heated in close contact with the substrate heater 411, and the inside of the i-type layer deposition chamber 418 was evacuated to a pressure of about $1 \times 10^{-5}$ Torr by the vacuum pump.

For fabricating the i-type layer, the substrate heater 411 was set to keep the temperature of the substrate 490 at 350° C., and, after the substrate was heated, the valves (not shown) were gradually opened to let $SiH_4$ gas and $H_2$ gas flow through the gas introducing pipe 449 into the i-type layer deposition chamber 418. At this time, $SiH_4$ gas flow was adjusted to 50 sccm and $H_2$ gas to 100 sccm by the respective mass controllers (not shown). The pressure inside the i-type layer deposition chamber 418 was controlled at 5 mTorr by adjusting the aperture of the conductance valve (not shown).

(5) The RF power supply 424 was set at 0.50 W/cm$^3$ and the power was applied to the bias electrode 428. After that, the power of the microwave power supply was set at 0.20 W/cm$^3$, and the microwave power was introduced through the microwave introducing waveguide tube 426 and microwave introducing window 425 into the i-type layer deposition chamber 418 to cause glow discharge. Then, by opening the shutter 427, fabrication of the i-type layer on the p-type layer was started. After the i-type layer was formed in a thickness of 0.1 μm, the microwave glow discharge was stopped and the output of bias power supply 424 was turned off, thus completing the fabrication of the i-type layer 104.

By closing the valve (not shown), the flow of $SiH_4$ gas into the i-type layer deposition chamber 418 was stopped, and then H$_2$ gas was continuously flowed into the i-type layer deposition chamber 418 for two minutes. After that, by closing the valve, the inside of the i-type layer deposition chamber 418 and the gas pipe were evacuated to 1×10$^{-5}$ Torr.

(6) For forming the RF n-type layer, the first n-type semiconductor layer or n1 layer (layer A) 105 was formed by exposing the surface of the i-type semiconductor layer of a-Si to a plasma containing an n-type valence electron controlling agent and an element for increasing the bandgap thereof so as to convert the surface region of the i-type semiconductor layer into an n-type region and to increase the bandgap thereof. In forming the first n-type semiconductor layer or n1 layer (layer A) 105, the gate valve 407 was opened and the substrate 490 was moved into the transport chamber 402 and n-type layer deposition chamber 417 which had been preliminarily evacuated by the vacuum pump.

(7) The back face of the substrate 490 was heated in close contact with the substrate heater 410, and the inside of the n-type layer deposition chamber 417 was evacuated to a pressure of about 1×10$^{-5}$ Torr by the vacuum pump. The substrate heater 412 was set so as to keep the temperature of substrate 490 at 230° C., and, after the substrate temperature became stable, He gas, PH$_3$/H$_2$ gas, and NO gas were introduced through the gas introducing pipe 429 into the deposition chamber 417 by manipulating the valves. At this time, He gas flow was controlled at 50 sccm, PH$_3$/H$_2$ gas at 0.5 sccm, and NO gas at 0.5 sccm by the mass flow controllers and the pressure inside the layer deposition chamber 417 was controlled at 0.5 Torr by adjusting the aperture of the conductance valve.

The power of the RF power supply 423 was set to 0.015 W/cm$^3$ and the RF power was applied to the plasma forming cup 421 to cause glow discharge. By exposing the surface of the i-type semiconductor layer to the plasma containing the n-type valence electron controlling agent and the element for increasing the bandgap of the i-type semiconductor layer, the i-type semiconductor layer near the surface started to be converted into the n-type layer and to increase the bandgap thereof to form the first n-type semiconductor layer or n1 layer (layer A). After the layer was formed in a thickness of 3 nm, the RF power supply was turned off to stop the glow discharge, thus completing the formation of the first n-type semiconductor layer or n1 layer (layer A) 105.

(8) By manipulating the valves, the flow of He gas was stopped, and H$_2$ gas was further flowed at 50 sccm, SiH$_4$ gas at 0.5 sccm, PH$_3$/H$_2$ gas at 0.5 sccm, and NO gas at 0.5 sccm. The second n-type semiconductor layer or n2 layer (layer B) containing the main constituent elements of the i-type semiconductor layer and the element for increasing the bandgap thereof was then stacked on the first n-type semiconductor layer or n1 layer (layer A). At this time, the pressure inside the layer deposition chamber 417 was controlled at 2.0 Torr by adjusting the aperture of the conductance valve (not shown).

The power of the RF power supply 423 was set to 0.1 W/cm$^3$ and the RF power was applied to the plasma forming cup 421 to cause glow discharge, thus starting formation of the second n-type semiconductor layer or n2 layer (layer B) containing the main constituent elements of the i-type semiconductor layer of a-Si and the element for increasing the bandgap thereof. After the RF n-type layer was formed in a thickness of 5 nm, the RF power supply was turned off to stop the glow discharge, thus completing the formation of the n-type layer of the present invention.

(9) By closing the valves (not shown), the flow of SiH$_4$ gas and PH$_3$/H$_2$ gas into the n-type layer deposition chamber 417 was stopped, and H$_2$ gas was continuously flowed into the n-type layer deposition chamber 417 for three minutes. After that, the flow of H$_2$ was also stopped by closing the valve, and the inside of the n-type layer deposition chamber 417 and the gas pipe were evacuated to 1×10$^{-5}$ Torr. Then the substrate 490 was moved into the unloading chamber 405 which had been preliminarily evacuated by the vacuum evacuation pump, and the unloading chamber 405 was leaked to the atmosphere by opening the leak valve (not shown).

(10) ITO was then deposited as a transparent and conductive layer 107 in a thickness of 80 nm on the n-type layer by the vacuum vapor deposition process. Next, a mask with a comb-shaped aperture was placed on the transparent and conductive layer 107, and the comb-shaped collector electrode 108 was deposited in the structure of Cr (40 nm)/Ag (1000 nm)/Cr (40 nm) by the vacuum vapor deposition process.

The other steps were the same as in Example 29.

The photovoltaic element fabricated in this example will be referred to as SC Ex 33.

Comparative Example 33-1

This example is different from Example 33 in that the first n-type semiconductor layer or n1 layer (layer A) was not formed. Further, the film thickness of the second n-type semiconductor layer or n2 layer (layer B) of a-SiO was 8 nm.

The other steps were the same as in Example 33.

The photovoltaic element fabricated in this example will be referred to as SC Comp Ex 33-1.

Next explained are evaluation tests which were carried out on six photovoltaic elements obtained in each of Example 33 and Comparative Example 33-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$), defined as (photoelectromotive force)/(incident light power), open-circuit voltage ($V_{oc}$), short-circuit current ($J_{sc}$), and fill factor (F.F.). Table 53 shows the photoelectric conversion factor ($\eta$), open-circuit voltage ($V_{oc}$), short-circuit current ($J_{sc}$), and fill factor (F.F.) of (SC Ex 33), which were normalized with corresponding measured values of (SC Comp Ex 33-1) being taken as 1.0.

TABLE 53

| | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 33) | 1.08 | 1.05 | 1.00 | 1.03 |

From Table 53, it is found that the photovoltaic elements of (SC Ex 33) were superior in the open-circuit voltage ($V_{oc}$) and the fill factor (F.F.), as well as in the photoelectric conversion efficiency ($\eta$) to those of (SC Comp Ex 33-1).

In order to check the unevenness and dispersion in the substrate, a mask with twenty five holes (of the area of 0.25 cm$^2$) was placed on the p-type layer and a film of ITO was formed as a transparent conductive layer in a thickness of 80 nm by the vacuum vapor deposition process. Table 54 shows results of unevenness and dispersion in substrate as reflected by the open-circuit voltage ($V_{oc}$) and the fill factor (F.F.), measured for such samples. Here, the maximum value of the measured values for the same substrate was taken as 1.

TABLE 54

|  | Open-ckt voltage ($V_{oc}$) | Fill factor (F. F.) |
| --- | --- | --- |
| (SC Ex 33) | 0.98–1.00 | 0.97–1.00 |
| (SC Comp Ex 33-1) | 0.90–1.00 | 0.95–1.00 |

From Table 54, it is found that the photovoltaic elements of (SC Ex 33) had less unevenness and dispersion in the substrate, whereby uniformity of photoelectric conversion characteristics thereof was improved.

Further, in measuring the V-I characteristics of the solar cells, a blue filter (HOYA B390) was used over AM 1.5 (100 mW/cm$^2$), thereby performing measurements to strongly reflect defect density on the light incidence side. Table 55 shows results of the photoelectric conversion efficiency ($\eta$), open-circuit voltage ($V_{oc}$), short-circuit current ($J_{sc}$) and fill factor (F.F.) measured for such samples. Each value in the table indicates a numerical value normalized with a corresponding measured value of (SC Comp Ex 33-1) being taken as 1.0.

TABLE 55

|  | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex. 33) | 1.10 | 1.05 | 1.00 | 1.05 |

From comparison of Table 55 with Table 53, it is found that an improvement in the fill factor (F.F.) in the measurement under the blue light was more noticeable than in the measurement under the white light.

It was concluded that this result showed that the interface levels in the p/i interface were decreased because almost all photocarriers were generated near the light incidence side of the i-type semiconductor layer under the blue light.

EXAMPLE 34

This example produced a photovoltaic element of the triple cell type (the stacked cell type of structure in which three pin-type semiconductor junctions are stacked) shown in FIG. 2.

The layer structure of the photovoltaic element of this example was: substrate 201/back electrode 202/first pin junction/second pin junction/third pin junction transparent electrode 215/collector electrode 216. Each pin junction was of the following layer structure from the substrate side:

The first pin junction 217 has the layer structure of, in order from the side of the back electrode 202, RF n-type layer (n1 layer) 203 of a-Si/RF i-type layer 251 of a-Si/MW i-type layer (i1 layer) 204 of a-SiGe RF i-type layer 261 of a-Si/first p-type semiconductor layer (p11 layer, or the layer A) 205 formed by exposing the surface of the i-type semiconductor layer (RF i-type layer 261) to a plasma containing the p-type valence electron controlling agent and an element for increasing the bandgap of the i-type semiconductor layer/second p-type semiconductor layer (p12 layer, or the layer B) 206 formed by depositing the p-type valence electron controlling agent, the element for expanding the bandgap of the i-type semiconductor layer, and the main constituent elements of the i-type semiconductor layer.

The second pin junction 218 has the layer structure of, in order from the side of the first pin junction 217, RF n-type layer (n2 layer) 207 of a-Si/RF i-type layer 252 of a-Si/MW i-type layer (i2 layer) 208 of a-SiGe/RF i-type layer 262 of a-Si/first p-type semiconductor layer (p21 layer, or the layer A) 209 formed by exposing the surface of the i-type semiconductor layer (RF i-type layer 262) to a plasma containing the p-type valence electron controlling agent and an element for increasing the bandgap of the i-type semiconductor layer/second p-type semiconductor layer (p22 layer, or the layer B) 210 formed by depositing the p-type valence electron controlling agent, the element for increasing the bandgap of the i-type semiconductor layer, and the main constituent elements of the i-type semiconductor layer.

The third pin junction 219 has the layer structure of, in order from the side of the second pin junction 218, RF n-type layer (n3 layer) 211 of a-Si/RF i-type layer (i3 layer) 212 of a-Si/first p-type semiconductor layer (p31 layer, or the layer A) 213 formed by exposing the surface of the i-type semiconductor layer (i3 layer 212) to a plasma containing a p-type valence electron controlling agent and an element for increasing the bandgap of the i-type semiconductor layer/second p-type semiconductor layer (p32 layer, or the layer B) 214 formed by depositing the p-type valence electron controlling agent, the element for increasing the bandgap of the i-type semiconductor layer, and the main constituent elements of the i-type semiconductor layer.

A process for fabricating the photovoltaic element of this example will be explained according to its procedures. Numerals in parentheses represent steps, wherein (1) and (2) are preparation steps, (3)–(6) forming steps for forming the first pin junction 217, ($\eta$)–(10) forming steps for forming the second pin junction 218, and (11)–(14) forming steps for forming the third pin junction 219.

(1) A substrate prepared in the same manner as in Example 29 was placed on the substrate carrying rails in the loading chamber and the inside of the load chamber was evacuated to a vacuum pump to a pressure of about $1\times10^{-5}$ Torr.

(2) After opening the gate valve, the substrate was moved into the transport chamber and deposition chamber which had been preliminarily evacuated by the vacuum pump. The back face of the substrate was heated in close contact with the substrate heater, and the inside of the deposition chamber was evacuated to a pressure of about $1\times10^{-5}$ Torr by the vacuum pump.

(3) Formation of RF n-type layer (n1 layer) 203 of a-Si

For forming the RF n-type layer, H$_2$ gas was introduced through the gas introducing pipe into the deposition chamber while the flow of H$_2$ gas was controlled at 200 sccm by the mass flow controller by opening the valve. The pressure inside the deposition chamber was adjusted to 1.1 Torr by the conductance valve (not shown).

The substrate heater was set to keep the temperature of the substrate at 380° C. When the substrate temperature became stable, SiH$_4$ gas and PH$_3$/H$_2$ gas were introduced through the gas introducing pipe into the deposition chamber by manipulating the valves. At this time, SiH$_4$ gas flow was adjusted to 2 sccm, H$_2$ gas to 50 sccm, and PH$_3$/H$_2$ gas to 0.5 sccm by the mass flow controllers, and the pressure inside the deposition chamber was adjusted to 1.1 Torr.

The power of the RF power supply was set to 0.005 W/cm$^3$, and the RF power was applied to the plasma forming cup to cause glow discharge and to start formation of the RF n-type layer on the substrate. After the RF n-type layer was formed in a thickness of 20 nm, the RF power supply was turned off to stop the glow discharge, thus completing formation of the RF n-type layer 203.

After stopping the flow of SiH$_2$ gas and PHs/H$_2$ into the deposition chamber, H$_2$ gas was continuously flowed into the deposition chamber for five minutes. After that, the flow of $H_2$ was also stopped, and the inside of the deposition chamber and gas pipe were evacuated to $1\times10^{-5}$ Torr.

(4) The RF i-type layer 251 of a-Si, the MW i-type layer 204 of a-SiGe, and the RF i-type layer 261 of a-Si were successively formed using the RF plasma CVD process, the microwave plasma CVD process, and the RF plasma CVD process, respectively.

(4-1) After opening the gate valve, the substrate was moved into the transport chamber and i-type layer deposition chamber which had been preliminarily evacuated by the vacuum pump. The back face of the substrate was heated in close contact with the substrate heater, and the inside of depositioned layer deposition chamber was evacuated to a pressure of about $1\times10^{-5}$ Torr by the vacuum pump.

(4-2) Formation of RF i-type layer 251 of a-Si

For forming the RF i-type layer, the substrate heater was set to keep the temperature of the substrate at 350° C., and, after the substrate was heated, the valves (not shown) were gradually opened to let $Si_2H_6$ gas and $H_2$ gas flow through the gas introducing pipe into the i-type layer deposition chamber. At this time, $Si_2H_6$ gas flow was adjusted to 4 sccm and $H_2$ gas to 100 sccm by the respective mass controllers. The pressure inside the i-type layer deposition chamber was controlled at 0.8 Torr by adjusting the aperture of the conductance valve.

Next, the RF power supply was set at 0.007 W/cm³ and the power was applied to the bias electrode to cause glow discharge. Then, by opening the shutter, formation of the i-type layer on the RF n-type layer was started.

After the i-type layer was formed in a thickness of 10 nm, the RF glow discharge was stopped and the output of the RF power supply was turned off, thus completing the formation of the RF i-type layer 251.

By closing the valve, the flow of $Si_2H_6$ gas into the i-type layer deposition chamber was stopped, and then $H_2$ gas was continuously flowed into the i-type layer deposition chamber for two minutes. After that, by closing the valve, the inside of the i-type layer deposition chamber and the gas pipe were evacuated to $1\times10^{-5}$ Torr.

(4-3) Formation of MW i-type layer (i1 layer) 204 of a-SiGe

For forming the MW i-type layer, the substrate heater was set to keep the temperature of the substrate at 380° C. and, by gradually opening the valves after the substrate was heated, $SiH_4$ gas, $GeH_4$ gas, and $H_2$ gas were flowed through the gas introducing pipe into the i-type layer deposition chamber. At this time, $SiH_4$ gas flow was controlled at 50 sccm, $GeH_4$ gas at 35 sccm, and $H_2$ gas at 120 sccm by adjusting the respective mass flow controllers. The pressure inside the i-type layer deposition chamber was controlled at 6 mTorr by adjusting the aperture of the conductance valve.

Next, the RF power supply was set to 0.2 W/cm³ to apply the power to the bias electrode. After that, the power of the microwave power supply was set to 0.2 W/cm³ and the microwave power was introduced through the microwave introducing waveguide pipe and the microwave introducing window into the i-type layer deposition chamber to cause glow discharge. Then, by opening the shutter, formation of the MW i-type layer was started on the RF i-type layer. After the i-type layer was formed in a thickness of 0.1 μm, the microwave glow discharge was stopped and the output from the bias power supply was turned off, thus completing the formation of the MW i-type layer 204.

Then the valves were closed to stop the flow of $SiH_4$ gas and $GeH_4$ gas into the i-type layer deposition chamber. After that, $H_2$ gas was continuously flowed into the i-type layer deposition chamber for two minutes. Then the valve was closed and the inside of the i-type layer deposition chamber and the gas pipe were evacuated to a vacuum of $1\times10^{-5}$ Torr.

(4-4) Formation of RF i-type layer 261 of a-Si

For forming the RF i-type layer, the substrate heater was set to keep the temperature of the substrate at 250° C. and, after the substrate was heated, the valves were gradually opened to let the $Si_2H_6$ gas and $H_2$ gas flow through the gas introducing pipe into the i-type layer deposition chamber. At this time, $Si_2H_6$ gas flow was controlled at 2 sccm and $H_2$ gas at 80 sccm by adjusting the respective mass flow controllers. The pressure inside the i-type layer deposition chamber was controlled at 0.7 Torr by adjusting the aperture of the conductance valve.

Next, the RF power supply was set to 0.007 W/cm³ and power was applied to the bias electrode to cause glow discharge. Then the shutter was opened to start formation of the RF i-type layer on the MW i-type layer. After the i-type layer was formed in a thickness of 20 nm, the RF glow discharge was stopped and the output from the RF power supply was turned off, thus completing the formation of RF i-type layer 261. The valve was closed to stop the flow of $Si_2H_6$ gas into the i-type layer deposition chamber and $H_2$ gas was continuously flowed into the i-type layer deposition chamber for two minutes. After that, the valve (not shown) was closed and the inside of the i-type layer deposition chamber and the gas pipe were evacuated to $1\times10^{-5}$ Torr.

(5) Formation of first p-type semiconductor layer (p11 layer) 205

After opening the gate valve, the substrate was moved into the transport chamber and p-type layer deposition chamber which had been preliminarily evacuated by the vacuum pump.

The back face of the substrate was heated in close contact with the substrate heater, and the inside of the p-type layer deposition chamber was evacuated to a pressure of about $1\times10^{-5}$ Torr by the vacuum pump. The substrate heater was set so as to keep the temperature of substrate at 230° C., and, after the substrate temperature became stable, He gas, $BF_3$/He gas, and $CH_4$ gas were introduced through the gas introducing pipe into the deposition chamber by manipulating the valves. At this time, He gas flow was controlled at 50 sccm, $BF_3$/He gas at 5 sccm, and $CH_4$ gas at 5 sccm by the mass flow controllers and the pressure inside the layer deposition chamber was controlled at 2.0 Torr by adjusting the aperture of the conductance valve.

The power of the RF power supply was set to 0.1 W/cm³ and the RF power was applied to the plasma forming cup to cause glow discharge. By exposing the surface of the i-type semiconductor layer to a plasma containing a p-type valence electron controlling agent and an element for increasing the bandgap of the i-type semiconductor layer, the surface of the i-type semiconductor layer started to be converted into a p-type layer and to increase the bandgap thereof to form the first p-type semiconductor layer (p11 layer, or the layer A) 205. After the layer was formed in a thickness of 3 nm, the RF power supply was turned off to stop the glow discharge, thus completing the formation of the first p-type semiconductor layer (p11 layer, or the layer A) 205.

(6) Formation of second p-type semiconductor layer (p12 layer) 206

By manipulating the valves, the flow of He gas was stopped, and $H_2$ gas was flowed at 50 sccm, $SiH_4/H_2$ gas at 0.25 sccm, $BF_3/H_2$ gas at 0.5 sccm, and $CH_4$ gas at 0.25 sccm. The second p-type semiconductor layer (p12 layer, or the layer B) containing the main constituent elements of the i-type semiconductor layer and the element for increasing the bandgap of the i-type semiconductor layer was then stacked on the first p-type semiconductor layer (p11 layer, or the layer A) 205. At this time, the pressure inside the layer deposition chamber 419 was controlled at 2.0 Torr by adjusting the aperture of the conductance valve.

The power of the RF power supply was set to 0.15 W/cm$^3$ and the RF power was applied to the plasma forming cup to cause glow discharge, thus starting formation of the second p-type semiconductor layer (p12 layer, or the layer B) 206 containing the main constituent elements of the i-type semiconductor layer of μc-SiC and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p12 layer, or the layer B) 206.

By closing the valves, the flow of SiH$_4$/H$_2$ gas, BF$_3$/H$_2$ gas, and CH$_4$ gas into the p-type layer deposition chamber was stopped, and H$_2$ gas was continuously flowed into the p-type layer deposition chamber for three minutes. After that, the flow of H$_2$ was also stopped by closing the valve, and the inside of the p-type layer deposition chamber and the gas pipe were evacuated to $1\times10^{-5}$ Torr.

Step (3) to step (6) as described above complete the formation of the first pin junction 217.

Explained in the following are steps for forming the second pin junction 218. The operation of these steps is basically the same operation as that for forming the first pin junction 217 as discussed above.

(7) Formation of RF n-type layer (n2 layer) 207 of a-Si

For forming the RF n-type layer, H$_2$ gas was introduced through the gas introducing pipe into the deposition chamber while the flow of H$_2$ gas was controlled at 200 sccm by the mass flow controller by opening the valve. The pressure inside the deposition chamber 417 was adjusted to 1.1 Torr by the conductance valve.

The substrate heater was set to keep the temperature of the substrate at 380° C. When the substrate temperature became stable, SiH$_2$ gas and PH$_3$/H$_2$ gas were introduced through the gas introducing pipe into the deposition chamber by manipulating the valves. At this time, SiH$_4$ gas flow was adjusted to 2 sccm, H$_2$ gas to 50 sccm, and PH$_3$/H$_2$ gas to 0.5 sccm by the mass flow controllers, and the pressure inside the deposition chamber was adjusted to 1.1 Torr.

The power of the RF power supply was set to 0.005 W/cm$^3$, and the RF power was applied to the plasma forming cup to cause glow discharge and to start formation of the RF n-type layer on the substrate. After the RF n-type layer was formed in a thickness of 20 nm, the RF power supply was turned off to stop the glow discharge, thus finishing the formation of the RF n-type layer 207.

After stopping the flow of SiH$_4$ gas and PH$_3$/H$_2$ into the deposition chamber, H$_2$ gas was continuously flowed into the deposition chamber for five minutes. After that, nthe flow of H$_2$ was also stopped, and the inside of the deposition chamber and gas pipe was evacuated to $1\times10^{-5}$ Torr.

(8) The RF i-type layer 252 of a-Si, the MW i-type layer 208 of a-SiGe, and the RF i-type layer 262 of a-Si were successively formed using the RF plasma CVD process, the microwave plasma CVD process, and the RF plasma CVD process, respectively.

(8-1) After opening the gate valve, the substrate was moved into the transport chamber and i-type layer deposition chamber which had been preliminarily evacuated by the vacuum pump. The back face of the substrate was heated in close contact with the substrate heater, and the inside of the i-type layer deposition chamber 418 was evacuated to a pressure of about $1\times10^{-5}$ Torr by the vacuum pump.

(8-2) Formation of RF i-type layer 252 of a-Si

For forming the RF i-type layer, the substrate heater was set to keep the temperature of the substrate at 350° C., and, after the substrate was heated, the valves were gradually opened to let Si$_2$H$_6$ gas and H$_2$ gas flow through the gas introducing pipe into the i-type layer deposition chamber. At this time, Si$_2$H$_6$ gas flow was adjusted to 4 sccm and H$_2$ gas to 100 sccm by the respective mass controllers. The pressure inside the i-type layer deposition chamber was controlled at 0.8 Torr by adjusting the aperture of the conductance valve.

Next, the RF power supply was set at 0.007 W/cm$^3$ and the power was applied to the bias electrode to cause glow discharge. Then, by opening the shutter, formation of the i-type layer on the RF n-type layer was started. After the i-type layer was formed in a thickness of 10 nm, the RF glow discharge was stopped and the output of the RF power supply was turned off, thus completing the formation of the RF i-type layer 252.

By closing the valve, the flow of Si$_2$H$_6$ gas into the i-type layer deposition chamber was stopped, and then gas was continuously flowed into the i-type layer deposition chamber for two minutes. After that, by closing the valve, the inside of the i-type layer deposition chamber and the gas pipe were evacuated to $1\times10^{-5}$ Torr.

(8-3) Formation of MW i-type layer (i1 layer) 208 of a-SiGe

For forming the MW i-type layer, the substrate heater was set to keep the temperature of the substrate at 380° C. and, by gradually opening the valves after the substrate was heated, SiH$_4$ gas, GeH$_4$ gas, and H$_2$ gas were flowed through the gas introducing pipe into the i-type layer deposition chamber. At this time, SiH$_2$ gas flow was controlled at 50 sccm, GeH$_4$ gas at 35 sccm, and H$_2$ gas at 120 sccm by adjusting the respective mass flow controllers. The pressure inside the i-type layer deposition chamber was controlled at 6 mTorr by adjusting the aperture of the conductance valve.

Next, the RF power supply was set to 0.2 W/cm$^3$ to apply the power to the bias bar. After that, the power of the microwave power supply was set to 0.2 W/cm$^3$ and the microwave power was introduced through the microwave introducing waveguide pipe and the microwave introducing window into the i-type layer deposition chamber to cause glow discharge. Then, by opening the shutter, formation of the MW i-type layer on the RF i-type layer was started. After the i-type layer was formed in a thickness of 0.1 μm, the microwave glow discharge was stopped and the output from the bias power supply was turned off, thus completing the formation of the MW i-type layer 208.

Then the valves were closed to stop the flow of SiH$_4$ gas and GeH$_4$ gas into the i-type layer deposition chamber. After that, H$_2$ gas was continuously flowed into the i-type layer deposition chamber for two minutes. Then the valve was closed and the inside of the i-type layer deposition chamber and the gas pipe were evacuated to $1\times10^{-5}$ Torr.

(8-4) Formation of RF i-type layer 262 of a-Si

For forming the RF i-type layer, the substrate heater was set to keep the temperature of the substrate at 250° C. and, after the substrate was heated, the valves were gradually opened to let the Si$_2$H$_6$ gas and H$_2$ gas flow through the gas introducing pipe into the i-type layer deposition chamber. At this time, Si$_2$H$_6$ gas flow was controlled at 2 sccm and H$_2$ gas at 80 sccm by adjusting the respective mass flow controllers. The pressure inside the i-type layer deposition chamber was controlled at 0.7 Torr by adjusting the aperture of the conductance valve.

Next, the RF power supply was set to 0.007 W/cm$^3$ and the power was applied to the bias electrode to cause glow discharge. Then the shutter was opened to start formation of the RF i-type layer on the MW i-type layer. After the i-type layer was formed in a thickness of 20 nm, the RF glow discharge was stopped and the output from the RF power supply was turned off, thus completing the formation of RF i-type layer 262.

The valve then was closed to stop the flow of $Si_2H_6$ gas into the i-type layer deposition chamber and $H_2$ gas was continuously flowed into the i-type layer deposition chamber for two minutes. After that, the valve was closed and the inside of the i-type layer deposition chamber and the gas pipe were evacuated to $1\times10^{-5}$ Torr.

(9) Formation of first p-type semiconductor layer (p21 layer) 209

After opening the gate valve, the substrate was moved into the transport chamber and p-type layer deposition chamber which had been preliminarily evacuated by the vacuum pump.

The back face of the substrate was heated in close contact with the substrate heater, and the inside of the p-type layer deposition chamber was evacuated to a pressure of about $1\times10^{-5}$ Torr by the vacuum pump. The substrate heater was set so as to keep the temperature of substrate at 230° C., and, after the substrate temperature became stable, He gas, $BF_3$/He gas, and $CH_4$ gas were introduced through the gas introducing pipe into the deposition chamber by manipulating the valves. At this time, He gas flow was controlled at 50 sccm, $BF_3$/He gas at 5 sccm, and $CH_4$ gas at 5 sccm by the mass flow controllers and the pressure inside the layer deposition chamber was controlled at 1.0 Torr by adjusting the aperture of the conductance valve.

The power of the RF power supply was set to 0.15 $W/cm^3$ and the RF power was applied to the plasma forming cup to cause glow discharge. By exposing the surface of the i-type semiconductor layer to a plasma containing a p-type valence electron controlling agent and an element for increasing the bandgap of the i-type semiconductor layer, the surface of the i-type semiconductor layer started to be converted into a p-type layer and to increase the bandgap thereof to form the first p-type semiconductor layer (p21 layer, or the layer A) 209. After the layer was formed in a thickness of 3 nm, the RF power supply was turned off to stop the glow discharge, thus completing the formation of the first p-type semiconductor layer (p21 layer, or the layer A) 209.

(10) Formation of second p-type semiconductor layer (p22 layer, or the layer B) 210

By manipulating the valves, the flow of He gas was stopped, and $H_2$ gas was flowed at 50 sccm, $SiH_4/H_2$ gas at 0.25 sccm, $BF_3/H_2$ gas at 0.5 sccm, and $CH_2$ gas at 0.25 sccm. The second p-type semiconductor layer (p22 layer, or the layer B) containing the main constituent elements of the i-type semiconductor layer and the element for increasing the bandgap of the i-type semiconductor layer, was then stacked on the first p-type semiconductor layer (p21 layer, or the layer A) 209. At this time, the pressure inside the layer deposition chamber was controlled at 2.0 Torr by adjusting the aperture of the conductance valve.

The power of the RF power supply was set to 0.15 $W/cm^3$ and the RF power was applied to the plasma forming cup to cause glow discharge, thus starting formation of the second p-type semiconductor layer (p22 layer, or the layer B) 210 containing the main constituent elements of the i-type semiconductor layer of μc-SiC and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p22 layer, or the layer B) 210.

By closing the valves, the flow of $SiH_4/H_2$ gas, $BF_3/H_2$ gas, and $CH_4$ gas into the p-type layer deposition chamber was stopped, and $H_2$ gas was continuously flowed into the p-type layer deposition chamber for three minutes. After that, the flow of $H_2$ was also stopped by closing the valve, and the inside of the p-type layer deposition chamber and the gas pipe were evacuated to $1\times10^{-5}$ Torr.

Step (7) to step (10) as described above complete the formation of the second pin junction 218.

Explained in the following are steps for forming the third pin junction 219.

(11) Formation of RF n-type layer (n3 layer) 211 of a-Si

For forming the RF n-type layer, $H_2$ gas was introduced through the gas introducing pipe into the deposition chamber while the flow of $H_2$ gas was controlled at 200 sccm by the mass flow controller as opening the valve. The pressure inside the deposition chamber was adjusted to 1.1 Torr by the conductance valve.

The substrate heater was set to keep the temperature of the substrate at 350° C. When the substrate temperature became stable, $SiH_4$ gas and $PH_3/H_2$ gas were introduced through the gas introducing pipe into the deposition chamber by manipulating the valves. At this time, $SiH_4$ gas flow was adjusted to 2 sccm, $H_2$ gas to 50 sccm, and $PH_3/H_2$ gas to 0.5 sccm by the mass flow controllers, and the pressure inside the deposition chamber was adjusted to 1.1 Torr.

The power of the RF power supply was set to 0.005 $W/cm^3$, and the RF power was applied to the plasma forming cup to cause glow discharge and to start formation of the RF n-type layer on the substrate. After the RF n-type layer was formed in a thickness of 10 nm, the RF power supply was turned off to stop the glow discharge, thus finishing the formation of the RF n-type layer 211.

After stopping the flow of $SiH_4$ gas and $PH_3/H_2$ into the deposition chamber, $H_2$ gas was continuously flowed into the deposition chamber for two minutes. After that, the flow of $H_2$ was also stopped, and the inside of the deposition chamber and gas pipe were evacuated to $1\times10^{-5}$ Torr.

(12) Formation of RF i-type layer 212 of a-Si

After opening the gate valve, the substrate was moved into the transport chamber and i-type layer deposition chamber which had been preliminarily evacuated by the vacuum pump. The back face of the substrate was heated in close contact with the substrate heater, and the inside of the i-type layer deposition chamber was evacuated to a pressure of about $1\times10^{-5}$ Torr by the vacuum pump.

For forming the RF i-type layer 212, the substrate heater was set to keep the temperature of the substrate at 200° C., and, after the substrate was heated, the valves were gradually opened to let $Si_2H_6$ gas and $H_2$ gas flow through the gas introducing pipe into the i-type layer deposition chamber. At this time, $Si_2H_6$ gas flow was adjusted to 2 sccm and $H_2$ gas to 80 sccm by the respective mass controllers. The pressure inside the i-type layer deposition chamber was controlled at 0.6 Torr by adjusting the aperture of the conductance valve (not shown).

Next, the RF power supply was set at 0.07 $W/cm^3$ and the power was applied to the bias electrode to cause glow discharge. Then, by opening the shutter, formation of the i-type layer on the RF n-type layer 211 was started. After the i-type layer was formed in a thickness of 120 nm, the RF glow discharge was stopped and the output of the RF power supply 424 was turned off, thus completing the formation of the RF i-type layer 212.

By closing the valve, the flow of $Si_2H_6$ gas into the i-type layer deposition chamber 418 was stopped, and then $H_2$ gas was continuously flowed into the i-type layer deposition chamber 418 for two minutes. After that, by closing the valve, the inside of the i-type layer deposition chamber 418 and the gas pipe were evacuated to $1\times10^{-5}$ Torr.

(13) Formation of first p-type semiconductor layer (p31 layer) 213

After opening the gate valve 408, the substrate 490 was moved into the transport chamber 404 and p-type layer deposition chamber 419 which had been preliminarily evacuated by the vacuum pump.

The back face of the substrate was heated in close contact with the substrate heater, and the inside of the p-type layer deposition chamber was evacuated to a pressure of about $1\times10^{-5}$ Torr by the vacuum pump. The substrate heater was set so as to keep the temperature of substrate 490 at 170° C., and, after the substrate temperature became stable, He gas, $BF_3$/He gas, and $CH_4$ gas were introduced through the gas introducing pipe into the deposition chamber by manipulating the valves. At this time, He gas flow was controlled at 50 sccm, $BF_3$/He gas at 5 sccm, and $CH_4$ gas at 5 sccm by the mass flow controllers and the pressure inside the layer deposition chamber was controlled at 2.0 Torr by adjusting the aperture of the conductance valve.

The power of the RF power supply was set to 0.15 W/cm$^3$ and the RF power was applied to the plasma forming cup to cause glow discharge. By exposing the surface of the i-type semiconductor layer to a plasma containing a p-type valence electron controlling agent and an element for increasing the bandgap of the i-type semiconductor layer, the surface of the i-type semiconductor layer started to be converted into a p-type layer and to increase the bandgap thereof to form the first p-type semiconductor layer (p31 layer, or the layer A) 213. After the layer was formed in a thickness of 3 nm, the RF power supply was turned off to stop the glow discharge, thus completing the formation of the first p-type semiconductor layer (p31 layer, or the layer A) 213.

(14) Formation of second p-type semiconductor layer (p32 layer, or the layer B) 214

By manipulating the valves, the flow of He gas was stopped, and $H_2$ gas was flowed at 50 sccm, $SiH_4$/$H_2$ gas at 0.25 sccm, $BF_3$/$H_2$ gas at 0.5 sccm, and $CH_4$ gas at 0.25 sccm. The second p-type semiconductor layer (p32 layer, or the layer B) containing the main constituent elements of the i-type semiconductor layer and the element for increasing the bandgap of the i-type semiconductor layer, was then stacked on the first p-type semiconductor layer (p31 layer, or the layer A) 213. At this time, the pressure inside the layer deposition chamber was controlled at 2.0 Torr by adjusting the aperture of the conductance valve.

The power of the RF power supply was set to 0.15 W/cm$^3$ and the RF power was applied to the plasma forming cup to cause glow discharge, thus starting formation of the second p-type semiconductor layer (p32 layer, or the layer B) 214 containing the main constituent elements of the i-type semiconductor layer of μc-SiC and the element for increasing the bandgap of the i-type semiconductor layer. After the RF p-type layer was formed in a thickness of 5 nm, the RF power supply was turned off to stop the glow discharge, thus completing the formation of the second p-type semiconductor layer (p32 layer, or the layer B) 214.

By closing the valves, the flow of $SiH_4$/$H_2$ gas, $BF_3$/$H_2$ gas, and $CH_4$ gas into the p-type layer deposition chamber was stopped, and $H_2$ gas was continuously flowed into the p-type layer deposition chamber for three minutes. After that, the flow of $H_2$ was also stopped by closing the valve, and the inside of the p-type layer deposition chamber and the gas pipe were evacuated to $1\times10^{-5}$ Torr.

Step (11) to step (14) as described above complete the formation of the third pin junction 219.

(15) Formation of transparent and conductive layer 215 and collector electrode 216

After opening the gate valve, the substrate was moved into the unloading chamber which had been preliminarily evacuated by the vacuum pump, and the unloading chamber was leaked to the atmosphere by opening the leak valve.

Next, ITO was deposited as a transparent and conductive layer 215 in a thickness of 70 nm on the RF p-type layer 214 by the vacuum vapor deposition process.

Next, a mask with a comb-shaped aperture was placed on the transparent and conductive layer 212, and the comb-shaped collector electrode 216 was deposited in the structure of Cr (40 nm)/Ag (1000 nm)/Cr (40 nm) by the vacuum vapor deposition process.

The foregoing concludes the fabrication of the photovoltaic element of this example. The photovoltaic element fabricated in this example will be referred to as SC Ex 34.

Comparative Example 34-1

This example is different from Example 34 in that the first p-type semiconductor layers (p11 layer, p21 layer, p31 layer, or the layers A) were not formed. Further, the film thickness of the second p-type semiconductor layers (p12 layer, p22 layer, p32 layer, or the layers B) of pc-SiC was 8 nm.

The other steps were the same as in Example 34.

The photovoltaic element fabricated in this example will be referred to as SC Comp Ex 34-1.

Next explained are evaluation tests which were carried out on six photovoltaic elements obtained in each of Example 34 and Comparative Example 34-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$), and fill factor (F.F.). Table 56 shows the photoelectric conversion factor ($\eta$), open-circuit voltage ($V_{oc}$), short-circuit current ($J_{sc}$), and fill factor (F.F.) of (SC Ex 34), which were normalized with corresponding measured values of (SC Comp Ex 34-1) being taken as 1.0.

TABLE 56

|  | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 34) | 1.08 | 1.05 | 1.00 | 1.03 |

From Table 56, it is found that the photovoltaic elements of (SC Ex 34) were superior in the open-circuit voltage ($V_{oc}$) and the fill factor (F.F.), as well as in the photoelectric conversion efficiency (9) to those of (SC Comp Ex 34-1).

In order to check the unevenness and dispersion in the substrate, a mask with twenty-five holes (of the area of 0.25 cm$^2$) was placed on the p-type layer and a film of ITO was formed as a transparent conductive layer in a thickness of 70 nm by the vacuum vapor deposition process. Table 57 shows results of unevenness and dispersion in substrate as reflected by the open-circuit voltage ($V_{oc}$) and the fill factor (F.F.), measured for such samples. Here, the maximum value of the measured values for the same substrate was taken as 1.

TABLE 57

|  | Open-ckt voltage ($V_{oc}$) | Fill factor (F. F.) |
|---|---|---|
| (SC Ex 34) | 0.98–1.00 | 0.98–1.00 |
| (SC Comp Ex 34-1) | 0.94–1.00 | 0.95–1.00 |

Table 57, it is found that the photovoltaic elements of (SC Ex 34) had less unevenness and dispersion in the substrate, whereby uniformity of photoelectric conversion characteristics thereof was improved.

EXAMPLE 35

This example is different from Example 34 in that Example 34 formed the photovoltaic element of the triple cell type with the p layers on the light incidence side whereas this example formed a photovoltaic element of the triple cell type with the n layers on the light incidence side, similar to Example 33.

The other steps were the same as in Example 34.

Explained in the following is formation of the n-type layer in a process for fabricating the photovoltaic element of this example.

(1) The surface of the i-type semiconductor layer (RF i-type layer 261, RF i-type layer 262, i3 layer) of a-Si was exposed to a plasma containing an n-type valence electron controlling agent and the element for increasing the bandgap of the i-type semiconductor layer so as to convert the surface of the i-type semiconductor layer into an n-type region, thereby forming the first n-type semiconductor layer (n11 layer, n21 layer, n31 layer, or the layer A) in a thickness of 3 nm.

(2) The n-type valence electron controlling agent, the element for increasing the bandgap of the i-type semiconductor layer, and the main constituent elements of the i-type semiconductor layer were then deposited on the surface of the first n-type semiconductor layer (n11 layer, n21 layer, n31 layer, or the layer A), thereby forming the second n-type semiconductor layer (n12 layer, n22 layer, n32 layer, or the layer B) in a thickness of 5 nm.

The photovoltaic element fabricated in this example will be referred to as SC Ex 35.

Comparative Example 35-1

This example is different from Example 35 in that the first n-type semiconductor layers (n11 layer, n21 layer, n31 layer, or the layers A) were not formed. Further, the film thickness of the second n-type semiconductor layers (n12 layer, n22 layer, n32 layer, or the layers B) of a-SiO was 8 nm.

The other steps were the same as in Example 35.

The photovoltaic element fabricated in this example will be referred to as SC Comp Ex 35-1.

Next explained are evaluation tests which were carried out on six photovoltaic elements obtained in each of Example 35 and Comparative Example 35-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$), and fill factor (F.F.). Table 58 shows the photoelectric conversion factor ($\eta$), open-circuit voltage $V_{oc}$, short-circuit current ($J_{sc}$), and fill factor (F.F.) of (SC Ex 35), which were normalized with corresponding measured values of (SC Comp Ex 35-1) being taken as 1.0.

TABLE 58

|  | P-E conversion efficiency ($\eta$) | Open-ckt volt ($V_{oc}$) | Short-ckt current ($J_{sc}$) | Fill factor (F. F.) |
|---|---|---|---|---|
| (SC Ex 35) | 1.08 | 1.05 | 1.01 | 1.02 |

From Table 58, it is found that the photovoltaic elements of (SC Ex 35) were superior in the open-circuit voltage ($V_{oc}$) and the fill factor (F.F.), as well as in the photoelectric conversion efficiency ($\eta$) to those of (SC Comp Ex 35-1).

In order to check the unevenness and dispersion in the substrate, a mask with twenty five holes (of the area of 0.25 cm$^2$) was placed on the p-type layer and a film of ITO was formed as a transparent conductive layer in a thickness of 80 nm by the vacuum vapor deposition process. Table 59 shows results of unevenness and dispersion in substrate as reflected by the open-circuit voltage ($V_{oc}$) and the fill factor (F.F.), measured for such samples. Here, the maximum value of the measured values for the same substrate was taken as 1.

TABLE 59

|  | Open-ckt voltge ($V_{oc}$) | Fill factor (F. F.) |
|---|---|---|
| (SC ex 35) | 0.98–1.00 | 0.98–1.00 |
| (SC Comp Ex 35-1) | 0.94–1.00 | 0.95–1.00 |

From Table 59, it is found that the photovoltaic elements of (SC Ex 35) had less unevenness and dispersion in the substrate, whereby uniformity of photoelectric conversion characteristics thereof was improved.

EXAMPLE 36

This example is different from Example 34 in that the following conditions were employed instead of those in Example 34 in forming the first p-type semiconductor layers (p11 layer, p21 layer, p31 layer, or the layers A).

(1) H$_2$ gas flow was controlled at 50 sccm, SiH$_4$/H$_2$ gas at 0.25 sccm, BF$_3$/H$_2$ gas at 1 sccm, and CH$_4$ gas at 0.25 sccm.

The other steps were the same as in Example 34.

The photovoltaic element fabricated in this example will be referred to as SC Ex 36.

This solar cell was evaluated by SIMS, which showed that the first p-type semiconductor layer (layer A) had a larger hydrogen content than that of the i-type semiconductor layer.

Next explained are evaluation tests which were carried out on six photovoltaic elements obtained in each of Example 36 and Comparative Example 34-1.

As the evaluation tests, V-I characteristics were observed while each photovoltaic element was placed under light irradiation of AM 1.5 (100 mW/cm$^2$). From the results, an average value was calculated for each of photoelectric conversion efficiency ($\eta$) defined as (photoelectromotive force)/(incident light power), open-circuit voltage ($V_{oc}$), short-circuit current ($J_{sc}$), and fill factor (F.F.). Table 60 shows the photoelectric conversion factor ($\eta$), open-circuit voltage ($V_{oc}$), short-circuit current ($J_{sc}$), and fill factor (F.F.) of (SC Ex 36), which were normalized with corresponding measured values of (SC Comp Ex 34-1) being taken as 1.0.

TABLE 60

| | P-E conversion efficiency (η) | Open-ckt volt (V$_{oc}$) | Short-ckt current (J$_{sc}$) | Fill factor (F. F.) |
| --- | --- | --- | --- | --- |
| (SC Ex 36) | 1.09 | 1.04 | 1.01 | 1.05 |

From Table 60, it is found that the photovoltaic elements of (SC Ex 36) were superior in the open-circuit voltage V$_{oc}$) and the fill factor (F.F.), as well as in the photoelectric conversion efficiency (η) to those of (SC Comp Ex 34-1).

EXAMPLE 37

This example is different from Example 30 in that the following conditions were employed instead of those in Example 30 in forming the first p-type semiconductor layer or p1 layer (layer A) 105 and the second p-type semiconductor layer or p2 layer (layer B) 106.

(1) Formation of first p-type semiconductor layer or p1 layer (layer A) 105

In forming the first p-type semiconductor layer or p1 layer (layer A) 105, H$_2$ gas flow was controlled at 50 sccm, SiH$_4$/H$_2$ gas at 0.25 sccm, BF$_3$/H$_2$ gas at 1 sccm, CH$_4$ gas at 2.5 sccm, and the pressure was controlled at 2.0 Torr. The RF power was set to 0.20 W/cm$^3$ to cause glow discharge under conditions so as not to deposit a layer. Formation of the first p-type semiconductor layer or p1 layer (layer A) 105 was started by converting the surface of the i-type semiconductor layer into a p-type layer and to increase the bandgap thereof. After the layer was formed in a thickness of 3 nm, the RF power supply was turned off to stop the glow discharge and the flow of CH$_4$ gas was stopped, thus completing the formation of the first p-type semiconductor layer or p1 layer (layer A) 105.

(2) Formation of second p-type semiconductor layer or p2 layer (layer B) 106

After completion of the formation of the first p-type semiconductor layer or p1 layer (layer A) 105, the power of the RF power supply was next lowered to 0.15 W/cm$^3$ to cause glow discharge, and formation of the second p-type semiconductor layer or p2 layer (layer B) 106 was started under conditions so as to deposit μc-SiC. After the RF p-type layer was formed in a thickness of 5 nm, the RF power supply was turned off to stop the glow discharge, thus completing the formation of the second p-type semiconductor layer or p2 layer (layer B) 106.

The other steps were the same as in Example 30.

The photovoltaic element fabricated in this example will be referred to as SC Ex 37.

Next explained are evaluation tests which were carried out on six photovoltaic elements obtained in each of Example 37 and Comparative Example 30-1.

As the evaluation tests, V-I characteristics were observed while each photovoltaic element was placed under light irradiation of AM 1.5 (100 mW/cm$^2$). From the results, an average value was calculated for each of photoelectric conversion efficiency (η) defined as (photoelectromotive force)/(incident light power), open-circuit voltage (V$_{oc}$), short-circuit current (J$_{sc}$), and fill factor (F.F.). Table 61 shows the photoelectric conversion factor (η), open-circuit voltage (V$_{oc}$), short-circuit current (J$_{sc}$), and fill factor (F.F.) of (SC Ex 37), which were normalized with corresponding measured values of (SC Comp Ex 30-1) being taken as 1.0.

TABLE 61

| | P-E conversion efficiency (η) | Open-ckt volt (V$_{oc}$) | Short-ckt current (J$_{sc}$) | Fill factor (F. F.) |
| --- | --- | --- | --- | --- |
| (SC Ex 37) | 1.09 | 1.05 | 1.00 | 1.04 |

From Table 61, it is found that the photovoltaic elements of (SC Ex 37) were superior in the open-circuit voltage (V$_{oc}$) and the fill factor (F.F.), as well as in the photoelectric conversion efficiency (η) to those of (SC Comp Ex 30-1).

EXAMPLE 38

This example is different from Example 30 in that the following conditions were employed instead of those in Example 30 in forming the first p-type semiconductor layer or p1 layer (layer A) 105 and the second p-type semiconductor layer or p2 layer (layer B) 106.

(1) Formation of first p-type semiconductor layer or p1 layer (layer A) 105

In forming the first p-type semiconductor layer or p1 layer (layer A) 105, H$_2$ gas flow was controlled at 200 sccm, SiH$_4$/H$_2$ gas at 0.25 sccm, and BF$_3$/H$_2$ gas at 1 sccm, the pressure was controlled at 2.0 Torr. The RF power was set to 0.15 W/cm$^3$ to cause glow discharge under conditions as not to deposit a layer. Formation of the first p-type semiconductor layer or p1 layer (layer A) 105 was started by converting the surface of the i-type semiconductor layer into a p-type layer and to increase the bandgap thereof. After the layer was formed in the thickness of 3 nm, the RF power supply was turned off to stop the glow discharge. Then the flow of CH$_4$ gas was stopped, thus completing the formation of the first p-type semiconductor layer or p1 layer (layer A) 105.

(2) Formation of second p-type semiconductor layer or p2 layer (layer B) 106

After completion of the formation of the first p-type semiconductor layer or p1 layer (layer A) 105, H$_2$ gas flow was controlled at 50 sccm, SiH$_4$/H$_2$ gas at 0.25 sccm, and BF$_3$/H$_2$ gas at 1 sccm. Formation of the second p-type semiconductor layer or p2 layer (layer B) 106 was started under conditions so as to deposit μc-SiC. After the RF p-type layer was formed in a thickness of 5 nm, the RF power supply was turned off to stop the glow discharge, thus completing the formation of the second p-type semiconductor layer or p2 layer (layer B) 106.

The other steps were the same as in Example 30.

The photovoltaic element fabricated in this example will be referred to as SC Ex 38.

Next explained are evaluation tests which were carried out on six photovoltaic elements obtained in each of Example 38 and Comparative Example 30-1.

As the evaluation tests, V-I characteristics were observed while each photovoltaic element was placed under light irradiation of AM 1.5 (100 mW/cm$^2$). From the results, an average value was calculated for each of photoelectric conversion efficiency (η) defined as (photoelectromotive force)/(incident light power), open-circuit voltage (V$_{oc}$), short-circuit current (J$_{sc}$), and fill factor (F.F.). Table 62 shows the photoelectric conversion factor (η), open-circuit voltage (V$_{oc}$), short-circuit current (J$_{sc}$), and fill factor (F.F.) of (SC Ex 38), which were normalized with corresponding measured values of (SC Comp Ex 30-1) being taken as 1.0.

TABLE 62

|  | P-E conversion efficiency ($\eta$) | Open-ckt volt ($V_{oc}$) | Short-ckt current ($J_{sc}$) | Fill factor (F. F.) |
| --- | --- | --- | --- | --- |
| (SC Ex 38) | 1.09 | 1.05 | 1.00 | 1.04 |

From Table 62, it is found that the photovoltaic elements of (SC Ex 38) were superior in the open-circuit voltage ($V_{oc}$) and the fill factor (F.F.), as well as in the photoelectric conversion efficiency ($\eta$) to those of (SC Comp Ex 30-1).

EXAMPLE 39

In this example, the effect of the discharge power and the frequency thereof used in forming the layer A and the layer B were investigated in fabrication of the photovoltaic element shown in FIG. 5. The photovoltaic element of this example was fabricated using a plasma CVD apparatus (not shown) of the ordinary parallel plate capacitively coupled type.

The process will be explained according to its fabrication procedures.

(1) An n-type semiconductor layer made of an n-type μc-Si:H film was formed in a thickness of 10 nm on a substrate (size 50 mm×100 mm) of stainless steel by the RF plasma CVD process.

(2) An i-type semiconductor layer made of a substantially intrinsic a-Si:H film was formed in a thickness of 120 nm on the n-type semiconductor layer by the RF plasma CVD process.

(3) Dopant impurities were implanted into the i-type semiconductor layer by plasma doping, thereby forming the first p-type layer (layer A) made of a p-type μc-Si:H film in a thickness of 10 nm. The frequency of discharge power used in this step was low (75 kHz).

(4) The second p-type layer (layer B) made of a p-type a-Si:H film was formed in a thickness of 5 nm on the first p-type semiconductor layer (layer A) by the RF plasma CVD process at a frequency of 13.56 MHz.

Table 63 shows the film-forming conditions in above steps (1) to (4).

TABLE 63

| Semicon layer | 103 | 104 | 105 | 106 |
| --- | --- | --- | --- | --- |
| Forming method | RF plasma CVD | RF plasma CVD | LF plasma CVD | RF plasma CVD |
| Forming layer | n-type a-Si layer | i-type a-Si layer | p-type μc-Si layer | p-type a-Si layer |
| (nm) | 20 | 100 | 10 | 5 |
| Feedstock Gas (sccm) | $SiH_4$: 150<br>$PH_3$: 300<br>$H_2$: 1500 | $SiH_4$: 160<br>$H_2$: 2000 | $SiH_4$: 0<br>$BF_3$: 0.1<br>$H_2$: 1000 | $SiH_4$: 10<br>$BF_3$: 5<br>$H_2$: 200 |
| Pressure in chamber (Pa) | 130 | 135 | 130 | 130 |
| Substrate Temp. (°C.) | 300 | 250 | 70 | 200 |
| Discharge power (W) | High frequency (13.56 MHz 150 (0.125 W/cm²) | High frequency (13.56 MHz 400 (0.33 W/cm²) | Low frequency (75 kHz 600 (0.50 W/cm²) | High frequency (13.56 MHz 120 (0.1 W/cm²) |

The substrate thus formed with the stacked semiconductor layers thereon was cut into 50 mm²/areas, and the vacuum vapor deposition process was carried out to form fifty segments of ITO transparent conductive layer 107 in a thickness 87 nm and area 0.25 cm² as upper electrodes, thus fabricating fifty small area cells as (Ex 39 elements).

These cells were irradiated with the pseudo sunlight of AM 1.5 (100 mW/cm²) and evaluation of their photoelectric conversion characteristics was carried out thereon.

For comparison, fifty small-area cells (Comp Ex 39-1 elements) were fabricated without stacking the second p-type semiconductor layer (layer B) and the same measurements were carried out.

For comparison, fifty small-area cells (Comp Ex 39-2 elements) were fabricated without the first p-type semiconductor layer (layer A) but with depositing a thicker (20 nm) second p-type semiconductor layer (layer B) as the p layer, and the same measurements were carried out thereon.

As a result, the photoelectric conversion efficiency of Ex 39 elements was 1.20 when normalized with the value of Comp Ex 39-1 elements being taken as 1.0. The photoelectric conversion efficiency of Ex 39 elements was 1.16 when normalized with the value of Comp Ex 39-2 elements being taken as 1.0. It thus was confirmed that the Ex. 39 elements had good characteristics.

When a gas containing an element for increasing the bandgap was further introduced in step (3), the elements were obtained with better characteristics.

When the gas containing the element for increasing the bandgap was introduced in step (4), the elements were obtained with better characteristics.

When the gas containing the element for increasing the bandgap was introduced in steps (3) and (4), the elements were obtained with better characteristics.

EXAMPLE 40

This example is different from Example 39 in that the photovoltaic element was formed using the apparatus of roll-to-roll type, which was able to consecutively form stacked semiconductor layers on the belt substrate, as shown in FIG. 6. The layer structure of the photovoltaic element was the same as in Example 39.

The process will be explained according to its fabrication procedures.

(1) The substrate used was a stainless steel belt (12 cm wide×200 m long×0.15 mm thick) made of SUS 430BA. A ZnO transparent conductive layer of about 1 μm was formed on the surface of the belt substrate by sputtering, thereby forming a substrate having a microscopically roughened surface.

(2) The substrate thus produced in above step (1) was rolled around a bobbin and placed in the feeding chamber 601.

(3) The belt substrate was guided through the film-forming chambers and through the respective gas gates up to the winding chamber 605, and a tractive tension was exerted so as to prevent the substrate from becoming loose. After the belt substrate was installed, the inside of each chamber was evacuated.

(4) Next, He gas was introduced and the inside of each film-forming chamber was heat-baked at approximately 350° C. in the atmosphere of He at about 200 Pa.

(5) After the heat baking, $H_2$ was introduced as a gate gas at 500 sccm into each gas gate and the feed stock gas was introduced at a predetermined flow rate into each film-forming chamber to set the internal pressure of each chamber at a predetermined pressure.

(6) The winding bobbin 609 in the winding chamber 605 was rotated to continuously move the belt substrate at a constant velocity of 100 cm/min in the direction of travel through each film-forming chamber. By means of a temperature controller (not shown) provided in each film-forming chamber, temperature control was carried out so that the moving belt substrate could be kept at a predetermined temperature in the film-forming space of each film-forming chamber.

(7) After the temperature of the belt substrate became stable, high frequency power of 13.56 MHz was supplied via parallel plate electrodes to the film-forming chambers 602, 603, 611 and low frequency power of 75 kHz was applied via a parallel plate electrode to the film-forming chamber 604 from respective power supplies (not shown) through matching means. The discharge power was supplied to convert the feed stock gas in each film-forming chamber into plasma and semiconductor films were formed on the surface of the belt substrate continuously moving through the film-forming chambers.

The film-forming chambers 604, 611 were constructed as shown in FIG. 7, in which a semiconductor film was formed through gas-exhaust-side plasma and gas-supply-side plasma in this order on the surface of the continuously moving belt substrate. The film-forming chambers 602, 603 were arranged so that their discharge chambers had the gas supply side and the gas exhaust side reversed from those in FIG. 7.

Formation of microcrystalline silicon in the film-forming chamber 604 was checked by RHEED pattern.

(7-1) An n-type semiconductor layer made of an n-type a-Si:H film was formed in a thickness of 10 nm on the surface of the belt substrate by the RF plasma CVD process in the film-forming chamber 602.

(7-2) An i-type semiconductor layer made of a substantially intrinsic a-Si:H film was formed in a thickness of 120 nm on the n-type semiconductor layer by the RF plasma CVD process in the film-forming chamber 603.

(7-3) Dopant impurities were implanted into the i-type semiconductor layer by plasma doping in the film-forming chamber 604, thus forming the first p-type semiconductor layer (layer A) of p-type $\mu$c-Si:H in a thickness of 10 nm.

(7-4) A second p-type semiconductor layer (layer B) made of a p-type a-Si:H film was formed in a thickness of 5 nm on the first p-type semiconductor layer (layer A) by the RF plasma CVD process in the film-forming chamber 611.

Table 64 shows the film-forming conditions in above steps (7-1) to (7-4).

TABLE 64

| Film-forming chamber | 602 | 603 | 604 | 611 |
| --- | --- | --- | --- | --- |
| Forming method | RF plasma CVD | RF plasma CVD | LF plasma CVD | RF plasma CVD |
| Length of forming region (cm) | 60 | 200 | 70 | 20 |
| Feed stock Gas (sccm) | SiH$_4$: 150 PH$_3$: 15 H$_2$: 1800 | SiH$_4$: 160 H$_2$: 2000 | SiH$_4$: 0 BF$_3$: 0.1 H$_2$: 1000 | SiH$_4$: 10 BF$_3$: 5 H$_2$: 200 |
| Pressure in chamber (Pa) | 130 | 135 | 130 | 130 |
| Temp. of belt Substrate (°C.) | 250 | 250 | 70 | 200 |
| Discharge power (W) | High frequency (13.56 MHz 150 (0.125 W/cm$^2$) | High frequency (13.56 MHz 400 (0.33 W/cm$^2$) | Low frequency (75 kHz 600 (0.50 W/cm$^2$) | High frequency (13.56 MHz 120 (0.1 W/cm$^2$) |

(8) The belt substrate was continuously moved for 180 minutes from the start of conveyance. During the movement the formation of stacked semiconductor films was conducted for 170 minutes.

(9) After the stacked semiconductor films were formed across about 170 m, the supply of discharge power, introduction of feed stock gas, and heating of the belt substrate and film-forming chambers were stopped and the inside of the film-forming chambers was purged.

After that, the belt substrate and the inside of apparatus were fully cooled and then the apparatus was opened. Then the belt substrate rolled on the bobbin was taken out of the apparatus from the winding chamber 609.

The belt substrate thus taken out was further processed by a continuous module forming apparatus. An ITO (In$_2$O$_3$+SnO$_2$) thin film of 70 nm was formed as a transparent electrode over the entire surface on the stacked semiconductor films formed by the apparatus of the present invention. Then Ag electrodes were formed in fine line patterns at constant intervals as collector electrodes. Then modules of unit elements, for example, series connected, solar cell modules (Ex 40 elements) of 35 cm×35 cm composed of single junction type solar cells were continuously fabricated.

Evaluation of the characteristics of the solar cell modules was carried out under irradiation with the pseudo solar light of AM 1.5 (100 mW/cm$^2$).

For comparison, solar cell modules (Comp Ex 40-1) were also fabricated with stopping of application of the high frequency power in the film-forming chamber 611 so as not to form the second p-type semiconductor layer (layer B), and the same measurements were carried out thereon.

For comparison, solar cell modules (Comp Ex 40-2) were fabricated in such a manner that the semiconductor forming method in the film-forming chamber 604 was changed from the low frequency plasma CVD process to the high frequency plasma CVD process, the film-forming conditions in the film-forming chamber 604 were set to be the same as in the film-forming chamber 611, and a thicker second p-type semiconductor layer (layer B) was deposited without forming the first p-type semiconductor layer (layer A), and the same measurements were carried out thereon.

As a result, the average value of photoelectric conversion efficiencies of Ex 40 elements was good (1.20) when compared with a value of Comp Ex 40-1 elements. Further, the average value of photoelectric conversion efficiencies of Ex 40 elements was good (1.16) when normalized with a value of Comp Ex 40-2 elements.

The dispersion in photoelectric conversion efficiencies between modules was also improved to be within +2 to 3% for Ex 40 elements whereas it was +5 to 7% for Comp Ex 40-1 elements and Comp Ex 40-2 elements.

Further, when a gas containing an element for increasing the bandgap was introduced into the film-forming chamber 604, the elements were obtained with better characteristics.

Further, when the gas containing the element for increasing the bandgap was introduced into the film-forming chamber 611, the elements were obtained with better characteristics.

Yet further, when the gas containing the element for increasing the bandgap was introduced into both the film-forming chambers 604 and 611, the elements were obtained with better characteristics.

EXAMPLE 41

This example is different from Example 40 in that the layer structure of the photovoltaic element was of the triple cell arrangement consisting of three pin unit cells, as shown in FIG. 8. In this example, only the p-type layer in the top cell in contact with the upper electrode was comprised of a first p-type semiconductor layer (layer A) and a second p-type semiconductor layer (layer B).

The film-forming apparatus employed was the one shown in FIG. 9, of the roll-to-roll type, which was able to continuously form the stacked semiconductor layers on a belt substrate.

The process will be explained according to its fabrication procedures.

(1) The substrate used was a stainless steel belt (12 cm wide×200 m long×0.15 mm thick) made of SUS 430BA. On the surface of this belt substrate, by the DC sputtering process, 400 nm of Ag as a reflective and conductive layer and 1 μm of ZnO as a buffer layer was deposited by sputtering, thus forming a belt substrate having a microscopically roughened surface.

(2) The substrate thus produced in step (1) was rolled around a bobbin and placed in the feeding chamber 901.

(3) The belt substrate was guided through the respective film-forming chambers via the respective gas gates up to the winding chamber 905, and a tension was exerted so as to prevent the substrate from becoming loose. After the belt substrate was set in place, the inside of each chamber was evacuated to a vacuum.

(4) He gas then was introduced and the inside of each film-forming chamber was heat-baked at approximately 350° C. in the atmosphere of He at about 200 Pa.

(5) After the heat baking, $H_2$ was introduced as a gate gas at 500 sccm into each gas gate and the feed stock gas was introduced at a predetermined flow rate into each film-forming chamber so as to set the internal pressure of each chamber at a predetermined pressure.

(6) The winding bobbin 909 in the winding chamber 905 was rotated to continuously move the belt substrate at a constant velocity of 100 cm/min. By means of a temperature controller (not shown) provided in each film-forming chamber, temperature control was carried out so that the moving belt substrate could be kept at a predetermined temperature in the film-forming space of each film-forming chamber.

(7) After the temperature of the belt substrate became stable, high frequency power of 13.56 MHz was supplied via parallel plate electrodes to the film-forming chambers 902A, 902B, 902C, 903A, 903B, 903C, 904A, 904B, 911A, 911B, 911C and low frequency power of 75 kHz was supplied via a parallel plate electrode to the film-forming chamber 904C from their respective power supplies (not shown) through matching means.

FIG. 10 shows an example of the structure of the film-forming chambers 910A and 910B. The microwave power of 2.45 GHz was supplied through a microwave introducing window provided in a side wall on one side of the film-forming chamber in each of the film-forming chambers 910A, 910B, and the high frequency power of 13.56 MHz was supplied from a rod-shaped bias electrode arranged in parallel with the belt substrate and before the microwave introducing window, each from an unillustrated power supply through a matching device.

The discharge power was supplied to convert the feed stock gas in each film-forming chamber into a plasma, and semiconductor films were formed on the surface of the belt substrate continuously moving in the film-forming chambers.

The film-forming chambers 904A, 904B, 904C, 911C were constructed as shown in FIG. 7, in which a semiconductor film was formed through gas-exhaust-side plasma and gas-supply-side plasma in this order on the surface of the continuously moving belt substrate. The film-forming chambers 902A, 902B, 902C, 903A, 903B, 903C, 911A, 911B, were arranged so that their discharge chamber had the gas supply side and the gas exhaust side reversed from those shown in FIG. 7.

(7-1) A bottom cell was formed by successively stacking an n-type layer (in the film-forming chamber 902A), an i-type layer (in the film-forming chamber 903A), an i-type layer (in the film-forming chamber 910A), an i-type layer (in the film-forming chamber 911A), and a p-type layer (in the film-forming chamber 904A) on the surface of the belt substrate.

(7-2) A middle cell was formed on the bottom cell by successively stacking an n-type layer (in the film-forming chamber 902B), an i-type layer (in the film-forming chamber 903B), an i-type layer (in the film-forming chamber 910B), an i-type layer (in the film-forming chamber 911B), and a p-type layer (in the film-forming chamber 904B).

(7-3) A top cell was formed on the middle cell by successively stacking an n-type layer (in the film-forming chamber 902C), an i-type layer (in the film-forming chamber 903C), a first p-type layer (the layer A) (in the film-forming chamber 904C), and a second p-type layer (the layer B) (in the film-forming chamber 911C).

By means of the above steps (7-1) to (7-3) the stacked semiconductor films were formed in the nipnipnip structure. Table 65 shows the film-forming conditions in the film-forming chambers 902A–904A in which step (7-1) was performed. Table 66 shows the film-forming conditions in the film-forming chambers 902B–904B in which step (7-2) was performed. Table 67 shows the film-forming conditions in the film-forming chambers 902C–911C in which step (7-3) was performed.

TABLE 65

| Film-forming chamber | 902A | 903A | 910A | 911 | 904A |
|---|---|---|---|---|---|
| Forming method | RF plasma CVD | RF plasma CVD | μ-wave plasma CVD | RF plasma CVD | RF plasma CVD |
| Length of forming region (cm) | 90 | 40 | 10 | 40 | 70 |
| Feed stock Gas (sccm) | SiH$_4$: 90 PH$_3$: 80 H$_2$: 500 | SiH$_4$: 30 H$_2$: 600 | SiH$_4$: 45 GeH$_4$: 55 H$_2$: 200 | SiH$_4$: 30 H$_2$: 600 | SiH$_4$: 10 BF$_3$: 5 H$_2$: 200 |
| Pressure in chamber (Pa) | 130 | 135 | 1 | 130 | 130 |
| Temp. of belt substrate (°C.) | 300 | 280 | 300 | 220 | 200 |
| Discharge power (W) | High frequency (13.56) MHz 90 | High frequency (13.56) MHz 75 | μ-wave (2.45 GHz) 150 | High Frequency (13.56) MHz 160 | High freq. (13.56 MHz) 120 |

TABLE 65-continued

| Film-forming chamber | 902A | 903A | 910A | 911 | 904A |
|---|---|---|---|---|---|
| Bias power (W) | — | — | High freq. (13.56) MHz 600 (0.5 W/cm$^2$) | — | — |

TABLE 66

| Film-forming chamber | 902B | 903B | 910B | 911B | 904B |
|---|---|---|---|---|---|
| Forming method | RF plasma CVD | RF plasma CVD | μ-wave plasma | RF plasma CVD | RF plasma CVD |
| Length of forming region (cm) | 25 | 40 | 10 | 40 | 70 |
| Feed stock Gas (sccm) | SiH$_4$: 30 PH$_3$: 80 H$_2$: 500 | SiH$_4$: 300 H$_2$: 600 | SiH$_4$: 40 BF$_3$: 60 H$_2$: 200 | SiH$_4$: 30 H$_2$: 600 | SiH$_4$: 10 BF$_3$: 5 H$_2$: 200 |
| Pressure in chamber (Pa) | 130 | 135 | 1 | 135 | 130 |
| Temp. of belt substrate (°C.) | 300 | 280 | 300 | 220 | 200 |
| Discharge power (W) | High freq. (13.56 MHz) 60 | High freq. (13.56 MHz) 75 | μ-wave (2.45 GHz) 150 | High freq. (13.56 MHz) 160 | High freq. (13.56 MHz) 120 |
| Bias power (W) | — | — | High freq. (13.56 MHz 600 (0.5 W/cm$^2$) | — | — |

TABLE 67

| Film-forming chamber | 902C | 903C | 904C | 911C |
|---|---|---|---|---|
| Forming method | RF plasma CVD | RF plasma CVD | LF plasma CVD | RF plasma CVD |
| Length of forming region (cm) | 60 | 200 | 70 | 20 |
| Feed stock Gas (sccm) | SiH$_4$: 40 PH$_3$: 15 H$_2$: 1800 | SiH$_4$: 160 H$_2$: 2000 | SiH$_4$: 0 BF$_3$: 0.1 H$_2$: 1000 | SiH$_4$: 10 BF$_3$: 5 H$_2$: 200 |
| Pressure in Chamber (Pa) | 130 | 135 | 130 | 130 |
| Temp. of belt substrate (°C.) | 250 | 250 | 70 | 200 |
| Discharge power (W) | High freq. (13.56 MHz) 80 (0.07 W/cm$^2$) | High freq. (13.56 MHz) 400 (0.33 W/cm$^2$) | Low freq. (75 kHz) 600 (0.50 W/cm$^2$) | High freq. (13.56 MHz) 120 (0.1 W/cm$^2$) |

(8) The belt substrate was continuously moved for 180 minutes from the start of conveyance. During the movement the formation of stacked semiconductor films was continued for 170 minutes.

(9) After the stacked semiconductor films were formed across about 170 nm, the supply of discharge power, introduction of stock gas, and heating of the belt substrate and film-forming chambers were stopped and the inside of the film-forming chambers was purged. After that, the belt substrate and the inside of apparatus were fully cooled and then the apparatus was opened. Then the belt substrate rolled on the bobbin was taken out of the apparatus from the winding chamber.

Further, module formation was carried out in the same manner as in Example 40, whereby solar cell modules (Ex 41 elements) of 35 cm×35 cm size were continuously fabricated, each composed of three-layer tandem junction solar cells in which photovoltaic elements of different bandgaps were stacked.

For each of the solar cell modules, evaluation of their characteristics was carried out under irradiation with the pseudo solar light of AM 1.5 (100 mW/cm$^2$).

For comparison, solar cell modules (Comp Ex 41-1) were also fabricated with stopping of application of the high frequency power in the film-forming chamber 911C so as not to form the second p-type semiconductor layer (layer B) 817, and the same measurements were carried out thereon.

For comparison, solar cell modules (Comp Ex 41-2) were fabricated wherein the semiconductor forming method in the film-forming chamber 904C was changed from the low frequency plasma CVD process to the high frequency plasma CVD process, the film-forming conditions in the film-forming chamber 904C were the same as in the film-forming chamber 911C, and a thicker second p-type semiconductor layer (layer B) 817 was deposited without forming the first p-type semiconductor layer (layer A) 816, and the same measurements were carried out therefor.

As a result, the average value of photoelectric conversion efficiencies of Ex 41 elements was good (1.06) when normalized with the value for Comp Ex 41-1 elements. Further, the average value of photoelectric conversion efficiencies of Ex 41 elements was good (1.04) when normalized with the value for Comp Ex 41-2 elements.

The dispersion in photoelectric conversion efficiencies between modules was also improved to be within ±1 to 2% for Ex 41 elements whereas it was ±4 to 6% for Comp Ex 41-1 elements and Comp Ex 41-2 elements.

Further, when a gas containing an element for increasing the bandgap was introduced into the film-forming chamber 904C, the elements were obtained with better characteristics.

Further, when the gas containing the element for increasing the bandgap was introduced into the film-forming chamber 911C, the elements were obtained with better characteristics.

Yet further, when the gas containing the element for increasing the bandgap was introduced into both film-forming chambers 904C and 911C, the elements were obtained with better characteristics.

As explained above, provided according to the present invention is the photovoltaic element having a stacked layers of non-single-crystal semiconductors, in which at least an i-type semiconductor layer and a second conductivity type semiconductor layer are formed on a first conductivity type semiconductor layer and in which the second conductivity type semiconductor layer has a layer A formed by exposing the surface of the i-type semiconductor layer to a plasma containing a valence electron controlling agent and a layer B deposited on the layer A by the CVD process using at least the valence electron controlling agent and the main constituent elements of the i-type semiconductor layer. Therefore, the doped layer can be formed with a high density of activated acceptors or donors with both a low activation energy and small absorption coefficient. Further, the interface between the i-type semiconductor layer and the layer A is covered upon deposition of the layer B, so that the open-circuit voltage ($V_{oc}$) and fill factor (F.F.) of photovoltaic element are increased, thereby obtaining a photovoltaic element with an improved photoelectric conversion efficiency.

Also, according to the present invention, the built-in potential is enhanced and at the same time, light absorption in the layer A is decreased so as to increase the short-circuit current ($J_{sc}$) of the photovoltaic element, thereby obtaining a photovoltaic element with a further improved photoelectric conversion efficiency.

Also, according to the present invention, when the layer B further contains an element for increasing the bandgap thereof, light absorption is decreased in the layer B so as to increase the short-circuit current ($J_{sc}$) of photovoltaic element, thereby obtaining a photovoltaic element with a further improved photoelectric conversion efficiency.

In addition, according to the present invention, when the first conductivity type is the n-type and the second conductivity type is the p-type, a photovoltaic element is obtained where the light is incident from the p-type semiconductor layer side.

Also, according to the present invention, when the first conductivity type is the p-type and the second conductivity type is the n-type, a photovoltaic element is obtained where the light is incident from the n-type semiconductor layer side.

Also, according to the present invention, when the hydrogen content of the layer A, formed by converting the i-type semiconductor layer near the surface of the photovoltaic element into the p-type or n-type region, is larger than the hydrogen content of the i-type semiconductor layer, the layer A has a widened bandgap, an increased built-in potential, and a decreased absorption coefficient, which increases the open-circuit voltage ($V_{oc}$) and the short-circuit current ($J_{sc}$) of the photovoltaic element, thereby obtaining a photovoltaic element with an improved photoelectric conversion efficiency.

Further, according to the present invention, when the crystal form of the layer A is amorphous and the crystal form of the layer B is microcrystalline or polycrystalline, the activation energy and absorption coefficient of the doped layer are decreased and the open-circuit voltage ($V_{oc}$) and short-circuit current ($J_{sc}$) are increased, thereby obtaining a photovoltaic element with an improved photoelectric conversion efficiency.

Also, according to the present invention, upon formation of the layer A the region of the i-type semiconductor layer near the surface is converted in a desired depth into a p-type or n-type region and the bandgap thereof is increased, and upon formation of the layer B the deposition reaction is mainly effected, thereby obtaining a simple fabrication process of the photovoltaic element with excellent repeatability.

Further, according to the present invention, the p-type semiconductor layer or the n-type semiconductor layer can be formed uniformly across a large area, so that the photovoltaic element can be formed uniformly across a large area. The invention can also improve adhesion of the p-type semiconductor layer or the n-type semiconductor layer to the i-type semiconductor layer, which can improve the yield of fabrication of photovoltaic elements.

What is claimed is:

1. A photovoltaic element having stacked films of non-single-crystal semiconductors, comprising a first conductivity type semiconductor layer, an i-type semiconductor layer on said first conductivity type semiconductor layer and a second conductivity type semiconductor layer on said i-type semiconductor layer, wherein said second conductivity type semiconductor layer has a first layer A formed by exposing the surface of the i-type semiconductor layer to a plasma containing a valence electron controlling agent and a layer B deposited on said layer A by a CVD process using at least a valence electron controlling agent and the main constituent element(s) of said i-type semiconductor layer.

2. A photovoltaic element according to claim 1, wherein said layer A further comprises at least one element for increasing the bandgap thereof.

3. A photovoltaic element according to claim 2, wherein said at least one element for increasing the bandgap is at least one element selected from the group consisting of carbon, oxygen, and nitrogen.

4. A photovoltaic element according to claim 1, wherein said layer B further comprises at least one element for increasing the bandgap thereof.

5. A photovoltaic element according to claim 4, wherein said at least one element for increasing the bandgap is at least one element selected from the group consisting of carbon, oxygen, and nitrogen.

6. A photovoltaic element according to claim 1, wherein said layer A and said layer B further comprise at least one element for increasing the bandgap thereof.

7. A photovoltaic element according to claim 6, wherein said at least one element for increasing the bandgap is at least one element selected from the group consisting of carbon, oxygen, and nitrogen.

8. A photovoltaic element according to claim 1, wherein said first conductivity type is the n-type and said second conductivity type is the p-type.

9. A photovoltaic element according to claim 1, wherein said first conductivity type is the p-type and said second conductivity type is the n-type.

10. A photovoltaic element according to claim 1, wherein the hydrogen content of said layer A, formed by converting the surface of the i-type semiconductor layer into a p-type or n-type region, is larger than the hydrogen content of said i-type semiconductor layer.

11. A photovoltaic element according to claim 1, wherein the crystal form of said layer A is amorphous and the crystal form of said layer B is microcrystalline or polycrystalline.

12. A photovoltaic element according to claim 1, wherein said at least one valence electron controlling agent is an element belonging to Group III or Group V of the Periodic Table.

13. A photovoltaic element according to claim 1, wherein layer B contains the same at least one valence electron controlling agent as contained in layer A.

14. A photovoltaic element according to claim 13, wherein said at least one valence electron controlling agent is at least one element belonging to Group III or Group V of the Periodic Table.

15. A photovoltaic element according to claim 1, wherein said layer B has a thickness of 1 nm to 10 nm.

16. A photovoltaic element according to claim 1, wherein said i-type semiconductor layer comprises silicon or germanium.

17. A photovoltaic element according to claim 16, wherein said i-type semiconductor layer further comprises at least one element selected from the group consisting of carbon, oxygen, and nitrogen.

18. A photovoltaic element according to claim 1, wherein said i-type semiconductor layer comprises at least one element selected from the group consisting of carbon, oxygen, and nitrogen.

19. A photovoltaic element according to claim 1, wherein when a set of layers has said first conductivity type semiconductor layer, i-type semiconductor layer, layer A and layer B stacked in this order, a plurality of such sets are stacked.

20. A photovoltaic element according to claim 1, wherein there are a plurality of stacked sets of layers, comprising a first set having said first conductivity type semiconductor layer, i-type semiconductor layer, layer A and layer B stacked in this order and a second set having the first conductivity type semiconductor layer, i-type semiconductor layer, and second conductivity type semiconductor layer stacked in this order.

21. A photovoltaic element according to claim 20, which comprises a plurality of such second sets.

22. A photovoltaic element according to claim 20, which has the first set closer to a light incidence side than said second set.

23. A photovoltaic element according to claim 22, which comprises a plurality of such second sets.

24. A photovoltaic element according to claim 1, which has an electrically conductive layer on said layer B.

25. A photovoltaic element according to claim 24, wherein said electrically conductive layer comprises a transparent conductive layer.

26. A photovoltaic element according to claim 25, further comprising a collector electrode on said transparent conductive layer.

27. A photovoltaic element according to claim 1, wherein a substrate on which said semiconductors are formed has a reflective film thereon.

28. A photovoltaic element according to claim 1, wherein a substrate on which said semiconductors are formed has a buffer layer thereon.

29. A photovoltaic element according to claim 1, wherein said layer A has a thickness of 1 nm to 10 nm.

30. A photovoltaic element according to claim 1, wherein said semiconductor layers contain hydrogen atoms, and the content of the hydrogen atoms is greater near an interface between the layers.

31. A photovoltaic element according to claim 30, wherein said hydrogen content near said interface is 1.1 to 2 times greater.

32. A process for fabricating a photovoltaic element, comprising:

a step of depositing a first conductivity type semiconductor;

a step of depositing an i-type semiconductor on said first conductivity type semiconductor;

a step of exposing a surface region of said i-type semiconductor layer to a plasma atmosphere containing a valence electron controlling agent, thereby forming from said surface region a layer A of a second conductivity type semiconductor; and a step of depositing a second conductivity type semiconductor containing a valence electron controlling agent on said layer A, thereby forming a layer B.

33. A fabrication process according to claim 32, wherein said plasma atmosphere further comprises at least one element for increasing the bandgap of said layer A.

34. A fabrication process according to claim 33, wherein said at least one element for increasing the bandgap is at least one element selected from the group consisting of carbon, oxygen, and nitrogen.

35. A fabrication process according to claim 33, wherein the pressure upon generating the plasma for forming said layer A is lower than the pressure upon depositing said layer B.

36. A fabrication process according to claim 32, wherein said layer B further comprises an element for increasing the bandgap thereof.

37. A fabrication process according to claim 32, wherein each said valence electron controlling agent comprises an element belonging to Group III or Group V of the Periodic Table.

38. A fabrication process according to claim 32, wherein a DC voltage or AC power applied when forming said layer A is greater than a DC voltage or AC power applied when depositing said layer B.

39. A fabrication process according to claim 32, wherein the hydrogen dilution ratio of a feed stock gas introduced when forming said layer A is higher than the hydrogen dilution ratio of the feed stock gas introduced when depositing said layer B.

40. A fabrication process according to claim 32, wherein the frequency of discharge power when forming said layer A is lower than the frequency of discharge power when depositing said layer B.

41. A fabrication process according to claim 40, wherein the frequency of discharge power when forming said layer A is between 5 kHz and 500 kHz.

42. A fabrication process according to claim 40, wherein the frequency of discharge power when forming said layer B is between 1 MHz and 100 MHz.

* * * * *

UNITED STATES PATENT AND TRADEMARK OFFICE
CERTIFICATE OF CORRECTION

PATENT NO. : 5,720,826
DATED : February 24, 1998
INVENTOR(S) : RYO HAYASHI, ET AL.

It is certified that error appears in the above-identified patent and that said Letters Patent is hereby corrected as shown below:

COLUMN 21

Line 55, "The" should read --¶ The--.

COLUMN 22

Line 41, "100" should read --100 sccm--.

COLUMN 23

Line 23, "exists" should read --exist--.

COLUMN 26

Line 63, "designate" should read --designates--.

COLUMN 28

Line 19, "GeM$_4$," should read --GeH$_4$,--; and
Line 51, "101 Torr." should read --1.1 Torr.--.

COLUMN 29

Line 57, "rates" should read --rate--.

COLUMN 32

Line 9, "SiH$_4$/HJ$_2$" should read --SiH$_4$/H$_2$--; and
Line 39, "factor ($\mu$)," should read --factor ($\eta$),--.

UNITED STATES PATENT AND TRADEMARK OFFICE
CERTIFICATE OF CORRECTION

PATENT NO. : 5,720,826

DATED : February 24, 1998

INVENTOR(S) : RYO HAYASHI, ET AL.

It is certified that error appears in the above-identified patent and that said Letters Patent is hereby corrected as shown below:

COLUMN 36

Line 4, "rates" should read --rate--; and
    Line 49, "rates" should read --rate.

COLUMN 37

Line 21, "$H_a$" should read --$H_2$--; and
    Line 31, "80 nm" should read --70 nm--.

COLUMN 41

Line 14, "was started" (first occurrence) should read --on the RF--.

COLUMN 43

Line 21, "at350°" should read --at 350°--; and
    Line 47, "bu" should read --by--.

COLUMN 46

Line 15, "$Si_2H_2$" should read --$Si_2H_6$--; and
    Line 35, "$BF_3$/Me" should read --$BF_3$/He--.

COLUMN 47

Line 58, "TABLE 20" should read --TABLE 10--.

UNITED STATES PATENT AND TRADEMARK OFFICE
CERTIFICATE OF CORRECTION

PATENT NO. : 5,720,826
DATED : February 24, 1998
INVENTOR(S) : RYO HAYASHI, ET AL.

It is certified that error appears in the above-identified patent and that said Letters Patent is hereby corrected as shown below:

COLUMN 48

Line 29, "in" (first occurrence) should be deleted.

COLUMN 74

Line 67, "AM\1.5" should read --AM 1.5--.

COLUMN 75

Line 66, "(photoelectrmotive" should read --(photoelectromotive--.

COLUMN 80

Line 42, "voltage (voc)," should read --voltage ($V_{oc}$),--.

COLUMN 83

Line 15, close up right margin; and
    Line 16, close up left margin.

COLUMN 85

Line 39, "Ex 241)." should read --Ex 24-1).

COLUMN 91

Line 14, "t1x10$^{-5}$ Torr." should read --1x10$^{-5}$ Torr.--.

UNITED STATES PATENT AND TRADEMARK OFFICE
CERTIFICATE OF CORRECTION

PATENT NO. : 5,720,826
DATED : February 24, 1998
INVENTOR(S) : RYO HAYASHI, ET AL.

It is certified that error appears in the above-identified patent and that said Letters Patent is hereby corrected as shown below:

COLUMN 93

Line 50, close up right margin; and
Line 51, close up left margin.

COLUMN 97

Line 20, "pc-SiC" should read --$\mu$c-SiC--.

COLUMN 101

Line 67, "plasm" should read --plasma--.

COLUMN 103

Line 31, "$CH_2$ gas" should read --$CH_4$ gas--.

COLUMN 112

Line 62, "80" should read --70--.

COLUMN 114

Line 30, "($\eta$)-(10)" should read --(7)-(10)--.

COLUMN 117

Line 53, "nthe" should read --the--.

UNITED STATES PATENT AND TRADEMARK OFFICE
CERTIFICATE OF CORRECTION

PATENT NO. : 5,720,826

DATED : February 24, 1998

INVENTOR(S) : RYO HAYASHI, ET AL.

It is certified that error appears in the above-identified patent and that said Letters Patent is hereby corrected as shown below:

<u>COLUMN 122</u>

Line 25, "pc-SiC" should read --$\mu$c-SiC--.

<u>COLUMN 124</u>

Line 19, "80" should read --70--.

<u>COLUMN 137</u>

Line 11, "are" should read --is--.

Signed and Sealed this

Fifth Day of January, 1999

Attest:

*Attesting Officer*

Acting Commissioner of Patents and Trademarks